US009312500B2

(12) United States Patent
Ikeda et al.

(10) Patent No.: US 9,312,500 B2
(45) Date of Patent: Apr. 12, 2016

(54) ORGANIC ELECTROLUMINESCENCE DEVICE

(71) Applicant: IDEMITSU KOSAN CO., LTD., Chiyoda-ku (JP)

(72) Inventors: Takeshi Ikeda, Sodegaura (JP); Hirokatsu Ito, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 400 days.

(21) Appl. No.: 14/014,442

(22) Filed: Aug. 30, 2013

(65) Prior Publication Data

US 2014/0061622 A1 Mar. 6, 2014

(30) Foreign Application Priority Data

Aug. 31, 2012 (JP) ................................ 2012-192676

(51) Int. Cl.
*H01L 51/00* (2006.01)
*H01L 51/50* (2006.01)

(52) U.S. Cl.
CPC .......... *H01L 51/0073* (2013.01); *H01L 51/006* (2013.01); *H01L 51/0054* (2013.01); *H01L 51/0061* (2013.01); *H01L 51/5012* (2013.01)

(58) Field of Classification Search
None
See application file for complete search history.

(56) References Cited

U.S. PATENT DOCUMENTS 7,357,991 B2 4/2008 Hosokawa et al.
7,651,786 B2 1/2010 Matsuura et al.

(Continued)

FOREIGN PATENT DOCUMENTS

CN 102516979 6/2012
CN 102807554 12/2012

(Continued)

*Primary Examiner* — Gregory Clark

(74) *Attorney, Agent, or Firm* — Oblon, McClelland, Maier & Neustadt, L.L.P.

(57) ABSTRACT

An organic electroluminescence device according to the invention includes: a cathode; an anode; and an organic layer being interposed between the cathode and the anode, the organic layer comprising one or more layers comprising at least an emitting layer. The emitting layer contains: an anthracene derivative represented by a formula (1) below; and a pyrene derivative represented by a formula (21) below.

(1)

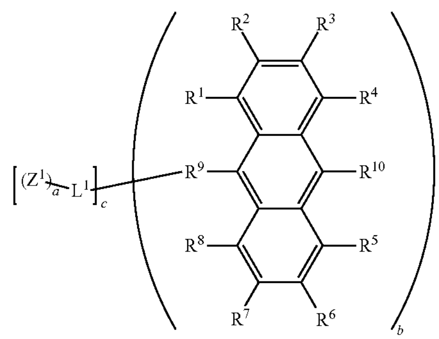

(21)

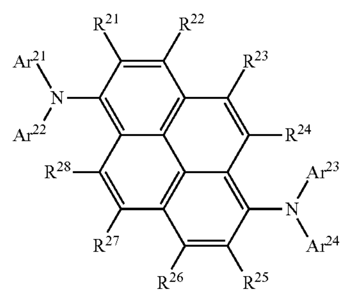

12 Claims, 1 Drawing Sheet

(56) References Cited

U.S. PATENT DOCUMENTS

| | | | |
|---|---|---|---|
| 7,732,063 | B2 | 6/2010 | Matsuura et al. |
| 7,790,892 | B2 | 9/2010 | Ikeda et al. |
| 7,839,074 | B2 | 11/2010 | Ikeda et al. |
| 7,867,629 | B2 | 1/2011 | Yamamoto et al. |
| 7,906,228 | B2 | 3/2011 | Lee et al. |
| 7,927,716 | B2 | 4/2011 | Matsuura et al. |
| 7,989,644 | B2 | 8/2011 | Tanabe et al. |
| 8,084,146 | B2 | 12/2011 | Murase et al. |
| 8,318,324 | B2 | 11/2012 | Ikeda et al. |
| 8,324,802 | B2 | 12/2012 | Matsuura et al. |
| 8,334,648 | B2 | 12/2012 | Matsuura et al. |
| 2004/0137270 | A1 | 7/2004 | Seo et al. |
| 2004/0209118 | A1 | 10/2004 | Seo et al. |
| 2005/0014017 | A1 | 1/2005 | Hosokawa et al. |
| 2005/0064233 | A1 | 3/2005 | Matsuura et al. |
| 2005/0214565 | A1 | 9/2005 | Ikeda et al. |
| 2005/0233165 | A1 | 10/2005 | Ido et al. |
| 2006/0033421 | A1 | 2/2006 | Matsuura et al. |
| 2006/0043858 | A1 | 3/2006 | Ikeda et al. |
| 2006/0154105 | A1 | 7/2006 | Yamamoto et al. |
| 2007/0042220 | A1 | 2/2007 | Inoue et al. |
| 2007/0072002 | A1 | 3/2007 | Kim et al. |
| 2007/0237984 | A1 | 10/2007 | Matsuura et al. |
| 2007/0247063 | A1 | 10/2007 | Murase et al. |
| 2008/0152950 | A1 | 6/2008 | Je et al. |
| 2008/0160344 | A1 | 7/2008 | Hosokawa et al. |
| 2008/0278065 | A1 | 11/2008 | Ueda et al. |
| 2008/0297037 | A1 | 12/2008 | Vestweber et al. |
| 2008/0303423 | A1 | 12/2008 | Heil et al. |
| 2008/0315754 | A1 | 12/2008 | Kawamura et al. |
| 2009/0131673 | A1 | 5/2009 | Tanabe et al. |
| 2009/0153039 | A1 | 6/2009 | Kim et al. |
| 2009/0200926 | A1 | 8/2009 | Lee et al. |
| 2009/0230855 | A1 | 9/2009 | Kim et al. |
| 2009/0247795 | A1 | 10/2009 | Kawakami |
| 2009/0251049 | A1 | 10/2009 | Kim et al. |
| 2009/0256468 | A1 | 10/2009 | Kim et al. |
| 2009/0288707 | A1 | 11/2009 | Lee et al. |
| 2009/0321729 | A1 | 12/2009 | Ido et al. |
| 2010/0032658 | A1 | 2/2010 | Lee et al. |
| 2010/0033083 | A1 | 2/2010 | Eum et al. |
| 2010/0045170 | A1 | 2/2010 | Lee et al. |
| 2010/0051106 | A1 | 3/2010 | Kim et al. |
| 2010/0072888 | A1 | 3/2010 | Kim et al. |
| 2010/0096982 | A1 | 4/2010 | Eum et al. |
| 2010/0108997 | A1 | 5/2010 | Kim et al. |
| 2010/0270913 | A1 | 10/2010 | Matsuura et al. |
| 2010/0277061 | A1 | 11/2010 | Matsuura et al. |
| 2011/0034744 | A1 | 2/2011 | Ikeda et al. |
| 2011/0049482 | A1 | 3/2011 | Ikeda et al. |
| 2011/0068683 | A1 | 3/2011 | Kawamura et al. |
| 2011/0108826 | A1 | 5/2011 | Jang et al. |
| 2011/0127510 | A1* | 6/2011 | Seo .................... H01L 51/0052 257/40 |
| 2011/0156016 | A1 | 6/2011 | Kawamura et al. |
| 2011/0168992 | A1 | 7/2011 | Bae et al. |
| 2011/0204339 | A1 | 8/2011 | Dobbs et al. |
| 2011/0248217 | A1 | 10/2011 | Tanabe et al. |
| 2011/0248246 | A1* | 10/2011 | Ogita .................. C07D 307/91 257/40 |
| 2011/0248247 | A1 | 10/2011 | Matsumoto et al. |
| 2011/0297923 | A1 | 12/2011 | Mizuki et al. |
| 2011/0315965 | A1 | 12/2011 | Takashima et al. |
| 2012/0013244 | A1 | 1/2012 | Kawamura et al. |
| 2012/0037892 | A1 | 2/2012 | Jang et al. |
| 2012/0056165 | A1 | 3/2012 | Kawamura et al. |
| 2012/0104940 | A1 | 5/2012 | Shin et al. |
| 2012/0138907 | A1 | 6/2012 | Murase et al. |
| 2012/0138914 | A1 | 6/2012 | Kawamura et al. |
| 2012/0165556 | A1 | 6/2012 | Suzuki et al. |
| 2012/0181922 | A1 | 7/2012 | Kawamura et al. |
| 2012/0217449 | A1 | 8/2012 | Spreitzer et al. |
| 2012/0235561 | A1 | 9/2012 | Ikeda et al. |
| 2012/0267615 | A1 | 10/2012 | Fujita et al. |
| 2012/0313511 | A1 | 12/2012 | Tsurutani et al. |
| 2013/0069523 | A1 | 3/2013 | Matsuura et al. |
| 2013/0187138 | A1 | 7/2013 | Matsumoto et al. |
| 2014/0167003 | A1 | 6/2014 | Kato et al. |

FOREIGN PATENT DOCUMENTS

| | | | |
|---|---|---|---|
| CN | 102807556 | | 12/2012 |
| CN | 102838585 | | 12/2012 |
| EP | 2 182 038 | A1 | 5/2010 |
| EP | 2182039 | | 5/2010 |
| EP | 2189508 | | 5/2010 |
| EP | 2256176 | | 12/2010 |
| EP | 2281862 | | 2/2011 |
| EP | 2281863 | | 2/2011 |
| EP | 2 665 342 | A1 | 11/2013 |
| EP | 2 752 907 | A1 | 7/2014 |
| JP | 2002-069044 | | 3/2002 |
| JP | 2003-238534 | | 8/2003 |
| JP | 2004-002297 | | 1/2004 |
| JP | 2004-224766 | | 8/2004 |
| JP | 2005-041843 | | 2/2005 |
| JP | 2007-63501 | A | 3/2007 |
| JP | 2007-77094 | A | 3/2007 |
| JP | 2007-138228 | A | 6/2007 |
| JP | 2007-227152 | | 9/2007 |
| JP | 2008-063240 | | 3/2008 |
| JP | 2008-244424 | A | 10/2008 |
| JP | 2009-001499 | | 1/2009 |
| JP | 2011-93931 | A | 5/2011 |
| JP | 2011-100942 | A | 5/2011 |
| JP | 2011-173973 | | 9/2011 |
| JP | 2012-190863 | A | 10/2012 |
| KR | 10-2009-0065201 | | 6/2009 |
| KR | 10-2009-0086015 | A | 8/2009 |
| KR | 10-2009-0129853 | A | 12/2009 |
| KR | 10-2009-0131958 | A | 12/2009 |
| KR | 10-2010-0002030 | A | 1/2010 |
| KR | 10-2010-0021367 | | 2/2010 |
| KR | 10-2010-006424 | A | 6/2010 |
| KR | 10-2010-0082676 | A | 7/2010 |
| KR | 10-2010-0094413 | A | 8/2010 |
| KR | 10-2011-0018195 | A | 2/2011 |
| KR | 10-2011-0024695 | A | 3/2011 |
| KR | 10-2011-081698 | | 7/2011 |
| KR | 10-2011-0099195 | A | 9/2011 |
| KR | 10-2011-0123701 | A | 11/2011 |
| KR | 10-1123047 | B1 | 3/2012 |
| KR | 10-2012-080508 | | 7/2012 |
| KR | 10-2012-120886 | | 11/2012 |
| KR | 10-2012-122897 | | 11/2012 |
| KR | 10-2012-135501 | | 12/2012 |
| KR | 10-2012-140603 | | 12/2012 |
| KR | 10-2013-007511 | | 1/2013 |
| KR | 10-2013-0075982 | A | 7/2013 |
| KR | 10-2013-0083129 | A | 7/2013 |
| KR | 10-2013-0098226 | | 9/2013 |
| KR | 10-2013-0098228 | | 9/2013 |
| WO | 2005/113531 | | 12/2005 |
| WO | WO 2009/069537 | A1 | 6/2009 |
| WO | WO 2010/013675 | A1 | 2/2010 |
| WO | 2010/052885 | | 5/2010 |
| WO | 2010/062107 | | 6/2010 |
| WO | 2010/064871 | | 6/2010 |
| WO | WO 2010/114253 | A2 | 10/2010 |
| WO | WO 2010/114256 | A2 | 10/2010 |
| WO | 2010/137285 | | 12/2010 |
| WO | 2011/019025 | | 2/2011 |
| WO | WO 2011/145876 | A2 | 11/2011 |
| WO | 2012/144176 | | 10/2012 |
| WO | 2013/109030 | | 7/2013 |
| WO | WO 2014/017094 | A1 | 1/2014 |
| WO | WO 2014/035159 | A1 | 3/2014 |

* cited by examiner

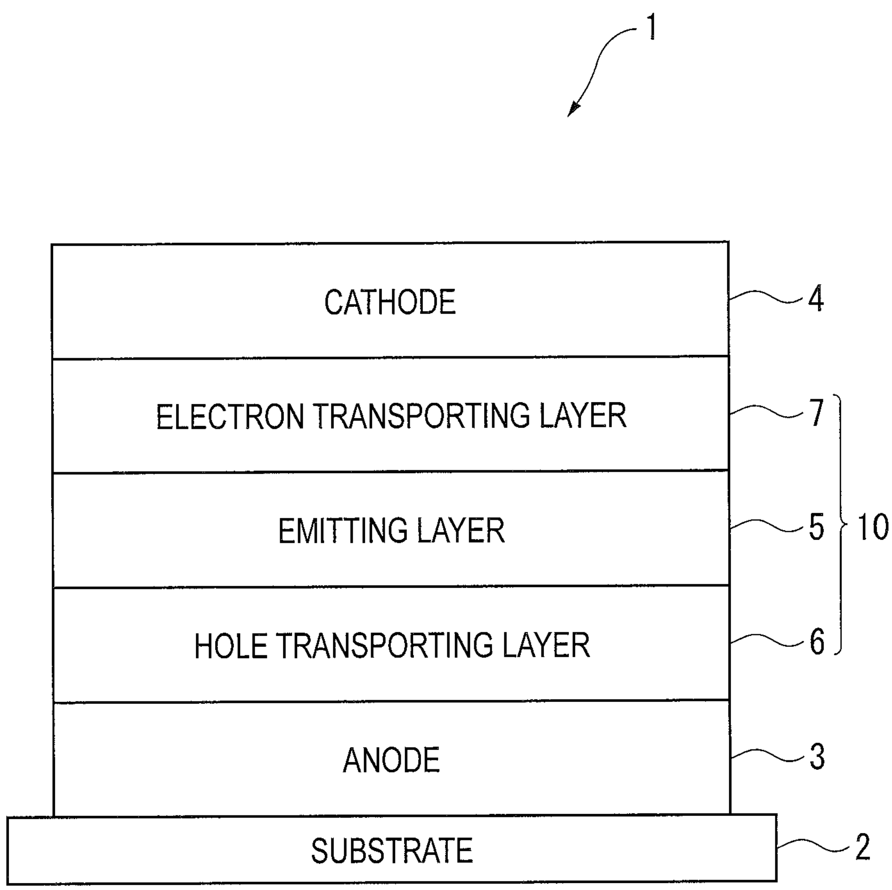
1
CATHODE
4
ELECTRON TRANSPORTING LAYER
7
EMITTING LAYER
5
10
HOLE TRANSPORTING LAYER
6
ANODE
3
SUBSTRATE
2

ORGANIC ELECTROLUMINESCENCE DEVICE

CROSS-REFERENCE TO RELATED APPLICATION(S)

The application is based upon and claims the benefit of priority from the prior Japanese Patent Application No. 2012-192676, filed Aug. 31, 2012; the entire content of which is incorporated herein by reference.

FIELD OF THE INVENTION

The present invention relates to an organic electroluminescence device.

BACKGROUND ART

An organic electroluminescence device (hereinafter occasionally simply referred to as organic EL device) using an organic substance is highly expected to serve as an inexpensive full-color display device with large area capable of solid-state lighting, so that it has been developed in many ways. A general organic EL device includes an emitting layer and a pair of opposing electrodes between which the emitting layer is interposed. When an electric field is applied between the electrodes, electrons are injected from a cathode while holes are injected from an anode. Recombination of the electrons with the holes in the emitting layer results in generation of an excited state. When the excited state returns to a ground state, energy is released as light.

Compared with an inorganic light-emitting diode, a typical organic EL device requires a high driving voltage but exhibits low luminescence intensity and luminous efficiency. Further, because of serious property degradation, the typical organic EL device has not been put into practical use. Although a recent organic EL device has been progressively improved, it is still required to further improve the organic EL device in terms of luminous efficiency, lifetime, color reproductivity, etc.

With an improved luminescent material for an organic EL device, the performance of an organic EL device has be progressively improved. In particular, improvement in the color purity of a blue-emitting organic EL device (i.e., shortening of the emission wavelength) is deemed as an important technique which leads to improvement in the color reproductivity of a display.

Examples of a material usable for the emitting layer are an anthracene derivative having dibenzofuran as a substituent as disclosed in Patent Literature 1 (International Publication No. WO 2010/137285). Patent Literature 1 also discloses that an organic EL device using this derivative as a host material is driven with a low voltage and is capable of blue emission with a short wavelength.

However, the efficiency and lifetime of the organic EL device disclosed in Patent Literature 1 are not sufficient and thus need to be further increased so that the organic EL device can be used as a light source for electronic devices such as a lighting device and a display.

SUMMARY OF THE INVENTION

An object of the invention is to provide an organic electroluminescence device capable of being driven with a low voltage and having a high luminous efficiency and a long lifetime.

[1] An organic electroluminescence device according to an aspect of the invention includes: a cathode; an anode; and an organic layer being interposed between the cathode and the anode, the organic layer including one or more layers including at least an emitting layer, in which the emitting layer contains: an anthracene derivative represented by a formula (1) below; and a pyrene derivative represented by a formula (21) below.

(1)

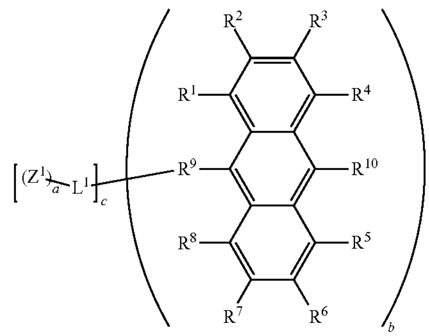

In the formula (1):

a variable number c of $R^1$ to $R^{10}$ is a single bond through which $L^1$ is bonded;

the rest of $R^1$ to $R^{10}$ at which $L^1$ is not bonded each represent any one of a hydrogen atom, a halogen atom, a hydroxyl group, a cyano group, a substituted or unsubstituted amino group, a substituted or unsubstituted alkyl group having 1 to 20 carbon atoms, a substituted or unsubstituted alkoxy group having 1 to 20 carbon atoms, a substituted or unsubstituted aryloxy group having 6 to 30 ring carbon atoms, a substituted or unsubstituted arylthio group having 6 to 30 ring carbon atoms, a substituted or unsubstituted aromatic hydrocarbon group having 6 to 30 ring carbon atoms and a substituted or unsubstituted heterocyclic group having 5 to 30 ring atoms;

$L^1$ is a single bond or a linking group;

the linking group is any one of an (a+1)-valent residue obtained by removing a variable number (a+1) of hydrogen atoms from a substituted or unsubstituted aromatic hydrocarbon group having 6 to 30 ring carbon atoms, an (a+1)-valent residue obtained by removing a variable number (a+1) of hydrogen atoms from a substituted or unsubstituted heterocyclic group having 5 to 30 ring atoms, and an (a+1)-valent residue obtained by removing a variable number (a+1) of hydrogen atoms from a group formed by bonding two to four of the substituted or unsubstituted aromatic hydrocarbon groups having 6 to 30 ring carbon atoms and the substituted or unsubstituted heterocyclic groups having 5 to 30 ring atoms;

a, b and c each represent an integer of 1 to 4; and $Z^1$ is represented by a formula (2) below.

(2)

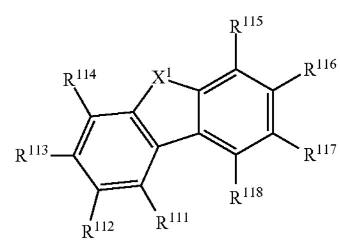

In the above formula:

$X^1$ is an oxygen atom or a sulfur atom;

$R^{111}$ to $R^{118}$ are each the same as the rest of $R^1$ to $R^{10}$ at which $L^1$ is not bonded in the formula (1); and adjacent two substituents of at least one pair of $R^{111}$ and $R^{112}$, $R^{112}$ and $R^{113}$, $R^{113}$ and $R^{114}$, $R^{115}$ and $R^{116}$, $R^{116}$ and $R^{17}$, and $R^{17}$ and $R^{118}$ are mutually bonded to form a ring represented by a formula (3) or a formula (4) below.

(3)

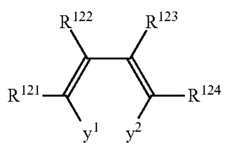

(4)

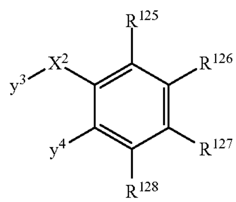

In the formulae (3) and (4):

$y^1$ and $y^2$ in the formula (3) represent positions where the pair selected from $R^{111}$ to $R^{118}$ in the formula (2) are bonded;

$y^3$ and $y^4$ in the formula (4) represent positions where the pair selected from $R^{111}$ to $R^{118}$ in the formula (2) are bonded;

$R^{121}$ to $R^{124}$ and $R^{125}$ to $R^{128}$ are each the same as the rest of $R^1$ to $R^{10}$ at which $L^1$ is not bonded in the formula (1);

$X^2$ is an oxygen atom or a sulfur atom; and one of the rest of $R^{111}$ to $R^{118}$ not forming the ring in the formula (2) and $R^{121}$ to $R^{124}$ in the formula (3) or one of the rest of $R^{111}$ to $R^{118}$ not forming the ring in the formula (2) and $R^{125}$ to $R^{128}$ in the formula (4) is a single bond through which $L^1$ is bonded in the formula (1).

(21)

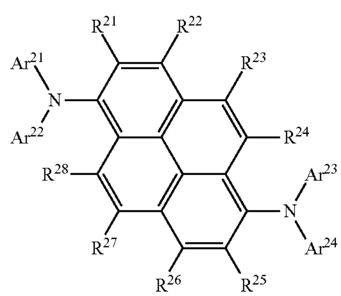

In the formula (21):

$R^{21}$ to $R^{28}$ each represent any one of a hydrogen atom, a halogen atom, a cyano group, a substituted or unsubstituted alkyl group having 1 to 20 carbon atoms, a substituted or unsubstituted silyl group and a substituted or unsubstituted aromatic hydrocarbon group having 6 to 30 ring carbon atoms;

$Ar^{21}$ to $Ar^{24}$ each represent a substituted or unsubstituted aromatic hydrocarbon group having 6 to 30 ring carbon atoms or a substituted or unsubstituted heterocyclic group having 5 to 30 ring atoms; and at least one of $Ar^{21}$ to $Ar^{24}$ is a heterocyclic group represented by a formula (22) below.

(22)

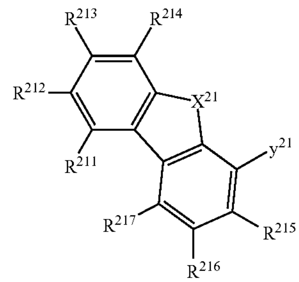

In the formula (22):

$R^{211}$ to $R^{217}$ each represent any one of a hydrogen atom, a halogen atom, a cyano group, a substituted or unsubstituted alkyl group having 1 to 20 carbon atoms, a substituted or unsubstituted alkenyl group having 2 to 20 carbon atoms, a substituted or unsubstituted alkynyl group having 2 to 20 carbon atoms, a substituted or unsubstituted silyl group, a substituted or unsubstituted aromatic hydrocarbon group having 6 to 30 ring carbon atoms and a substituted or unsubstituted heterocyclic group having 5 to 30 ring atoms;

each pair of $R^{211}$ and $R^{212}$, $R^{212}$ and $R^{213}$, $R^{213}$ and $R^{214}$, $R^{215}$ and $R^{216}$, and $R^{216}$ and $R^{217}$ are optionally mutually bonded to form a saturated or unsaturated ring that is optionally substituted;

$X^{21}$ is an oxygen atom or a sulfur atom; and $y^{21}$ is a single bond through which a nitrogen atom in the formula (21) is bonded.

[2] In the organic electroluminescence device, it is preferable that $Z^1$ is represented by one of formulae (5) to (7) below.

(5)

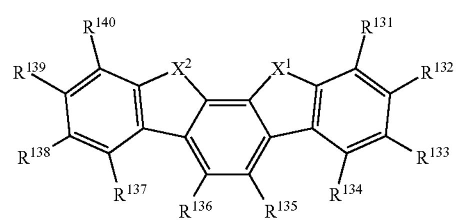

(6)

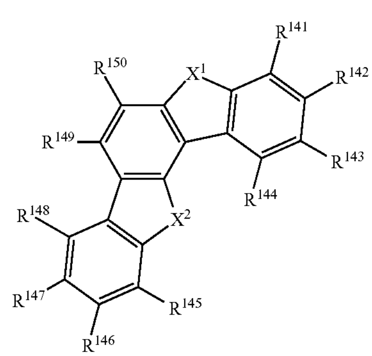

-continued (7)

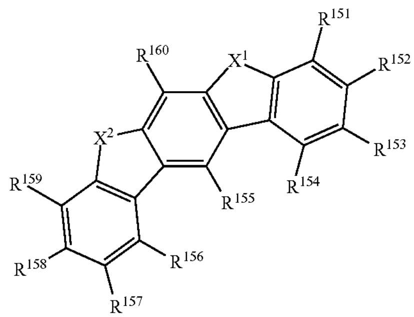

In the formulae (5) to (7):

$R^{131}$ to $R^{140}$, $R^{141}$ to $R^{150}$ and $R^{151}$ to $R^{160}$ are each the same as the rest of $R^1$ to $R^{10}$ at which $L^1$ is not bonded in the formula (1);

$L^1$ is bonded to $Z^1$ at one selected from among $R^{131}$ to $R^{140}$, one selected from among $R^{141}$ to $R^{150}$ or one selected from among $R^{151}$~$R^{160}$ through a single bond; and $X^1$ and $X^2$ are the same as $X^1$ in the formula (2) and $X^2$ in the formula (4), respectively, and are mutually the same or different.

[3] In the organic electroluminescence device, it is preferable that $Z^1$ is represented by one of formulae (8) to (10) below.

(8)

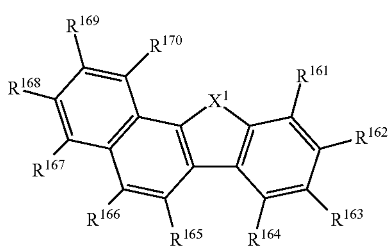

(9)

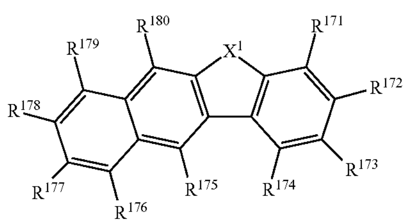

(10)

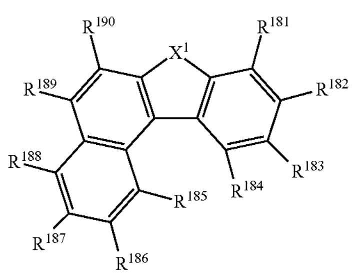

In the formulae (8) to (10):

$R^{161}$ to $R^{170}$, $R^{171}$ to $R^{180}$ and $R^{181}$ to $R^{190}$ are each the same as the rest of $R^1$ to $R^{10}$ at which $L^1$ is not bonded in the formula (1);

$L^1$ is bonded to $Z^1$ at one selected from among $R^{161}$ to $R^{170}$, one selected from among $R^{171}$ to $R^{180}$ or one selected from among $R^{181}$~$R^{190}$ through a single bond; and $X^1$ is the same as $X^1$ in the formula (2).

[4] In the organic electroluminescence device, it is preferable that b in the formula (1) represents 1.

[5] In the organic electroluminescence device, it is preferable that a in the formula (1) represents 1 or 2.

[6] In the organic electroluminescence device, it is preferable that at least one of $R^9$ and $R^{10}$ in the formula (1) is a single bond through which $L^1$ is bonded.

[7] In the organic electroluminescence device, it is preferable that $R^9$ in the formula (1) represents a substituted or unsubstituted aromatic hydrocarbon group having 6 to 30 ring carbon atoms or a substituted or unsubstituted heterocyclic group having 5 to 30 ring atoms.

[8] In the organic electroluminescence device, it is preferable that $X^1$ and $X^2$ each represent an oxygen atom.

[9] In the organic electroluminescence device, it is preferable that $Ar^{21}$ and $Ar^{23}$ in the formula (21) each represent the heterocyclic group represented by the formula (22).

[10] In the organic electroluminescence device, it is preferable that $R^{20}$ to $R^{29}$ in the formula (21) each represent a hydrogen atom.

[11] In the organic electroluminescence device, it is preferable that $R^{22}$ and $R^{26}$ in the formula (21) each represent a substituted or unsubstituted alkyl group having 1 to 20 carbon atoms or a substituted or unsubstituted alkylsilyl group having 3 to 30 carbon atoms, and $R^{21}$, $R^{23}$, $R^{24}$, $R^{25}$, $R^{27}$ and $R^{28}$ each represent a hydrogen atom.

[12] In the organic electroluminescence device, it is preferable that $X^{21}$ in the formula (22) represents an oxygen atom.

According to the aspect of the invention, it is possible to provide a long-life organic electroluminescence device capable of being driven with a low voltage and emitting light with a high luminous efficiency.

BRIEF DESCRIPTION OF DRAWINGS

FIG. 1 schematically shows an exemplary arrangement of an organic EL device according to an exemplary embodiment of the invention.

DESCRIPTION OF EXEMPLARY EMBODIMENT

Arrangement of Organic EL Device

Arrangement(s) of an organic EL device according to the invention will be described below.

The organic EL device according to the invention includes an organic layer interposed between a pair of electrodes. The organic layer includes at least one layer made of an organic compound. The organic layer may contain an inorganic compound.

In the organic EL device according to the invention, at least one of layers forming the organic layer includes an emitting layer. In other words, the organic layer may be an emitting layer or may additionally include layers usable in a known organic EL device such as a hole injecting layer, a hole transporting layer, an electron injecting layer, an electron transporting layer, a hole blocking layer and an electron blocking layer.

The followings are representative arrangement examples of an organic EL device:

(a) anode/emitting layer/cathode;

(b) anode/hole injecting•transporting layer/emitting layer/cathode;

(c) anode/emitting layer/electron injecting•transporting layer/cathode;

(d) anode/hole injecting•transporting layer/emitting layer/electron injecting•transporting layer/cathode; and (e) anode/hole injecting•transporting layer/emitting layer/blocking layer/electron injecting•transporting layer/cathode.

While the arrangement (d) is preferably usable among the above, the arrangement of the invention is not limited to the above exemplary arrangements.

Incidentally, the "emitting layer", which is an organic layer provided with a luminescent function, is designed to include a host material and a dopant material when the device uses a doping system. In this case, while the host material mainly serves to enhance recombination of electrons and holes and to entrap excitons, which are generated as a result of the recombination, in the emitting layer, the dopant material serves to make the excitons emit light with efficiency. When the organic EL device is a phosphorescent device, the host material mainly serves to entrap excitons generated in the dopant in the emitting layer.

It should be noted that the "hole injecting/transporting layer" means "at least one of hole injecting layer and hole transporting layer", while the "electron injecting/transporting layer" means "at least one of electron injecting layer and electron transporting layer". When the device includes the hole injecting layer and the hole transporting layer, the hole injecting layer is preferably located closer to the anode. When the device includes the electron injecting layer and the electron transporting layer, the electron injecting layer is preferably located closer to the cathode.

According to the invention, the electron transporting layer is an organic layer with the highest electron mobility among organic layers (i.e., an electron transport zone) existing between the emitting layer and the cathode. When the electron transport zone is provided by one layer, this layer is referred to as the electron transporting layer. In a phosphorescent organic EL device, a blocking layer, the electron mobility of which is not necessarily high, may be provided between the emitting layer and the electron transporting layer as in the exemplary arrangement (e) in order to prevent diffusion of an excited energy generated in the emitting layer, so that the organic layer adjacent to the emitting layer is not always the electron transporting layer.

FIG. 1 schematically shows an exemplary arrangement of an organic EL device according to an exemplary embodiment of the invention.

An organic EL device 1 includes a light-transmissive substrate 2, an anode 3, a cathode 4 and an organic layer 10 interposed between the anode 3 and the cathode 4.

The organic layer 10 includes an emitting layer 5 containing a host material and a dopant material. The organic layer 10 further includes a hole transporting layer 6 interposed between the emitting layer 5 and the anode 3. The organic layer 10 still further includes an electron transporting layer 7 interposed between the emitting layer 5 and the cathode 4.

Emitting Layer

Host Material

As the host material for the organic EL device according to the exemplary embodiment of the invention, an anthracene derivative represented by the following formula (1) is usable.

(1)

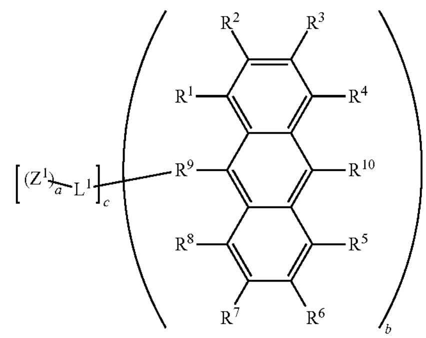

In the formula (1): a variable number c of $R^1$ to $R^{10}$ is a single bond through which $L^1$ is bonded; the rest of $R^1$ to $R^{10}$ at which $L^1$ is not bonded each represent any one of a hydrogen atom, a halogen atom, a hydroxyl group, a cyano group, a substituted or unsubstituted amino group, a substituted or unsubstituted alkyl group having 1 to 20 carbon atoms, a substituted or unsubstituted alkoxy group having 1 to 20 carbon atoms, a substituted or unsubstituted aryloxy group having 6 to 30 ring carbon atoms, a substituted or unsubstituted arylthio group having 6 to 30 ring carbon atoms, a substituted or unsubstituted aromatic hydrocarbon group having 6 to 30 ring carbon atoms and a substituted or unsubstituted heterocyclic group having 5 to 30 ring atoms; $L^1$ is a single bond or a linking group; the linking group is any one of an (a+1)-valent residue obtained by removing a variable number (a+1) of hydrogen atoms from a substituted or unsubstituted aromatic hydrocarbon group having 6 to 30 ring carbon atoms, an (a+1)-valent residue obtained by removing a variable number (a+1) of hydrogen atoms from a substituted or unsubstituted heterocyclic group having 5 to 30 ring atoms, and an (a+1)-valent residue obtained by removing a variable number (a+1) of hydrogen atoms from a group formed by bonding two to four of substituted or unsubstituted aromatic hydrocarbon groups having 6 to 30 ring carbon atoms and substituted or unsubstituted heterocyclic groups having 5 to 30 ring atoms; a, b and c each represent an integer of 1 to 4; and $Z^1$ is represented by the following formula (2).

(2)

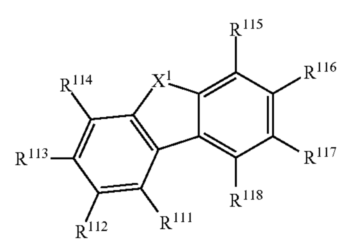

In the above formula: $X^1$ is an oxygen atom or a sulfur atom; $R^{111}$ to $R^{118}$ are each the same as the rest of $R^1$ to $R^{10}$ at which $L^1$ is not bonded in the formula (1); and adjacent two substituents of at least one pair of $R^{111}$ and $R^{112}$, $R^{112}$ and $R^{113}$, $R^{113}$ and $R^{114}$, $R^{115}$ and $R^{116}$, $R^{116}$ and $R^{117}$, and $R^{117}$ and $R^{118}$ are mutually bonded to form a ring represented by the following formula (3) or (4).

(3)

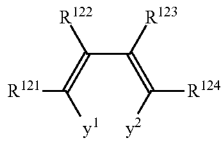

(4)

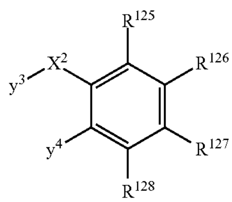

In the above formulae: $y^1$ and $y^2$ in the formula (3) represent positions where the pair selected from $R^{111}$ to $R^{118}$ in the formula (2) are bonded; $y^3$ and $y^4$ in the formula (4) represent positions where the pair selected from $R^{111}$ to $R^{118}$ in the formula (2) are bonded; $R^{121}$ to $R^{124}$ and $R^{125}$ to $R^{128}$ are each the same as the rest of $R^1$ to $R^{10}$ at which $L^1$ is not bonded in the formula (1); $X^2$ is an oxygen atom or a sulfur atom; and one of the rest of $R^{111}$ to $R^{118}$ not forming the ring in the formula (2) and $R^{121}$ to $R^{124}$ in the formula (3) or one of the rest of $R^{111}$ to $R^{118}$ not forming the ring in the formula (2) and $R^{125}$ to $R^{128}$ in the formula (4) is a single bond through which $L^1$ is bonded in the formula (1).

In the formula (1), $Z^1$ is preferably represented by one of the following formulae (5) to (7). In the formula (5), for instance, $y^3$ in the formula (4) positionally corresponds to a carbon atom to which $R^{114}$ in the formula (2) is bonded, while $y^4$ positionally corresponds to a carbon atom to which $R^{113}$ in the formula (2) is bonded.

(5)

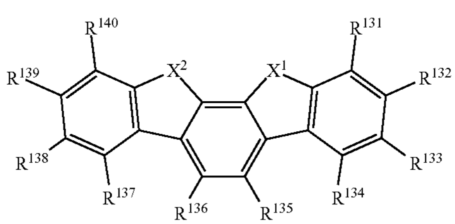

(6)

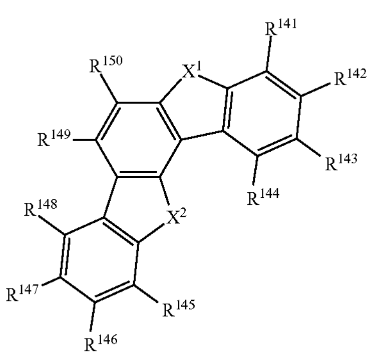

-continued (7)

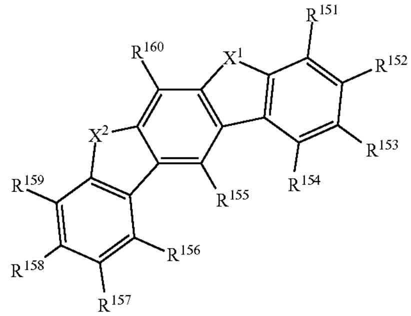

In the formulae (5) to (7): $R^{131}$ to $R^{140}$, $R^{141}$ to $R^{150}$ and $R^{151}$ to $R^{160}$ are each the same as the rest of $R^1$ to $R^{10}$ at which $L^1$ is not bonded in the formula (1); $L^1$ is bonded to $Z^1$ at one selected from among $R^{131}$ to $R^{140}$, one selected from among $R^{141}$ to $R^{150}$ or one selected from among $R^{151}$~$R^{160}$ through a single bond; and $X^1$ and $X^2$ are the same as $X^1$ in the formula (2) and $X^2$ in the formula (4), respectively, and are mutually the same or different.

In the formula (1), $Z^1$ is preferably represented by one of the following formulae (8) to (10).

(8)

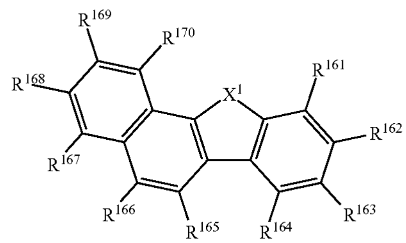

(9)

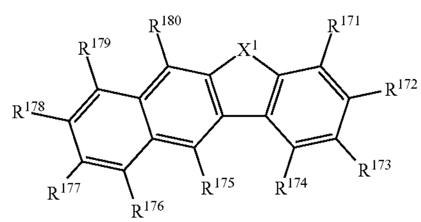

(10)

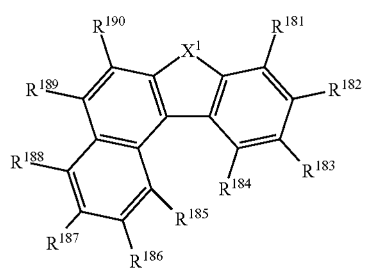

In the formulae (8) to (10): $R^{161}$ to $R^{170}$, $R^{171}$ to $R^{180}$ and $R^{181}$ to $R^{190}$ are each the same as the rest of $R^1$ to $R^{10}$ at which $L^1$ is not bonded in the formula (1); $L^1$ is bonded to $Z^1$ at one selected from among $R^{161}$ to $R^{170}$, one selected from among $R^{171}$ to $R^{180}$ or one selected from among $R^{181}$~$R^{190}$ through a single bond; and $X^1$ is the same as $X^1$ in the formula (2).

In the formula (1), $Z^1$ is particularly preferably represented by one of the formulae (8) to (10).

In the formula (1), it is preferable that b is 1 and a is 1 or 2. More preferably, a is 1.

It is preferable that at least one of $R^9$ and $R^{10}$ in the formula (1) is a single bond through which $L^1$ is bonded.

$R^9$ in the formula (1) is preferably a substituted or unsubstituted aromatic hydrocarbon group having 6 to 30 ring carbon atoms or a substituted or unsubstituted heterocyclic group having 5 to 30 ring atoms, and more preferably represented by the following formula (11).

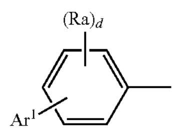

(11)

In the formula (11): $Ar^1$ represents a substituted or unsubstituted aromatic hydrocarbon group having 6 to 30 ring carbon atoms or a substituted or unsubstituted heterocyclic group having 5 to 30 ring atoms; Ra are each the same as the rest of $R^1$ to $R^{10}$ at which $L^1$ is not bonded in the formula (1); d represents an integer 1 to 4; and when d is 2 to 4, plural Ra are mutually the same or different.

When $R^9$ in the formula (1) is any one of the groups listed above, it is more preferable that $R^{10}$ in the formula (1) is a single bond through which $L^1$ is bonded.

In addition, $R^9$ in the formula (1) is preferably a substituted or unsubstituted fused aromatic hydrocarbon group having 10 to 30 ring carbon atoms.

In addition, in the formula (1), each of $X^1$ and $X^2$ is preferably an oxygen atom.

Next, description will be made on substituents in the formulae (1) to (11).

Specific examples of the substituents in the formulae (1) to (11) are a halogen atom, a hydroxyl group, a cyano group, a substituted or unsubstituted amino group, a substituted or unsubstituted and linear, branched or cyclic alkyl group having 1 to 20 carbon atoms, a substituted or unsubstituted and linear, branched or cyclic haloalkyl group having 1 to 20 carbon atoms, a substituted or unsubstituted and linear, branched or cyclic alkoxy group having 1 to 20 carbon atoms, a substituted or unsubstituted and linear, branched or cyclic haloalkoxy group having 1 to 20 carbon atoms, a substituted or unsubstituted aryloxy group having 6 to 30 ring carbon atoms, a substituted or unsubstituted arylthio group having 6 to 30 ring carbon atoms, a substituted or unsubstituted aromatic hydrocarbon group having 6 to 30 ring carbon atoms, and a substituted or unsubstituted heterocyclic group having 5 to 30 ring atoms.

Examples of the halogen atom in the formulae (1) to (11) are fluorine, chlorine, bromine and iodine, among which fluorine is preferable.

The substituted or unsubstituted amino group in the formulae (1) to (11) may be an amino group substituted with an aromatic hydrocarbon group, a preferable example of which is a phenylamino group. The aromatic hydrocarbon group with which the amino group is substituted may be an aromatic hydrocarbon group having 6 to 30 ring carbon atoms described below.

The alkyl group having 1 to 20 carbon atoms in the formulae (1) to (11) may be linear, branched or cyclic and examples of the linear or branched alkyl group are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 2-methylpentyl group, 1-pentylhexyl group, 1-butylpentyl group, 1-heptyloctyl group, 3-methylpentyl group, hydroxymethyl group, 1-hydroxyethyl group, 2-hydroxyethyl group, 2-hydroxyisobutyl group, 1,2-dihydroroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 1,2-dinitroethyl group, 2,3-dinitro-t-butyl group, 1,2,3-trinitropropyl group, trifluoromethyl group, 2,2,2-trifluoroethyl and 1,1,1,3,3,3-hexafluoro-2-propyl group.

Examples of the cyclic alkyl group (cycloalkyl group) are a cyclopropyl group, cyclobutyl group, cyclopentyl group, cyclohexyl group, cyclopentyl group, cyclohexyl group, cyclooctyl group, 4-methylcyclohexyl group, 3,5-tetramethylcyclohexyl group, 1-adamantyl group, 2-adamantyl group, 1-norbornyl group and 2-norbornyl group.

Among the above examples of the alkyl group, an alkyl group having 1 to 10 carbon atoms is preferable, an alkyl group having 1 to 8 carbon atoms is more preferable and an alkyl group having 1 to 4 carbon atoms is particularly preferable. Specifically, a methyl group, isopropyl group, t-butyl group and cyclohexyl group are preferable.

An example of the linear, branched or cyclic haloalkyl group having 1 to 20 carbon atoms is a haloalkyl group provided by substituting the alkyl group having 1 to 20 carbon atoms with one or more halogen atom(s). Specific examples of the haloalkyl group are a fluoromethyl group, difluoromethyl group, trifluoromethyl group, fluoroethyl group and trifluoromethylmethyl group.

The linear, branched or cyclic alkoxy group having 1 to 20 carbon atoms in the formulae (1) to (11) is represented by $—OY^1$. An example of $Y^1$ is the above alkyl group having 1 to 20 carbon atoms. Examples of the alkoxy group are a methoxy group, ethoxy group, propoxy group, butoxy group, pentyloxy group and hexyloxy group. Among the above examples of the alkoxy group, an alkoxy group having 1 to 10 carbon atoms is preferable and an alkoxy group having 1 to 8 carbon atoms is more preferable. A particularly preferable example is an alkyl group having 1 to 4 carbon atoms.

An example of the linear, branched or cyclic haloalkoxy group having 1 to 20 carbon atoms in the formulae (1) to (11) is a haloalkoxy group provided by substituting the alkoxy group having 1 to 20 carbon atoms with one or more halogen atom(s).

The aryloxy group having 6 to 30 ring carbon atoms in the formulae (1) to (11) is represented by $—OZ^2$. An example of $Z^2$ is an aromatic hydrocarbon group having 6 to 30 ring carbon atoms described below. An example of the aryloxy group is a phenoxy group.

The arylthio group having 6 to 30 ring carbon atoms in the formulae (1) to (11) is represented by —$SZ^3$. An example of $Z^3$ is an aromatic hydrocarbon group having 6 to 30 ring carbon atoms described below.

The aromatic hydrocarbon group having 6 to 30 ring carbon atoms in the formulae (1) to (11) is exemplified by a non-fused aromatic hydrocarbon group or fused aromatic hydrocarbon group and more specific examples thereof are a phenyl group, naphthyl group, anthryl group, phenanthryl group, biphenyl group, terphenyl group, quarterphenyl group, fluoranthenyl group, pyrenyl group, triphenylenyl group, phenanthrenyl group, fluorenyl group, 9,9-dimethylfluorenyl group, benzo[c]phenanthrenyl group, benzo[a]triphenylenyl group, naphtho[1,2-c]phenanthrenyl group, naphtho[1,2-a]triphenylenyl group, dizenzo[a,c]triphenylenyl group and benzo[b]fluoranthenyl group. Among the above examples of the aromatic hydrocarbon group, an aromatic hydrocarbon group having 6 to 20 ring carbon atoms is more preferable and an aromatic hydrocarbon group having 6 to 12 ring carbon atoms is particularly preferable.

The aromatic heterocyclic group having 5 to 30 ring carbon atoms in the formulae (1) to (11) is exemplified by a non-fused aromatic heterocycle or fused aromatic heterocycle and more specific examples thereof are a pyroryl group, pyrazinyl group, pyridinyl group, indolyl group, isoindolyl group, furyl group, benzofuranyl group, isobenzofuranyl group, dibenzofuranyl group, dibenzothiophenyl group, quinolyl group, isoquinolyl group, quinoxalinyl group, carbazolyl group, phenanthrydinyl group, acridinyl group, phenanthrolinyl group, thienyl group, and group formed based on a pyridine ring, pyrazine ring, pyrimidine ring, pyridazine ring, triazine ring, indole ring, quinoline ring, acridine ring, pyrrolidine ring, dioxane ring, piperidine ring, morpholine ring, piperazine ring, carbazole ring, furan ring, thiophene ring, oxazole ring, oxadiazole ring, benzoxazole ring, thiazole ring, thiadiazole ring, benzothiazole ring, triazole ring, imidazole ring, benzimidazole ring, pyrane ring, dibenzofuran ring and benzo[c]dibenzofuran ring. Among the above heterocyclic groups, a heterocyclic group having 5 to 20 ring atoms is more preferable and a heterocyclic group having 5 to 12 ring atoms is particularly preferable.

In the formula (1), each of the rest of $R^1$ to $R^{10}$ at which $L^1$ is not bonded is more preferably a hydrogen atom, an alkyl group or the like and particularly preferably a hydrogen atom.

When $R^9$ represents a fused aromatic hydrocarbon group having 10 to 30 ring carbon atoms, more preferable examples thereof are a 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 3-methyl-2-naphthyl group, 4-methyl-1-naphthyl group and 4-methyl-1-anthryl group.

In the formula (1), when $L^1$ represents a linking group, examples thereof are a substituted or unsubstituted (a+1)-valent aromatic hydrocarbon group having 6 to 30 ring carbon atoms, substituted or unsubstituted (a+1)-valent heterocyclic group having 5 to 10 ring atoms, and a divalent group formed by bonding two to four of such aromatic hydrocarbon groups and heterocyclic groups.

A specific example of the (a+1)-valent aromatic hydrocarbon group having 6 to 30 ring carbon atoms is an (a+1)-valent group derived from one of the examples of the above aromatic hydrocarbon group having 6 to 30 ring carbon atoms.

A specific example of the (a+11)-valent heterocyclic group having 5 to 30 ring atoms is an (a+11)-valent group derived from one of the examples of the above heterocyclic group having 5 to 30 ring atoms.

When $L^1$ represents the (a+1)-valent aromatic hydrocarbon group having 6 to 30 ring carbon atoms, more preferable examples of the aromatic hydrocarbon group are a phenyl group, biphenyl group, naphthyl group and 9,9-dimethylfluorenyl group.

When $L^1$ represents the (a+1)-valent heterocyclic group having 6 to 30 ring atoms, more preferable examples of the heterocyclic group are a pyridyl group, pyrimidyl group, dibenzofuranyl group and carbazolyl group.

Each of $R^{111}$ to $R^{114}$ in the formula (2) is more preferably a hydrogen atom or an alkyl group and particularly preferably a hydrogen atom.

Each of $R^{121}$ to $R^{124}$ and $R^{125}$ to $R^{128}$ in the formulae (3) and (4) is more preferably a hydrogen atom or an alkyl group and particularly preferably a hydrogen atom.

When the substituents of $R^{111}$ and $R^{112}$ in the formula (2) form a ring represented by the formula (4), $R^{117}$ and $R^{118}$ are preferably hydrogen atoms. When the substituents of $R^{117}$ and $R^{118}$ form a ring represented by the formula (4), $R^{111}$ and $R^{112}$ are preferably hydrogen atoms. When $R^{111}$ and $R^{112}$ or $R^{117}$ and $R^{118}$ in the formula (2) are not hydrogen atoms but have substituents, a distance to an adjacent molecule is increased in an amorphous thin film due to steric exclusion effect, which possibly results in an increase in the driving voltage. In view of the above, when the substituents of $R^{111}$ and $R^{112}$ in the formula (2) form a ring represented by the formula (4), $R^{117}$ and $R^{118}$ are preferably hydrogen atoms, and when the substituents of $R^{117}$ and $R^{118}$ form a ring represented by the formula (4), $R^{111}$ and $R^{112}$ are preferably hydrogen atoms.

In the formula (11), $Ar^1$ is particularly preferably a phenyl group, naphthyl group, phenanthryl group, 9,9-dimethylfluorenyl group or biphenyl group.

Ra is particularly preferably a hydrogen atom, aryl group or heterocyclic group.

The term "carbon atoms forming a ring (ring carbon atoms)" herein means carbon atoms forming a saturated ring, unsaturated ring or aromatic ring. The term "atoms forming a ring (ring atoms)" herein means carbon atoms and hetero atoms forming a hetero ring including a saturated ring, unsaturated ring or aromatic ring.

A hydrogen atom herein includes isotopes with various neutron numbers, i.e., protium, deuterium and tritium.

When the expression "substituted or unsubstituted . . . " is used herein, examples of the substituent are an aromatic hydrocarbon group, heterocyclic group, alkyl group (linear or branched alkyl group, cycloalkyl group or haloalkyl group), alkoxy group, aryloxy group, aralkyl group, haloalkoxy group, alkylsilyl group, dialkylarylsilyl group, alkyldiarylsilyl group, triarylsilyl group, halogen atom, cyano group, hydroxyl group, nitro group and carboxy group as described above. Additionally, an alkenyl group and alkynyl group are also usable.

Among the above examples of the substituent, an aromatic hydrocarbon group, heterocyclic group, alkyl group, halogen atom, alkylsilyl group, arylsilyl group and cyano group are preferable and the specific preferable examples of the substituents listed above are more preferable.

When the expression "substituted or unsubstituted . . . " is used herein, "unsubstituted" means that a group is not substituted but has a hydrogen atom bonded thereto.

When the expression "substituted or unsubstituted XX group having a to b carbon atoms" is used herein, "a to b carbon atoms" represents the number of the carbon atoms of the unsubstituted XX group, not including the number of the carbon atoms of the substituent in the substituted XX group.

The above explanation of the expression "substituted or unsubstituted." is likewise applicable to the following descriptions of compounds or partial structures thereof.
Specific examples of the anthracene derivative represented by the formula (1) are shown below, but the anthracene derivative is not limited thereto.
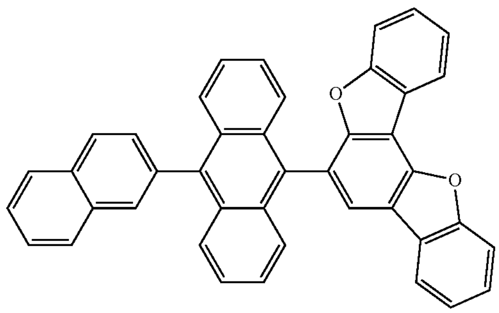
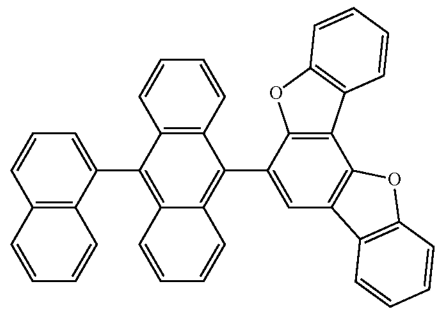
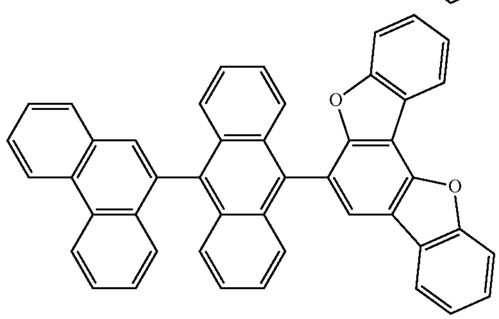
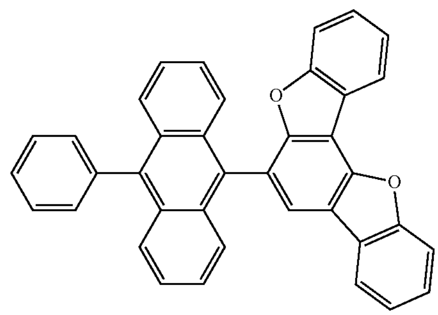
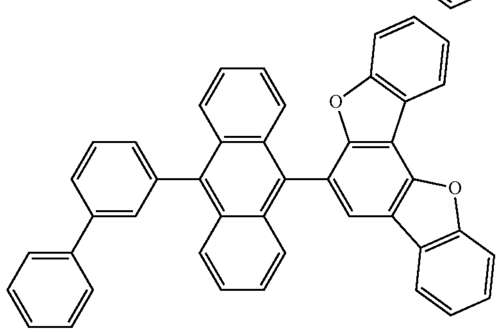
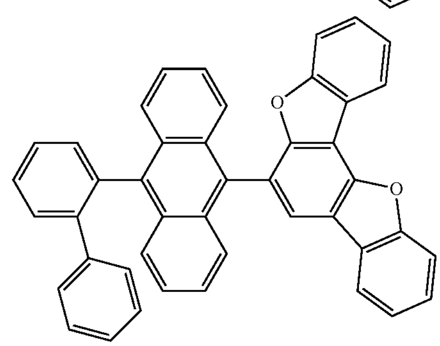
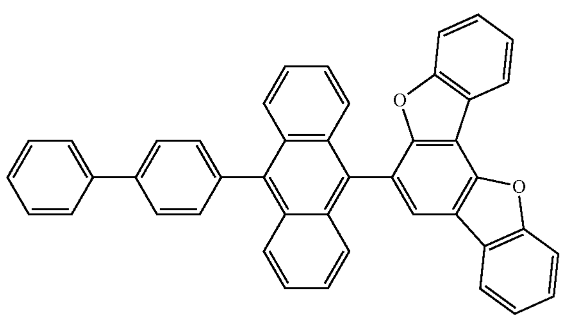
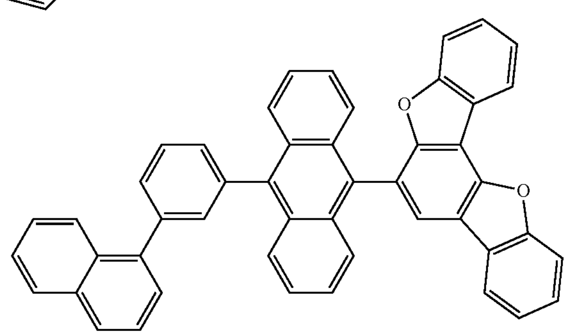
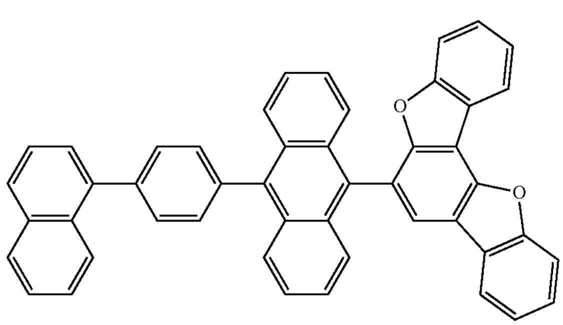
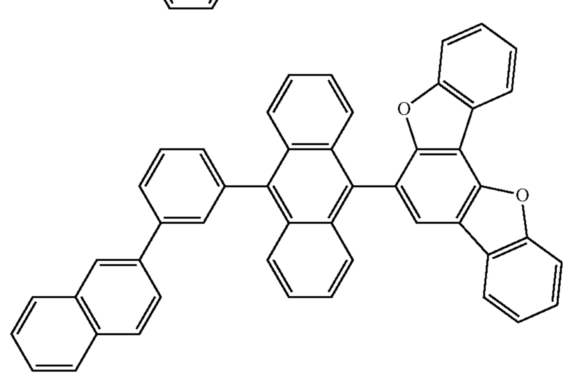

-continued
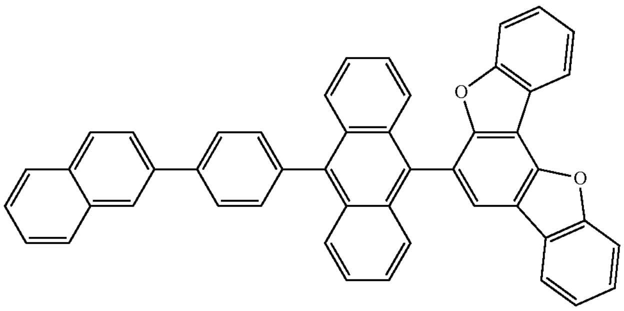
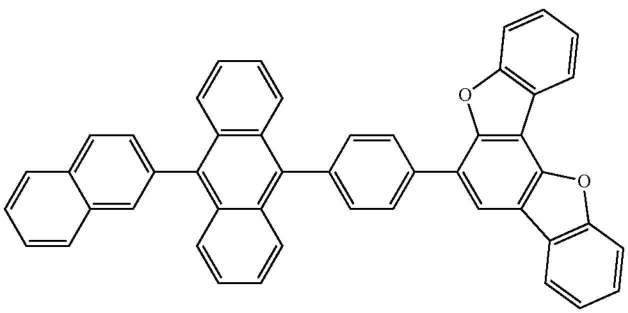
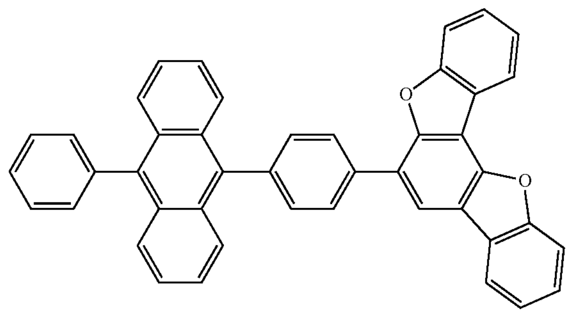
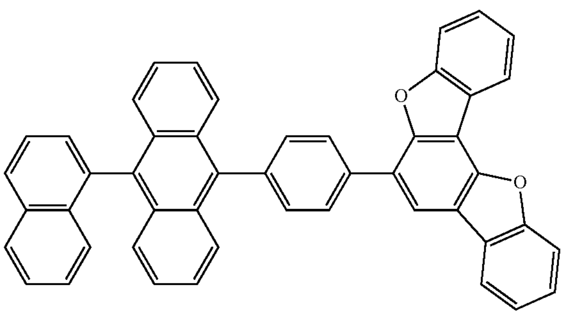
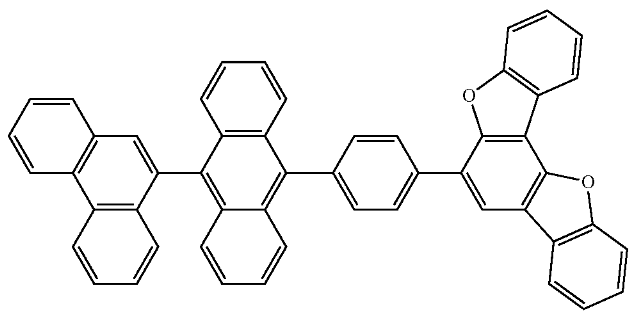
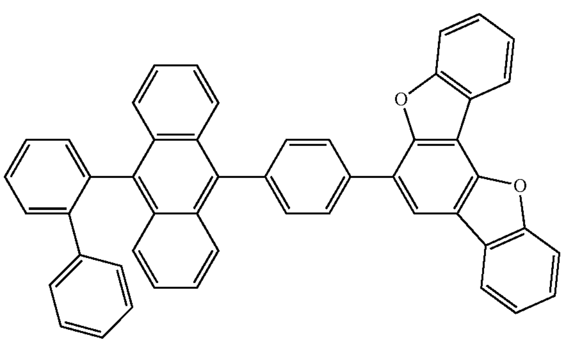
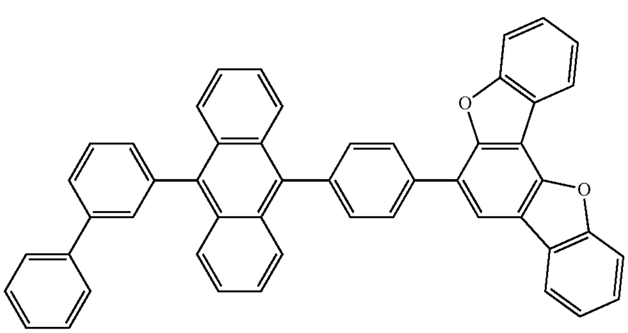

-continued
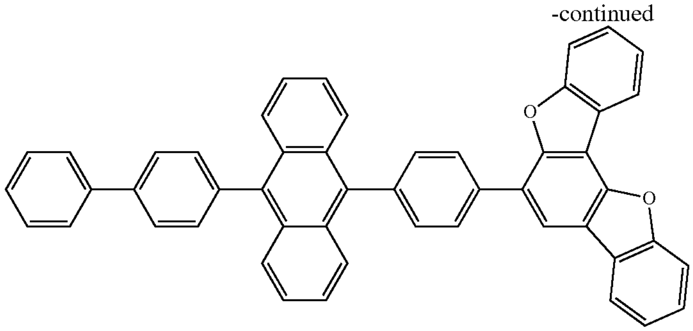
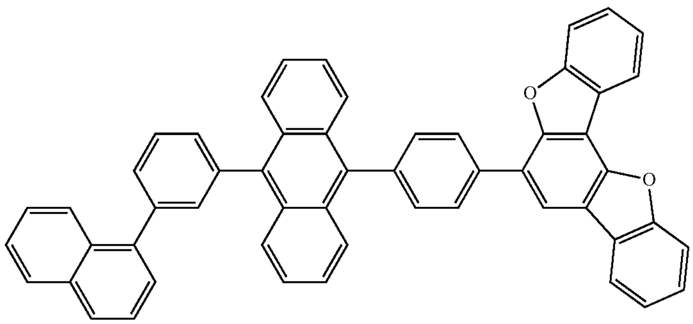
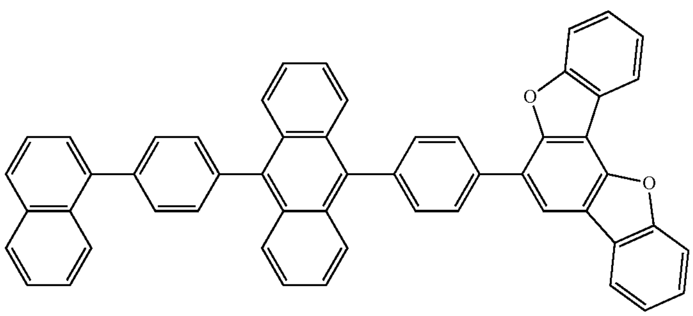
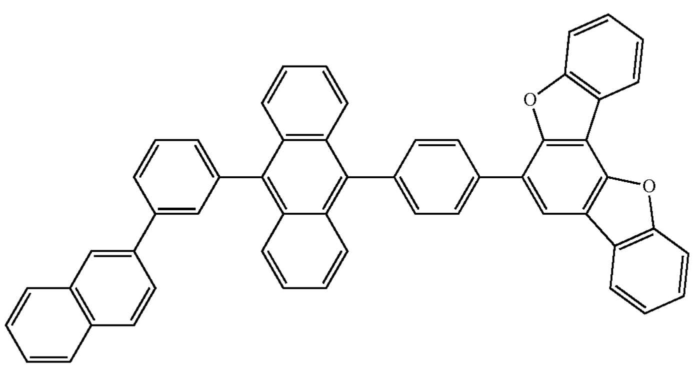
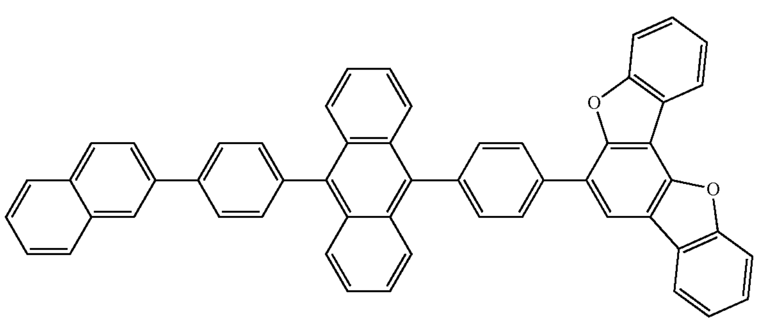

-continued
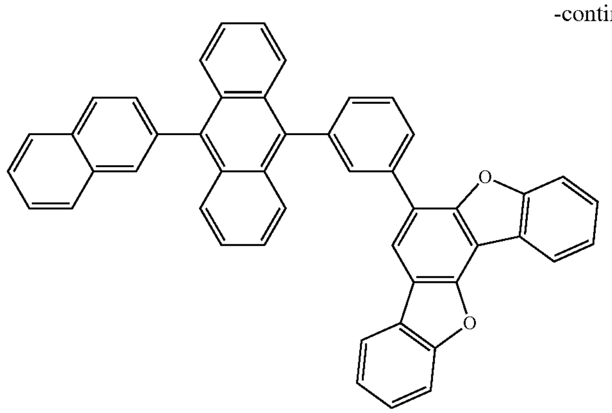
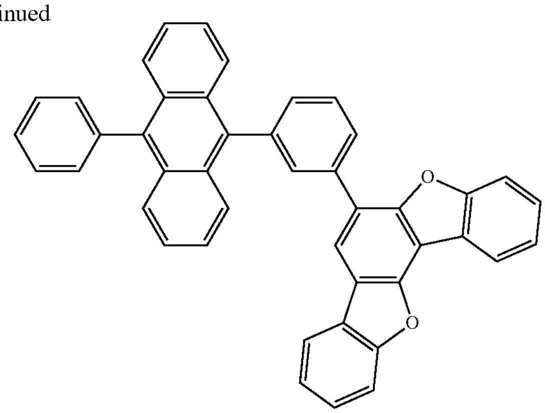
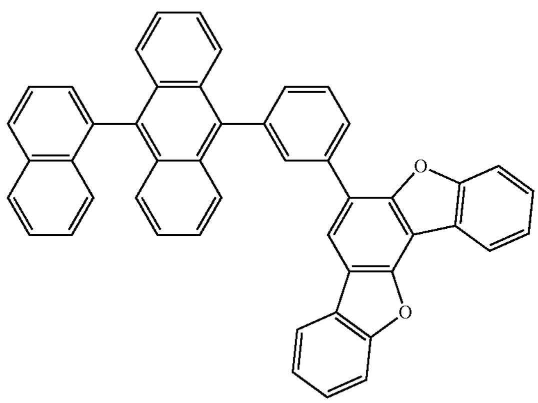
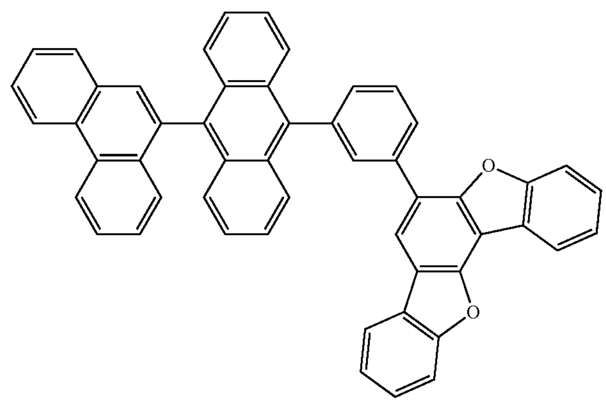
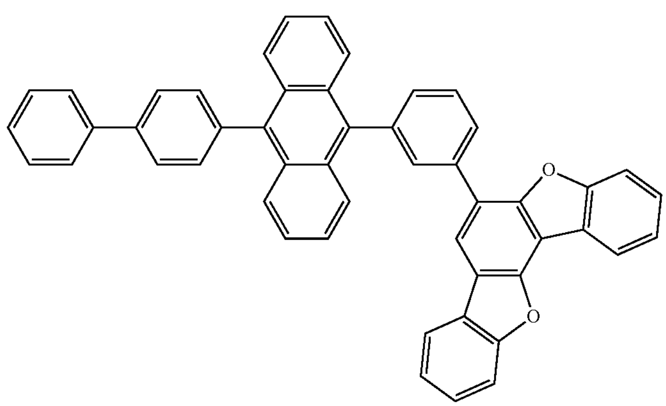
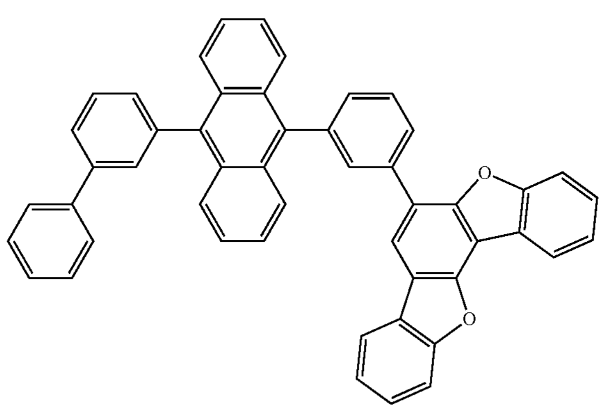
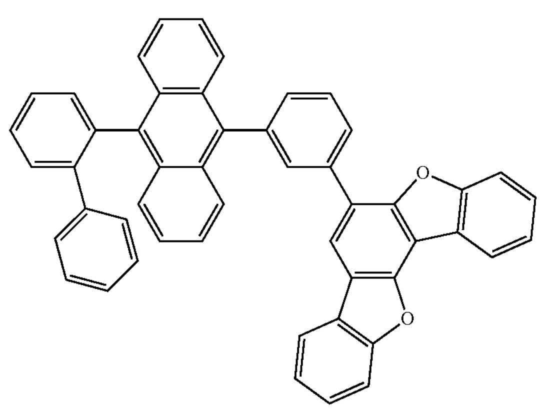

-continued
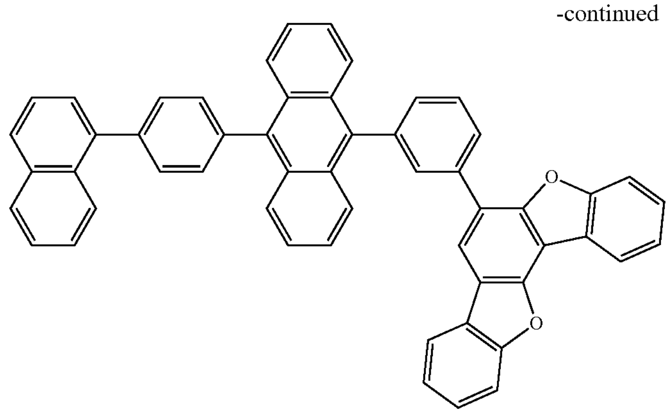
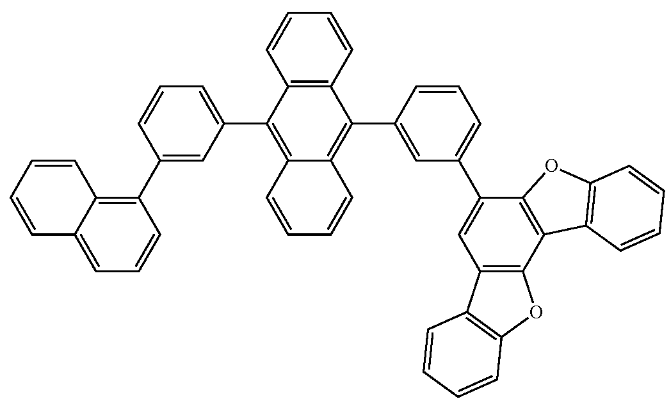
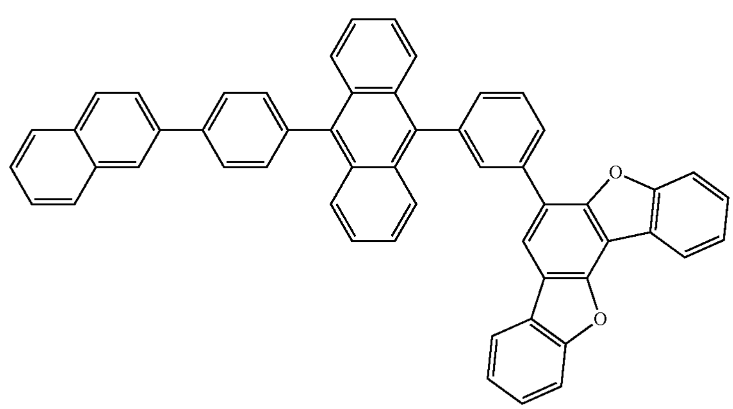
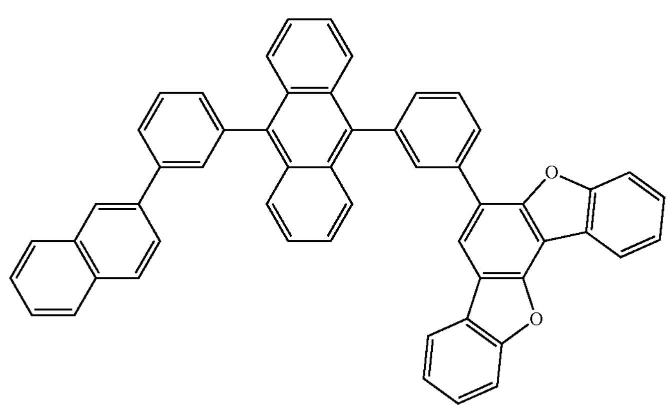

-continued
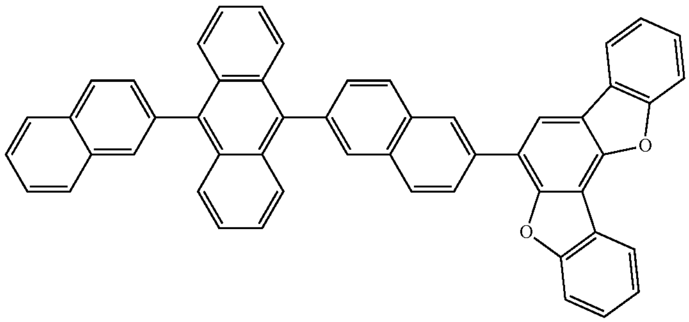
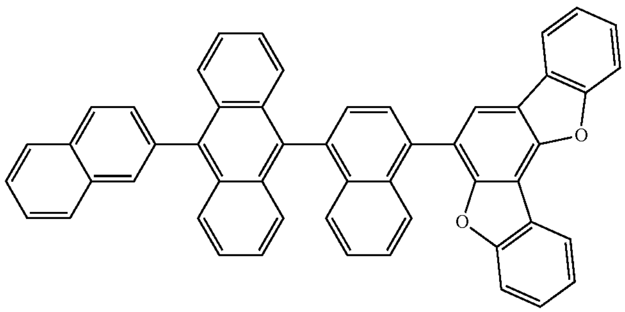
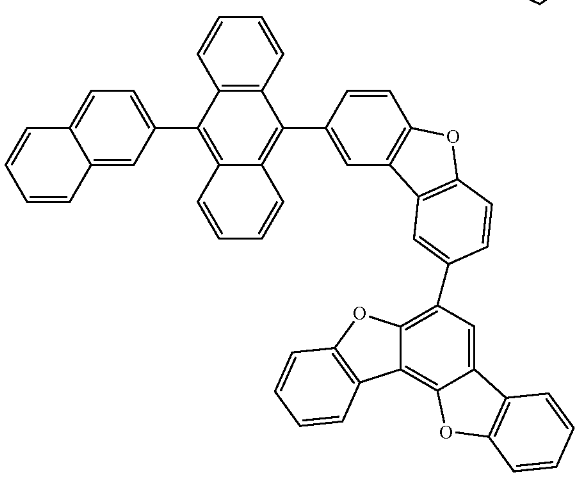
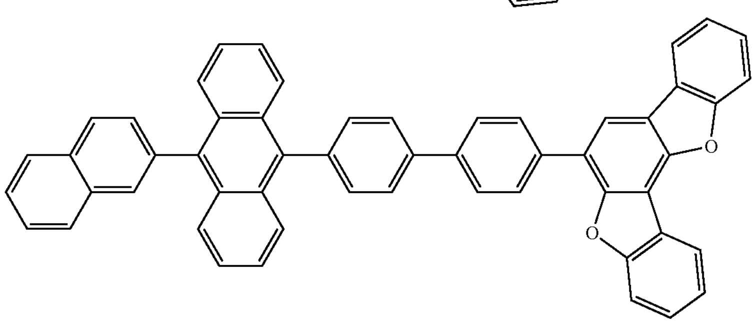
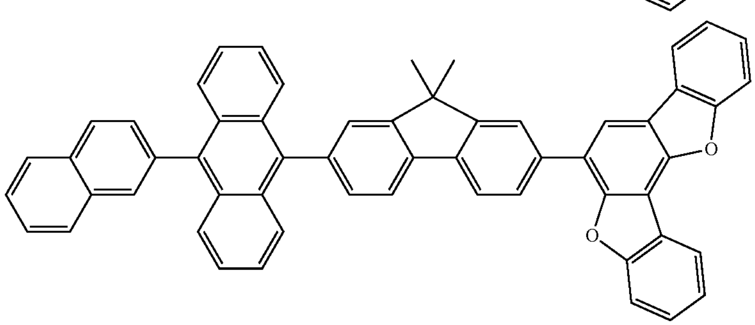

-continued
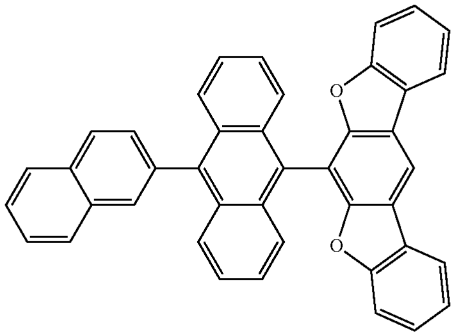
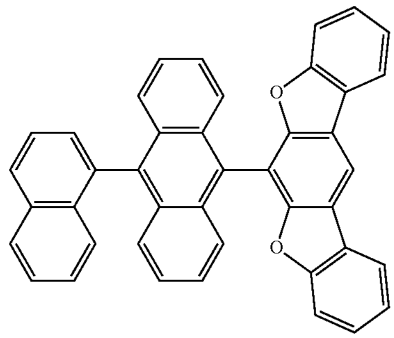
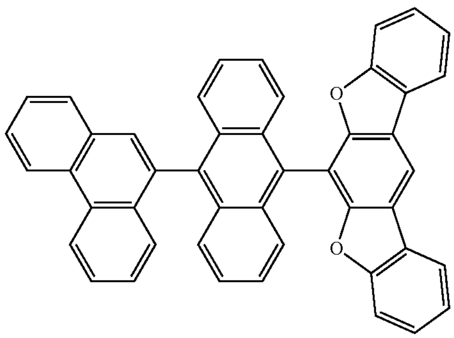
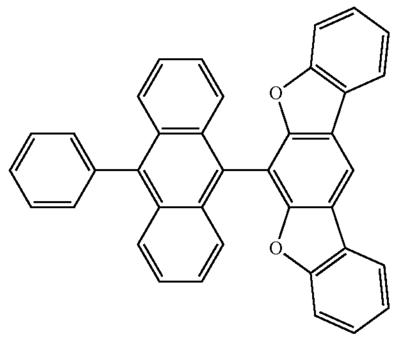
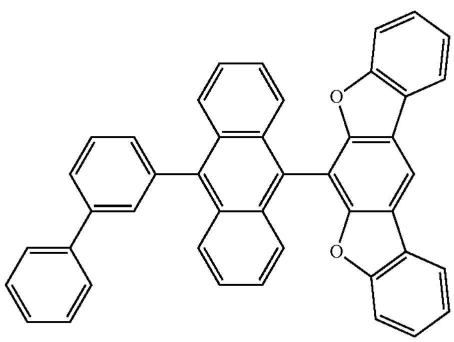
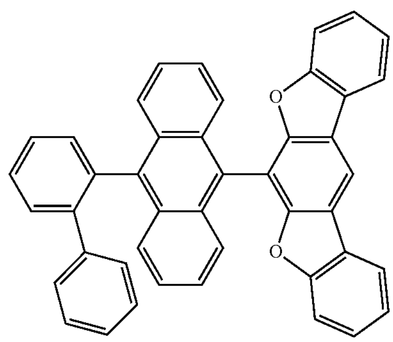
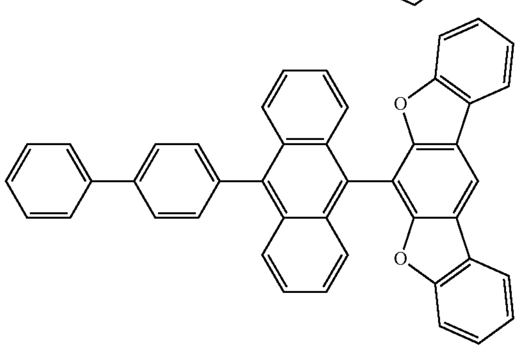
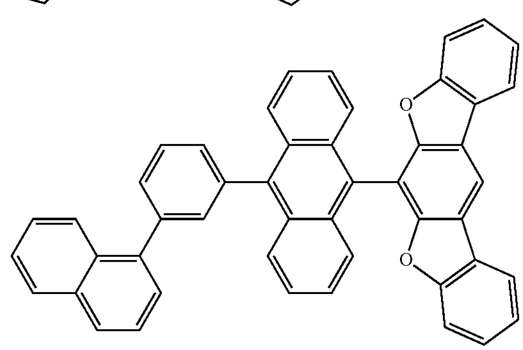
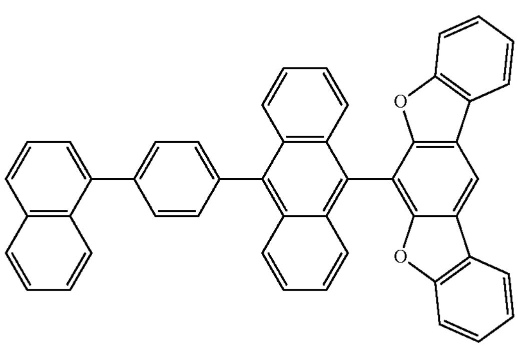
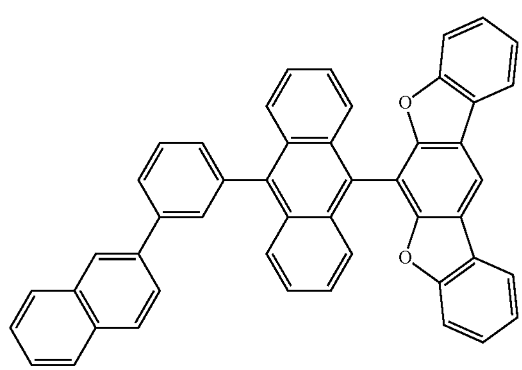

-continued
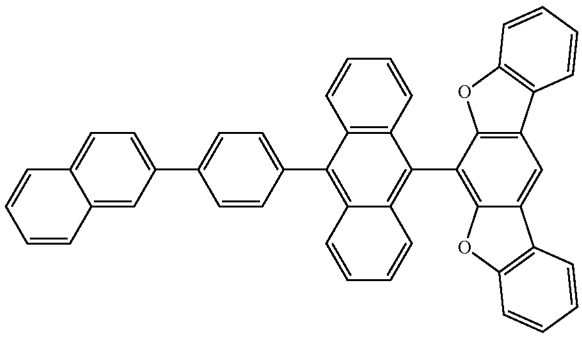
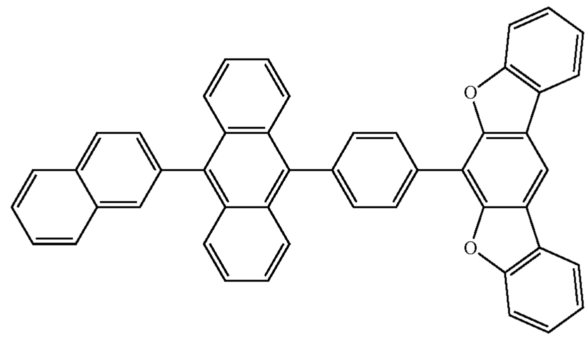
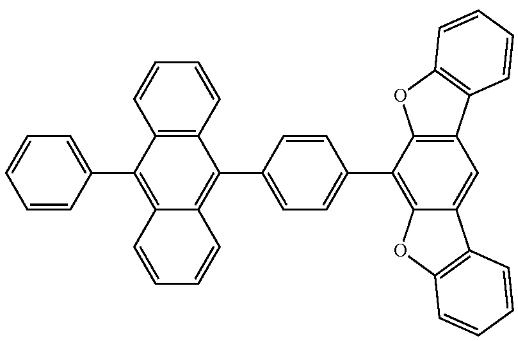
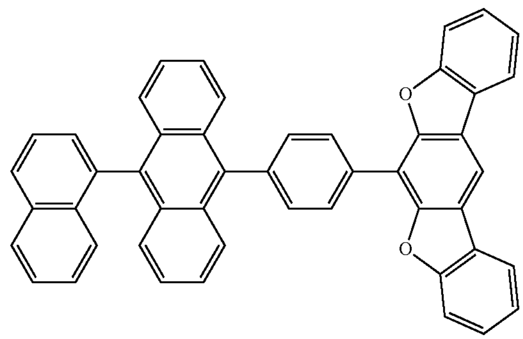
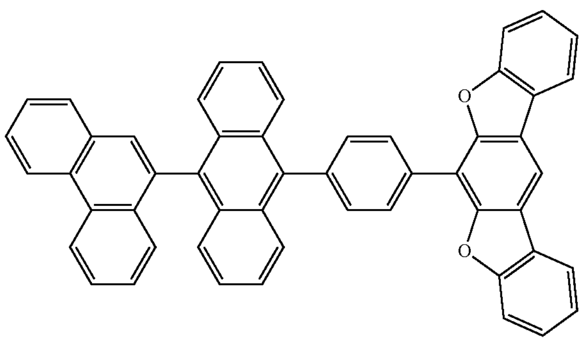
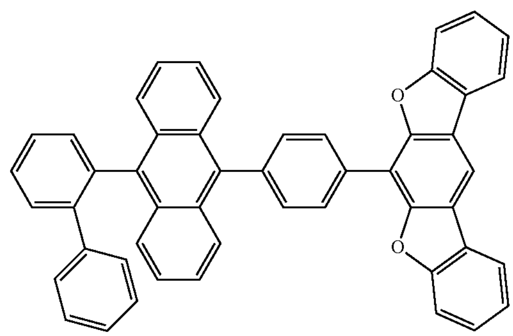
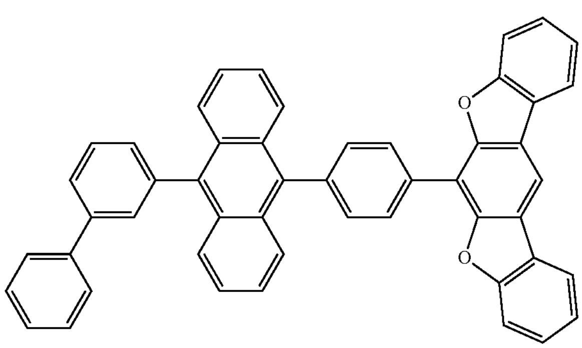
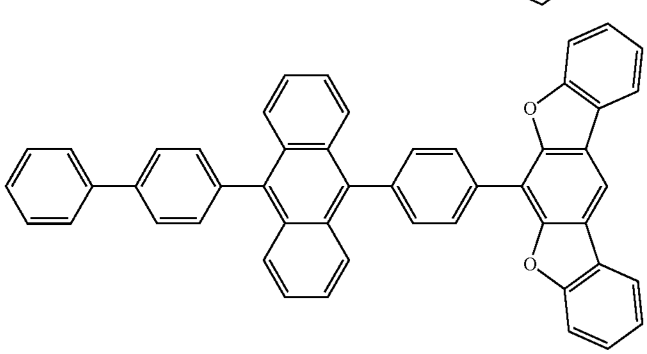

-continued
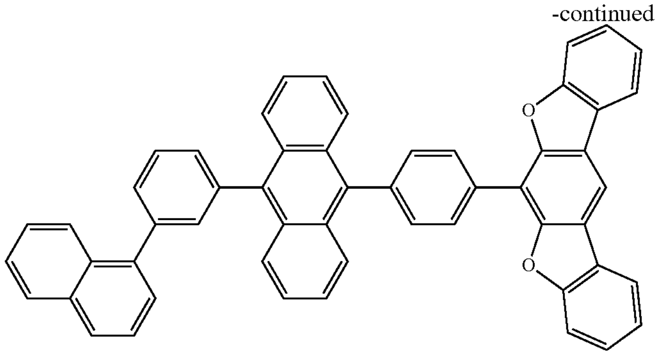
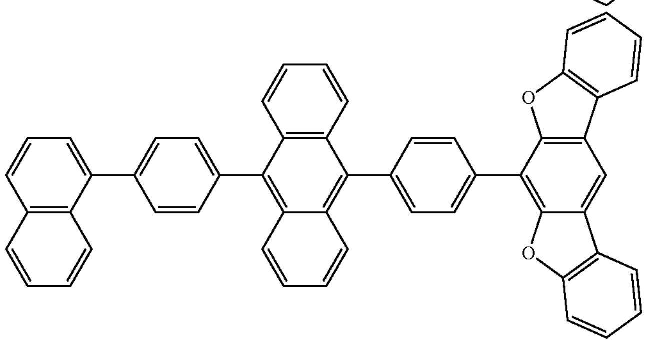
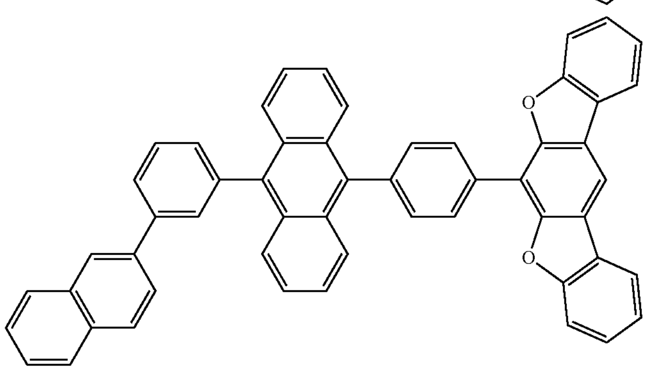
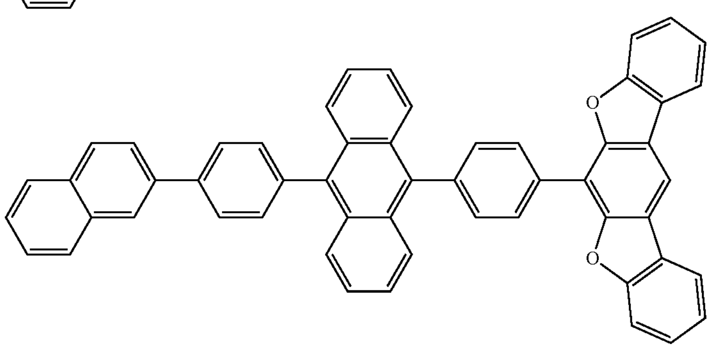
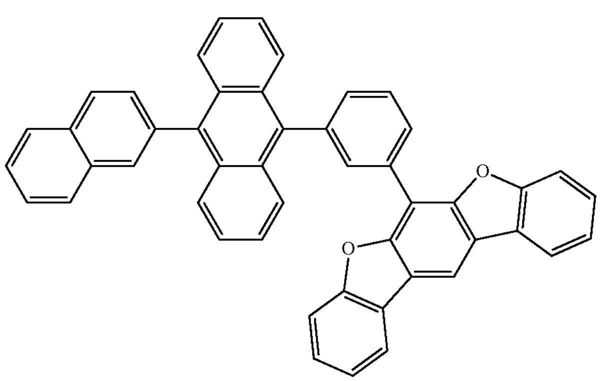
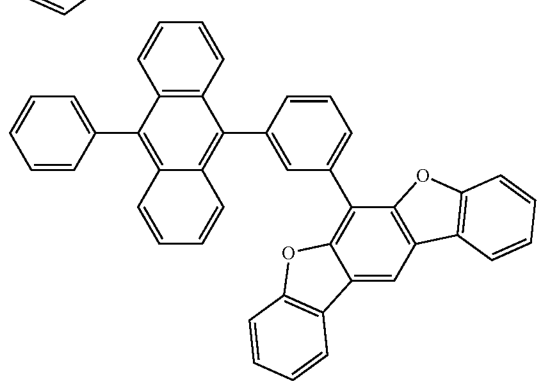

-continued
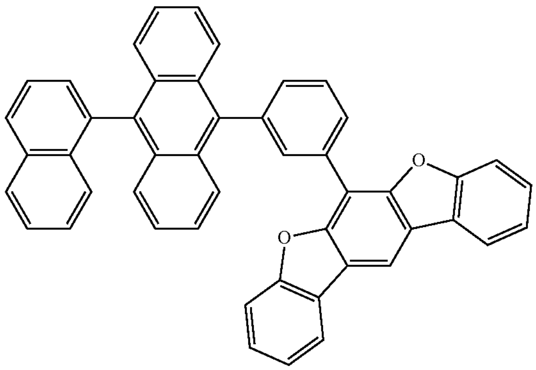
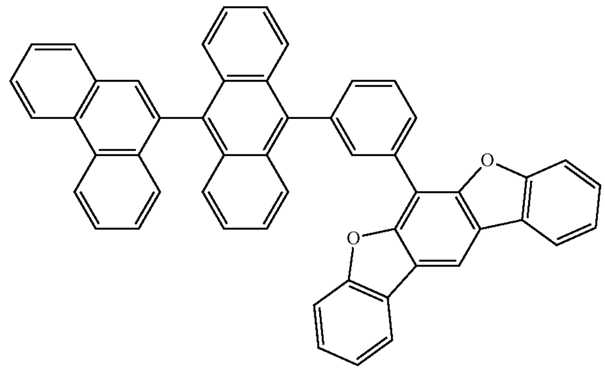
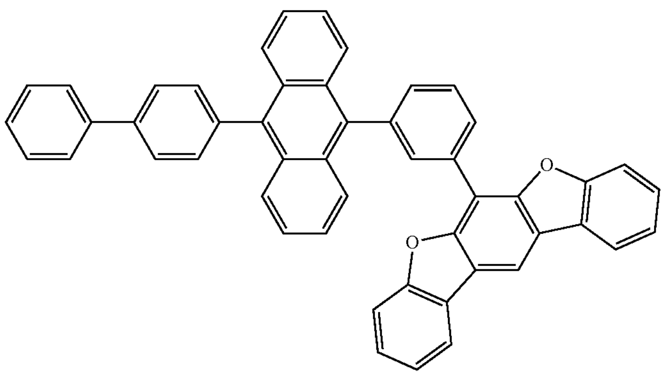
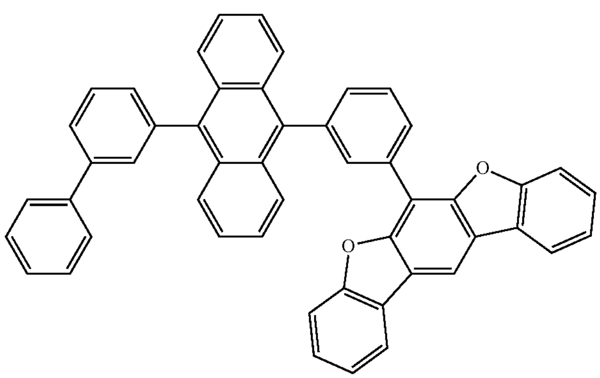
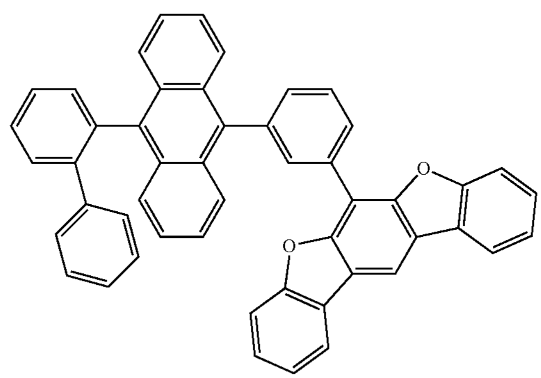
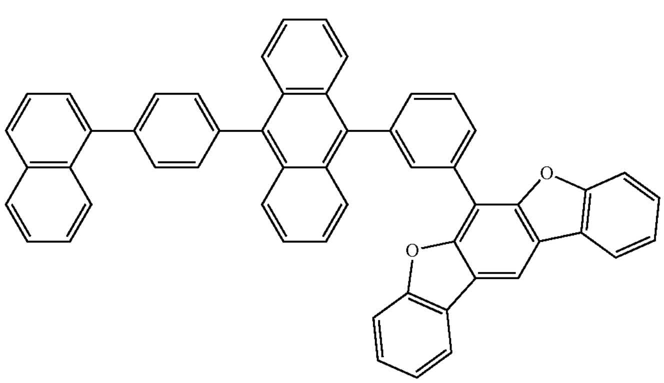

-continued
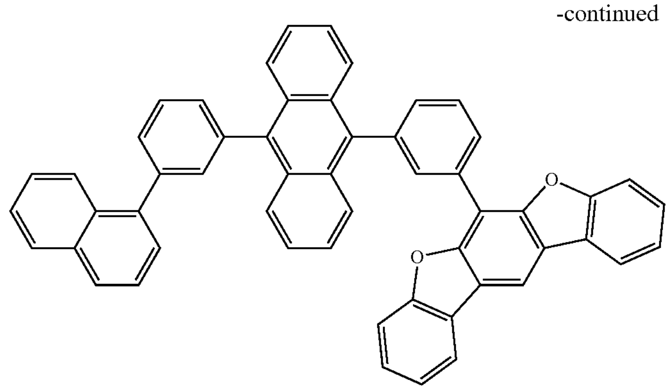
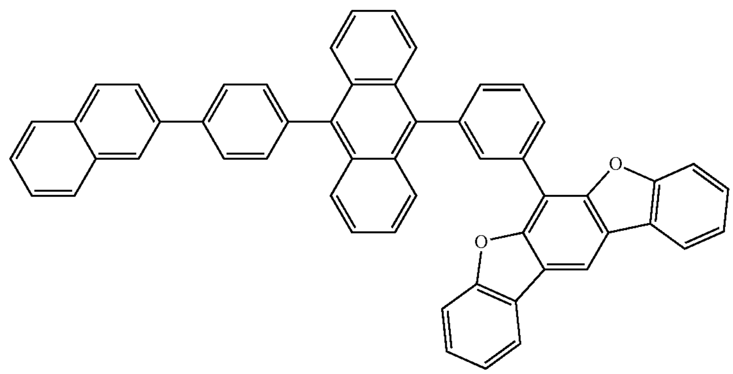
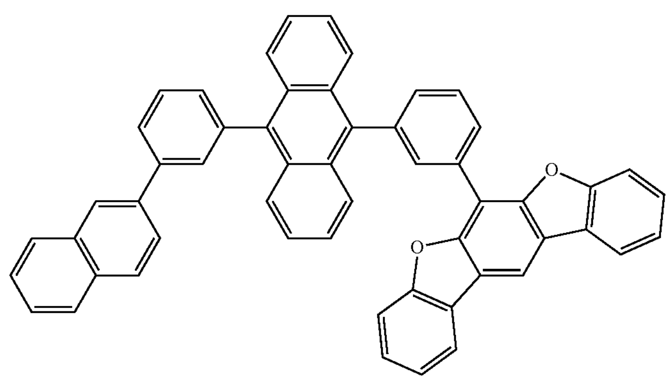
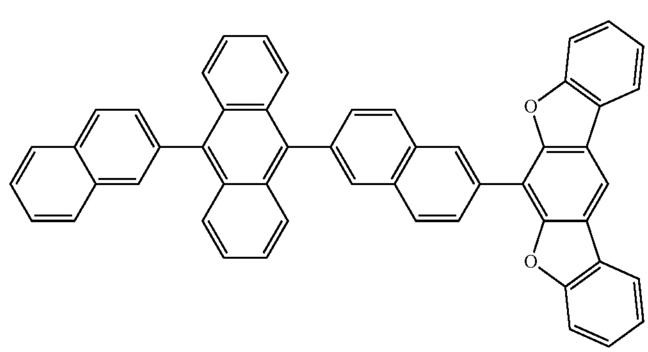

-continued
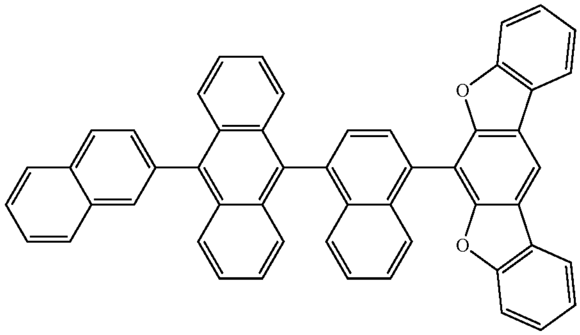
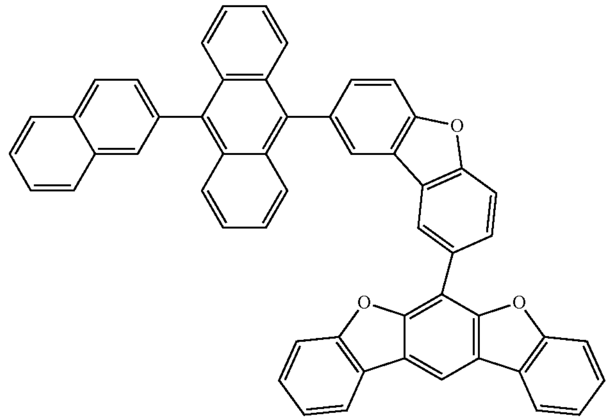
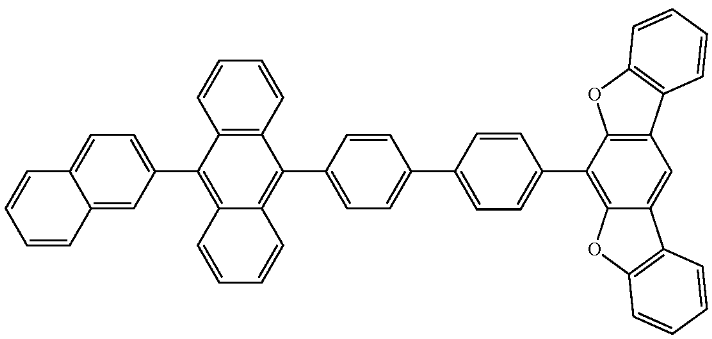
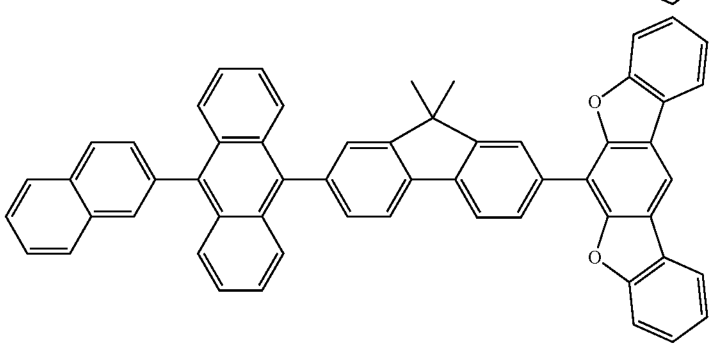
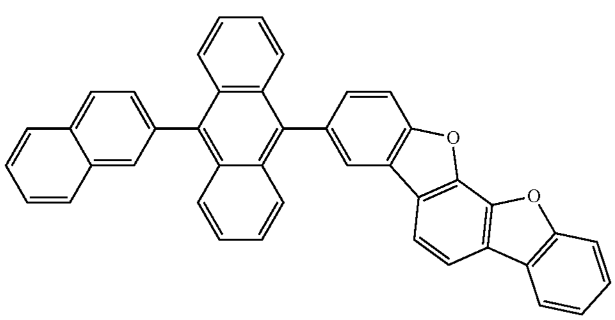
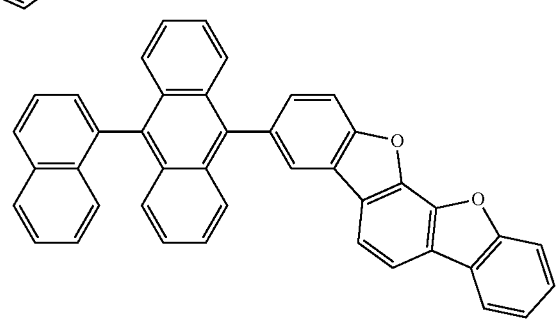
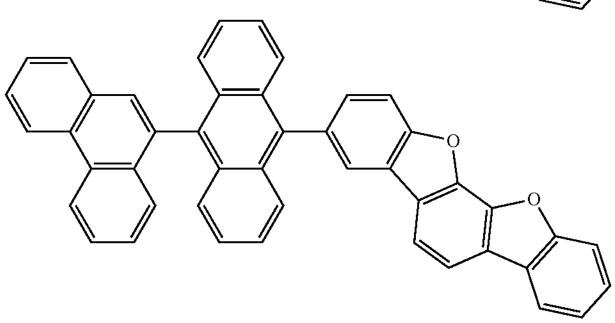
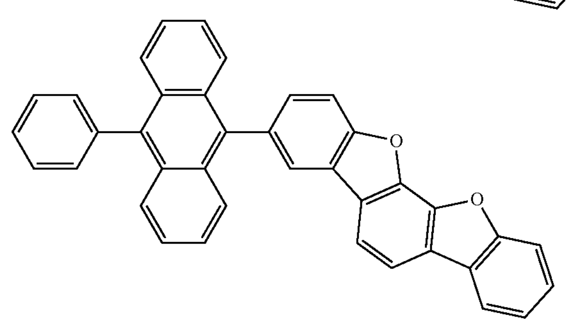

-continued
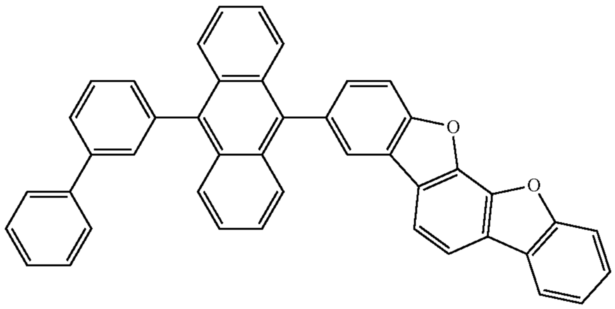
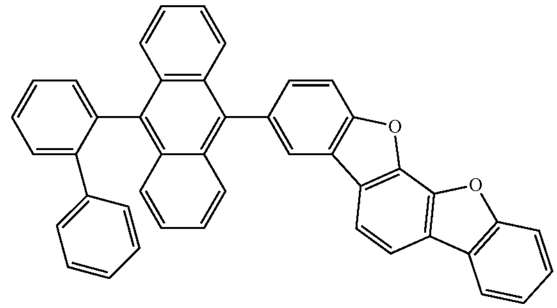
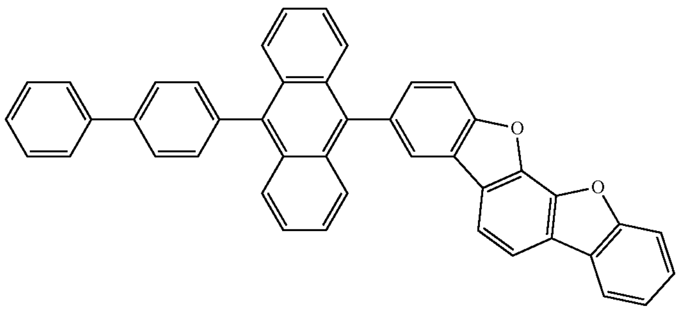
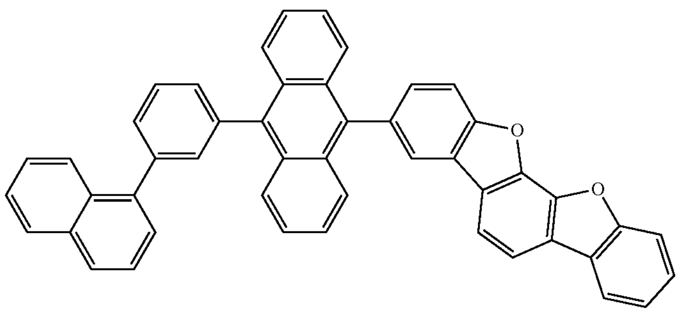
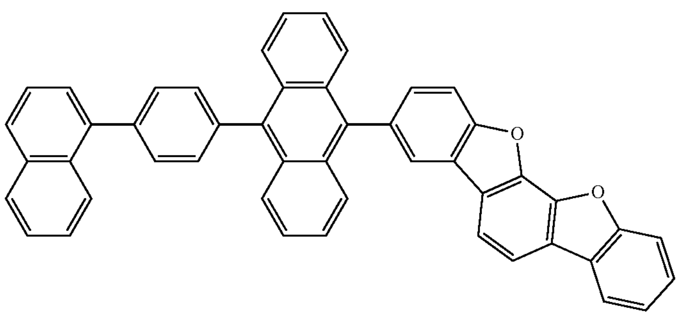
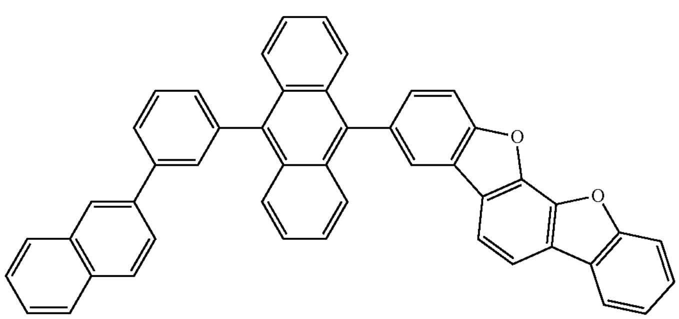

-continued
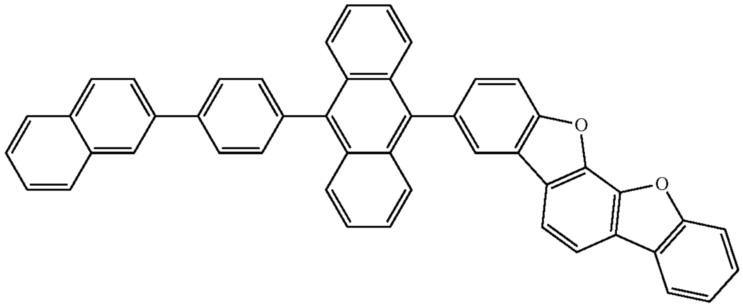
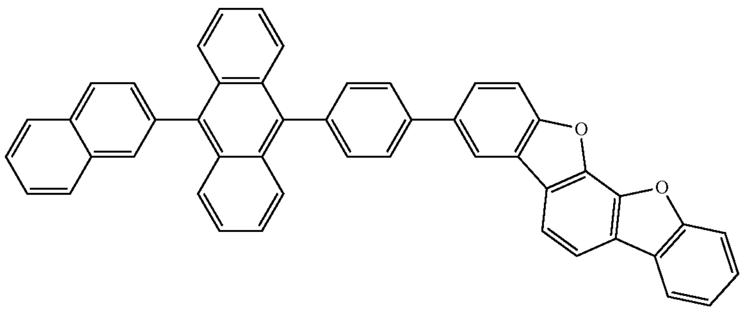
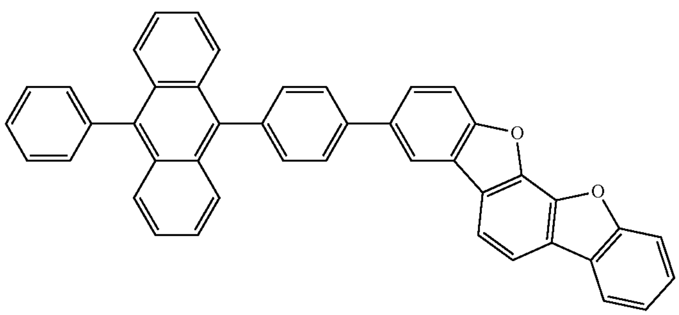
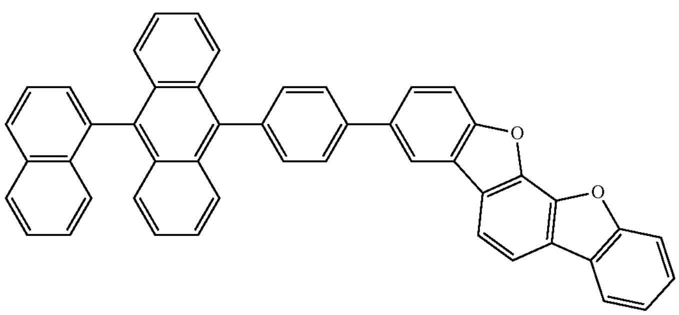
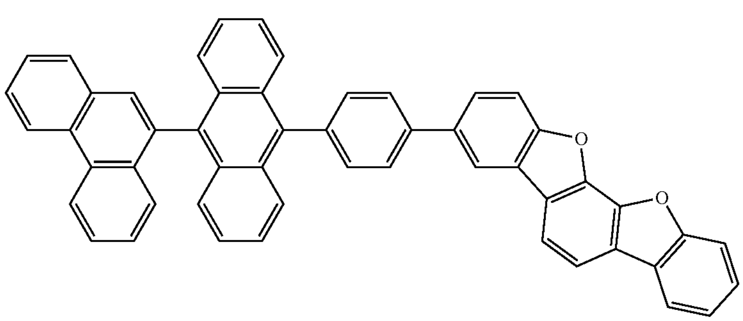

-continued
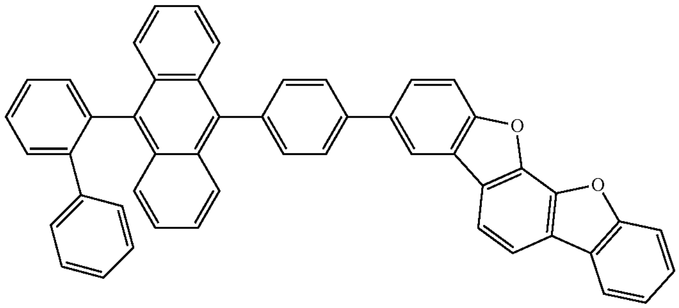
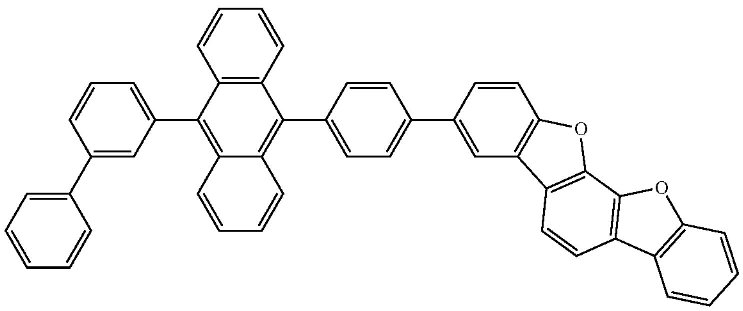
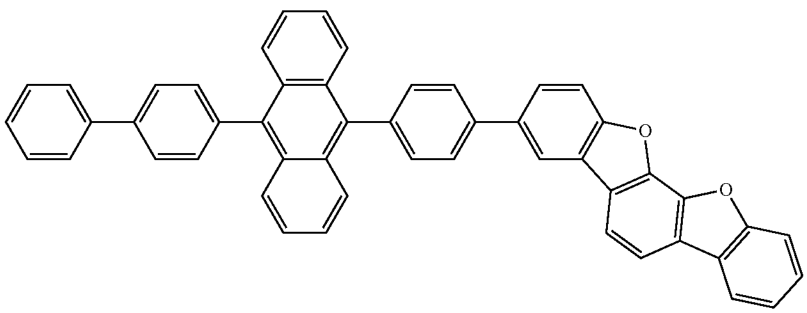
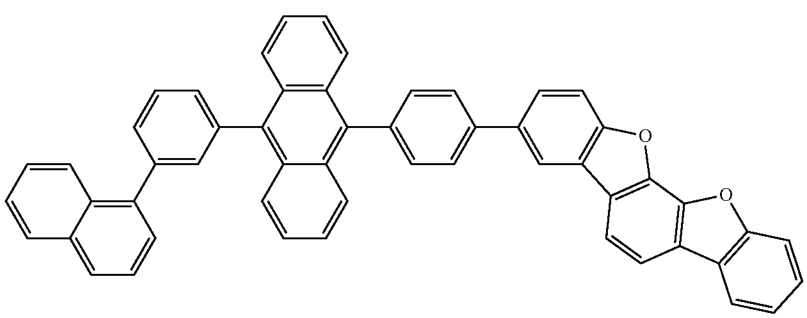
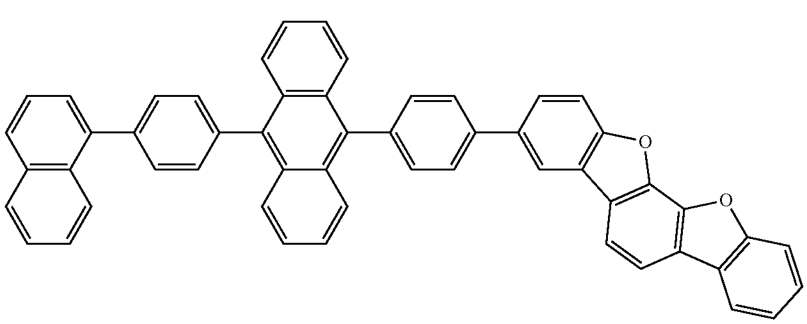

-continued
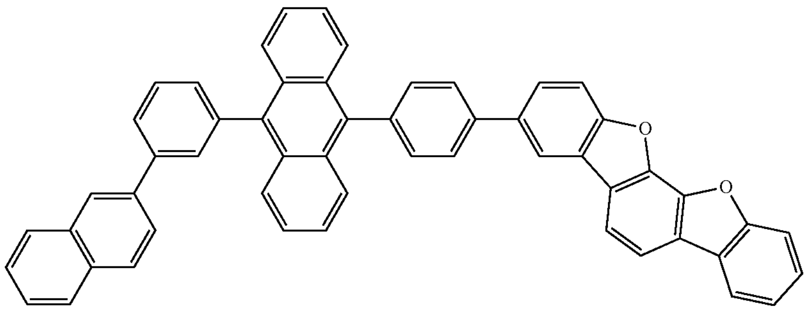
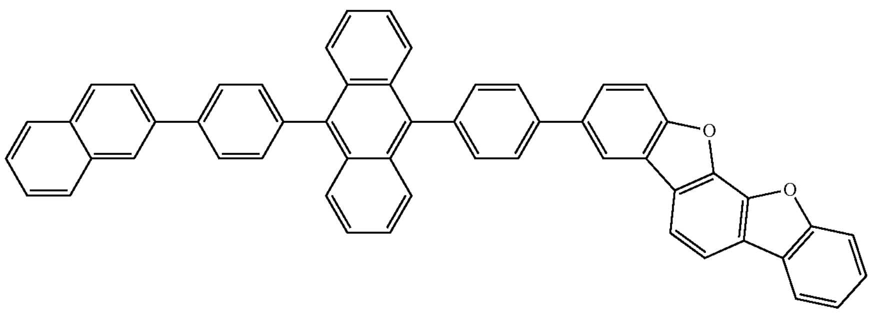
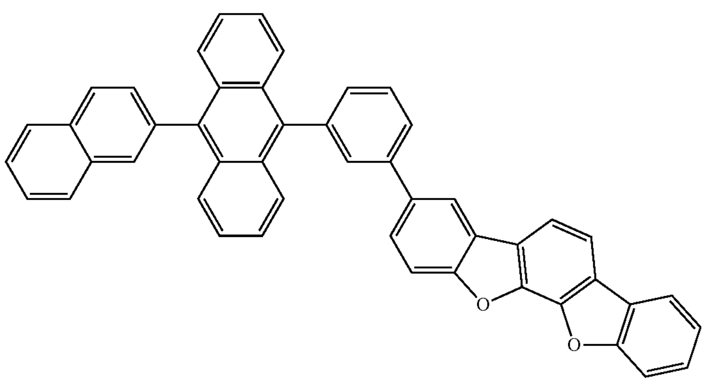
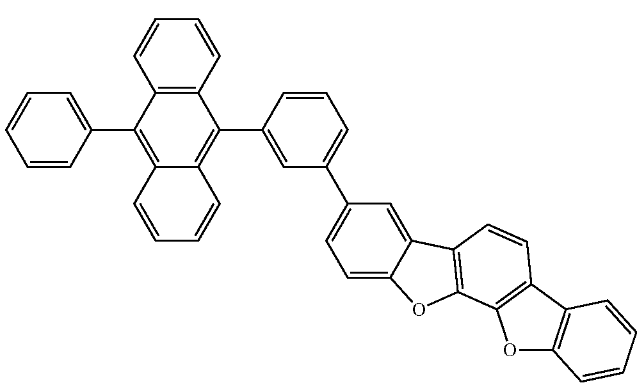

-continued
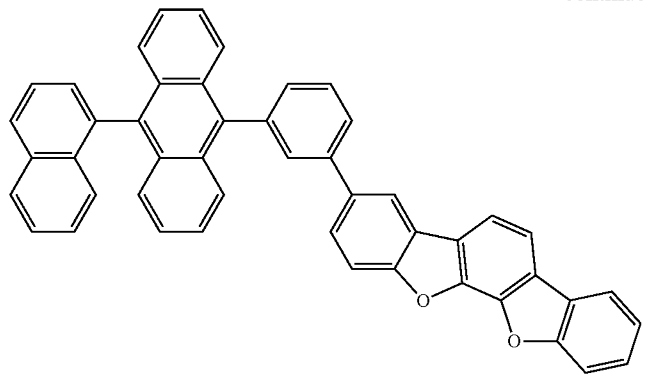
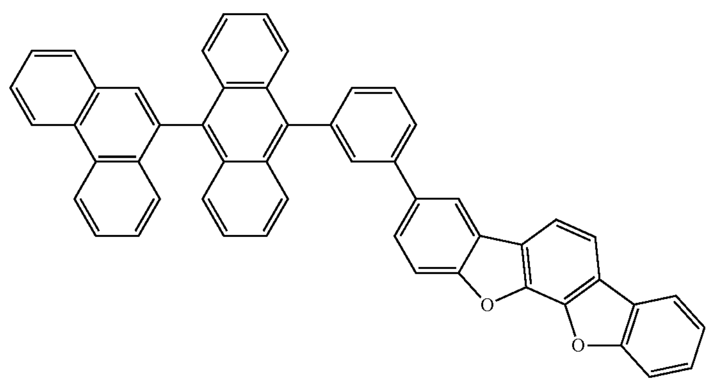
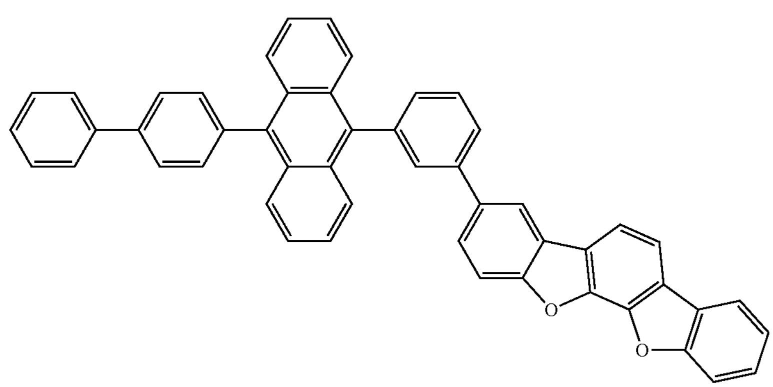
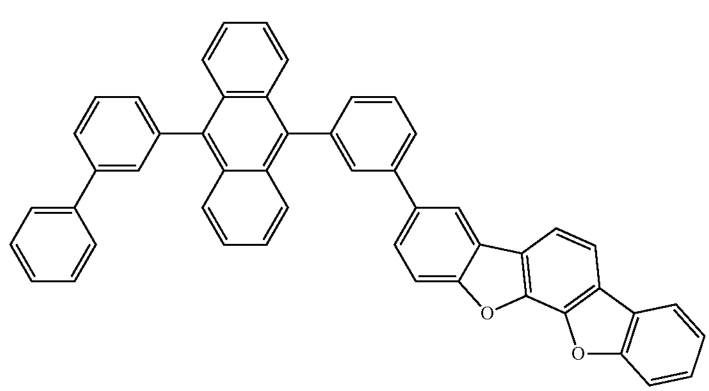

-continued
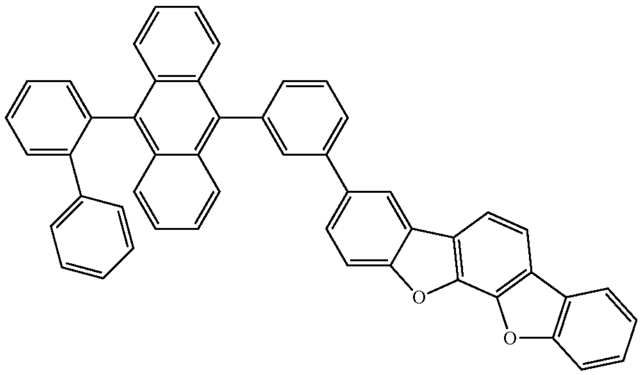
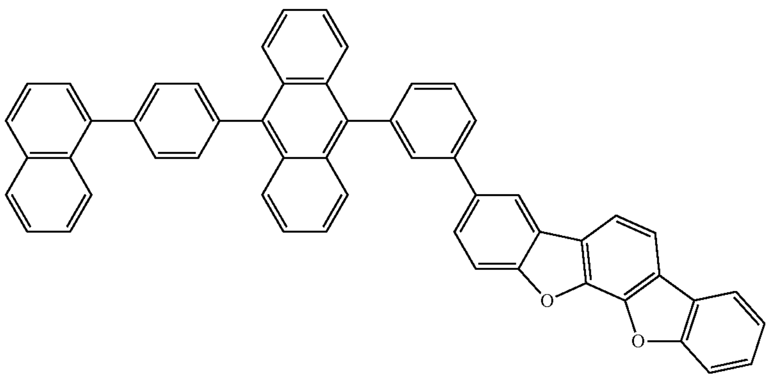
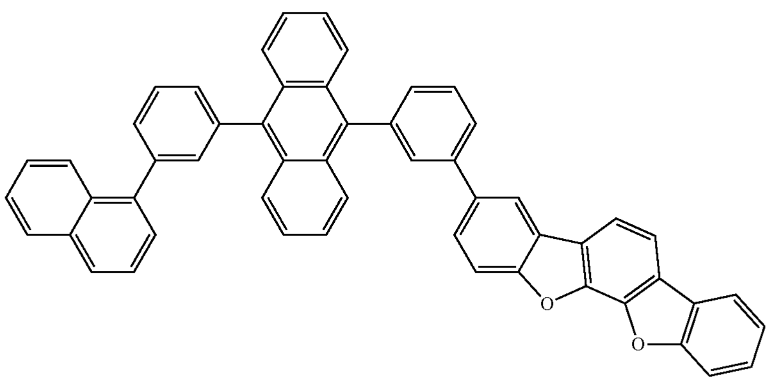
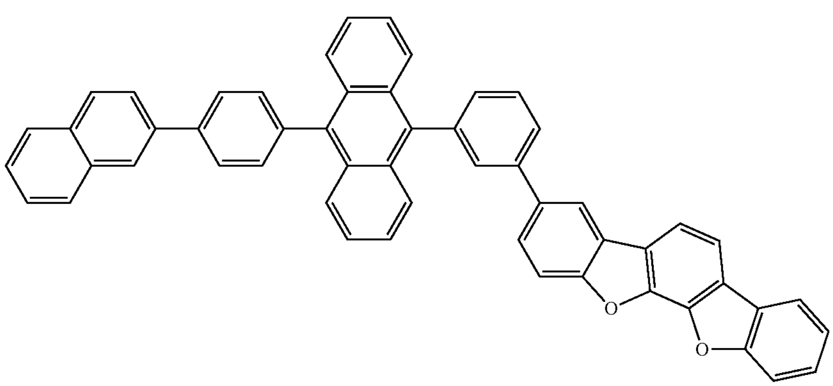

-continued
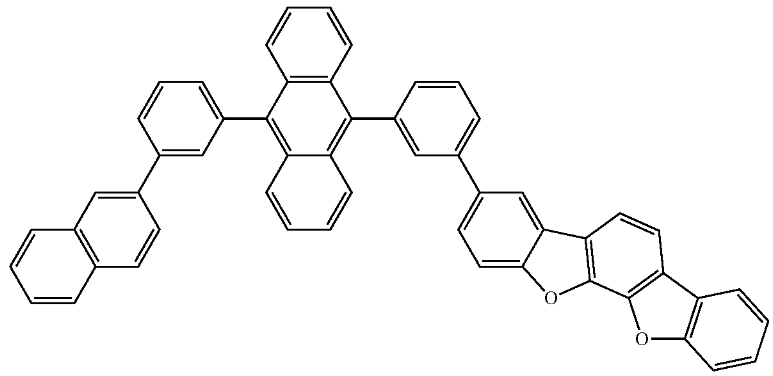
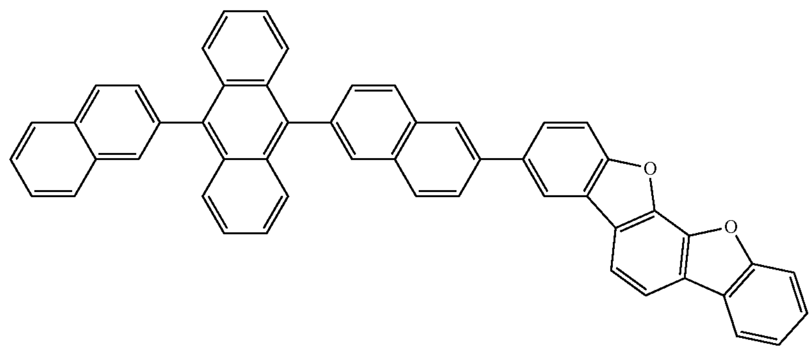
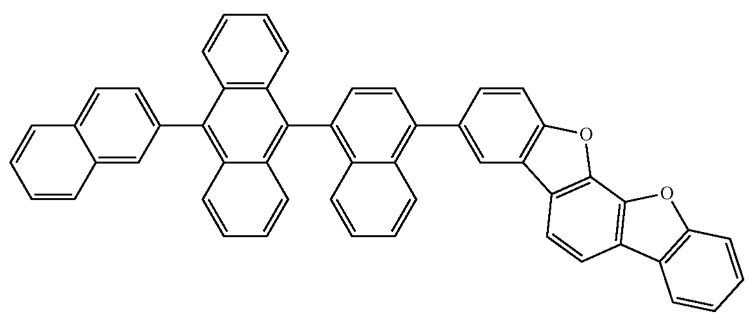
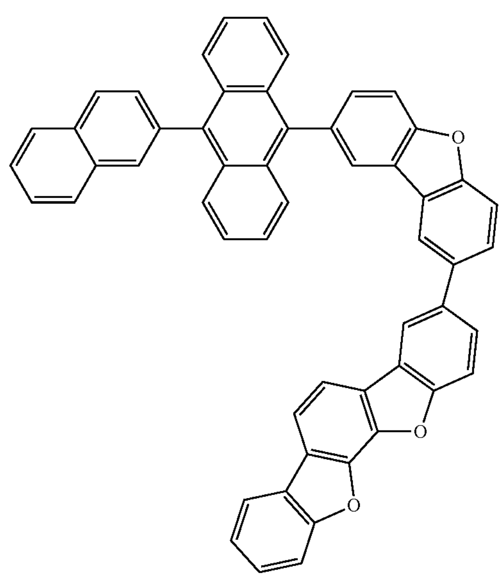

-continued
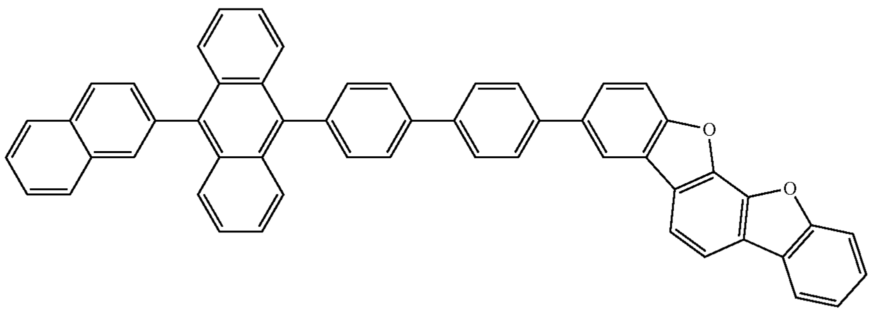
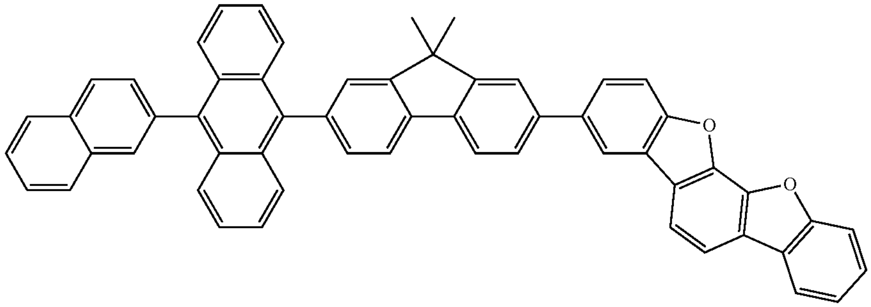
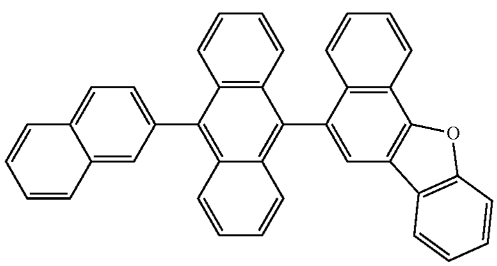
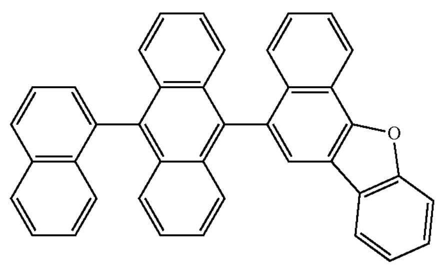
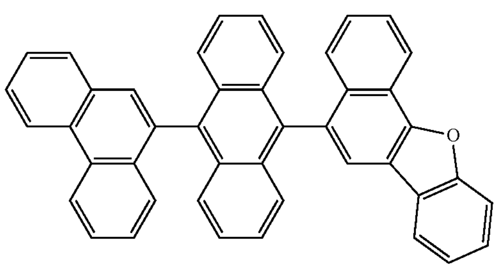
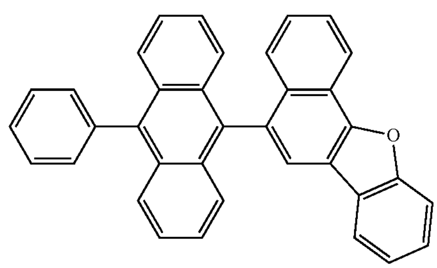
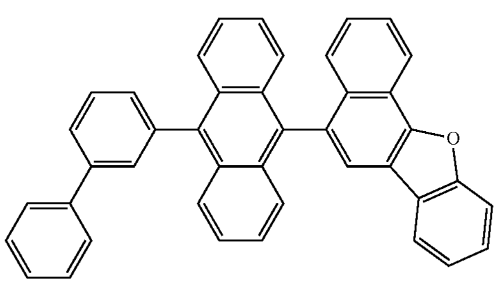
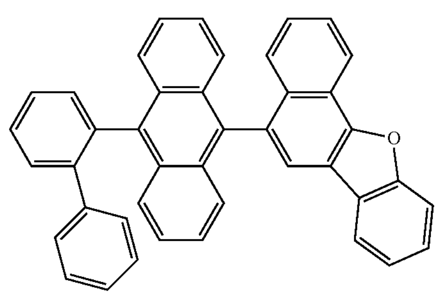
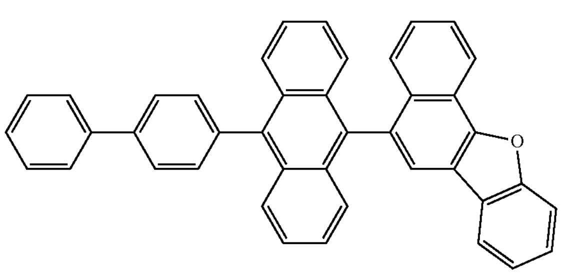
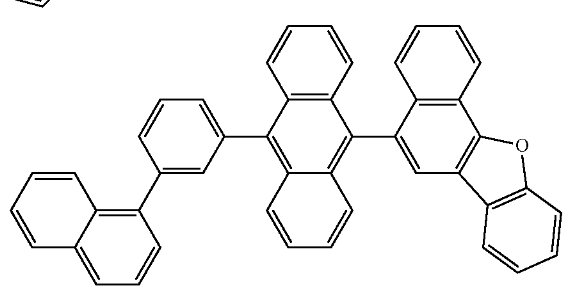

-continued
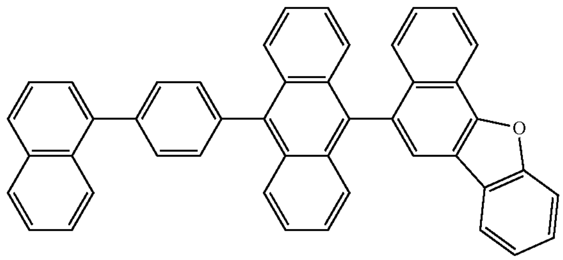
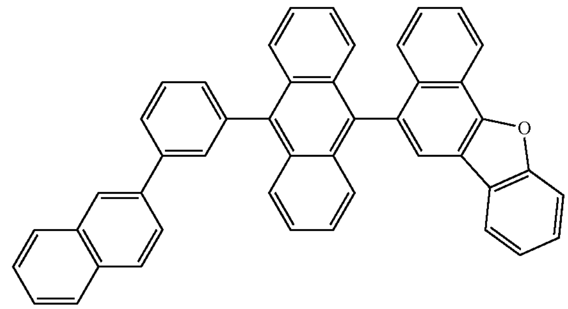
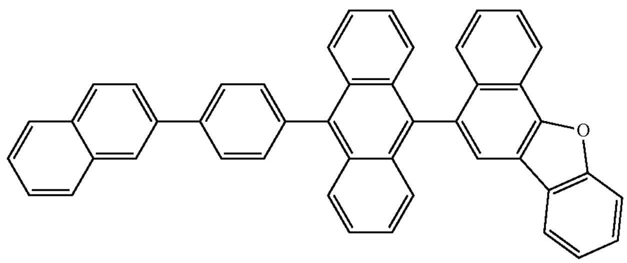
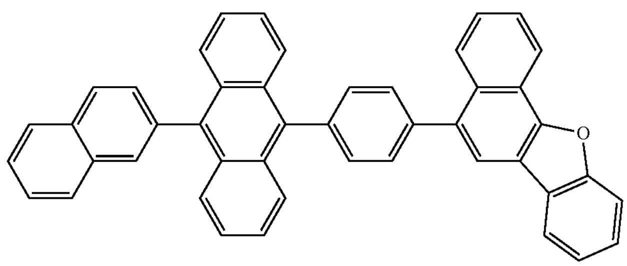
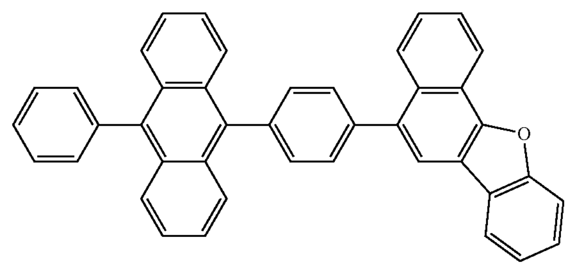
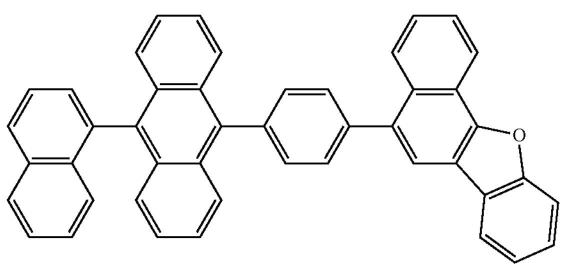
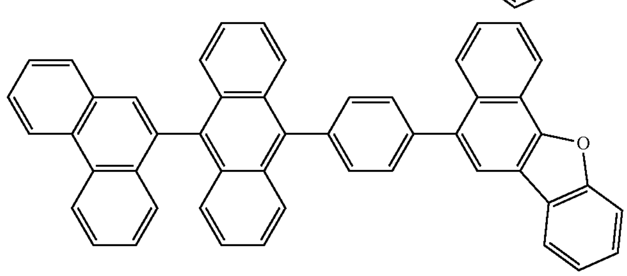
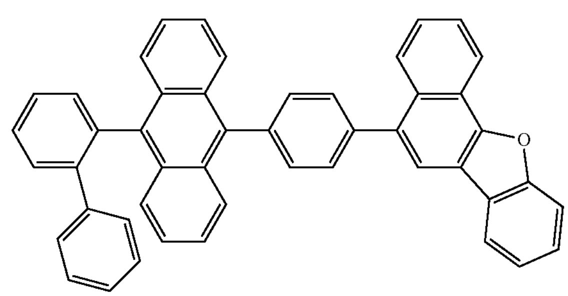
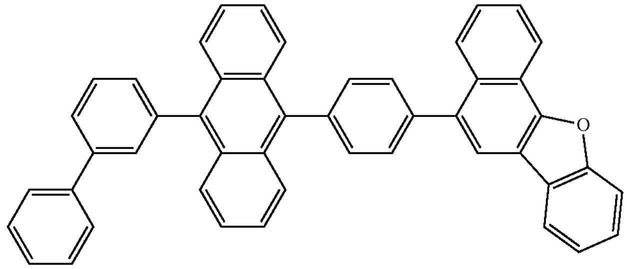

-continued
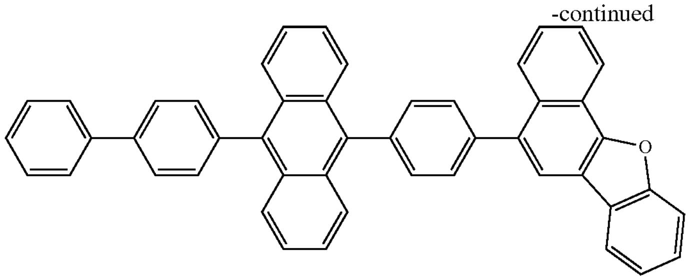
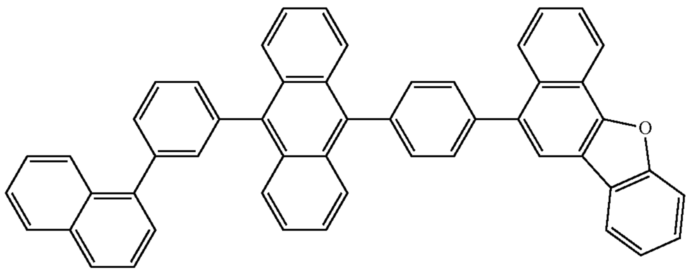
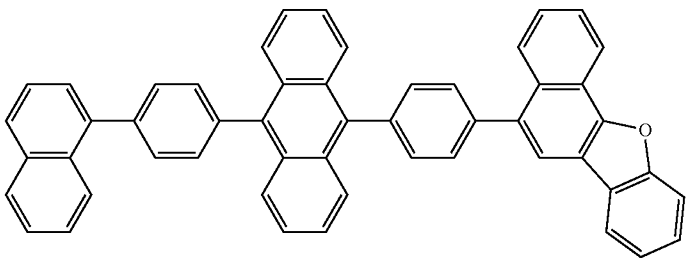
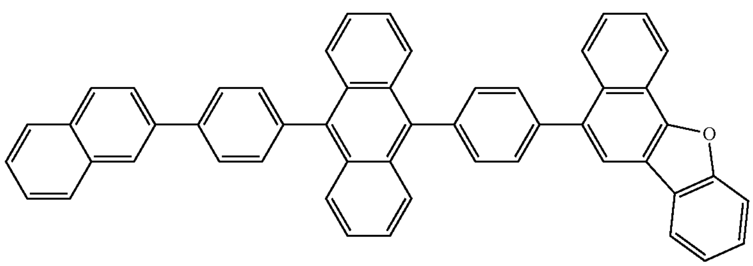
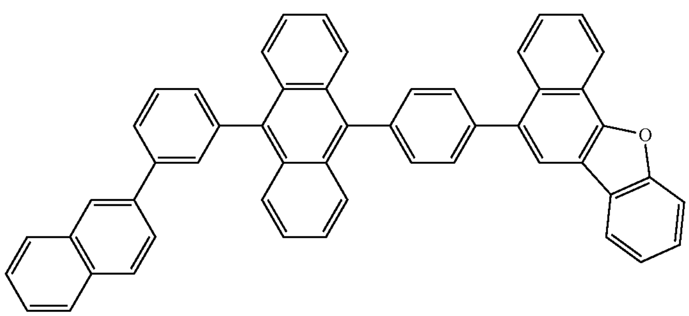
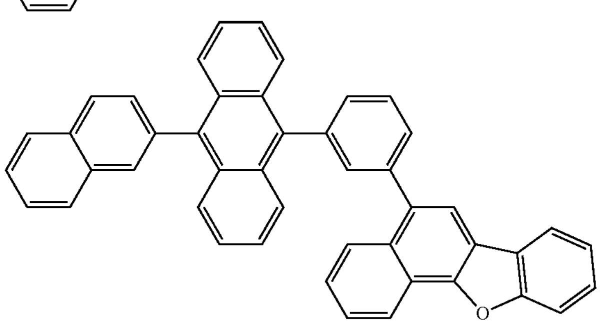
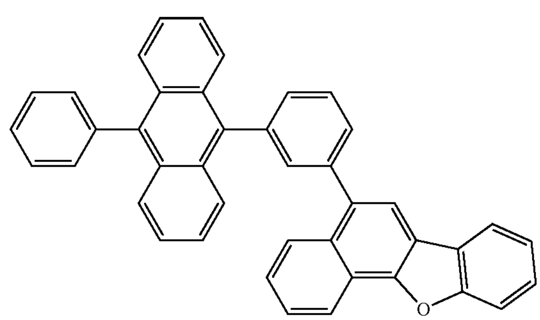

-continued
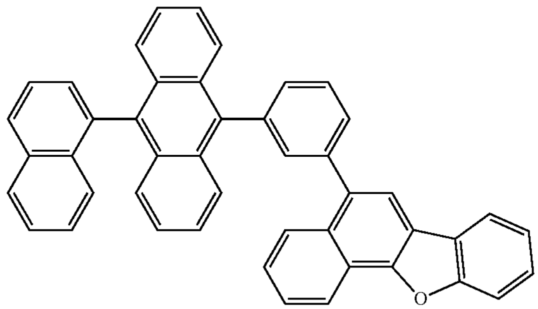
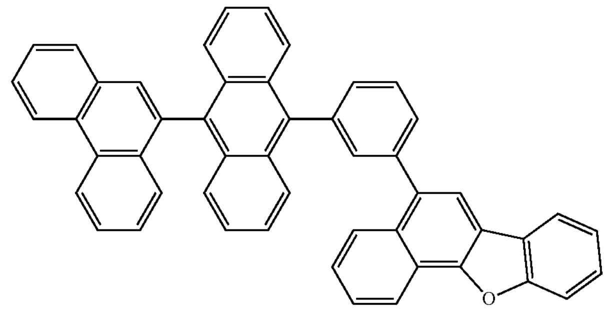
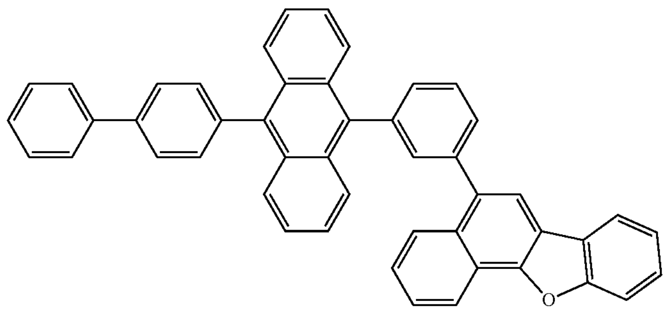
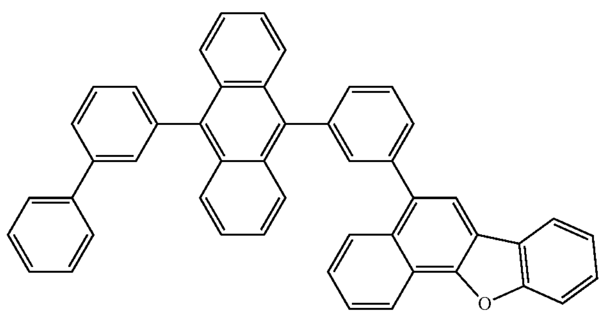
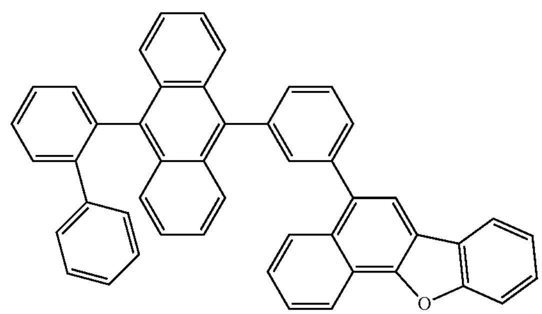
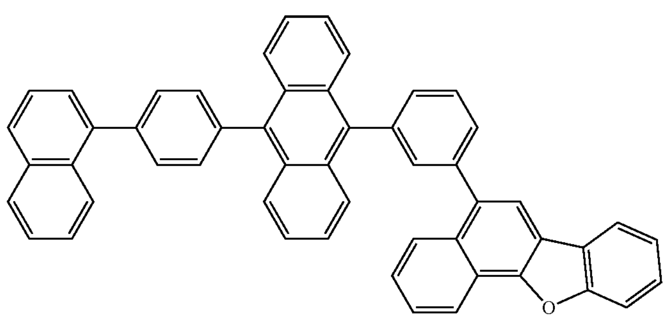
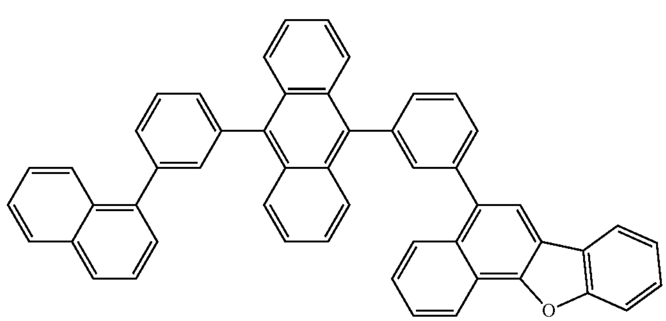

-continued
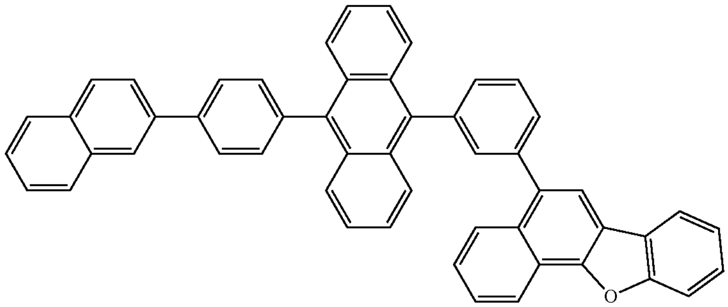
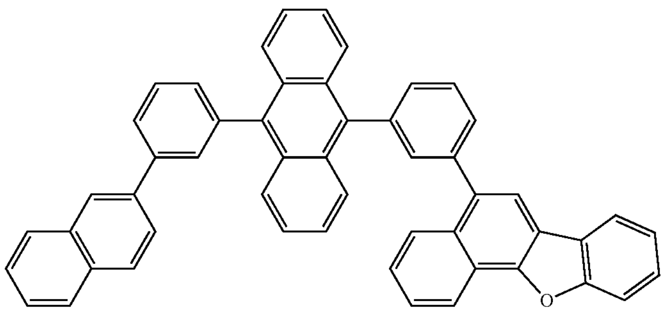
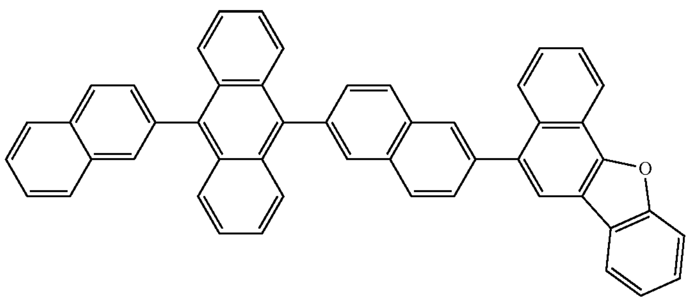
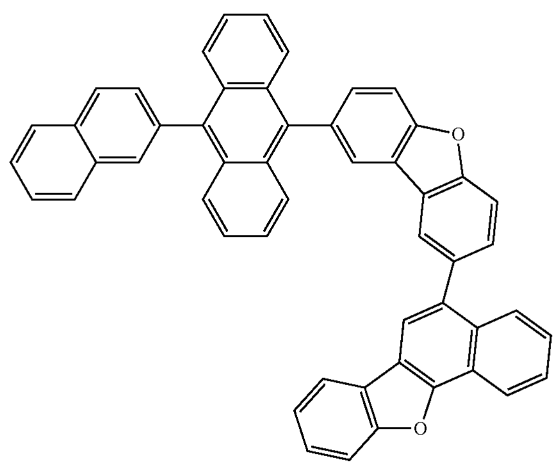
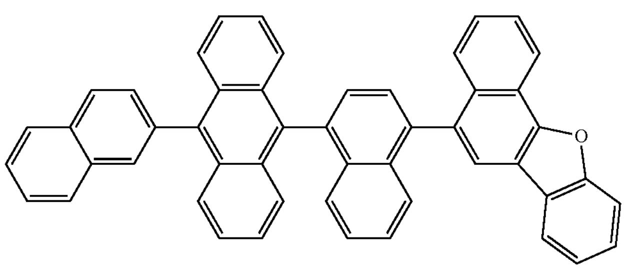
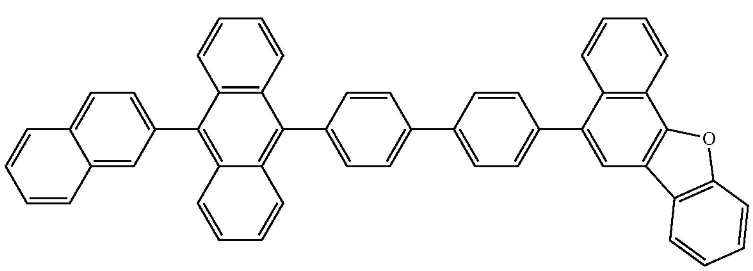

-continued
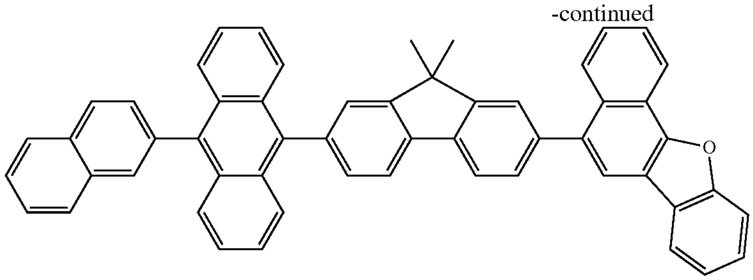
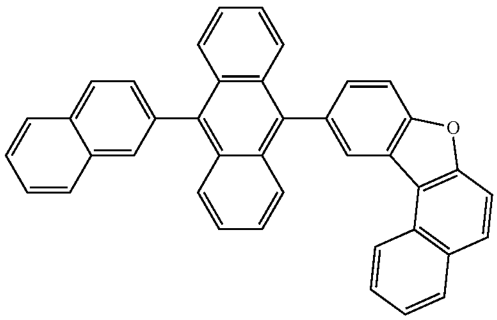
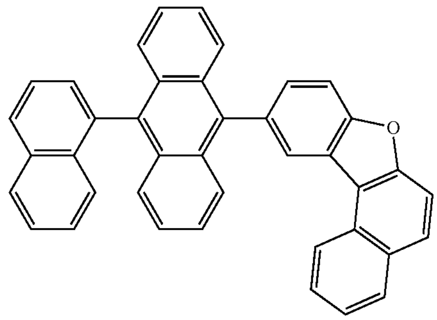
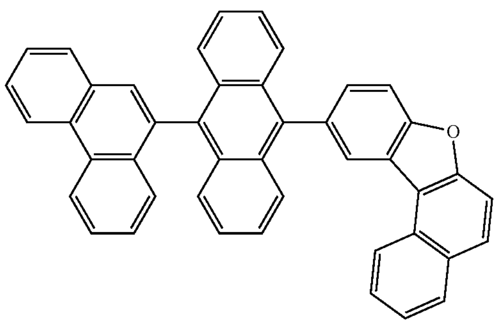
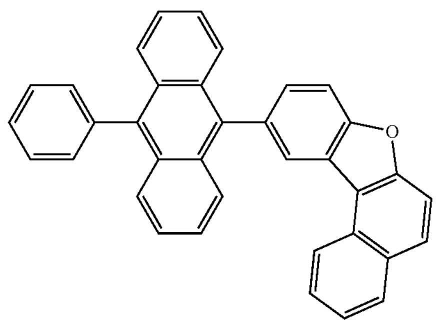
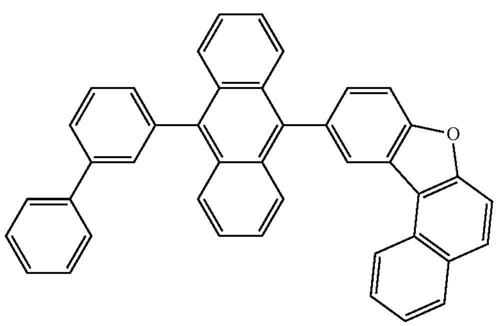
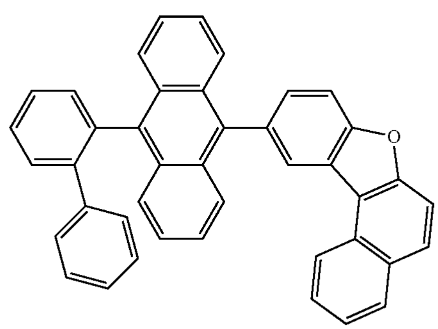
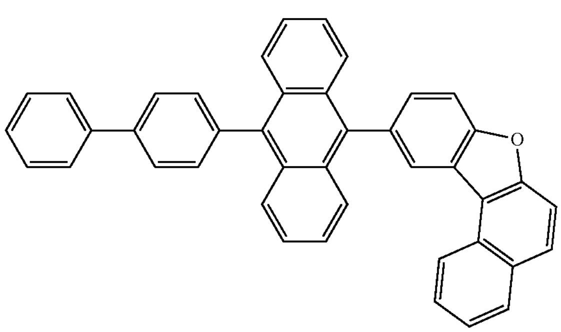
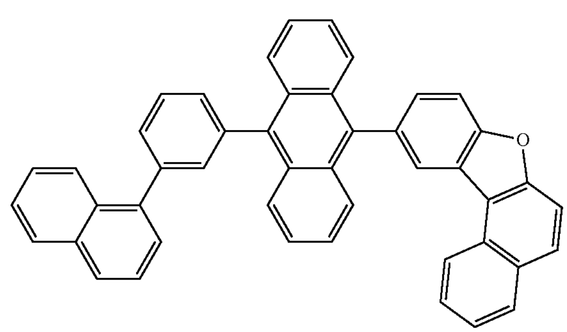

-continued
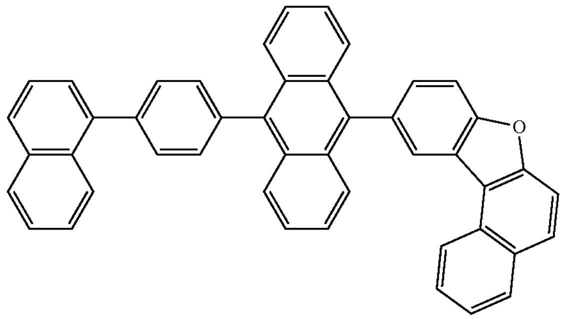
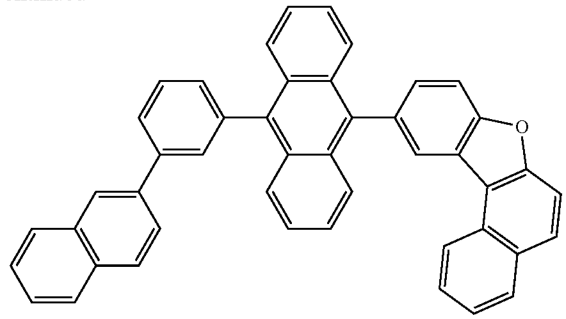
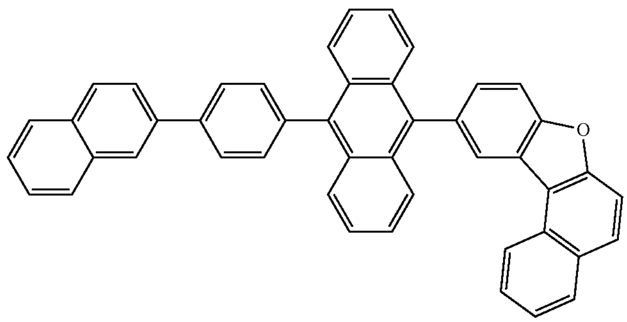
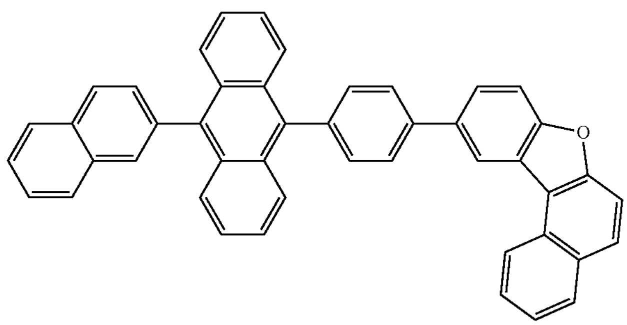
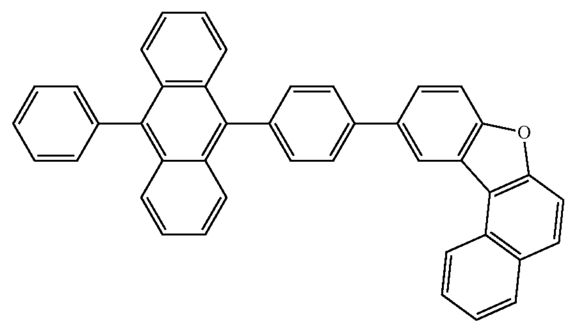
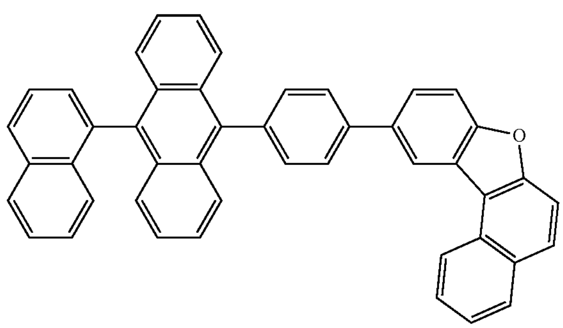
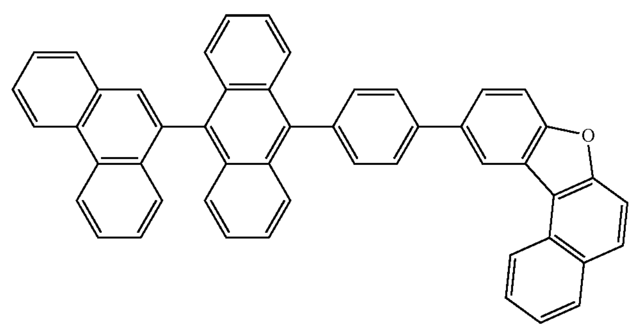
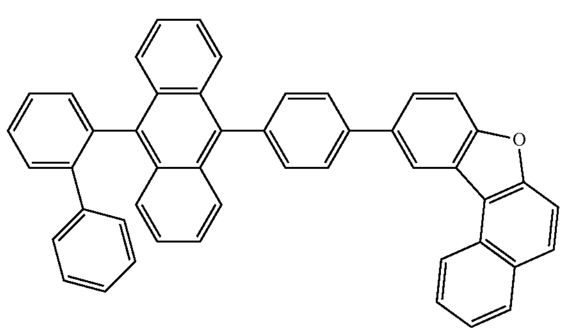
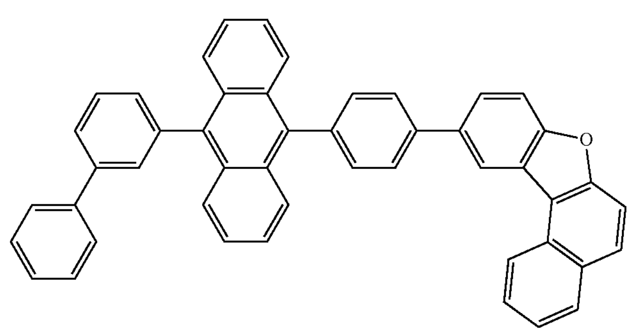

-continued
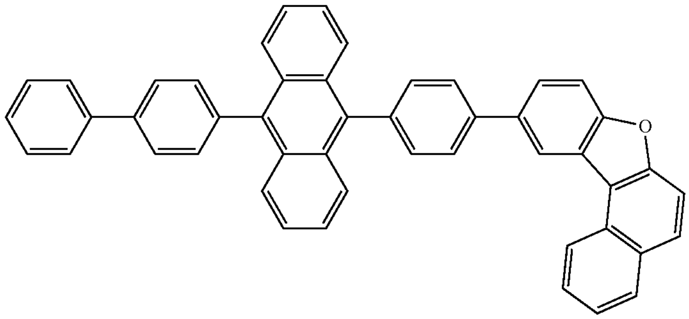
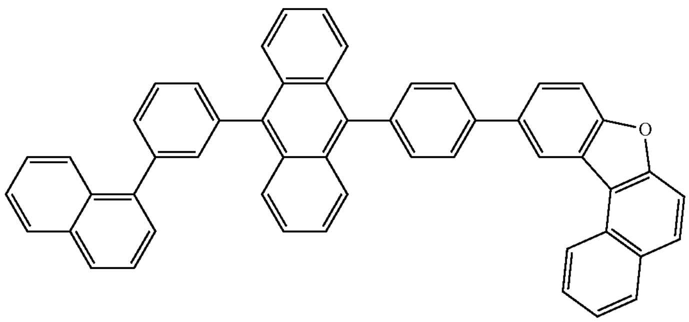
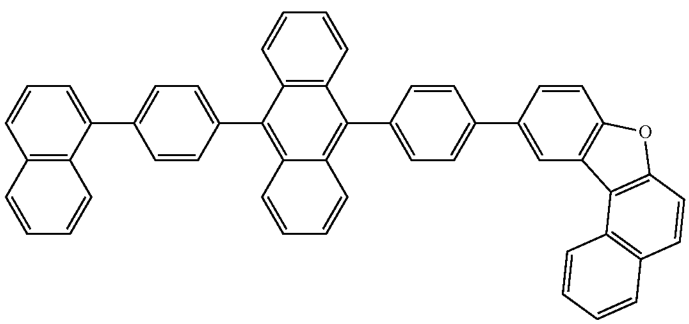
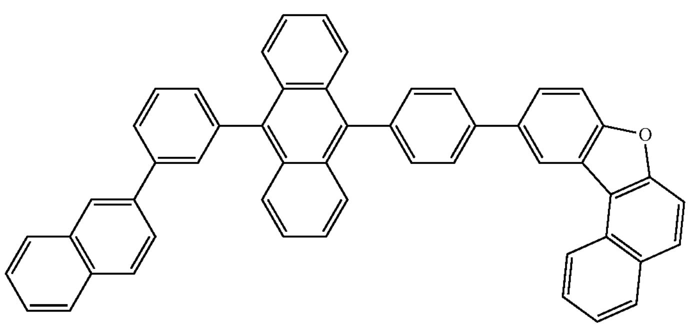
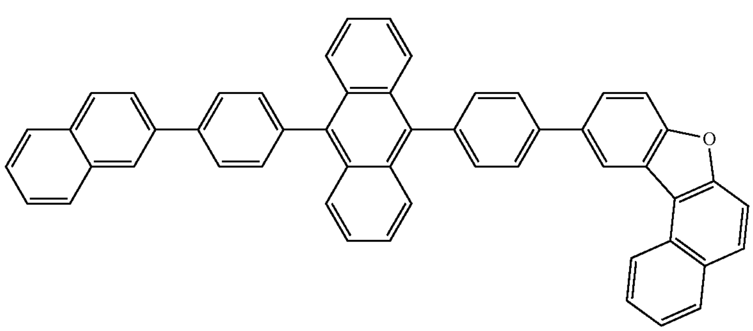

-continued
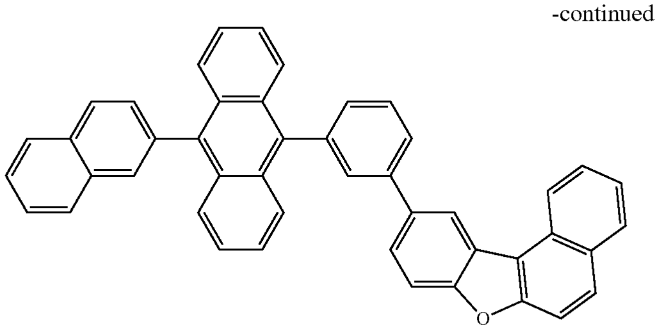
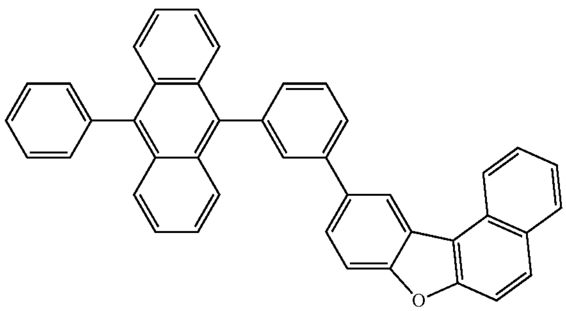
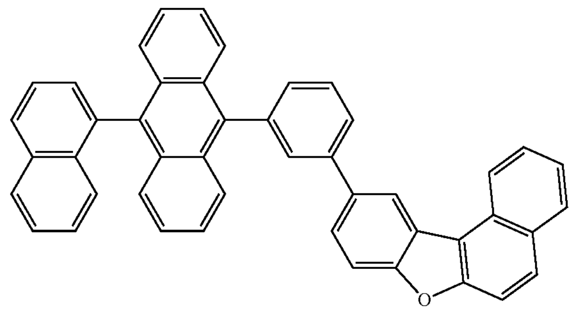
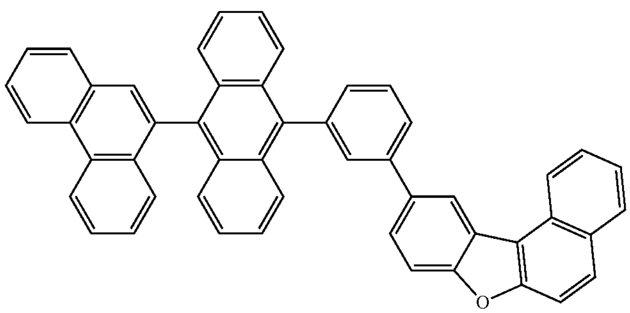
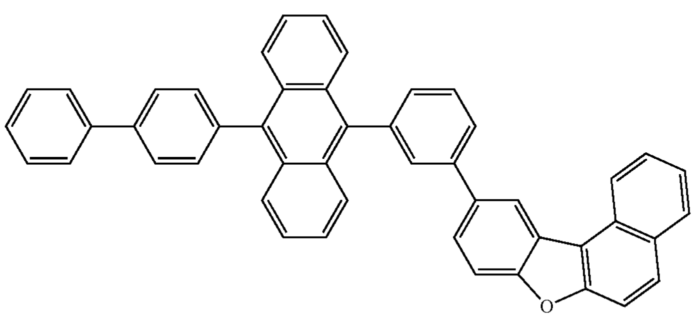
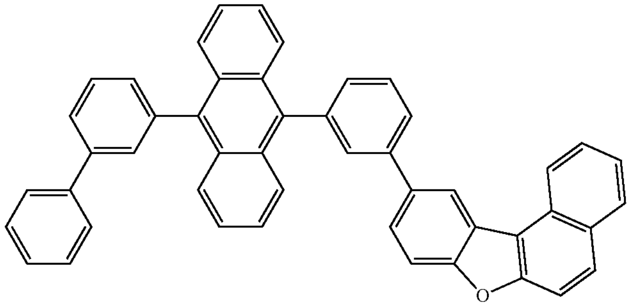

-continued
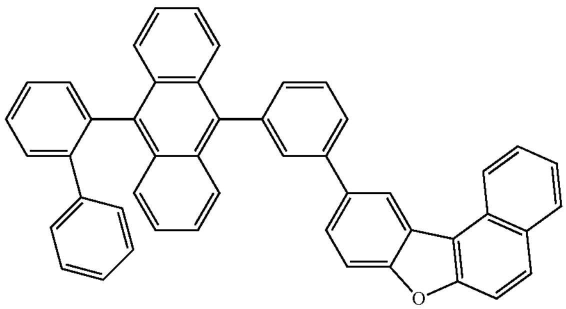
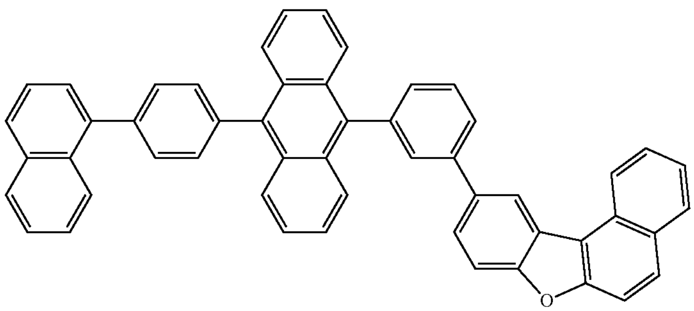
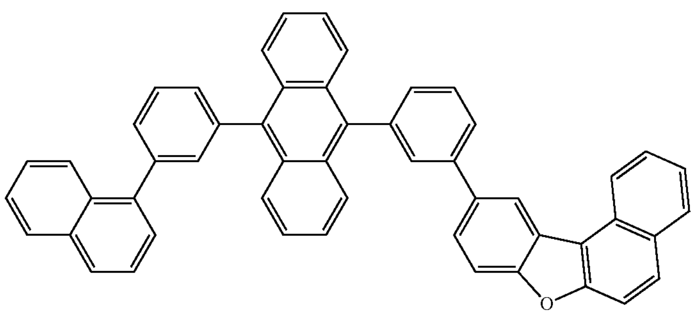
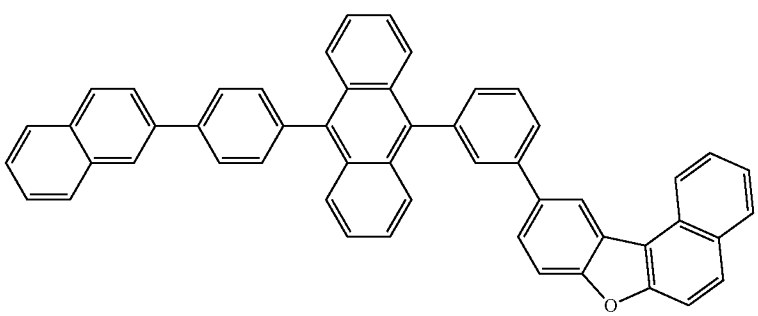
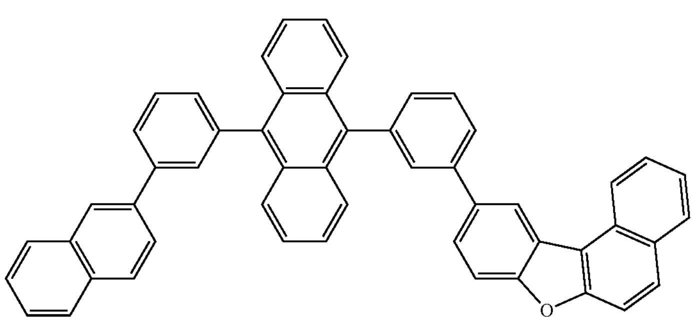

-continued
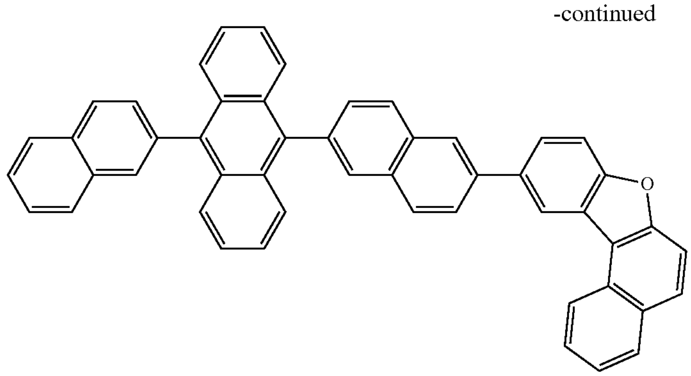
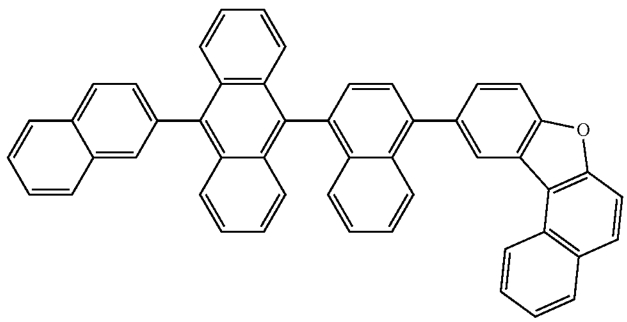
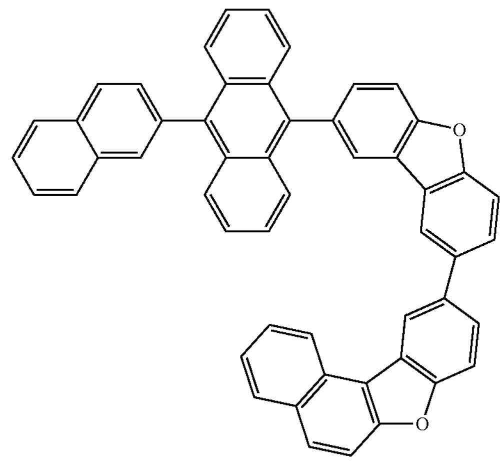
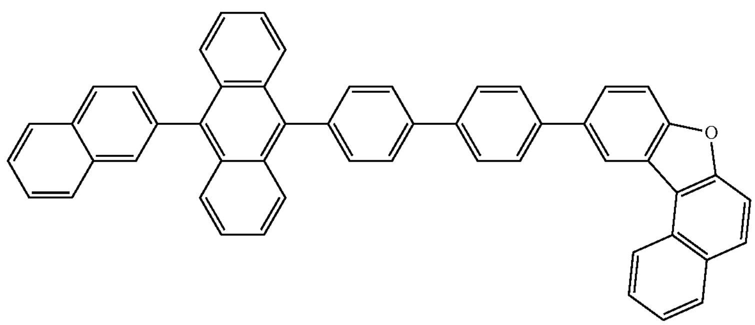
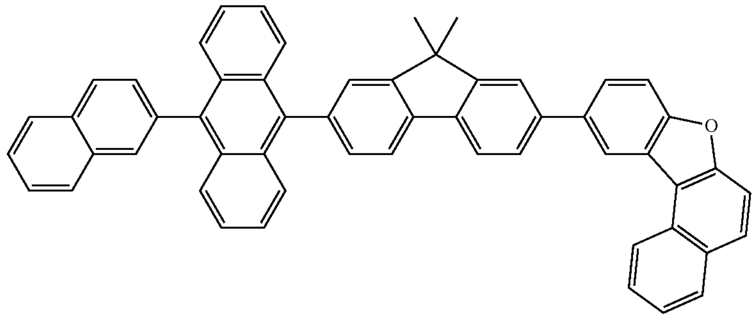
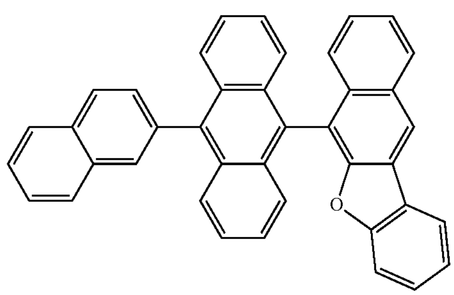
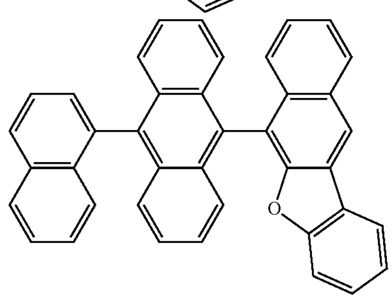

-continued
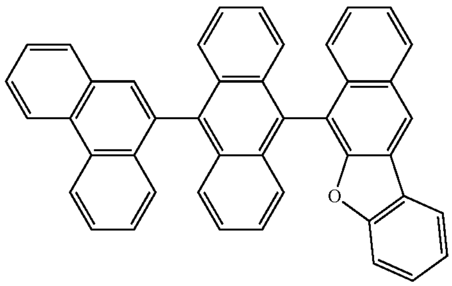
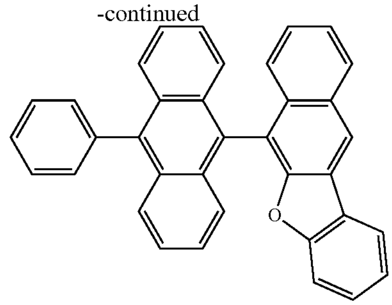
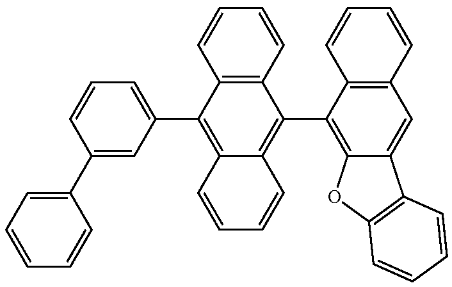
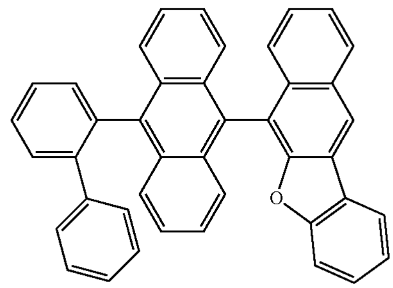
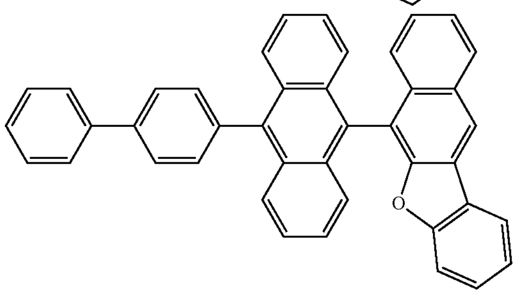
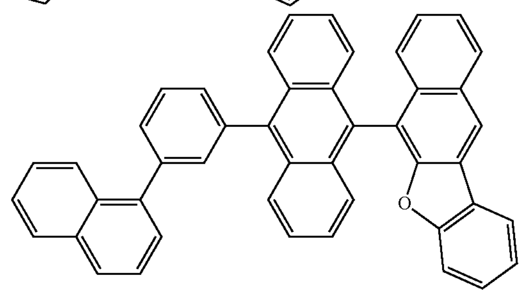
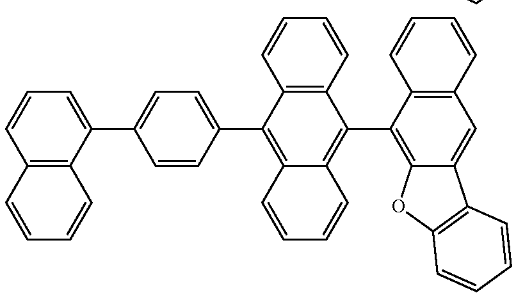
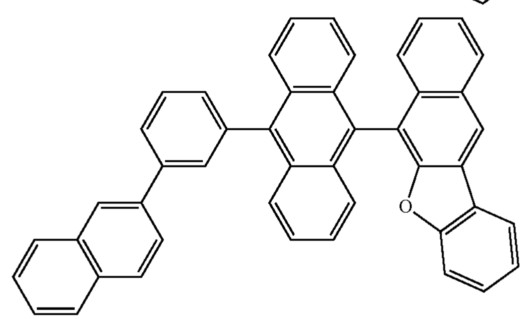
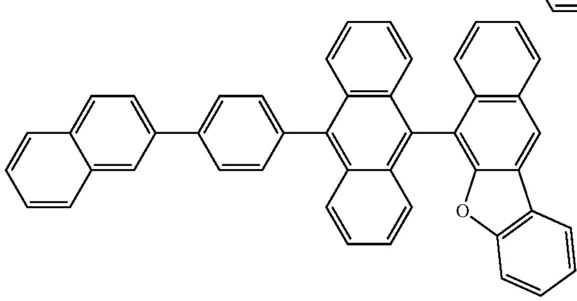
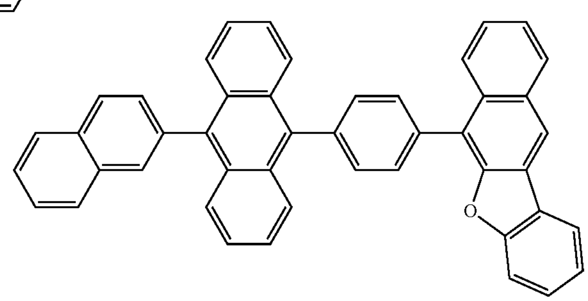
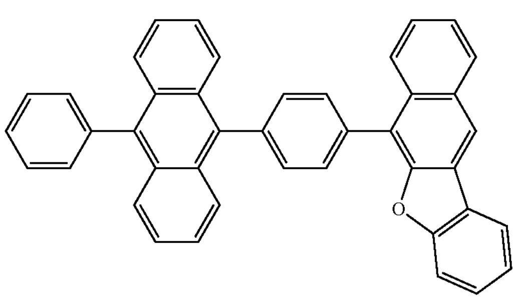
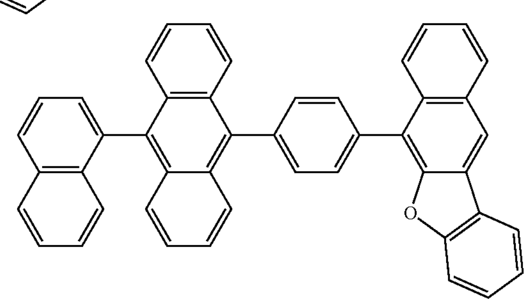

-continued
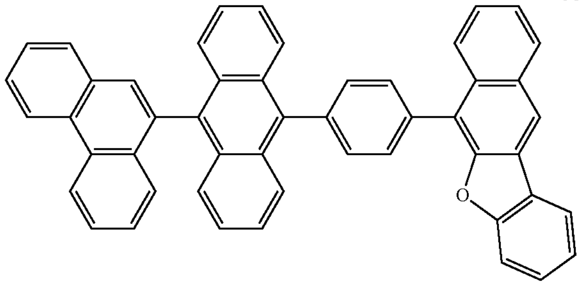
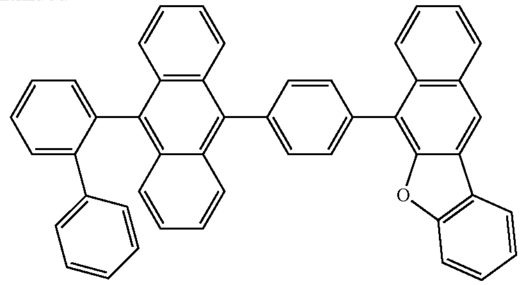
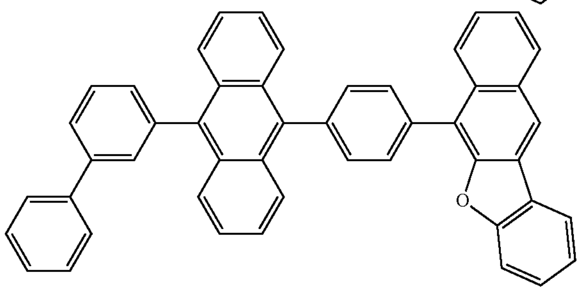
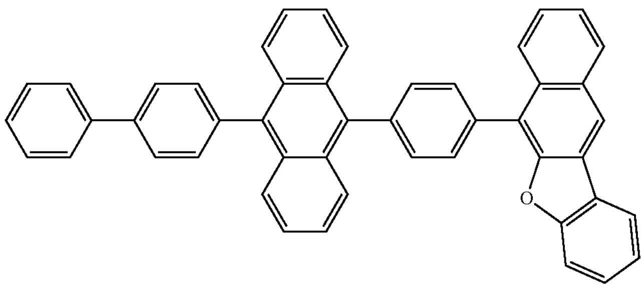
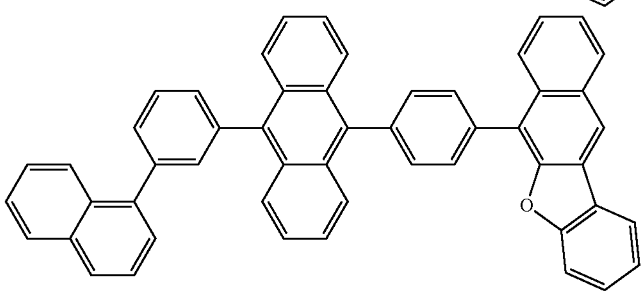
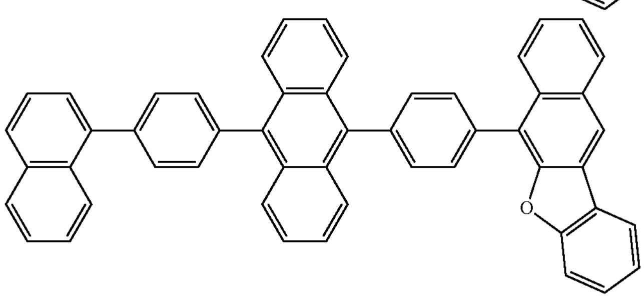
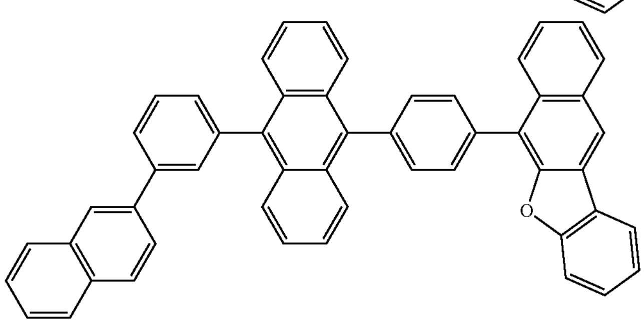

-continued
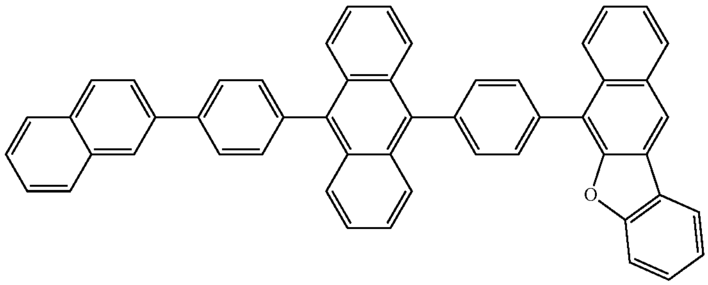
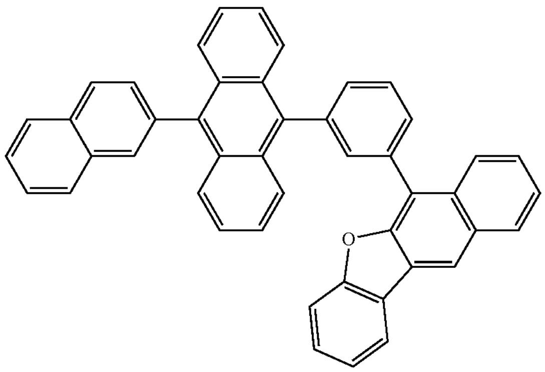
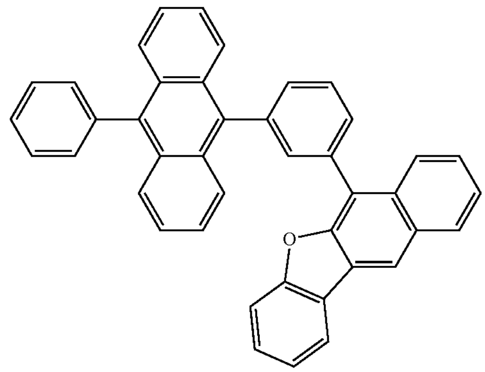
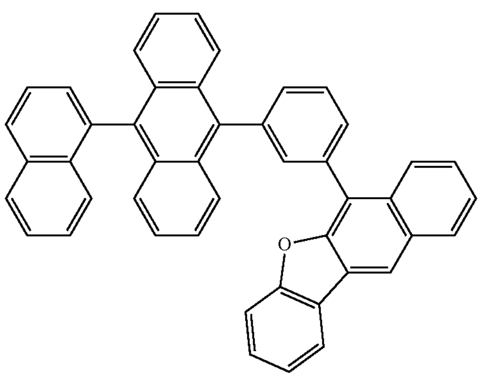
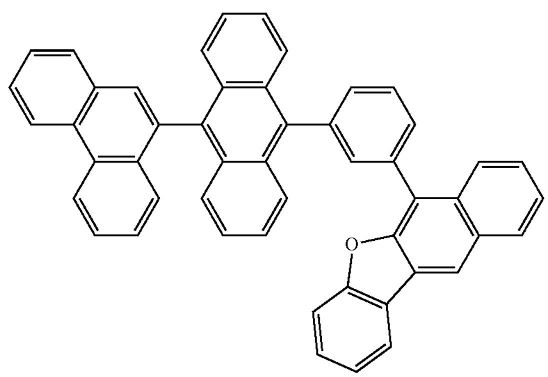
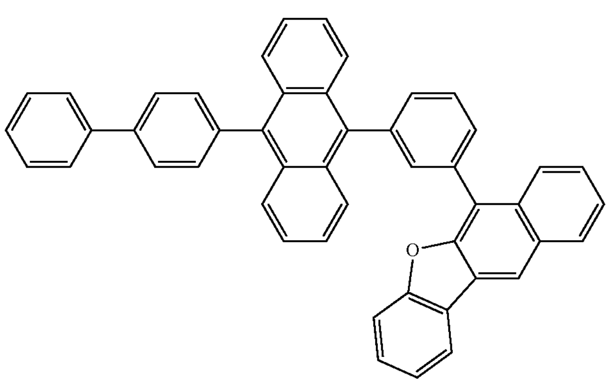
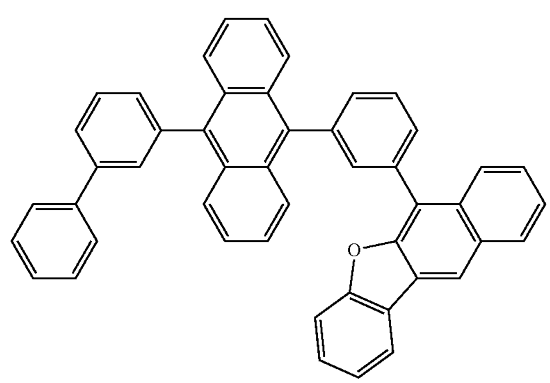

-continued
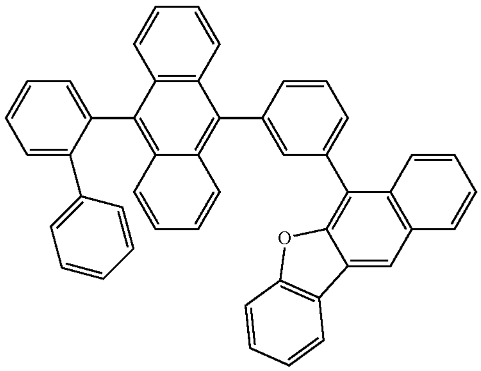
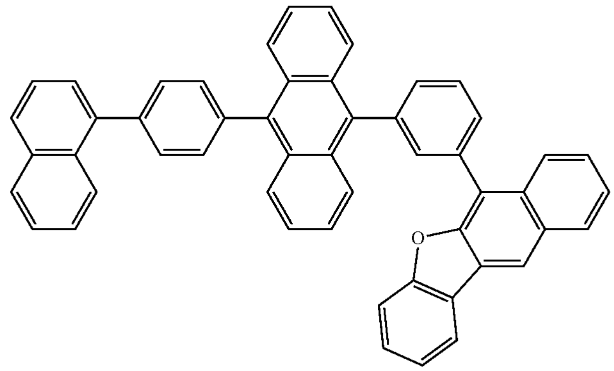
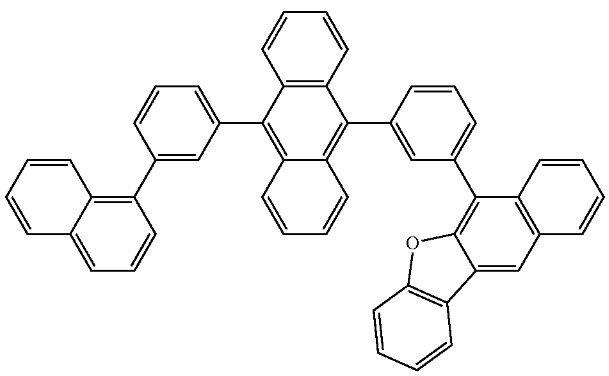
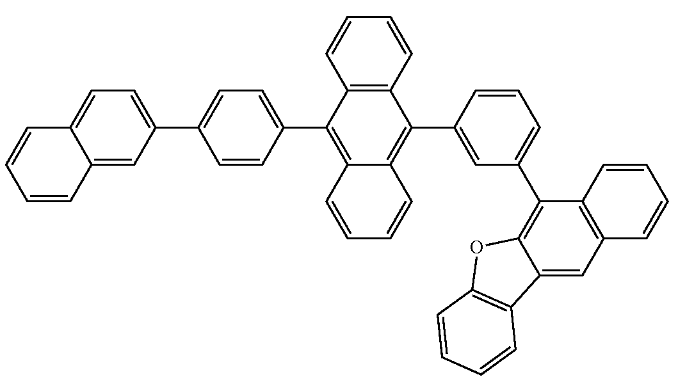
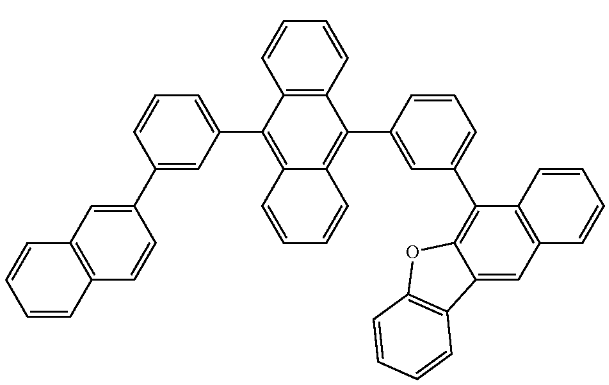

-continued
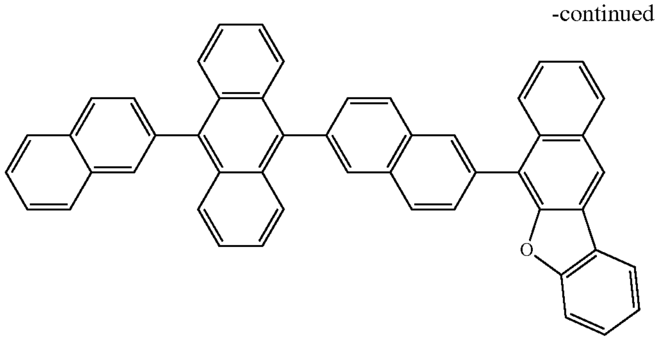
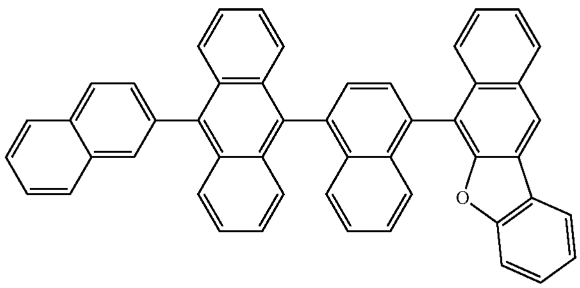
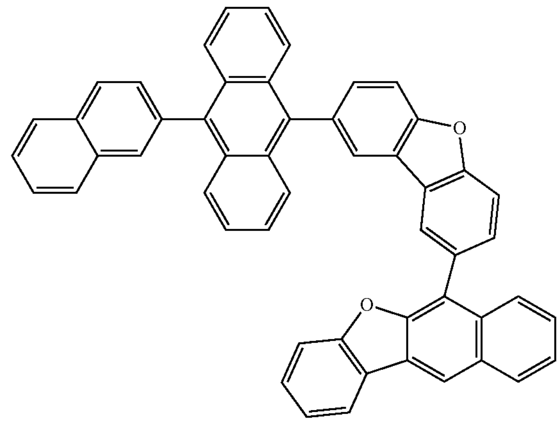
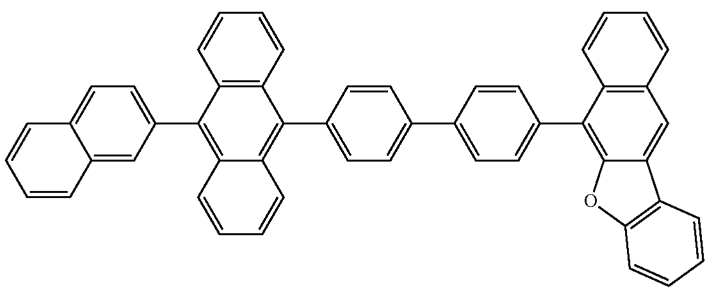
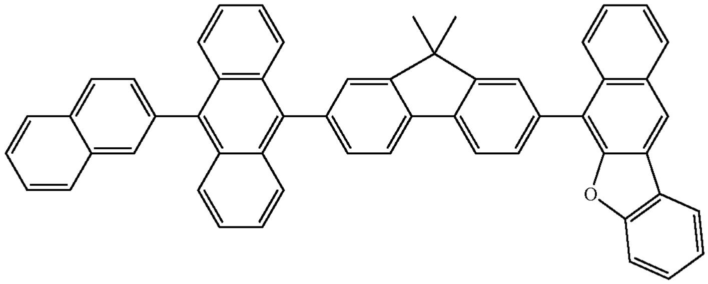
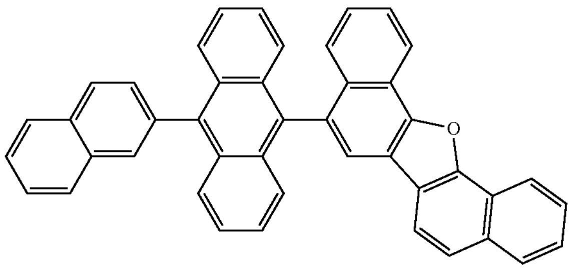
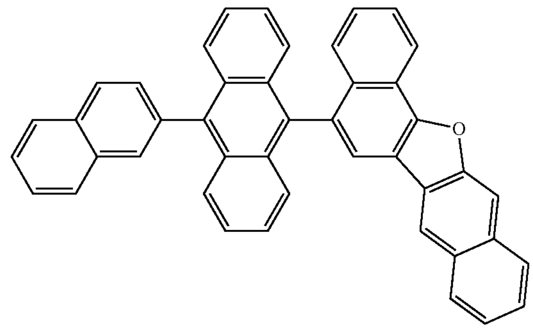

-continued
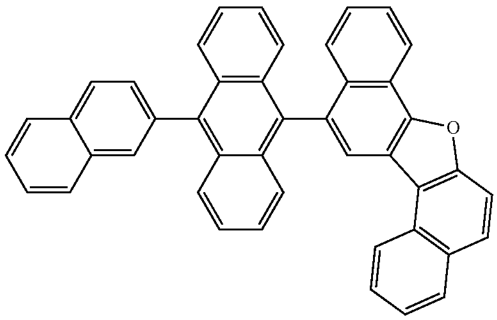
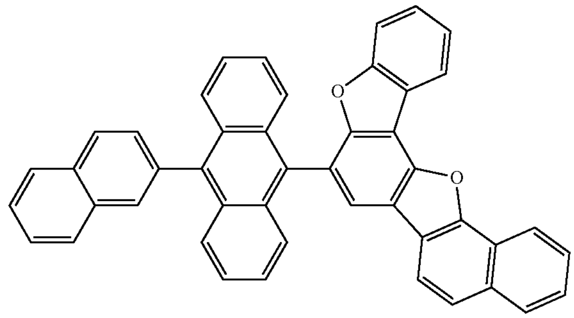
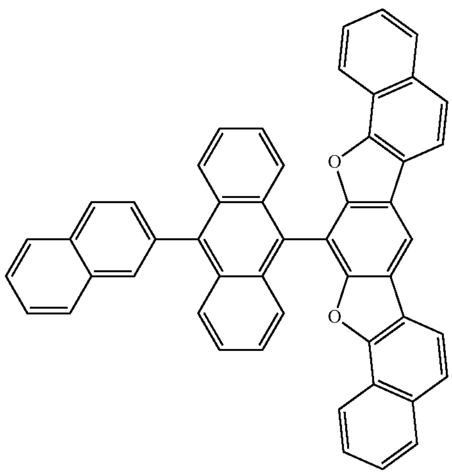
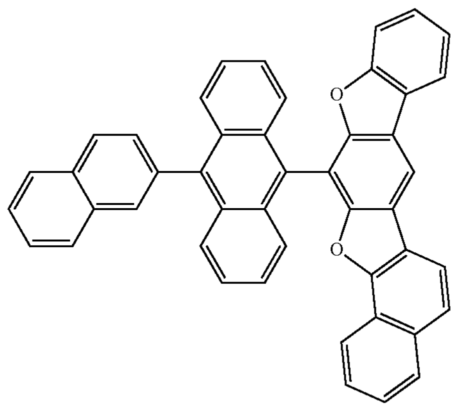
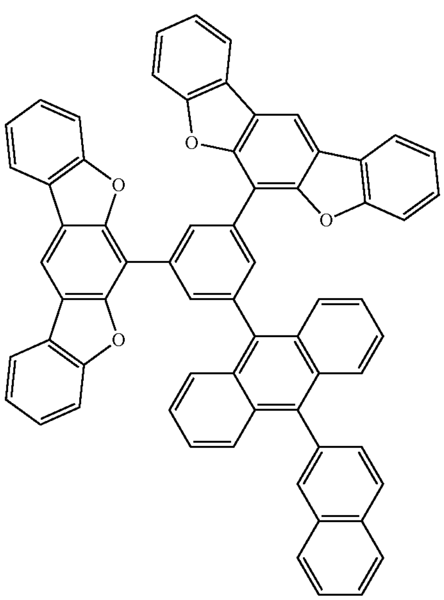
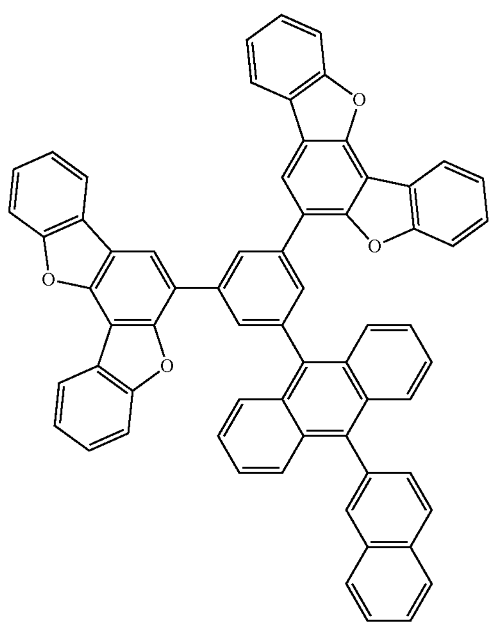

-continued
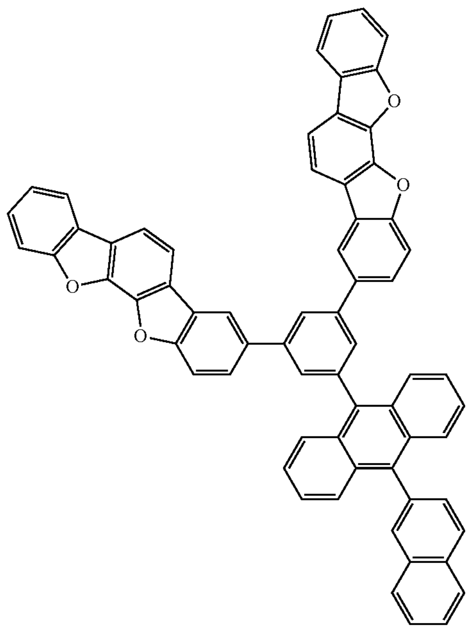
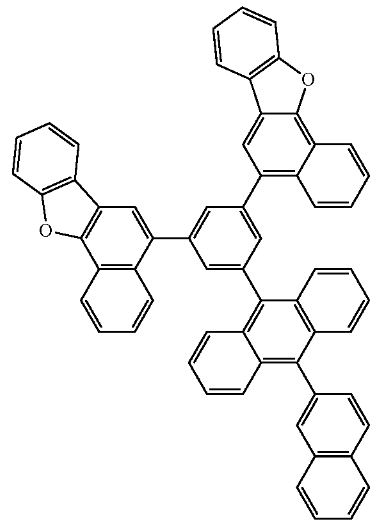
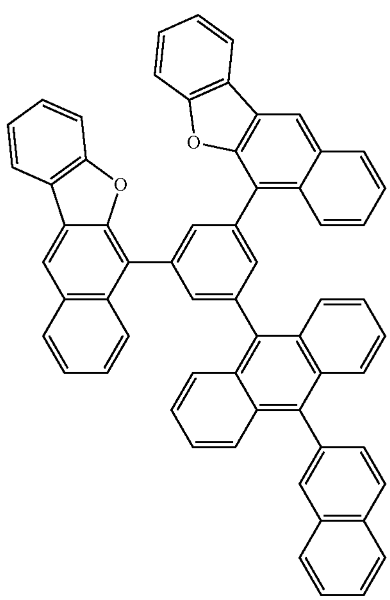
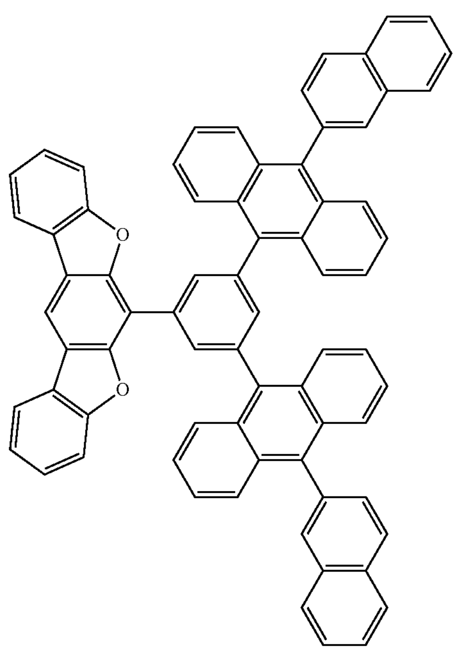

-continued
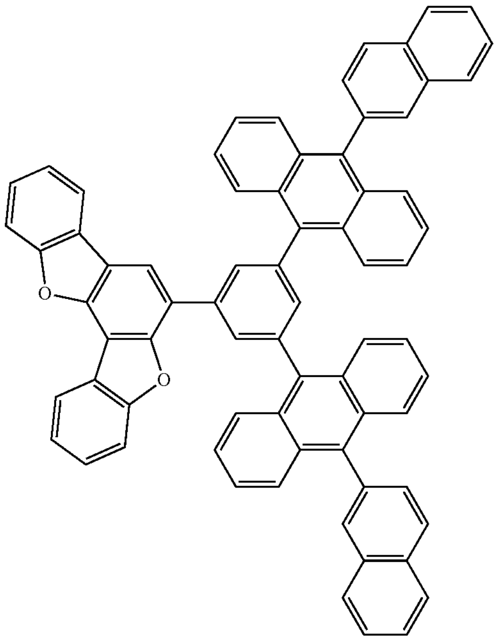
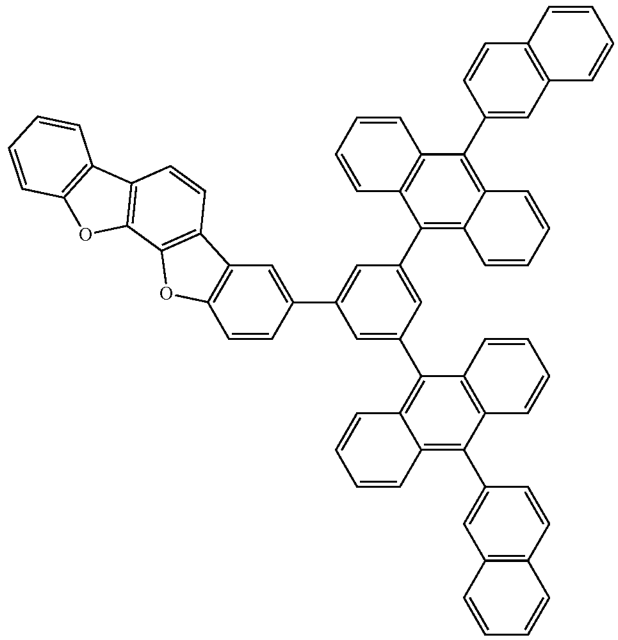
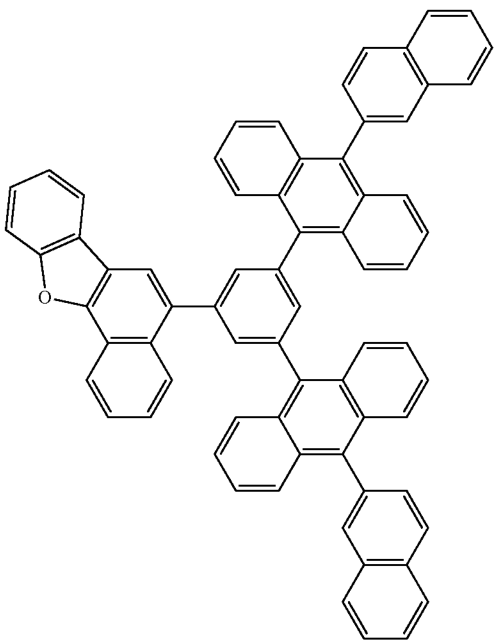
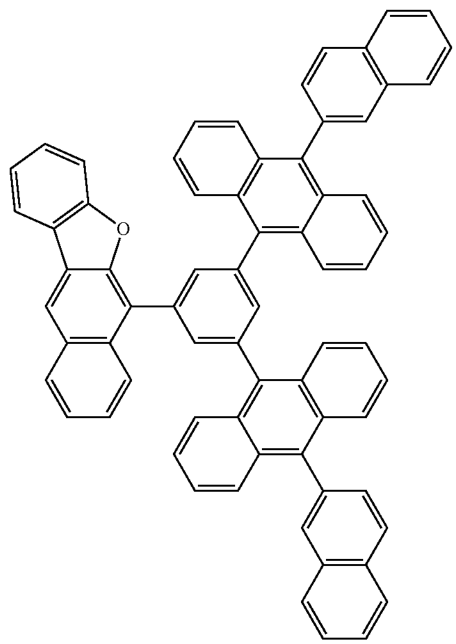
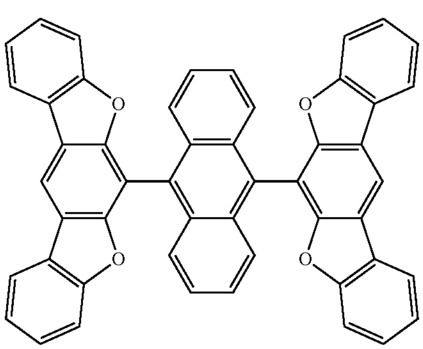
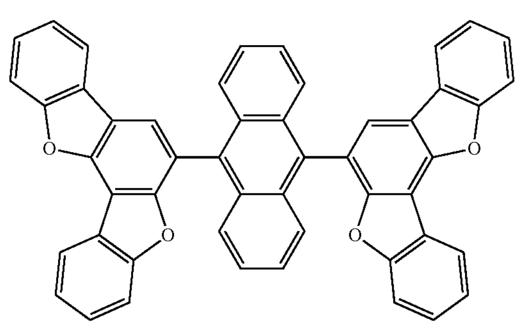

-continued
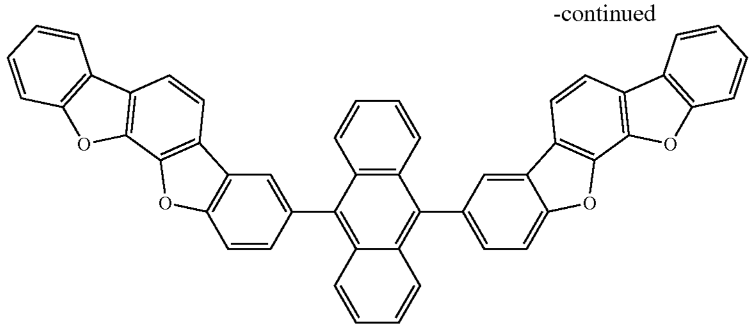
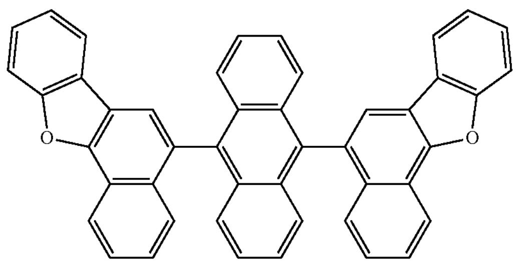
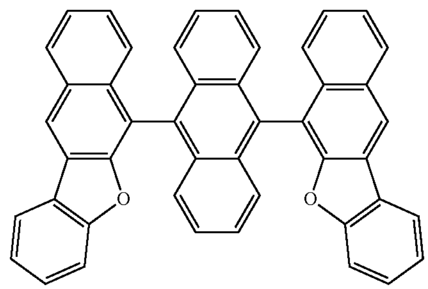
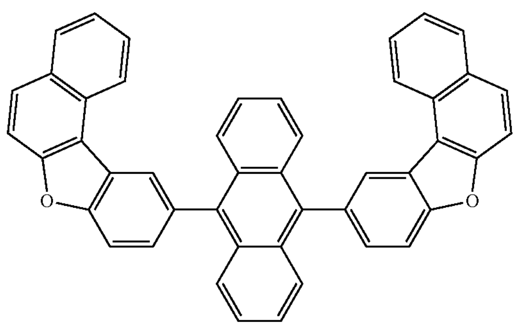
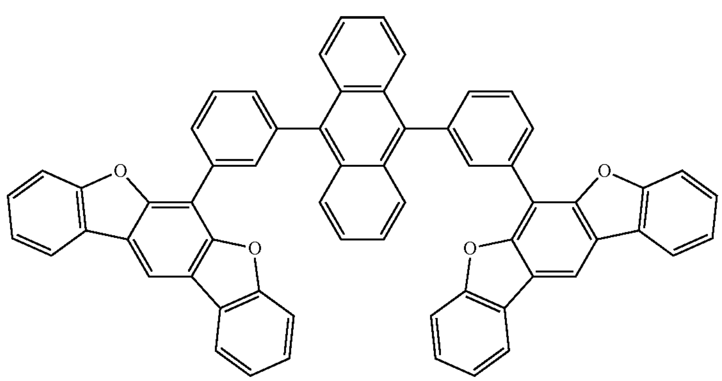
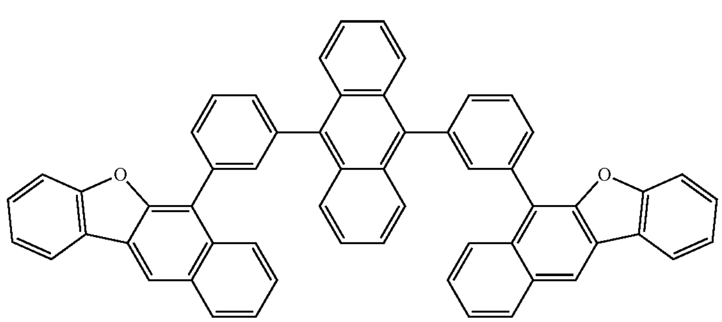

-continued
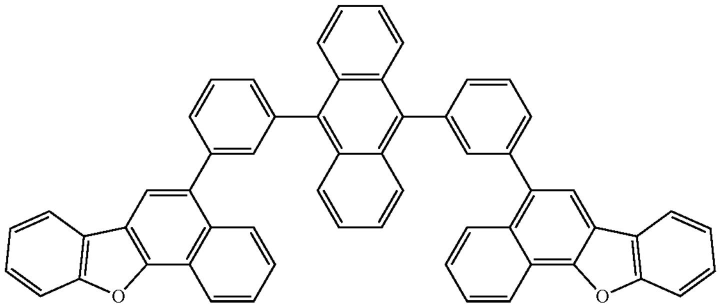
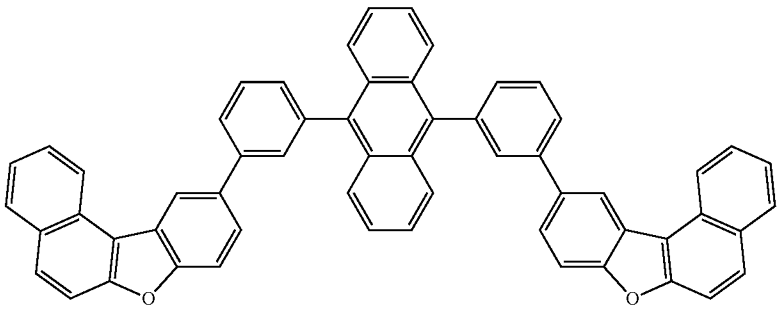
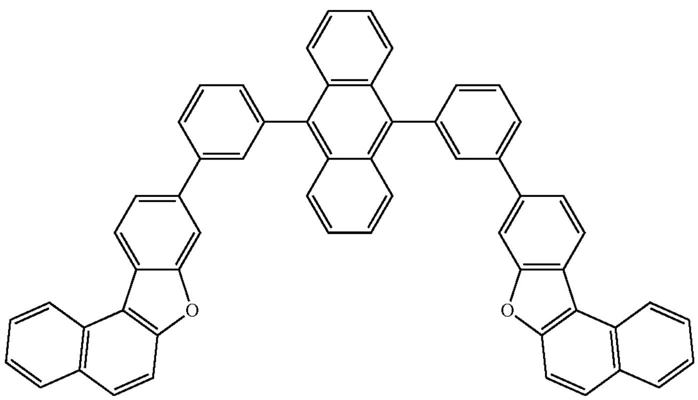
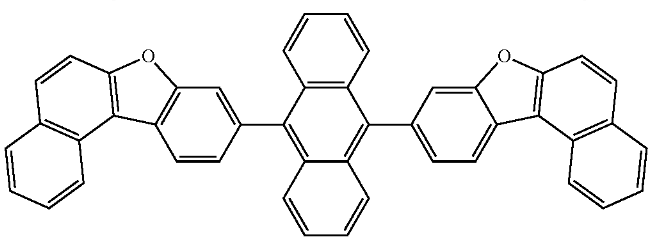
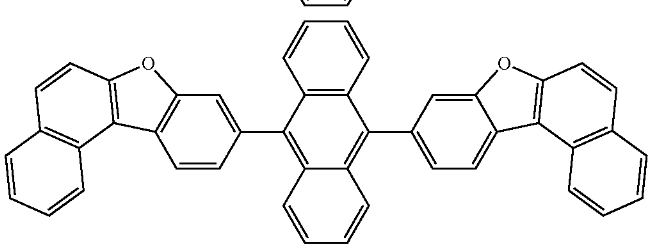
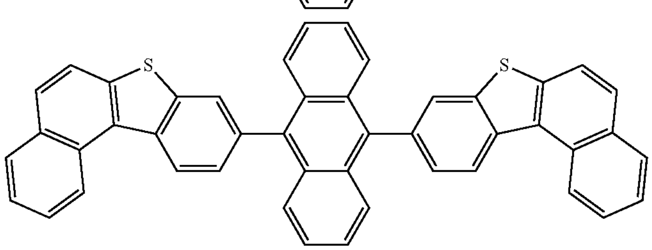

-continued

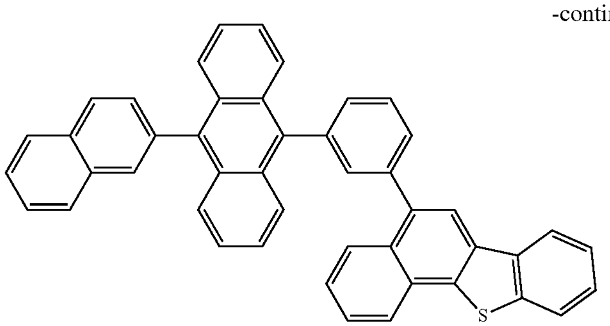

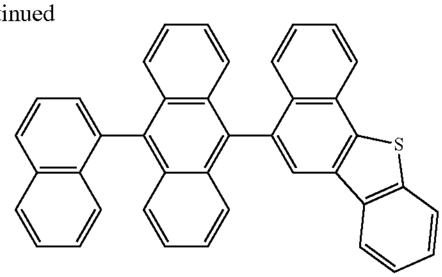

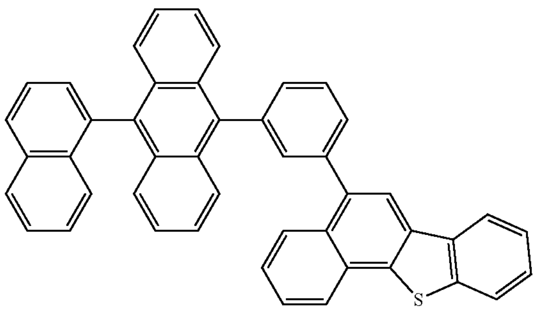

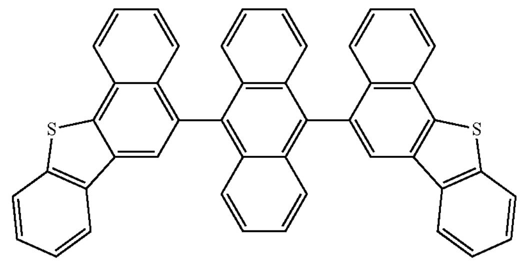

Dopant Material

As the dopant material for the organic EL device according to the exemplary embodiment of the invention, a chrysene derivative represented by the following formula (21) is usable.

(21)

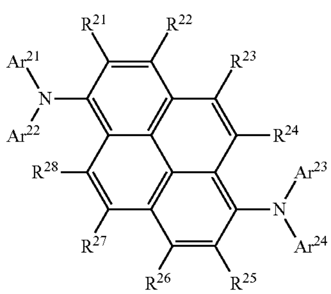

In the formula (21), $R^{21}$ to $R^{28}$ each represent any one of a hydrogen atom, a halogen atom, a cyano group, a substituted or unsubstituted alkyl group having 1 to 20 carbon atoms, a substituted or unsubstituted silyl group and a substituted or unsubstituted aromatic hydrocarbon group having 6 to 30 ring carbon atoms; $Ar^{21}$ to $Ar^{24}$ each represent a substituted or unsubstituted aromatic hydrocarbon group having 6 to 30 ring carbon atoms or a substituted or unsubstituted heterocyclic group having 5 to 30 ring atoms; and at least one of $Ar^{21}$ to $Ar^{24}$ is a heterocyclic group represented by the following formula (22).

(22)

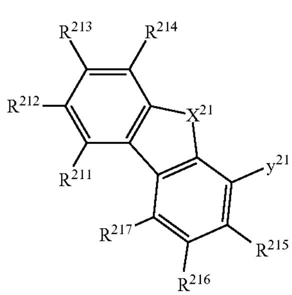

In the formula (22), $R^{211}$ to $R^{217}$ each represent any one of a hydrogen atom, a halogen atom, a cyano group, a substituted or unsubstituted alkyl group having 1 to 20 carbon atoms, a substituted or unsubstituted alkenyl group having 2 to 20 carbon atoms, a substituted or unsubstituted alkynyl group having 2 to 20 carbon atoms, a substituted or unsubstituted silyl group, a substituted or unsubstituted aromatic hydrocarbon group having 6 to 30 ring carbon atoms and a substituted or unsubstituted heterocyclic group having 5 to 30 ring atoms; each pair of $R^{211}$ and $R^{212}$, $R^{212}$ and $R^{213}$, $R^{213}$ and $R^{214}$, $R^{215}$ and $R^{216}$, and $R^{216}$ and $R^{217}$ may be mutually bonded to form a saturated or unsaturated ring that may be substituted; $X^{21}$ is an oxygen atom or a sulfur atom; and $y^{21}$ is a single bond to the nitrogen atom in the formula (21).

Examples of the halogen atom, aromatic hydrocarbon group, heterocyclic group, alkyl group, alkoxy group, aryloxy group, arylthio group and arylamino group in the formulae (21) and (22) are the same as those listed above in connection with the formulae (1) to (11).

Examples of the silyl group in the formulae (21) and (22) are an unsubstituted silyl group, an alkylsilyl group having 1 to 30 carbon atoms and an arylsilyl group having 6 to 60 carbon atoms.

An example of the alkylsilyl group having 1 to 30 carbon atoms is a trialkylsilyl group containing the alky group listed above as an example of the above alkyl group having 1 to 20 carbon atoms and specific examples thereof are a trimethylsilyl group, triethylsilyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butylsilyl group, dimethyl-t-butylsilyl group, diethylisopropylsilyl group, vinyldimethylsilyl group, propyldimethylsilyl group and triisopropylsilyl group. The three alkyl groups may be mutually the same or different.

Examples of the arylsilyl group having 6 to 60 ring carbon atoms are an arylsilyl group, alkylarylsilyl group, dialkylarylsilyl group, diarylsilyl group, alkyldiarylsilyl group and triarylsilyl group. Plural aryl groups or alkyl groups may be mutually the same or different.

The dialkylarylsilyl group is exemplified by a dialkylarylsilyl group containing two of the alkyl groups listed above as examples of the above alkyl group having 1 to 20 carbon atoms and one of the above aromatic hydrocarbon groups having 6 to 30 ring carbon atoms. The dialkylarylsilyl group preferably has 8 to 30 carbon atoms. The two alkyl groups may be mutually the same or different.

The alkyldiarylsilyl group is exemplified by an alkyldiarylsilyl group containing one of the alkyl groups listed above as examples of the above alkyl group having 1 to 20 carbon atoms and two of the above aromatic hydrocarbon groups having 6 to 30 ring carbon atoms. The alkyldiarylsilyl group preferably has 13 to 30 carbon atoms. The two aryl groups may be mutually the same or different.

The triarylsilyl group is exemplified by a triarylsilyl group having three of the above aromatic hydrocarbon groups having 6 to 30 ring carbon atoms. The triarylsilyl group preferably has 18 to 30 carbon atoms. The three aryl groups may be mutually the same or different.

Examples of the arylsilyl group are a phenyldimethylsilyl group, diphenylmethylsilyl group, diphenyl-t-butylsilyl group and triphenylsilyl group.

The alkenyl group having 2 to 20 carbon atoms in the formula (22) may be linear, branched or cyclic and examples thereof are vinyl, propenyl, butenyl, oleyl, eicosapentaenyl, docosahexaenyl, styryl, 2,2-diphenylvinyl, 1,2,2-triphenylvinyl and 2-phenyl-2-propenyl. Among the above examples of the alkenyl group, a vinyl group is preferable.

The alkynyl group having 2 to 20 carbon atoms in the formula (22) may be linear, branched or cyclic and examples thereof are ethynyl, propynyl and 2-phenylethynyl. Among the above examples of the alkynyl group, an ethynyl group is preferable.

Examples of the saturated or unsaturated ring formed by the mutually bonded $R^{211}$ and $R^{212}$, $R^{212}$ and $R^{213}$, $R^{213}$ and $R^{214}$, $R^{215}$ and $R^{216}$, or $R^{216}$ and $R^{217}$ are: cycloalkanes having 4 to 12 ring carbon atoms such as cyclobutane, cyclopentane, cyclohexane, adamantane and norbornane; cycloalkens having 4 to 12 ring carbon atoms such as cyclobutene, cyclopentene, cyclohexene, cycloheptene and cyclooctene; cycloalkadienes having 6 to 12 ring carbon atoms such as cyclohexadiene, cycloheptadiene and cyclooctadiene; and aromatic rings having 6 to 50 ring carbon atoms such as benzene, naphthalene, phenanthrene, anthracene, pyrene, chrysene and acenaphthylene. Examples of the substituent is the same as those listed above.

In the formula (21), $Ar^{21}$ and $Ar^{23}$ each preferably represent a heterocyclic group represented by the formula (22).

In the formula (21), $R^{21}$ to $R^{28}$ each preferably represent a hydrogen atom.

More preferably, $R^{22}$ and $R^{26}$ in the formula (21) each represent a substituted or unsubstituted alkyl group having 1 to 20 carbon atoms or a substituted or unsubstituted alkylsilyl group having 3 to 30 carbon atoms, and $R^{21}$, $R^{23}$, $R^{24}$, $R^{25}$, $R^{27}$ and $R^{28}$ each represent a hydrogen atom.

$X^{21}$ in the formula (22) preferably represents an oxygen atom.

Particularly preferably, each of $Ar^{21}$ to $Ar^{24}$ is represented by the formula (22) and $X^{21}$ represents an oxygen atom.

Specific examples of the pyrene derivative represented by the formula (21) are shown below, but the pyrene derivative is not limited thereto.

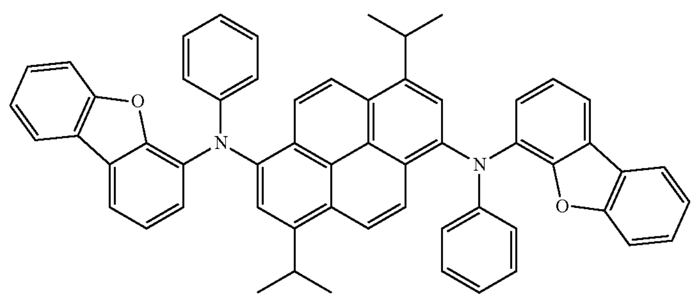

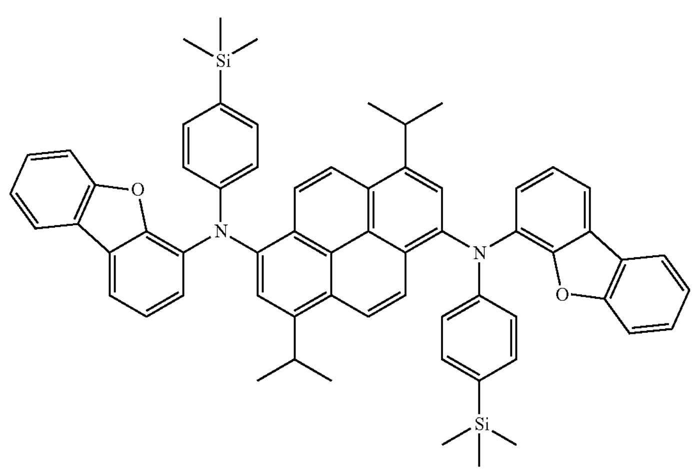

-continued
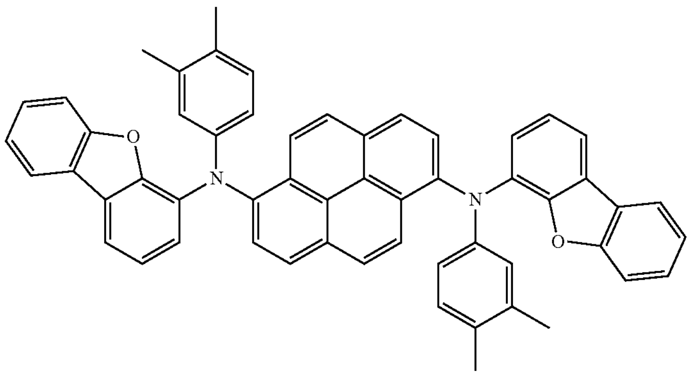
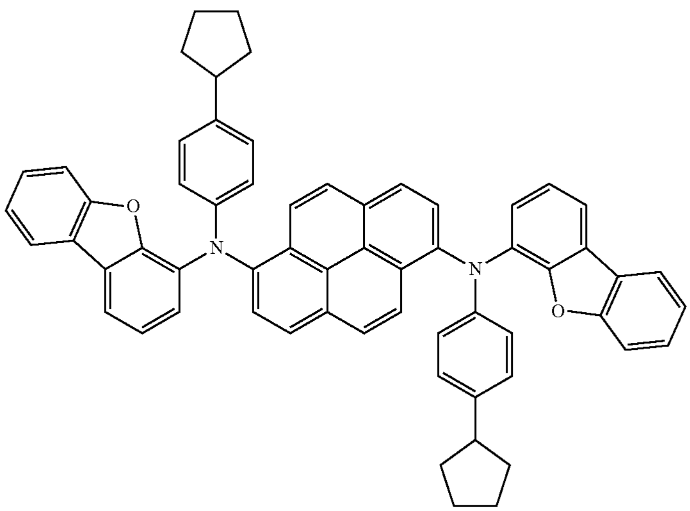
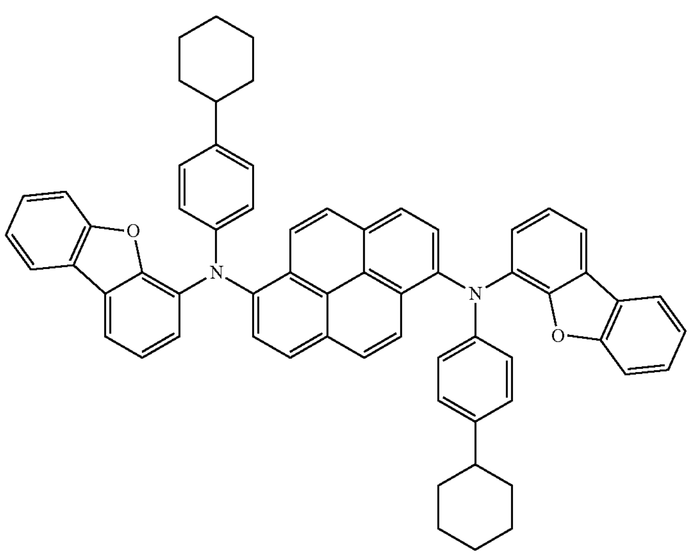

-continued
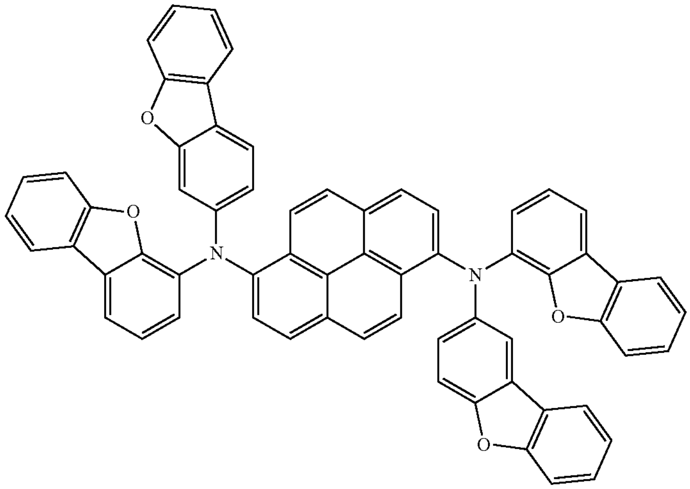
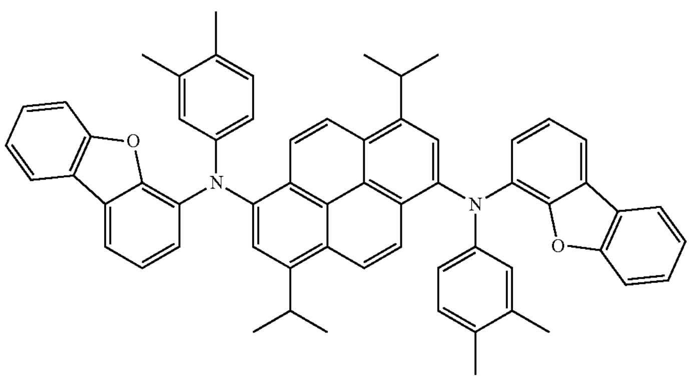
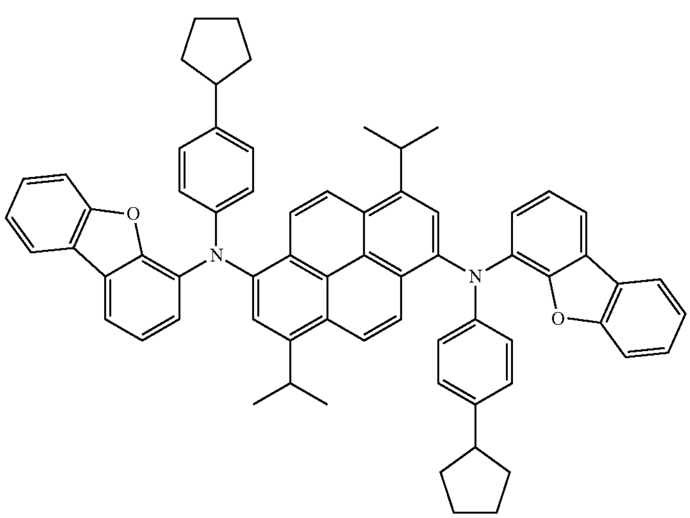

-continued
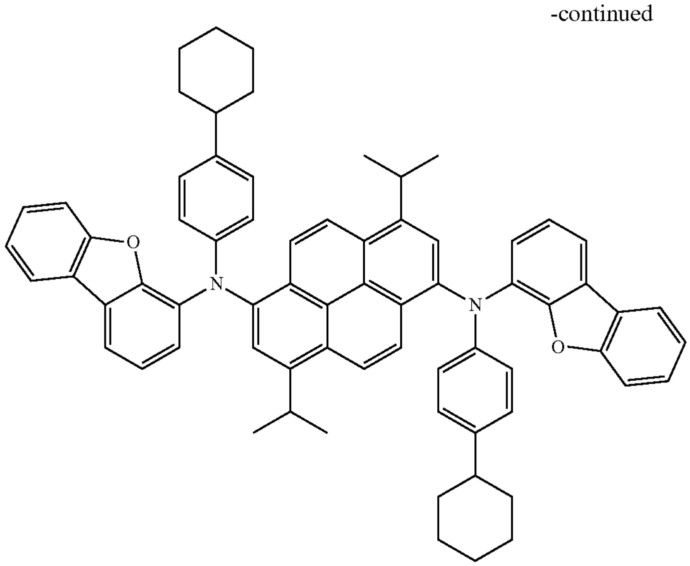
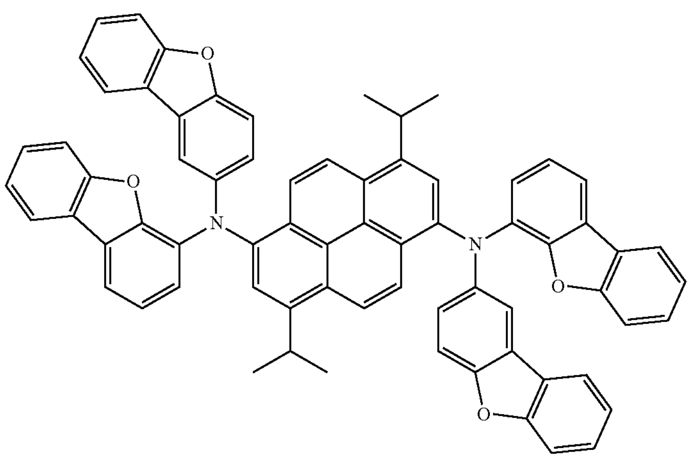
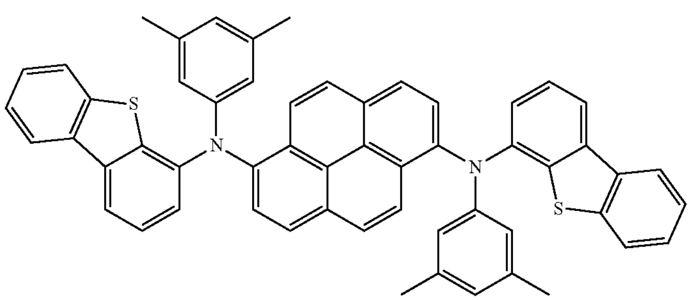
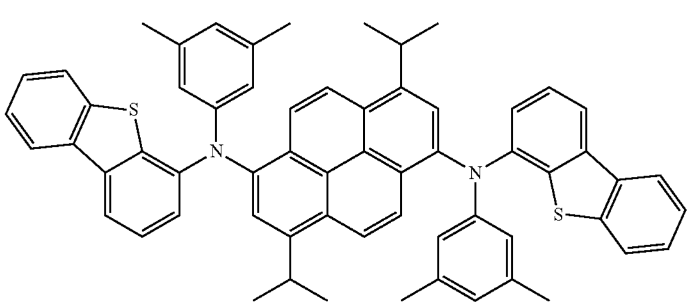

-continued
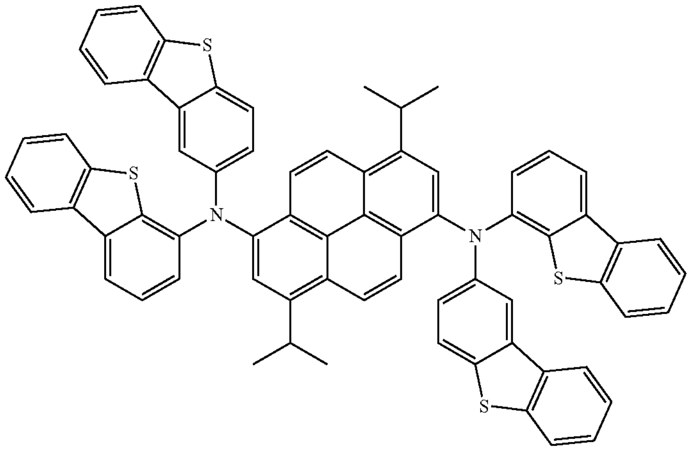
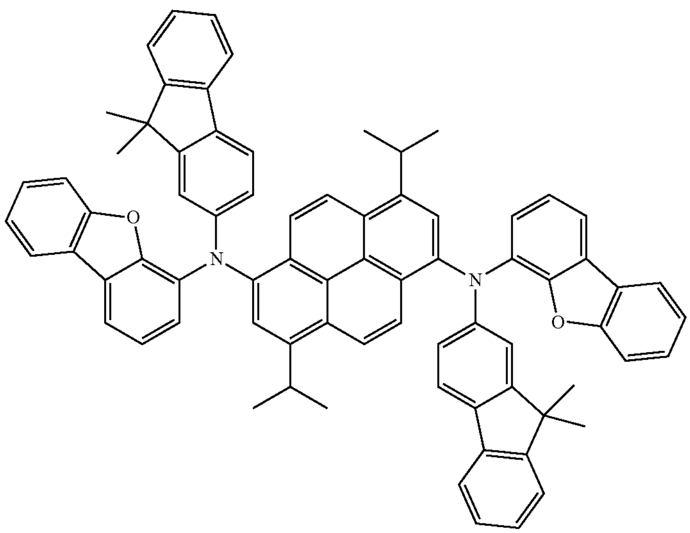
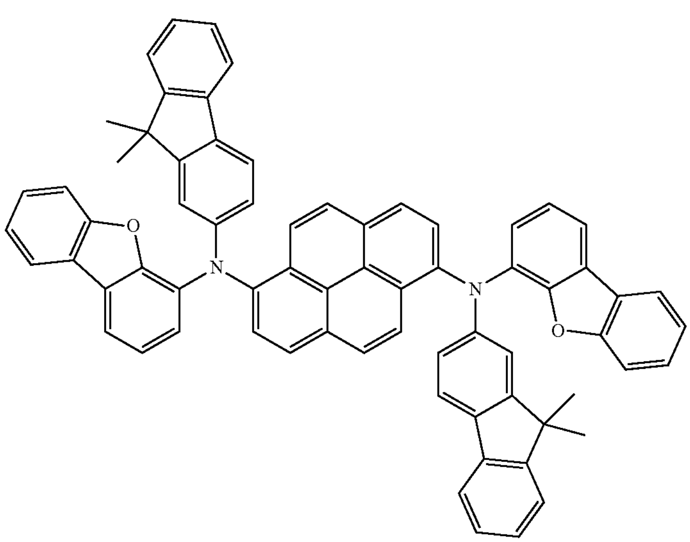

-continued
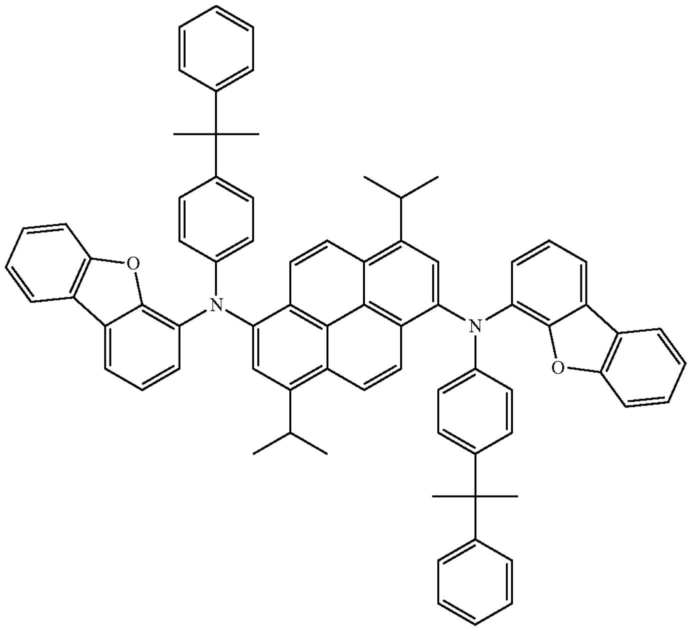
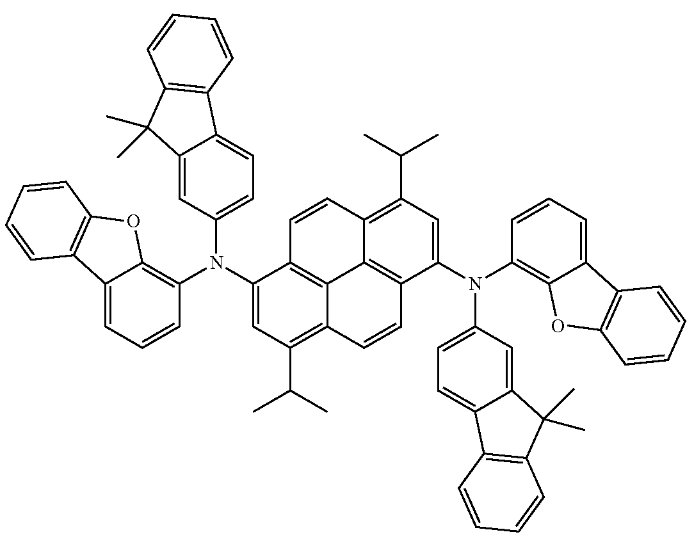

-continued
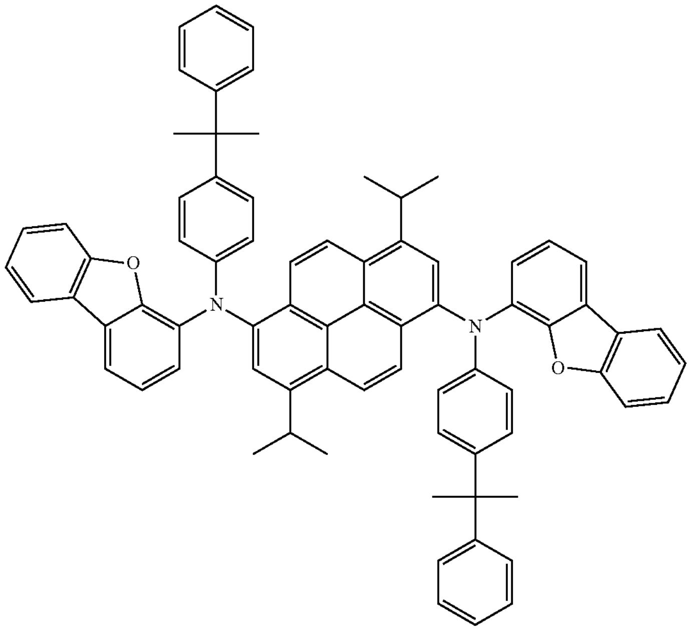
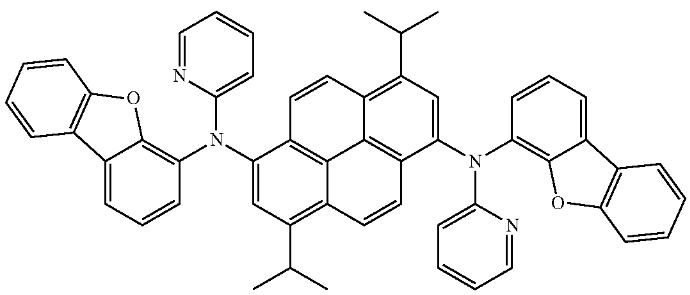
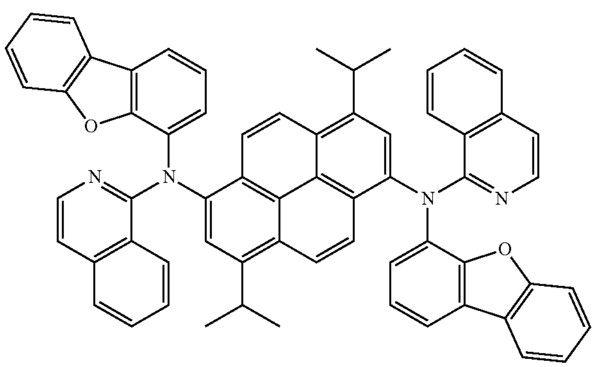
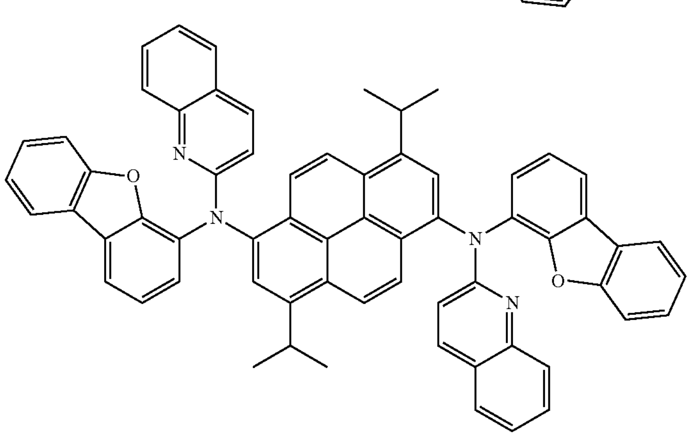

-continued
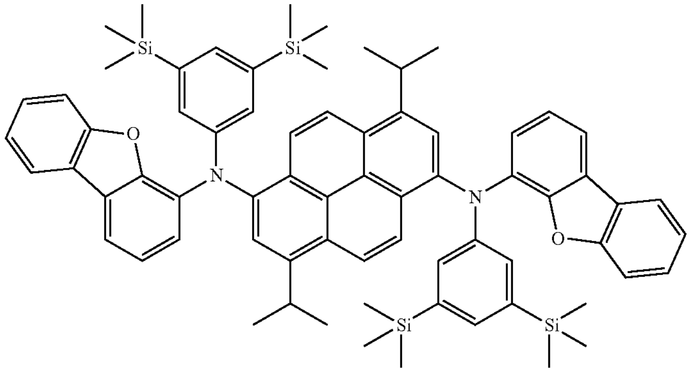
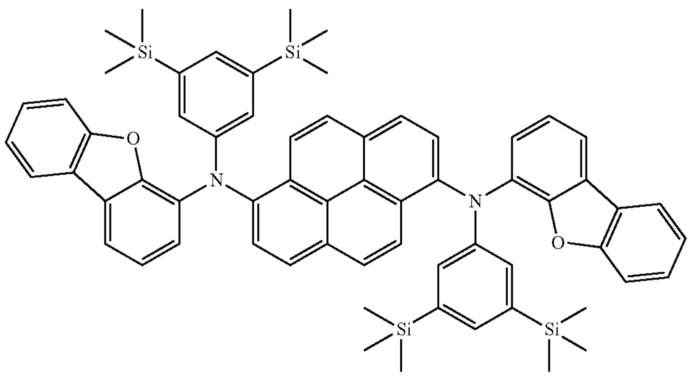
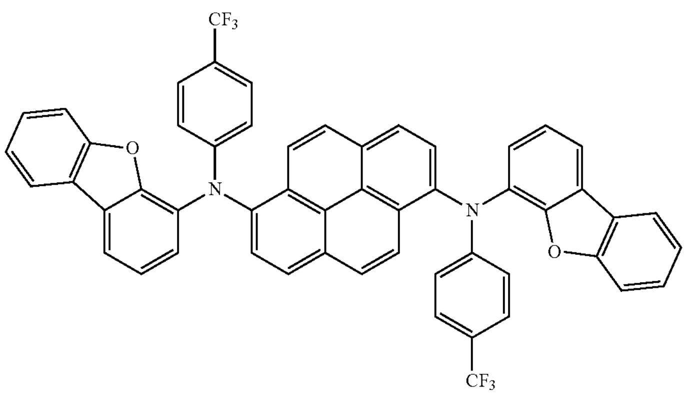
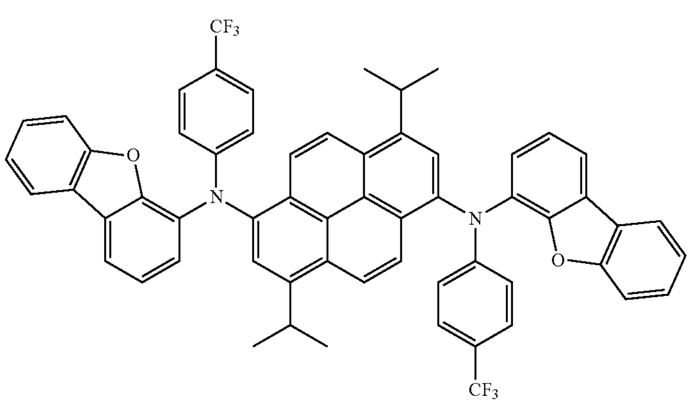

-continued
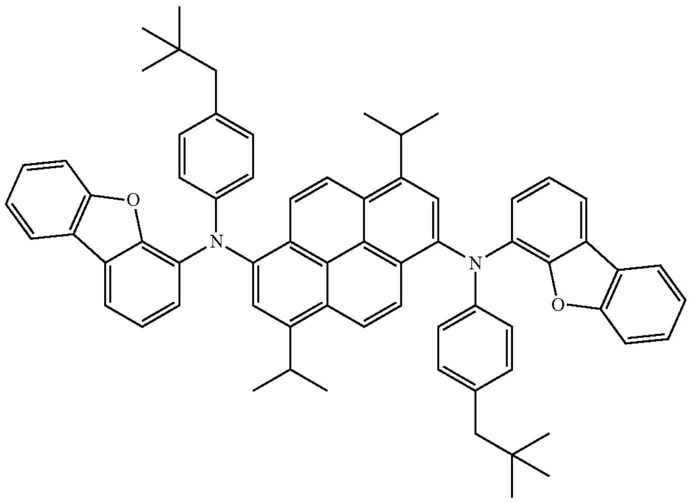
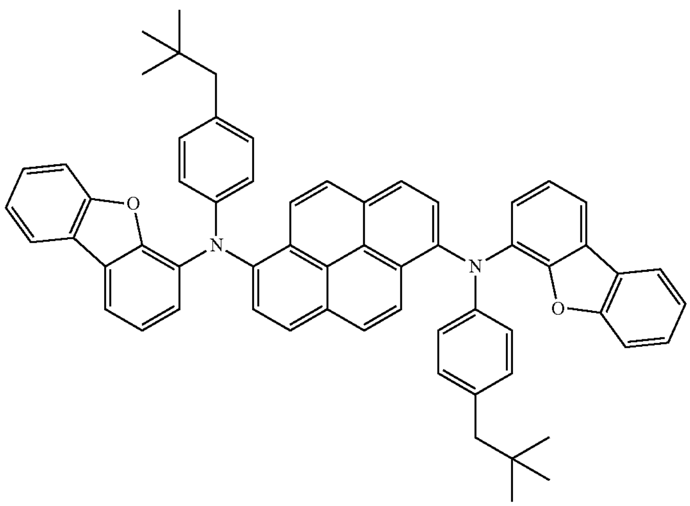
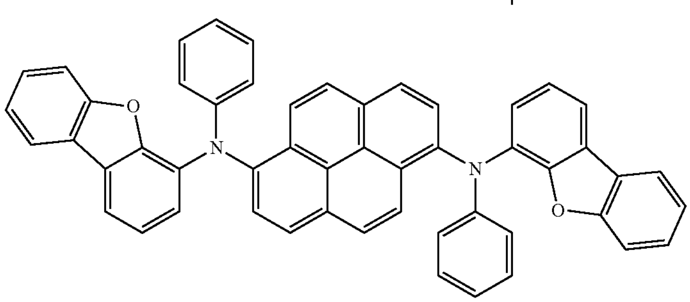
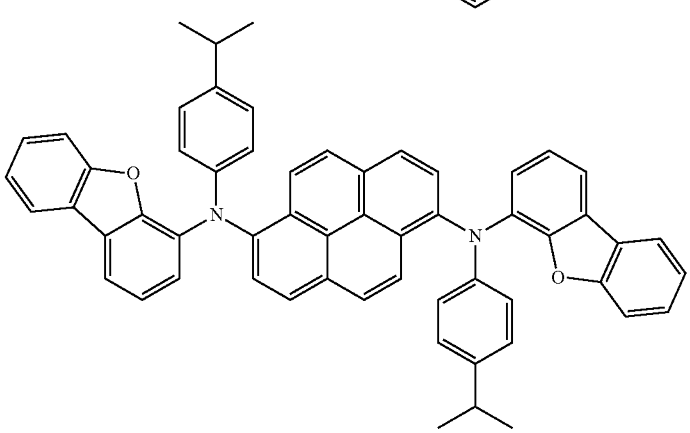

-continued
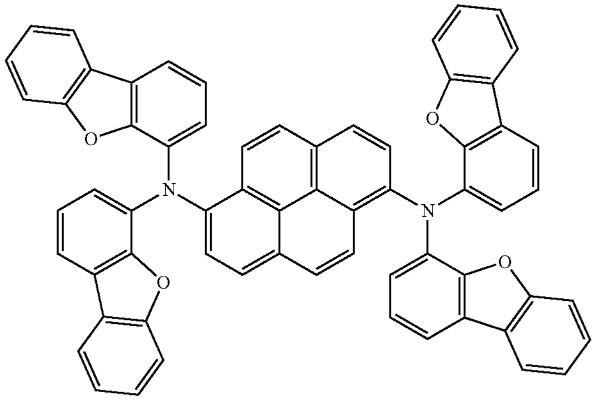
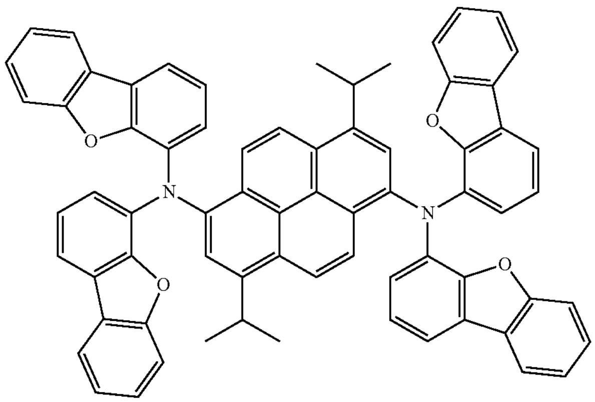
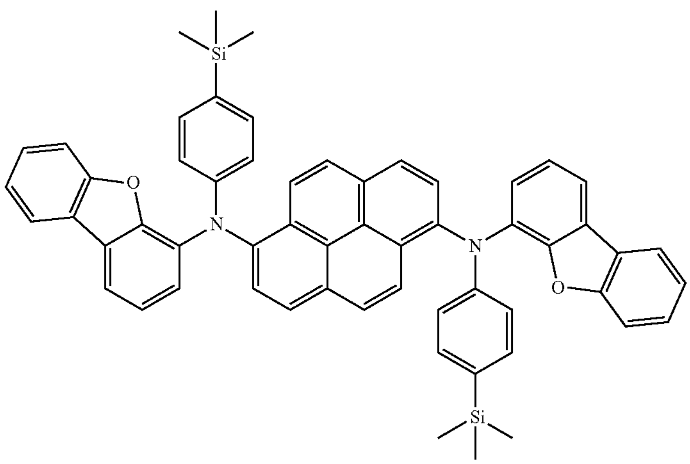
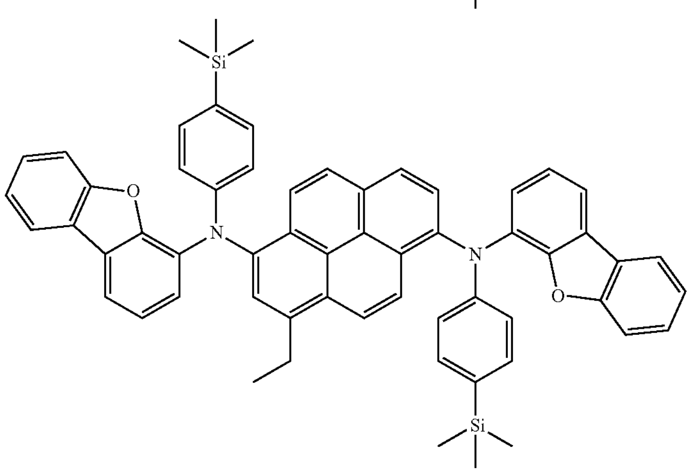

-continued
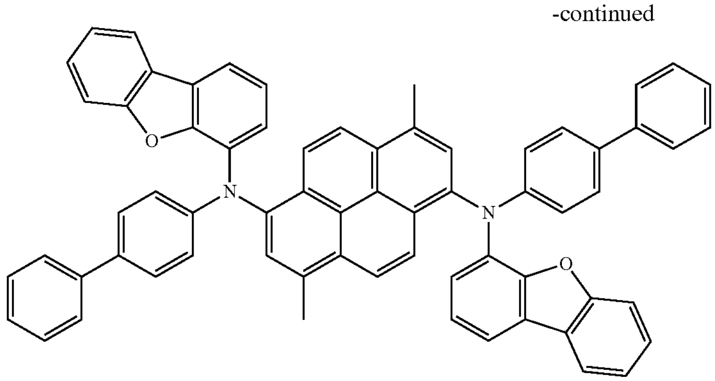
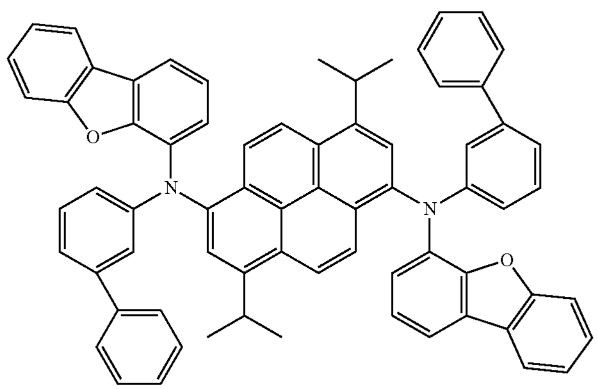
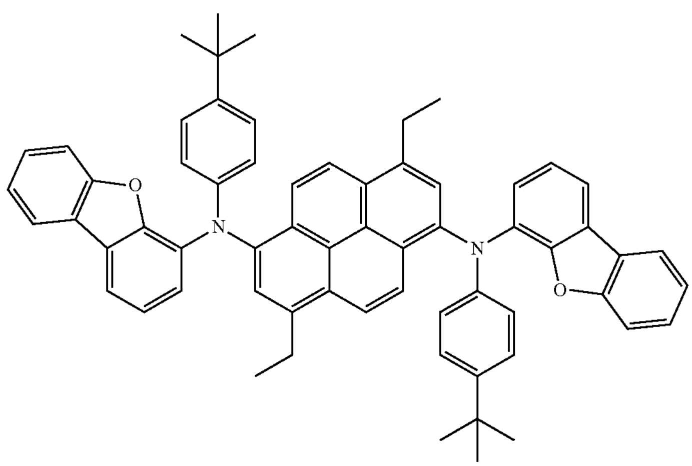
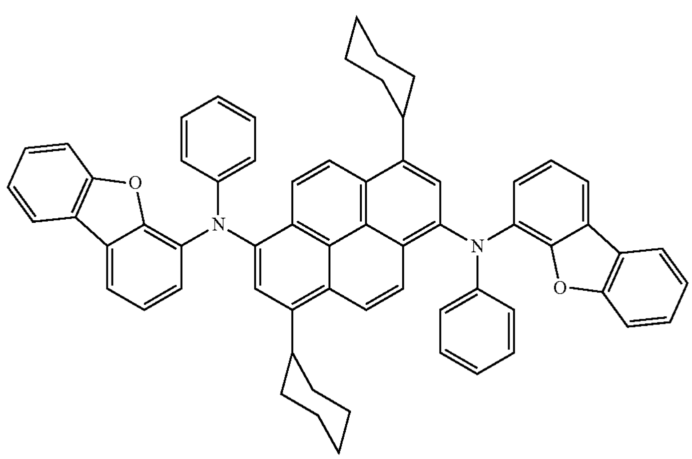

-continued
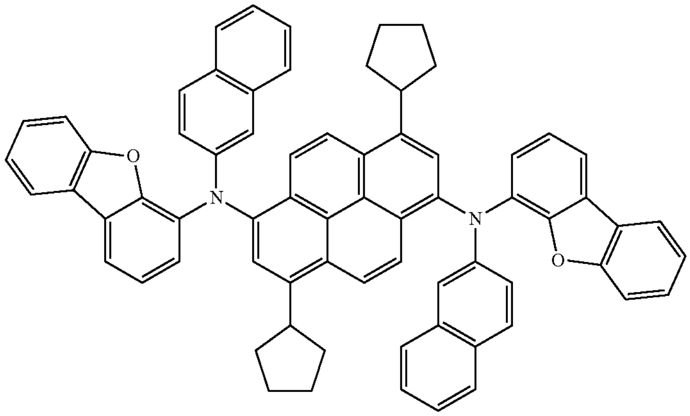
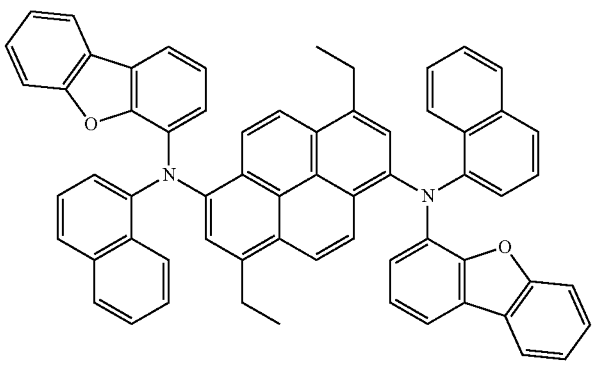
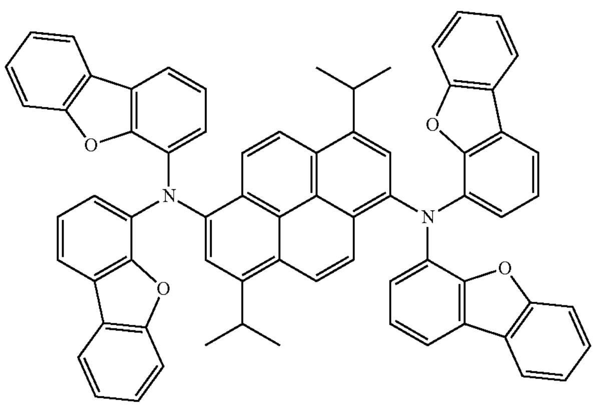
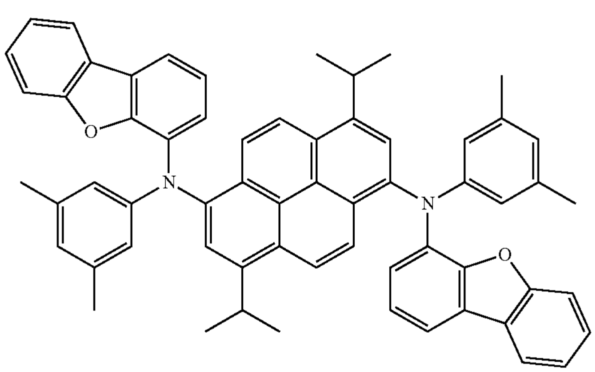

-continued
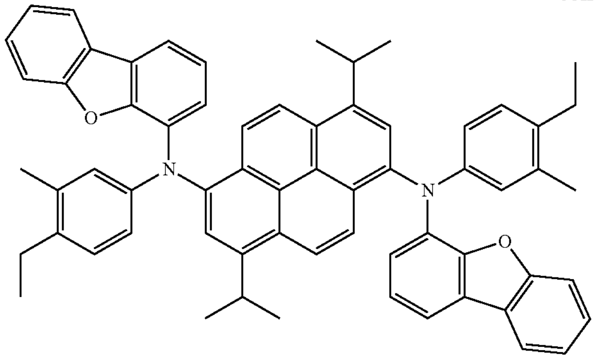
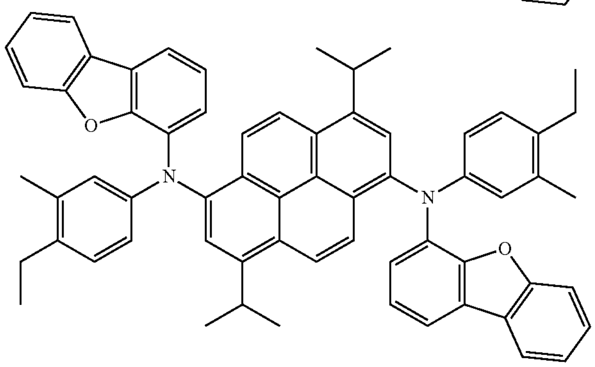
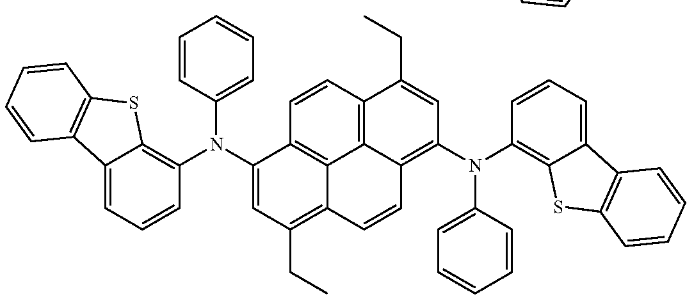
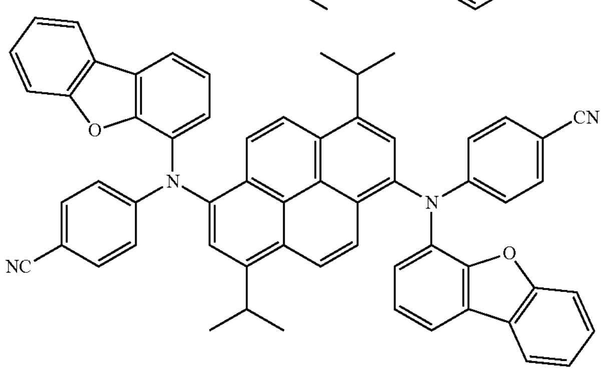
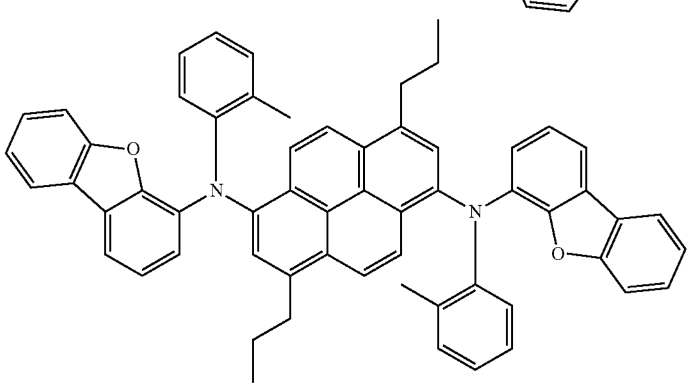

-continued
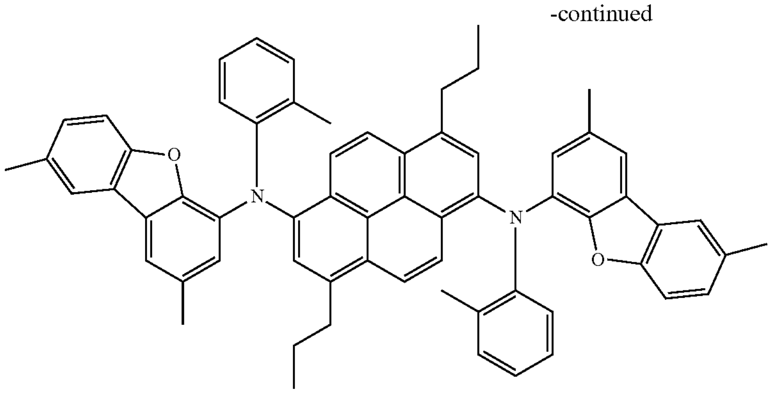
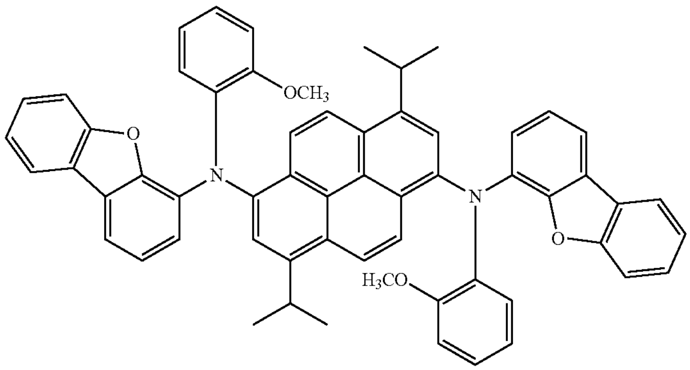
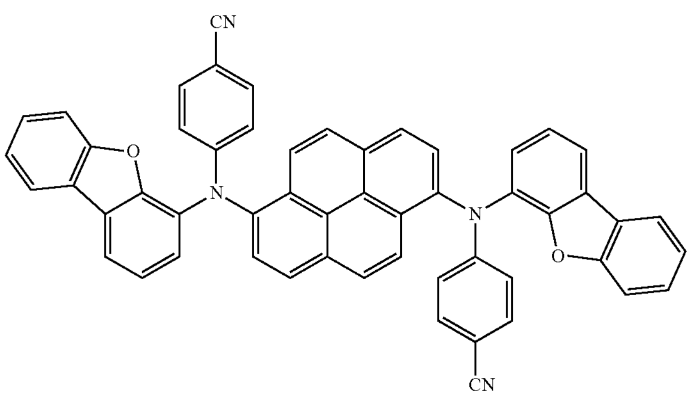
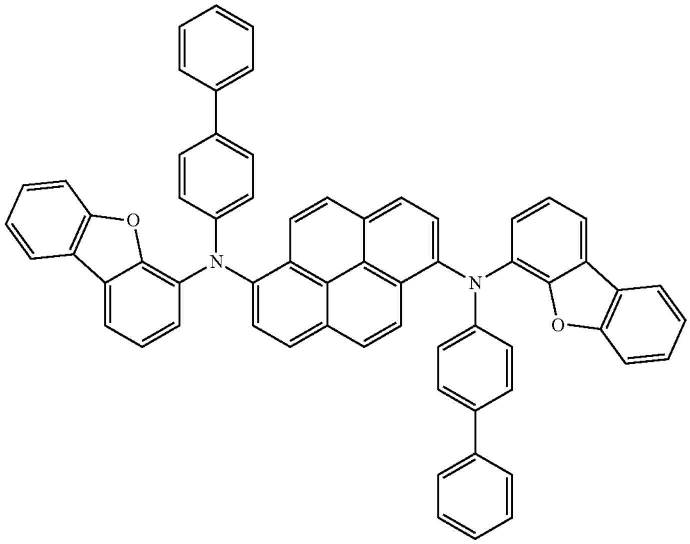

-continued
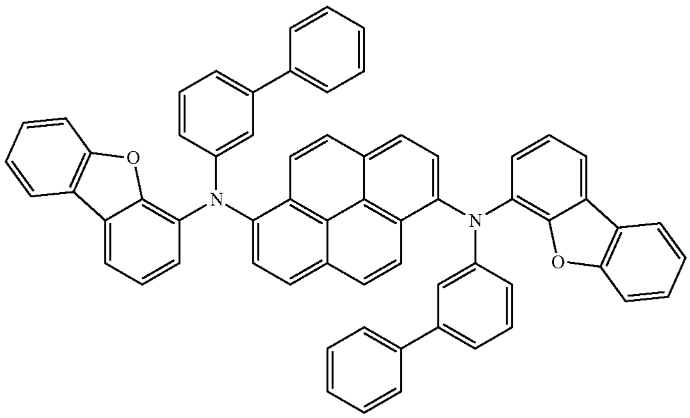
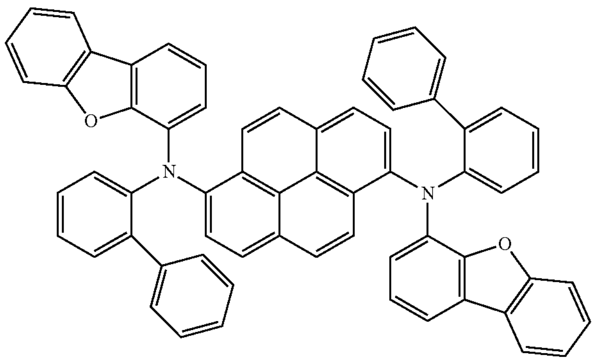
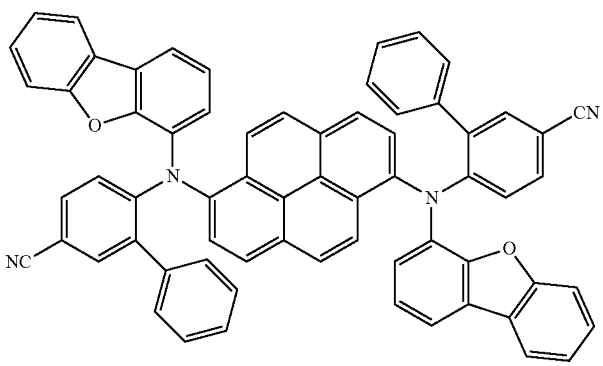
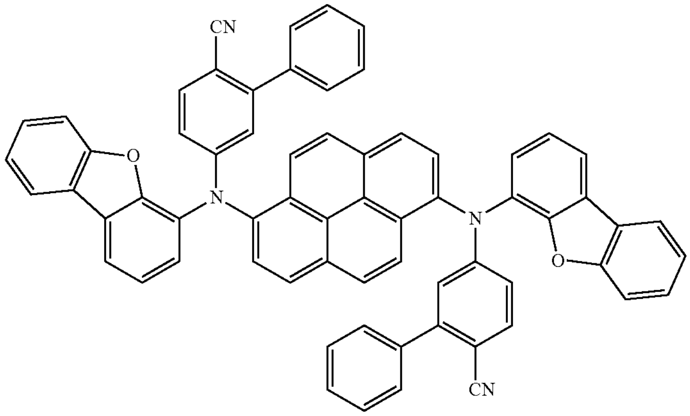

-continued
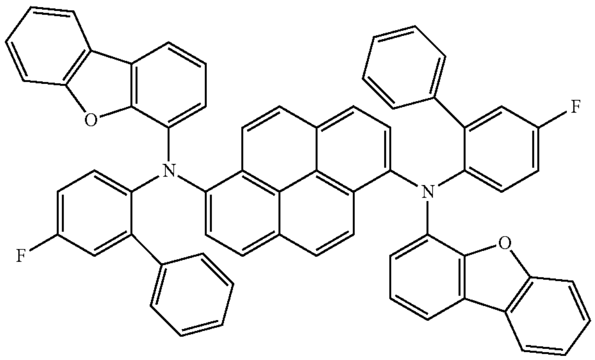
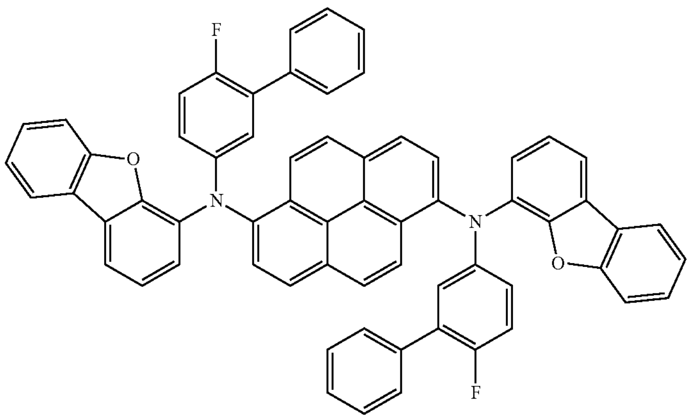
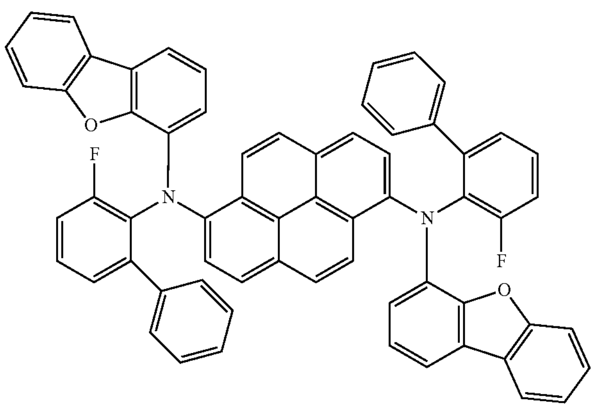
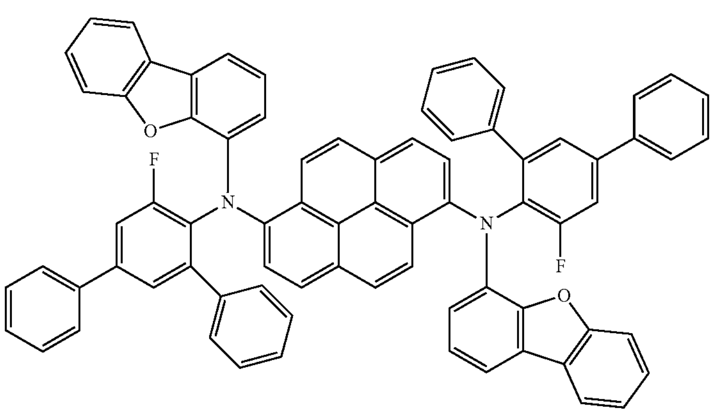

-continued
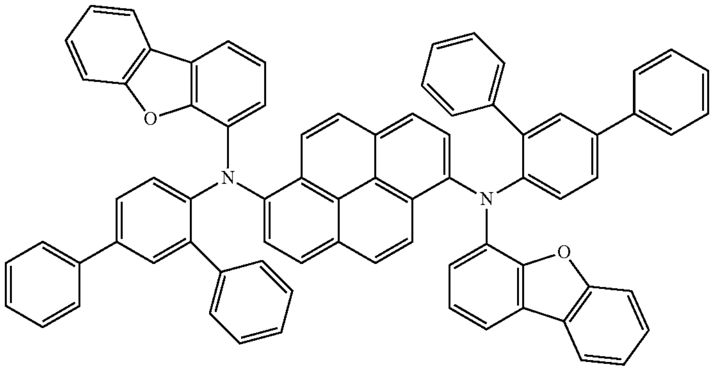
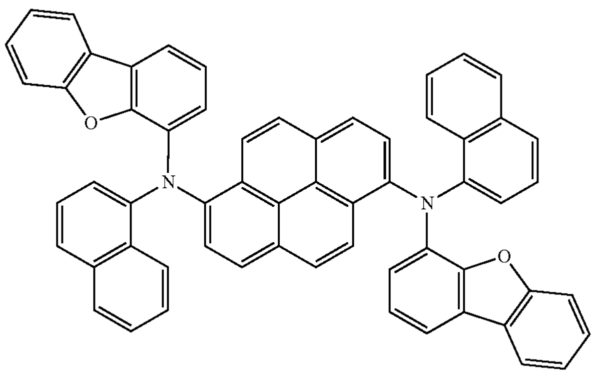
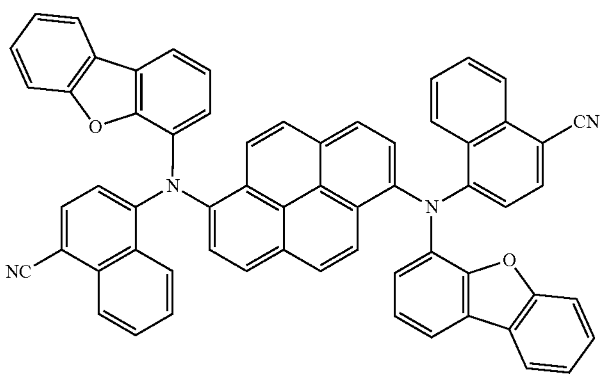
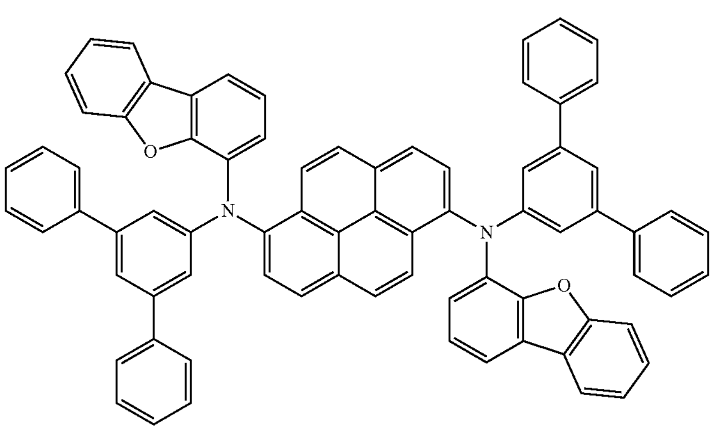

-continued
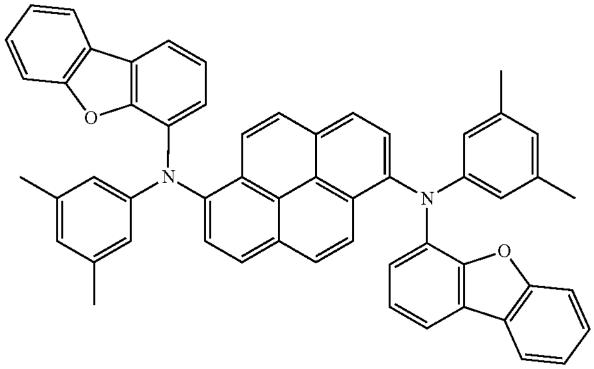
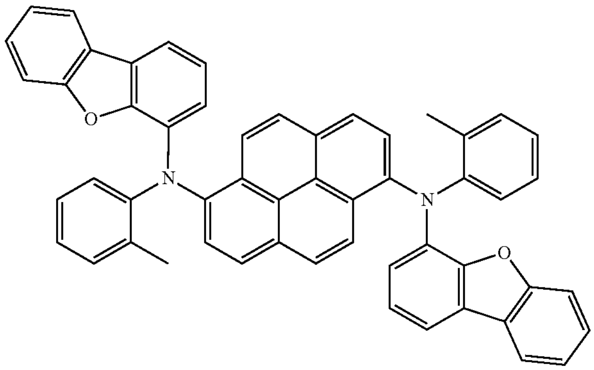
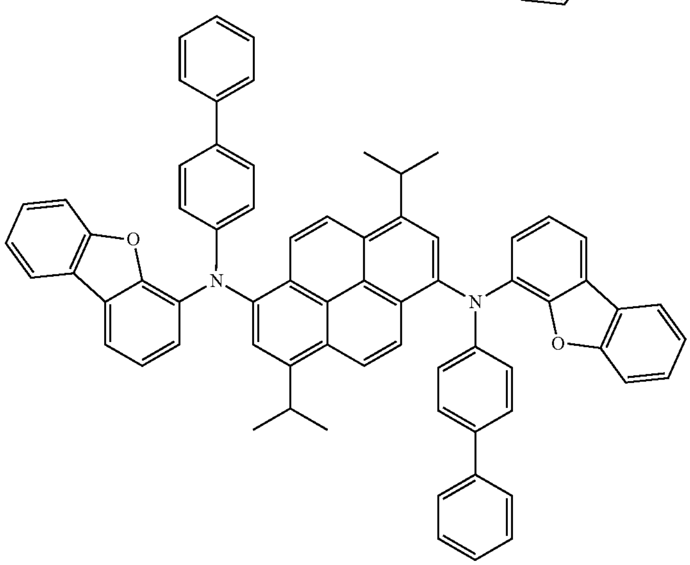
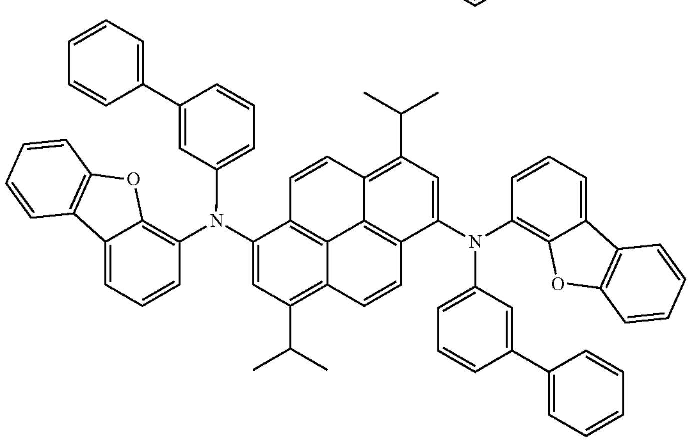

-continued
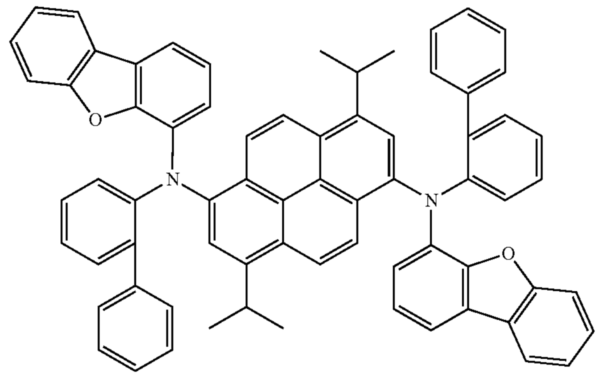
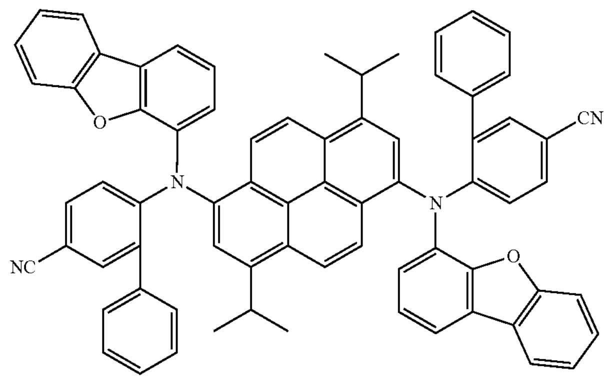
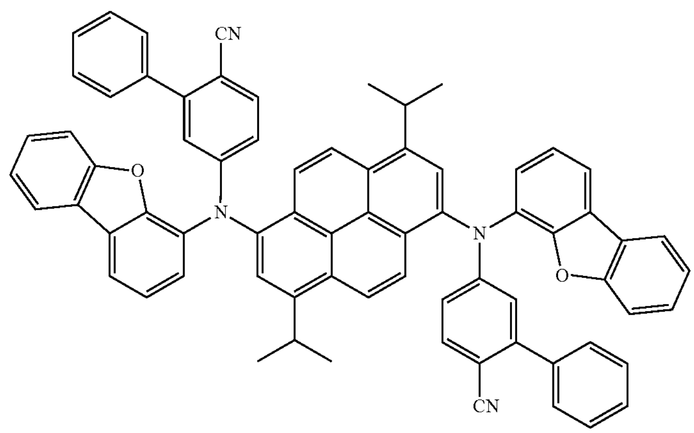
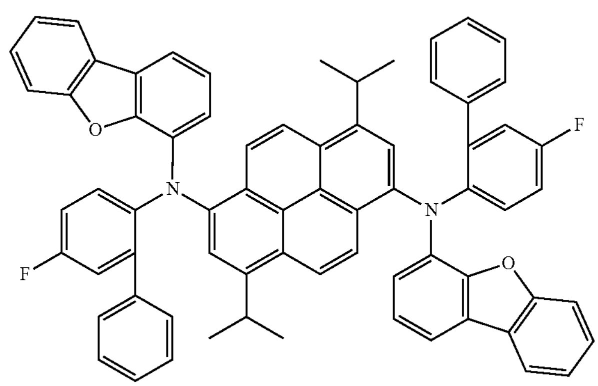

-continued
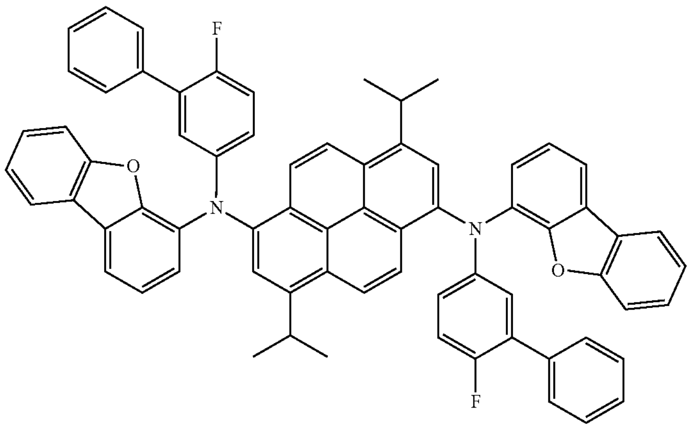
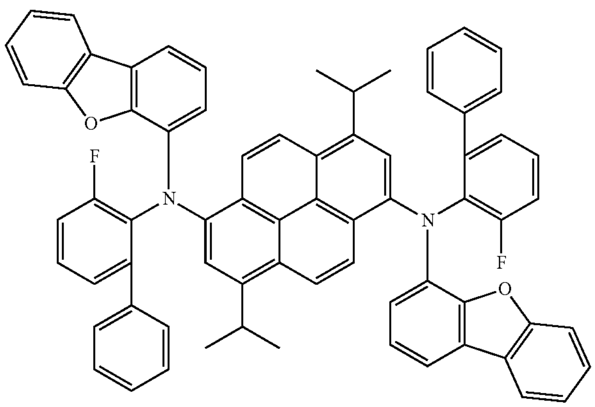
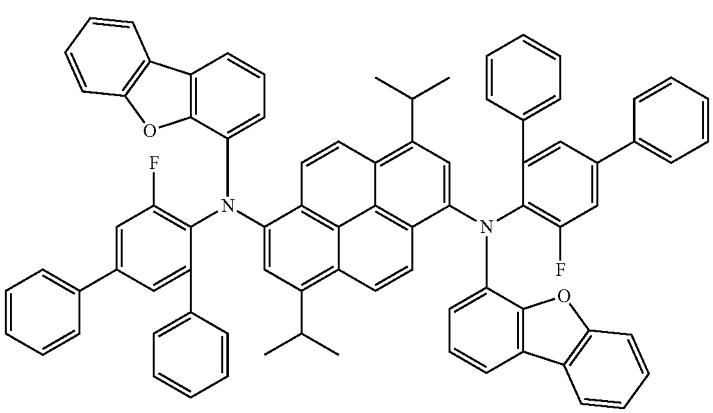
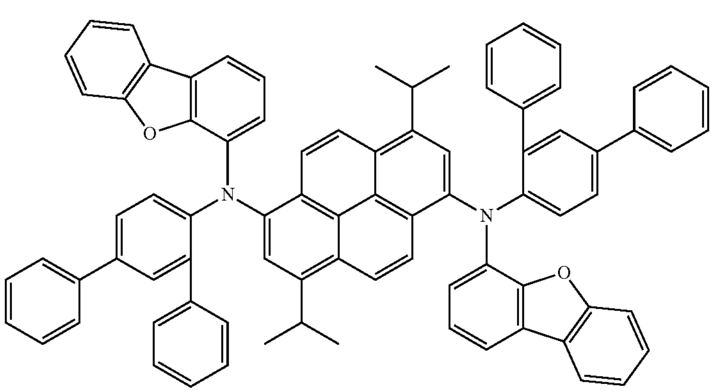

-continued
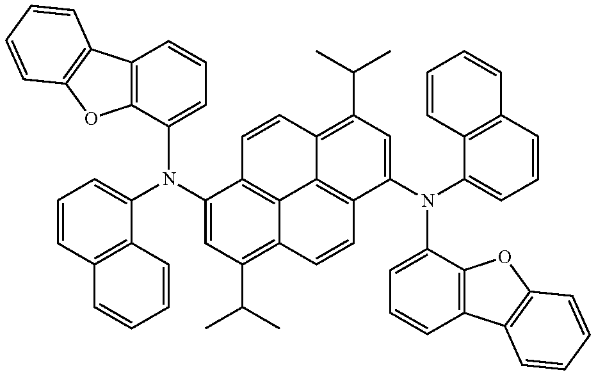
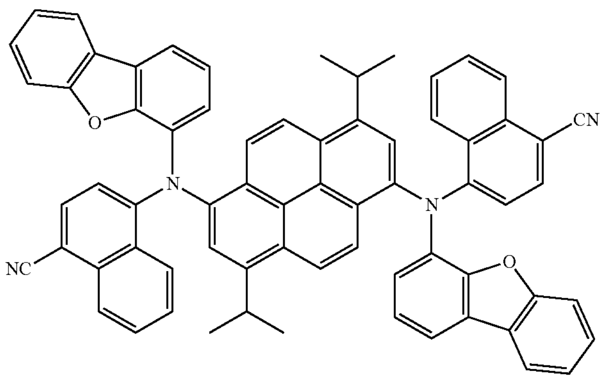
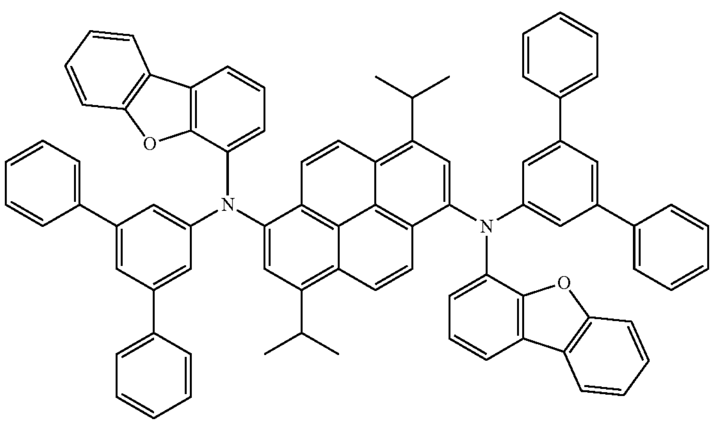
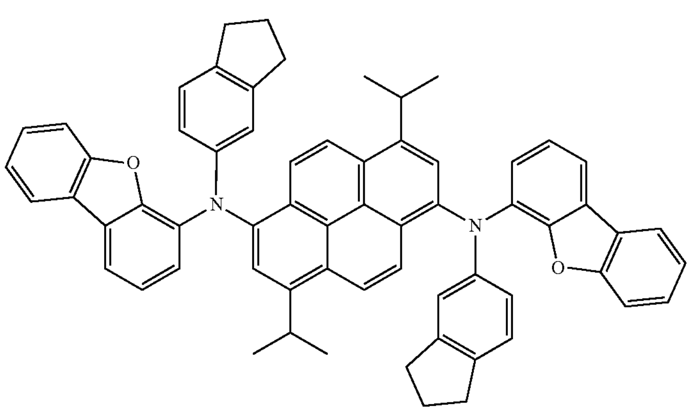

-continued
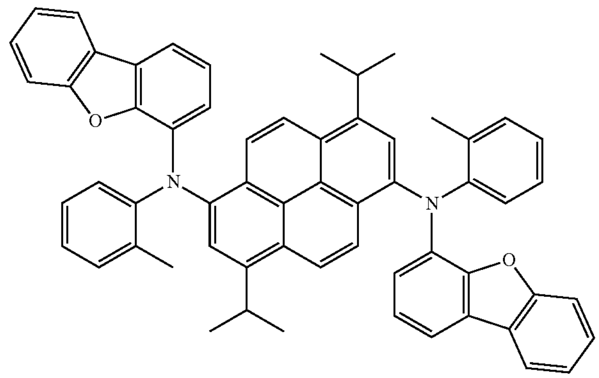
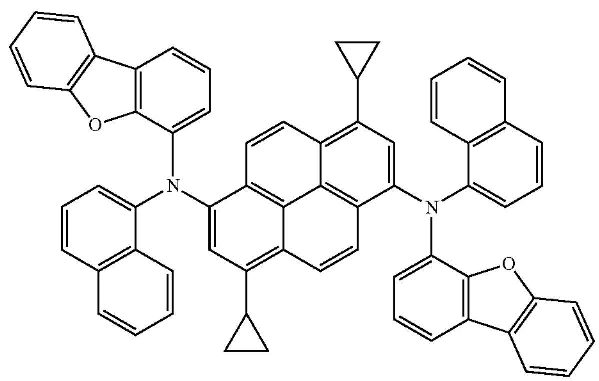
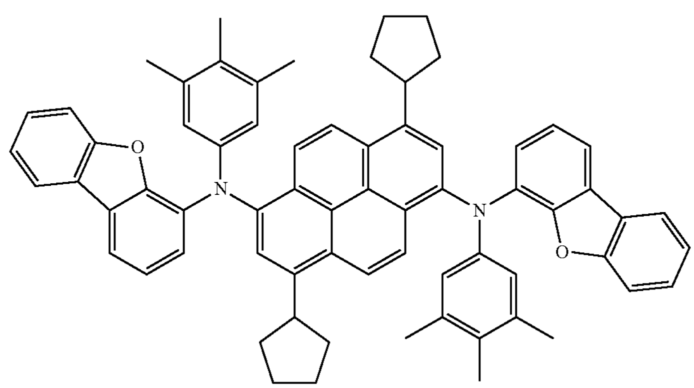
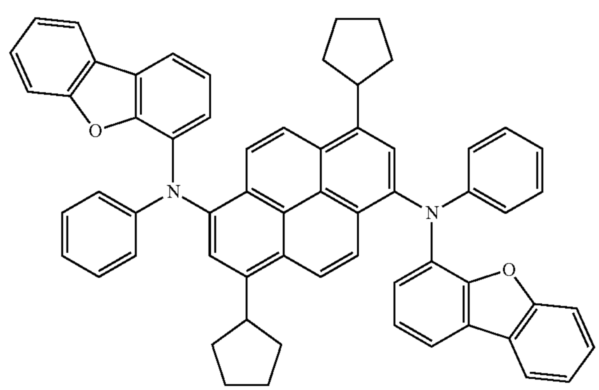

-continued
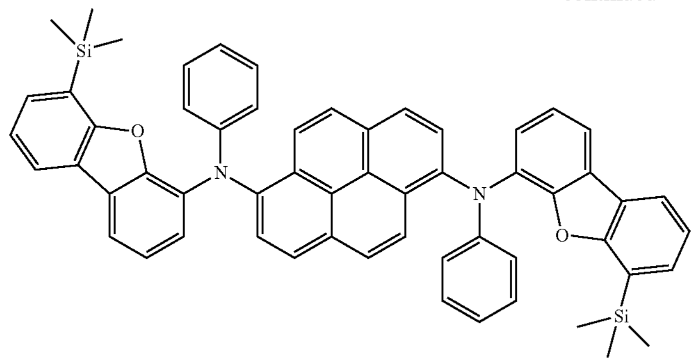
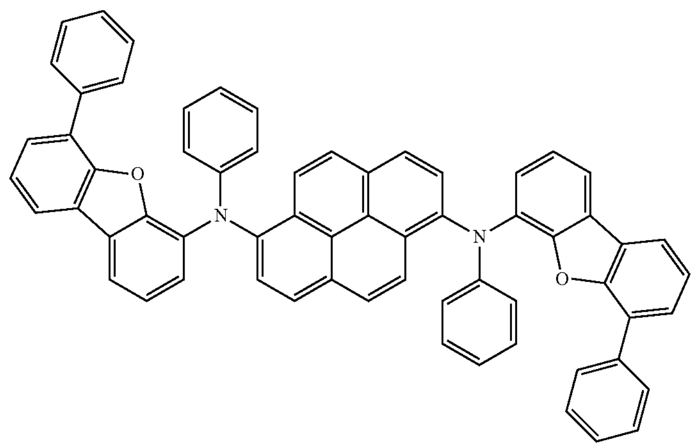
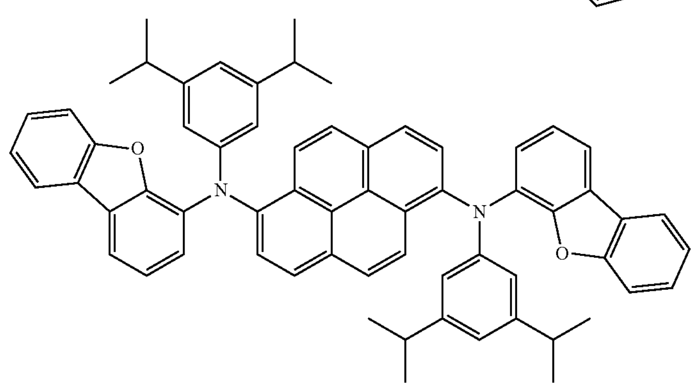
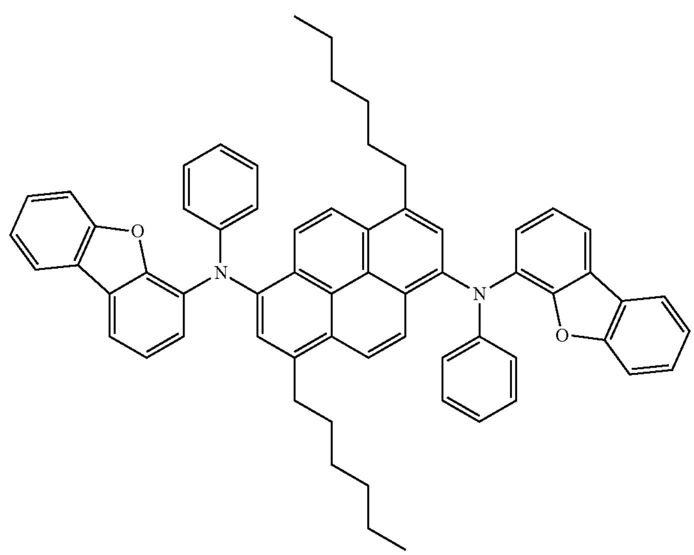

-continued
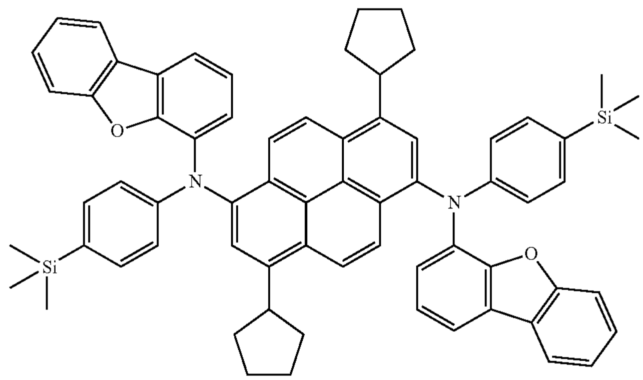
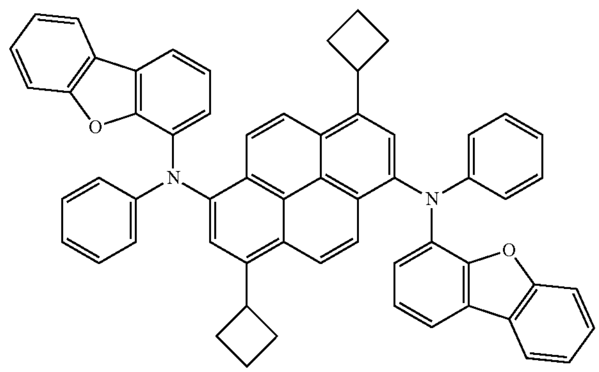
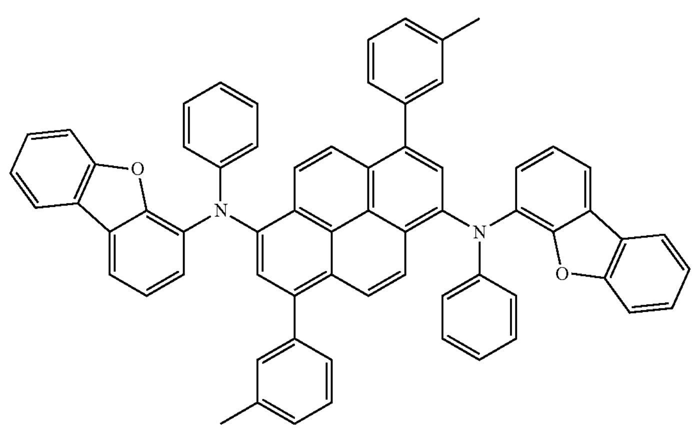
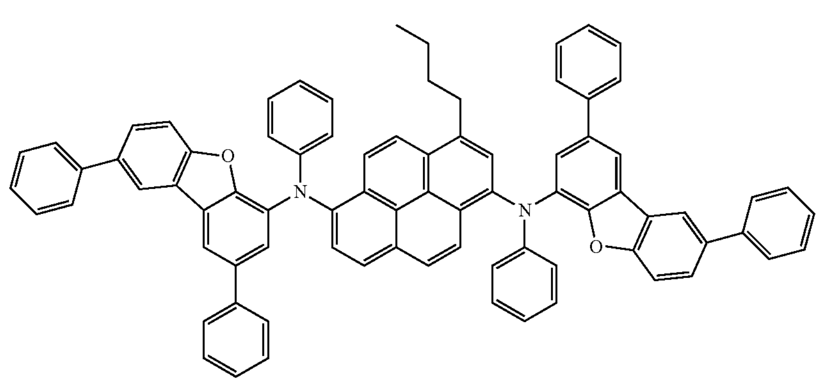

-continued
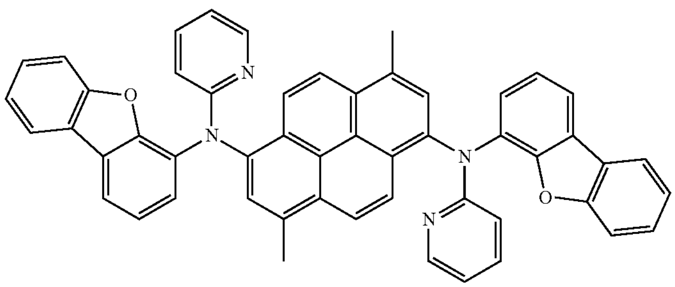
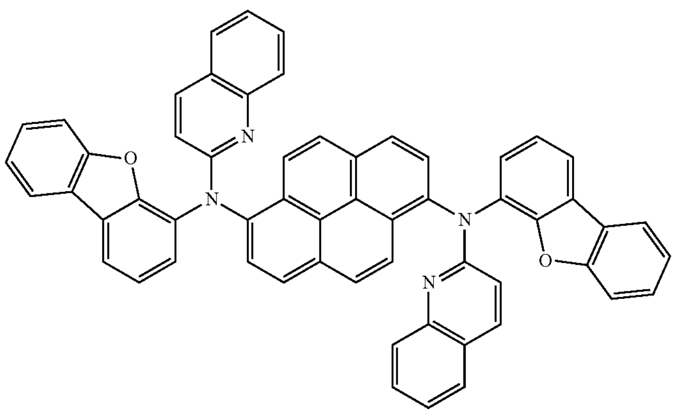
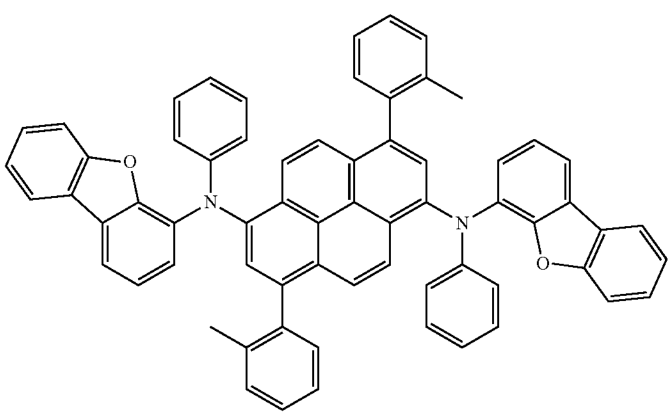
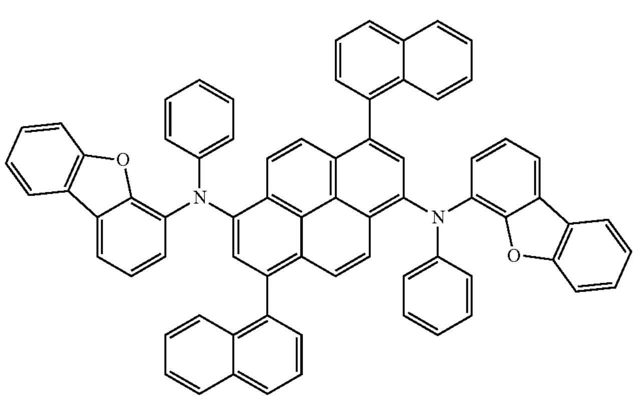

-continued
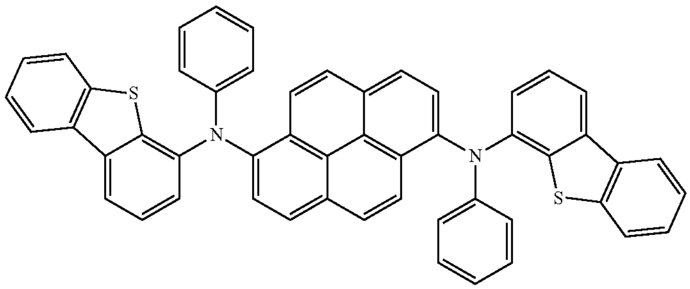
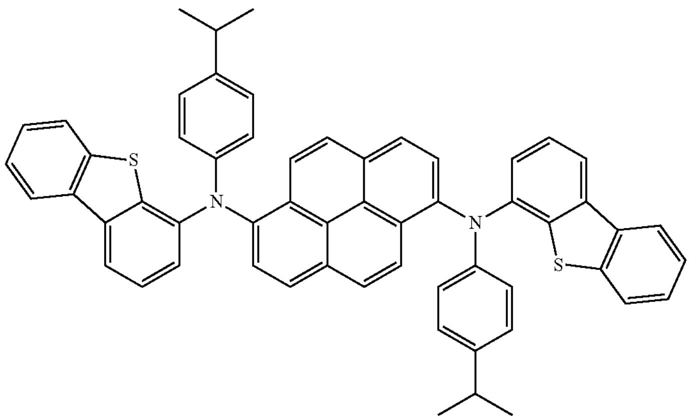
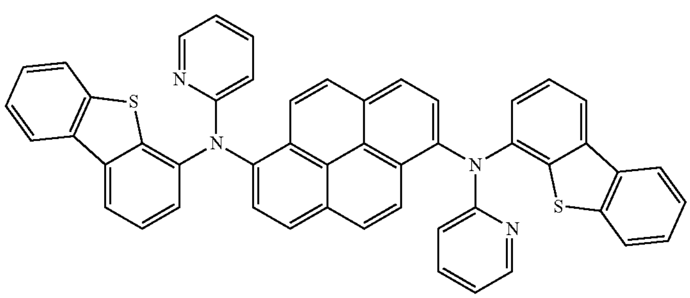
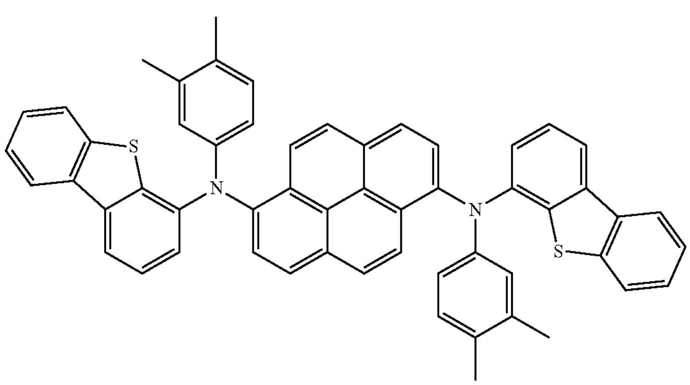

-continued
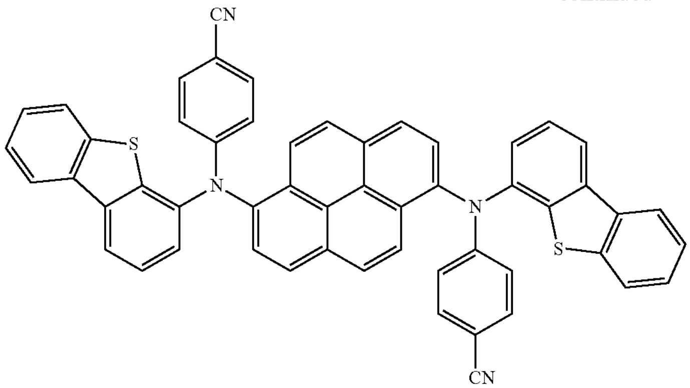
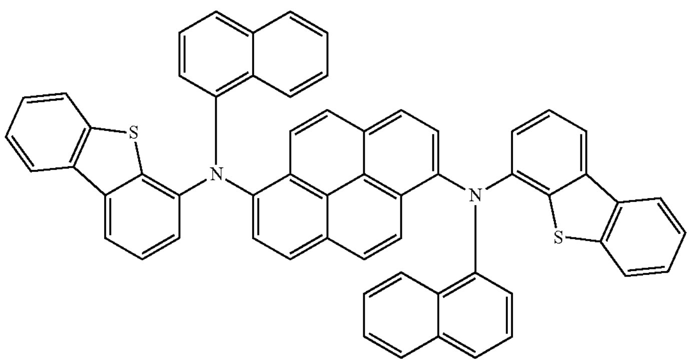
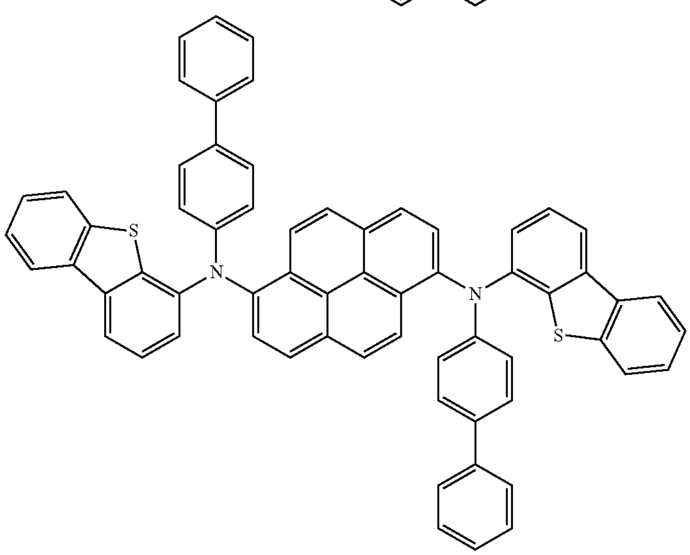
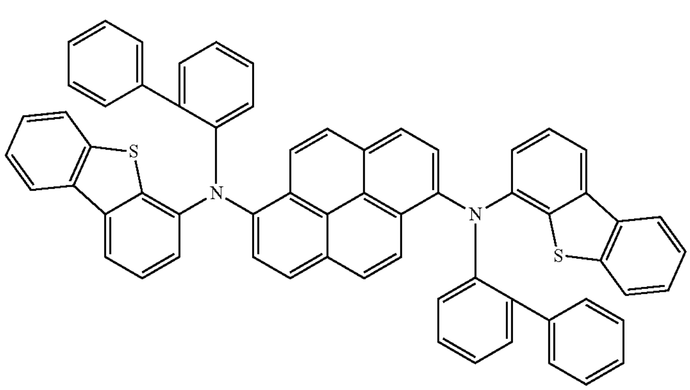

-continued
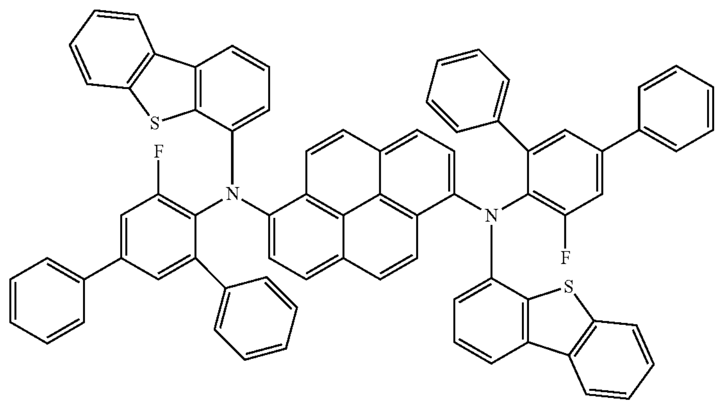
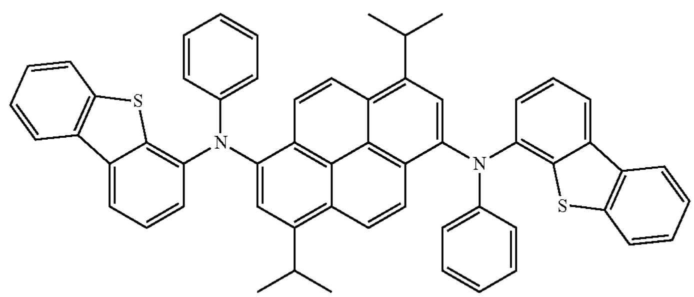
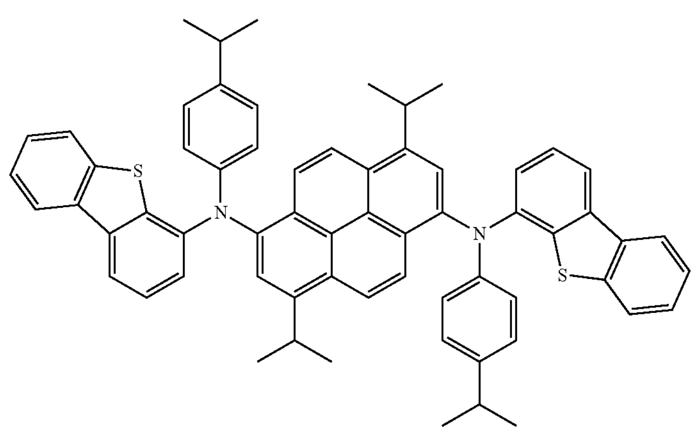
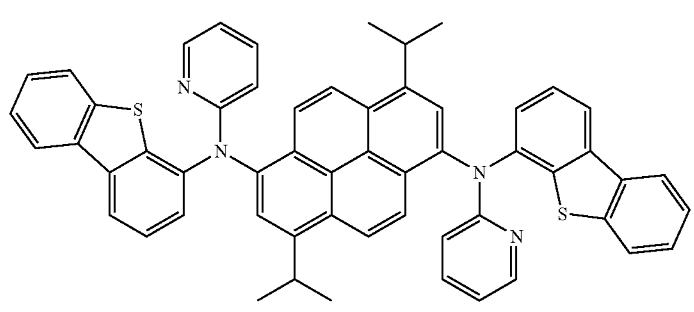

-continued
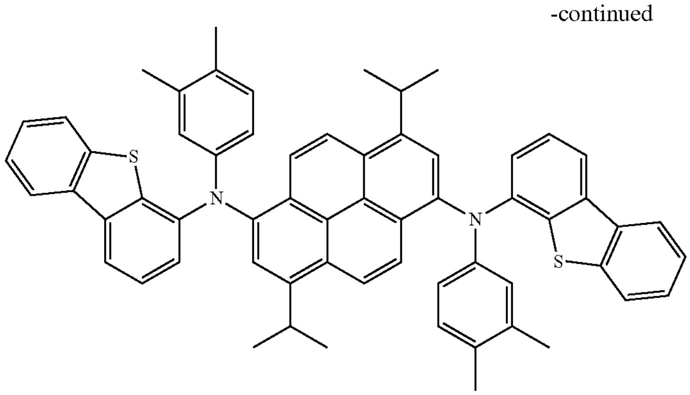
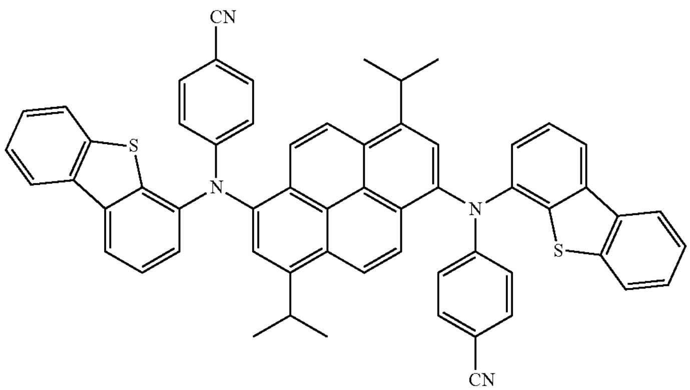
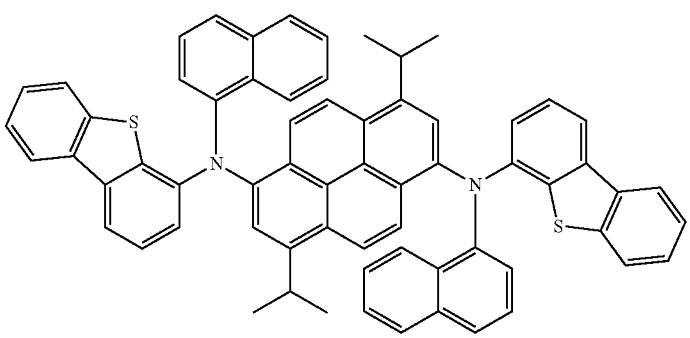
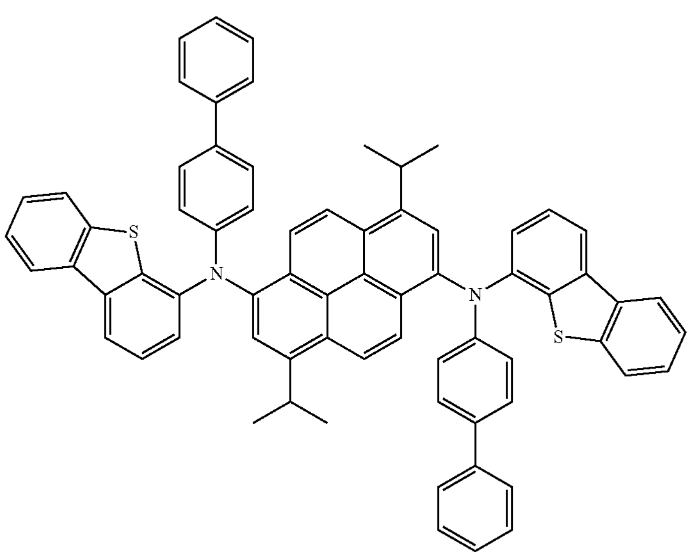

-continued
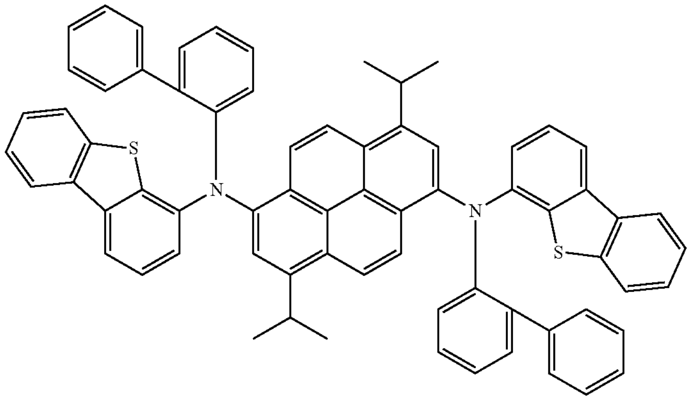
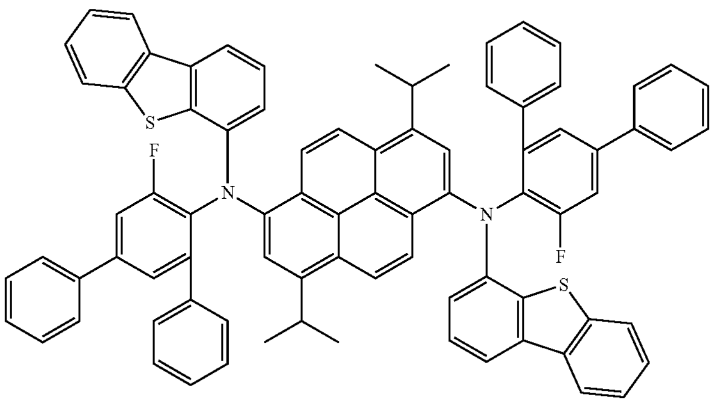
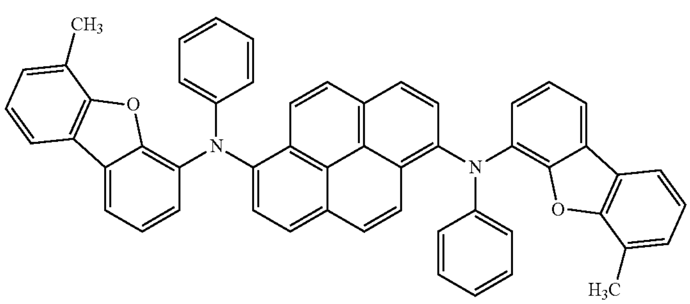
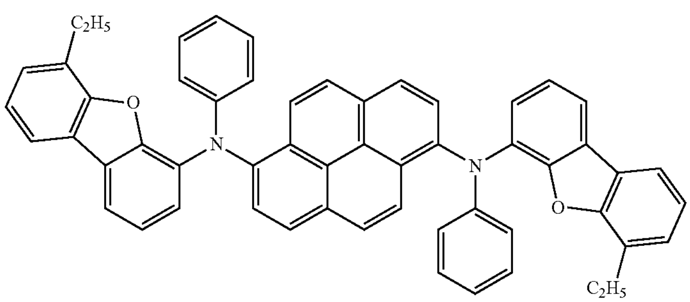
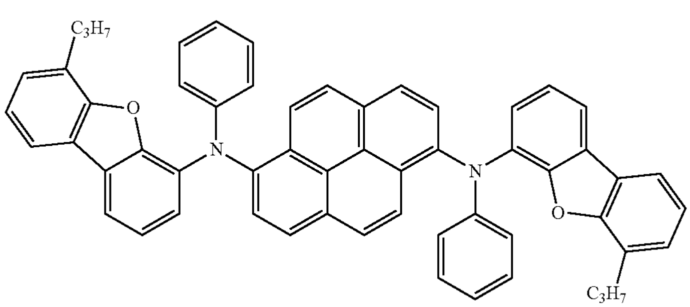

-continued
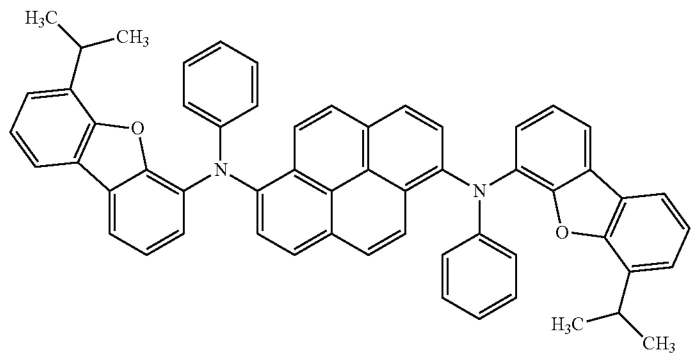
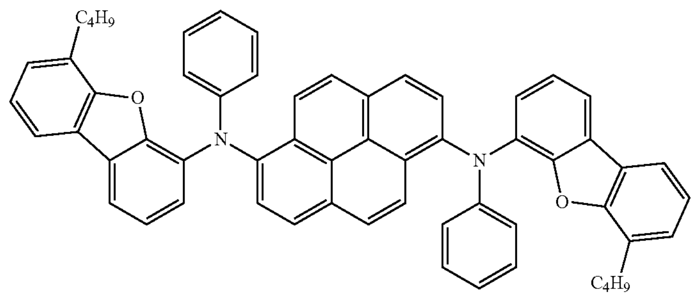
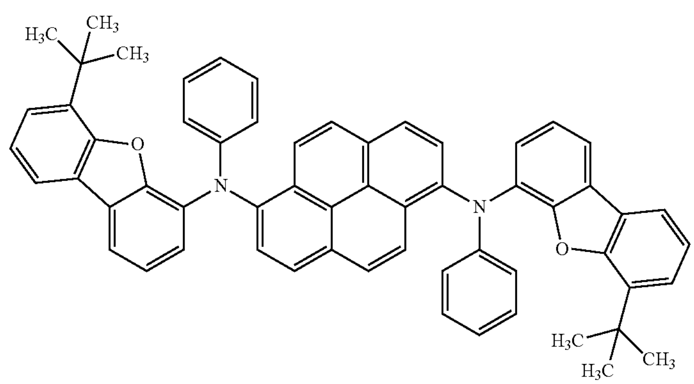
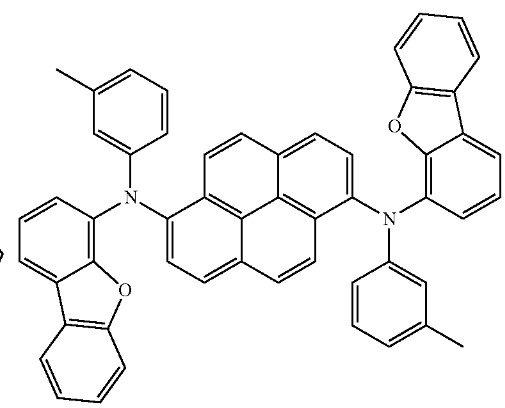
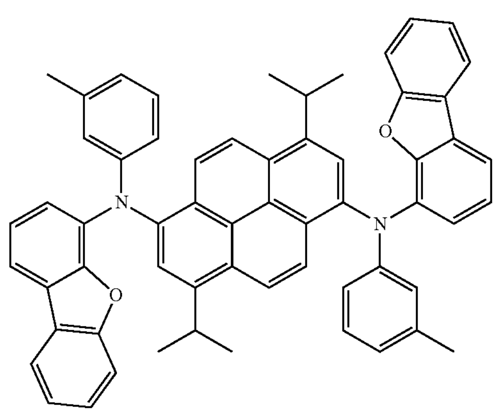
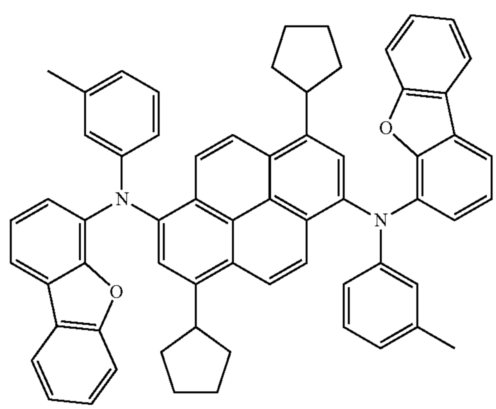

-continued
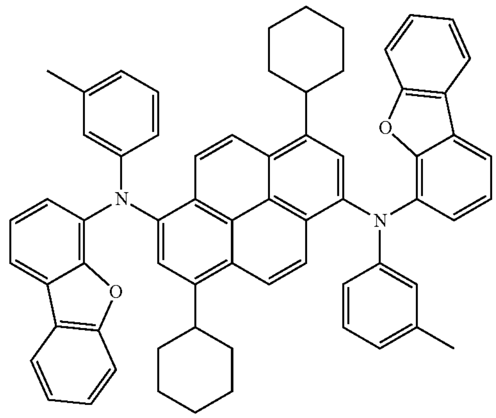
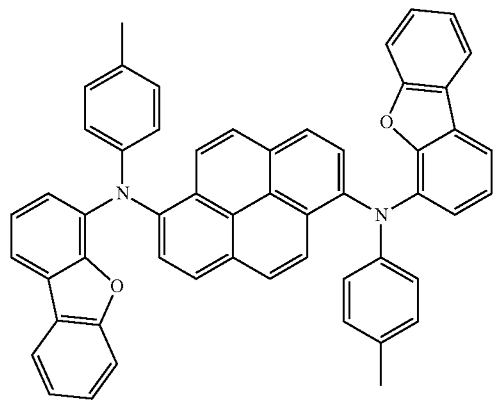
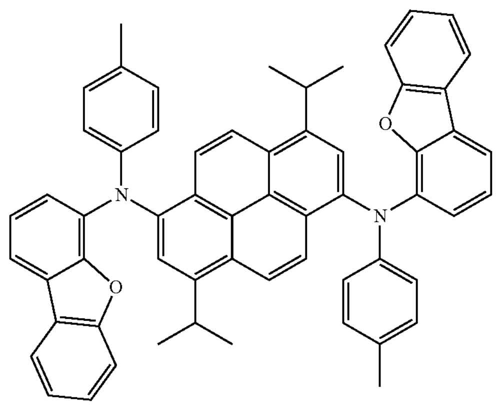
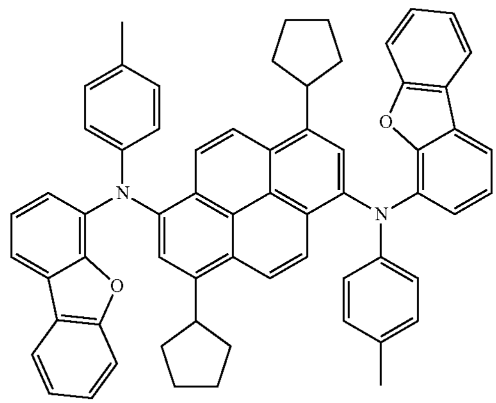
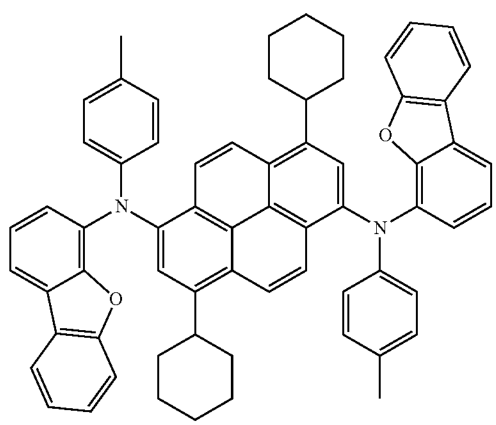
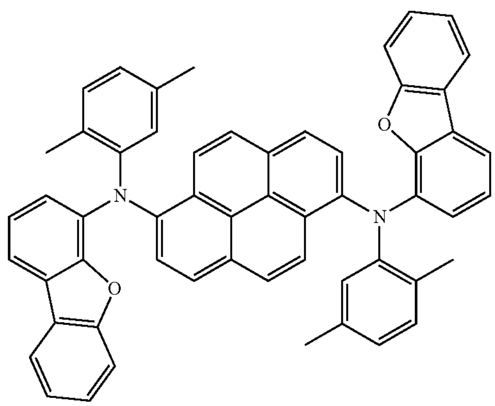
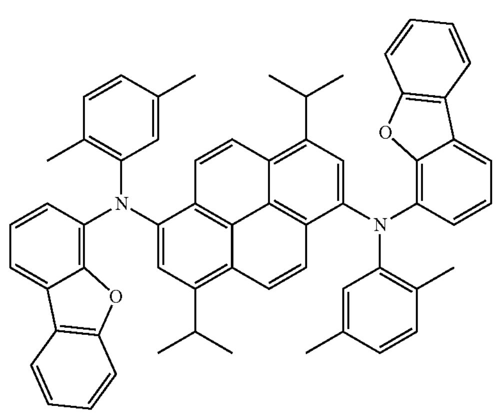
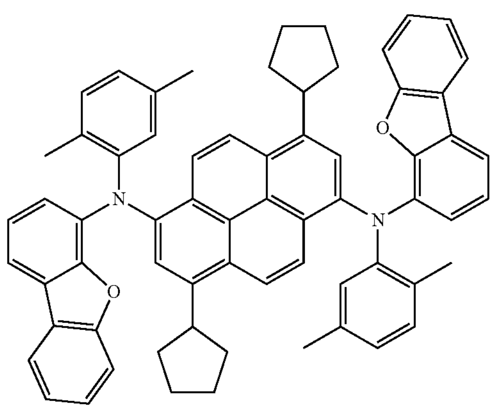

-continued
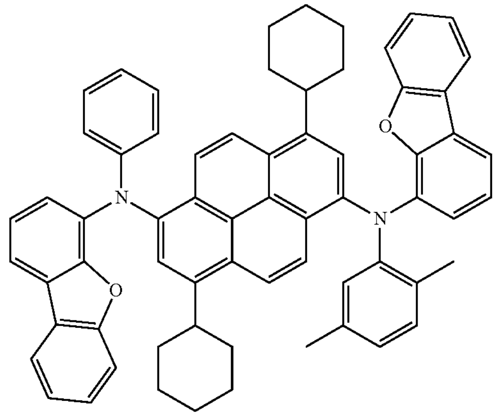
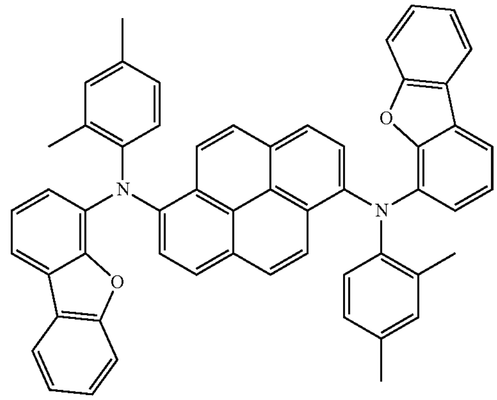
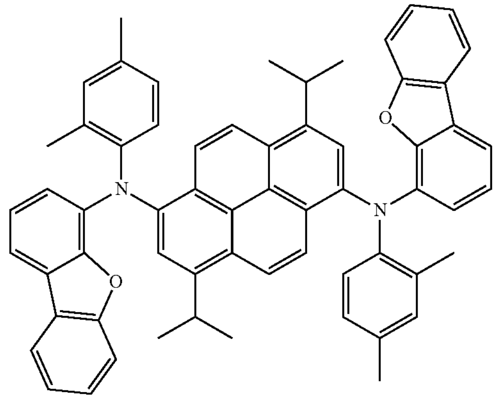
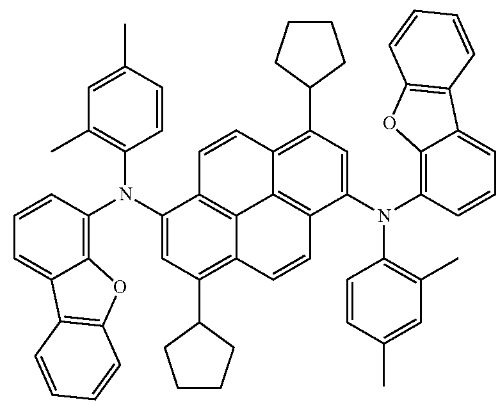
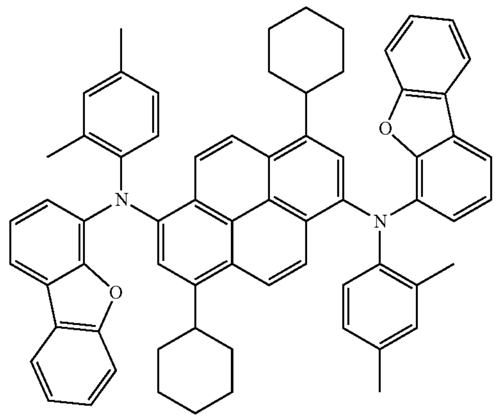
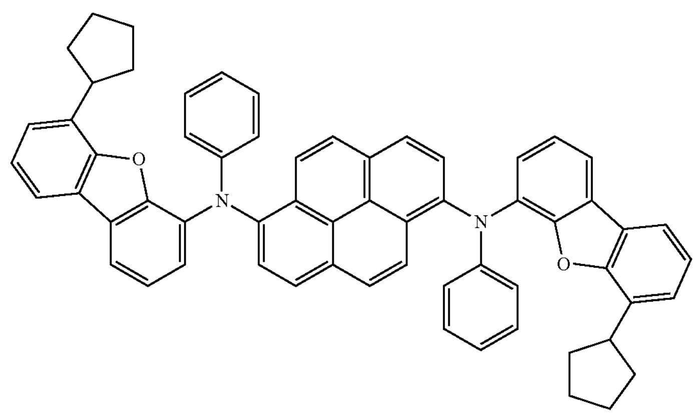
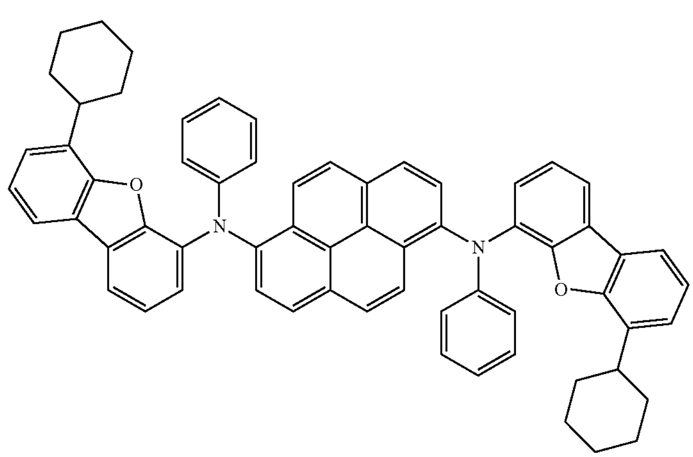

-continued
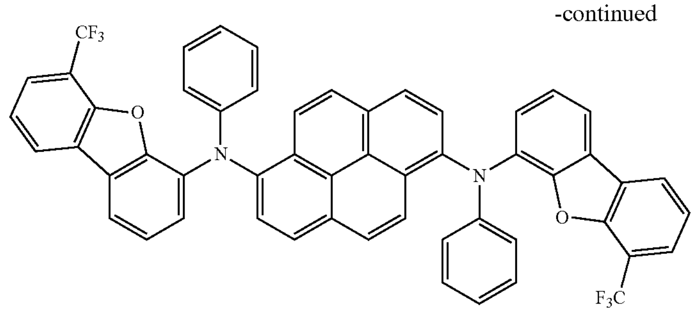
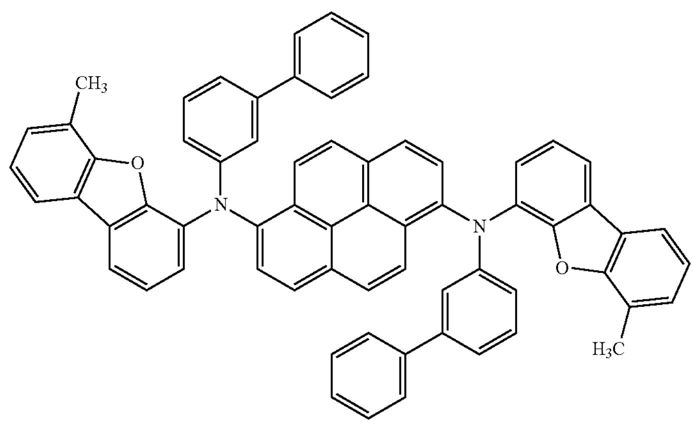
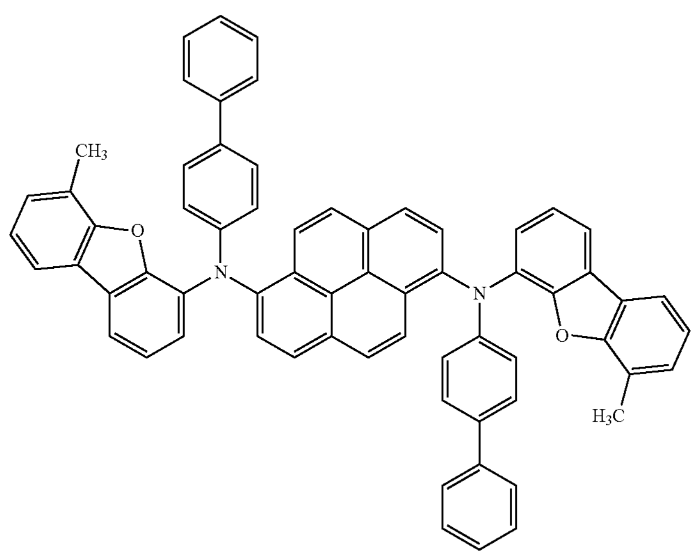

-continued
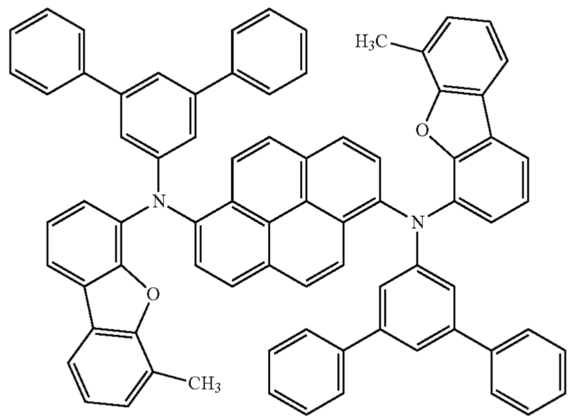
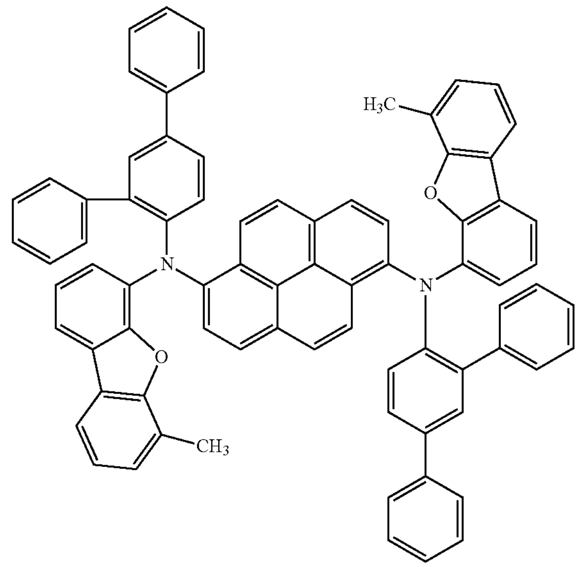
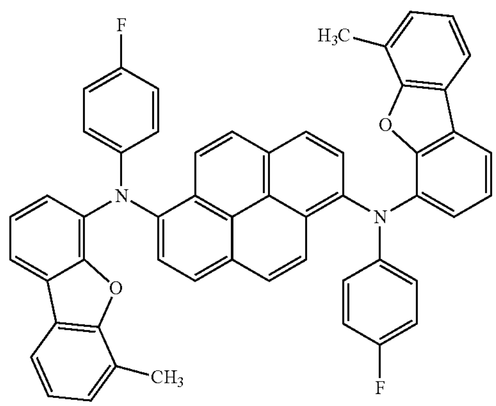
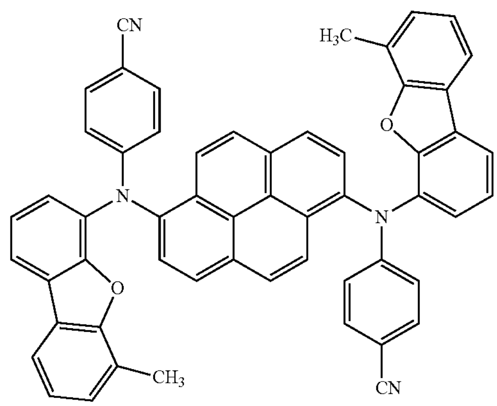
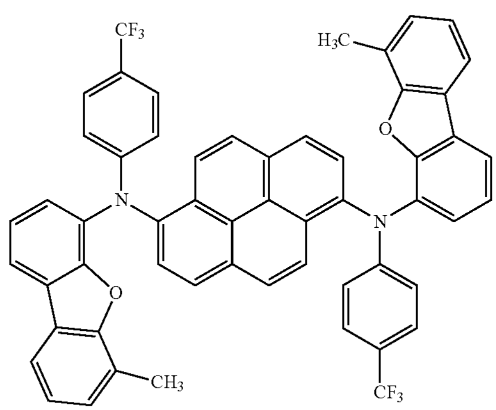
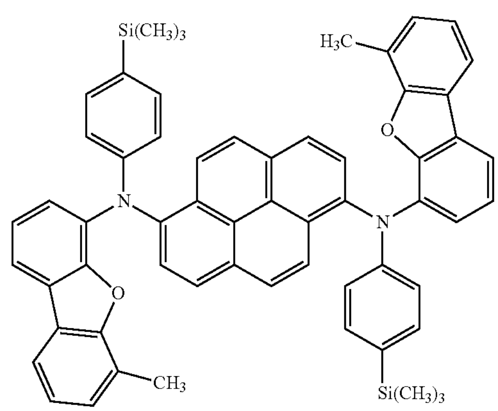

-continued
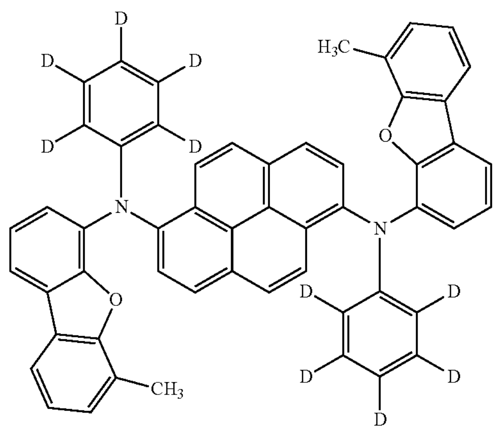
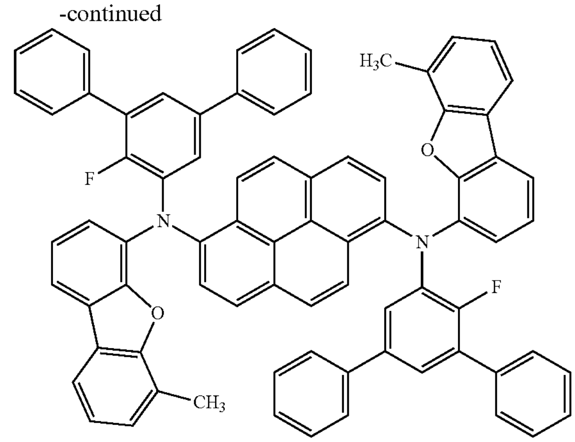
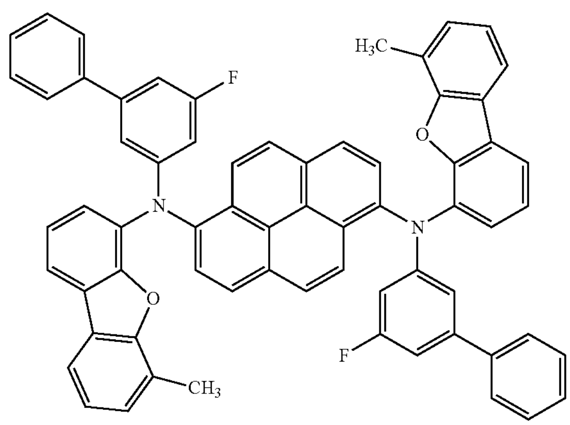
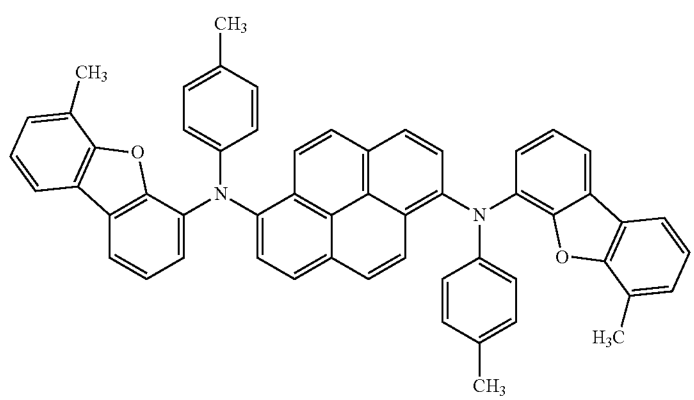
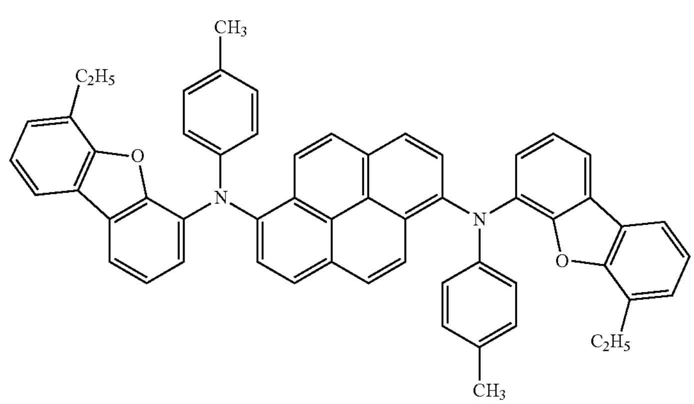

-continued
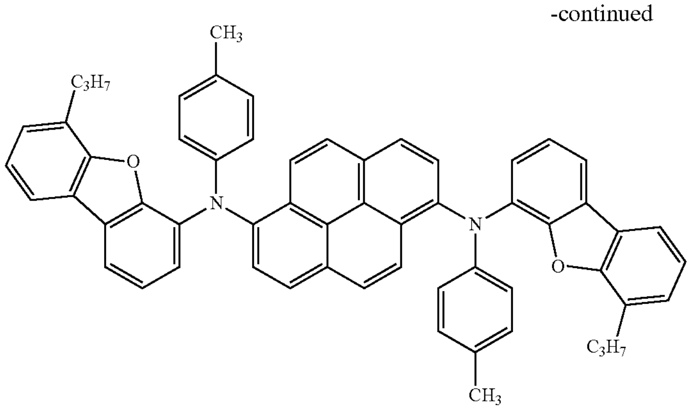
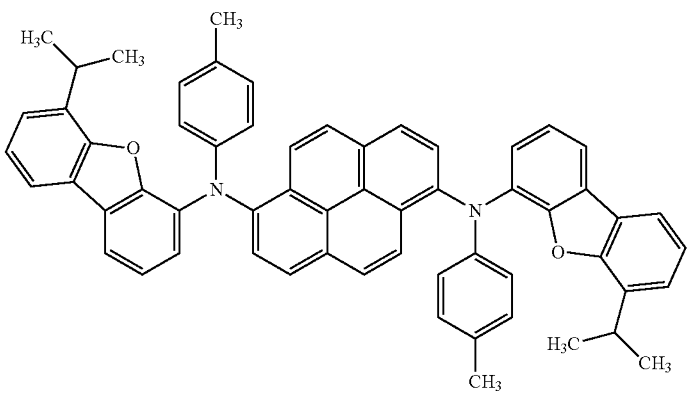
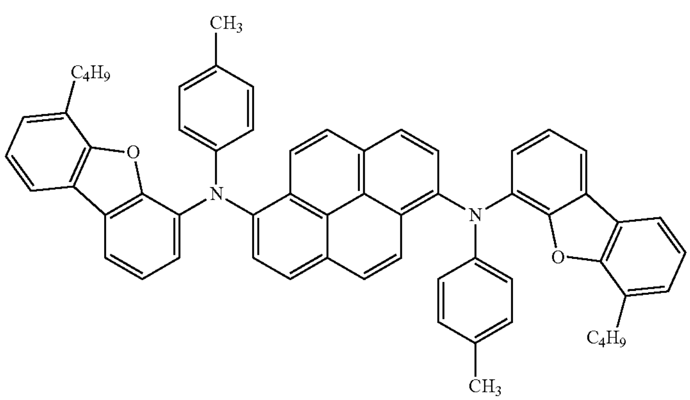
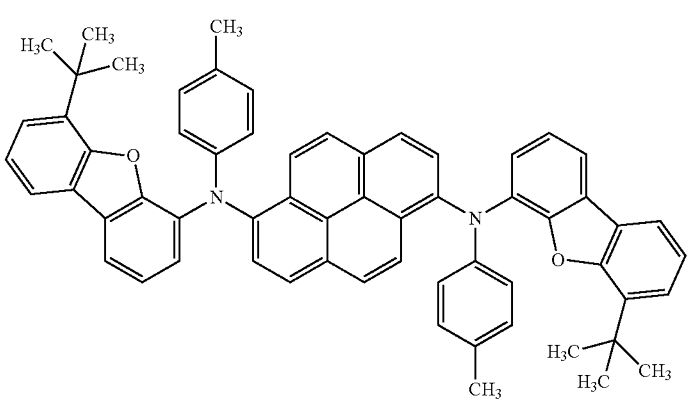

-continued
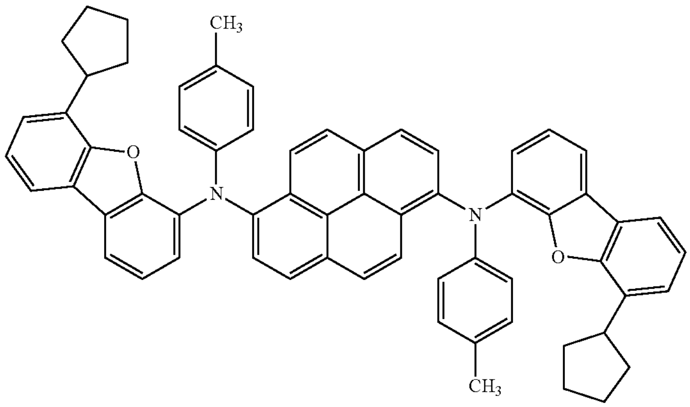
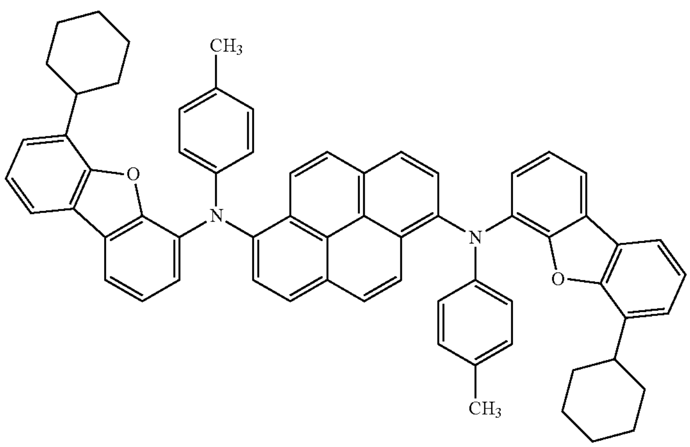
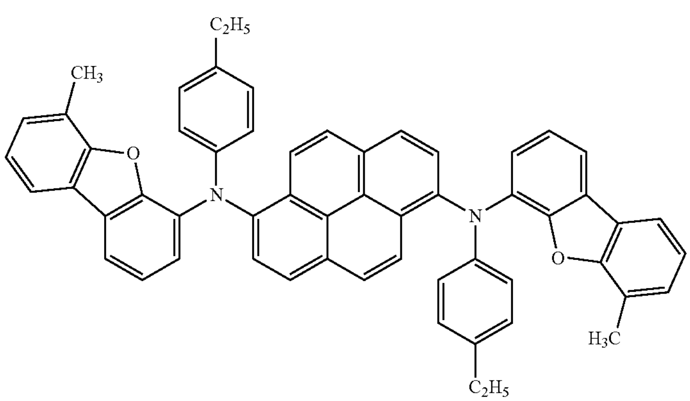
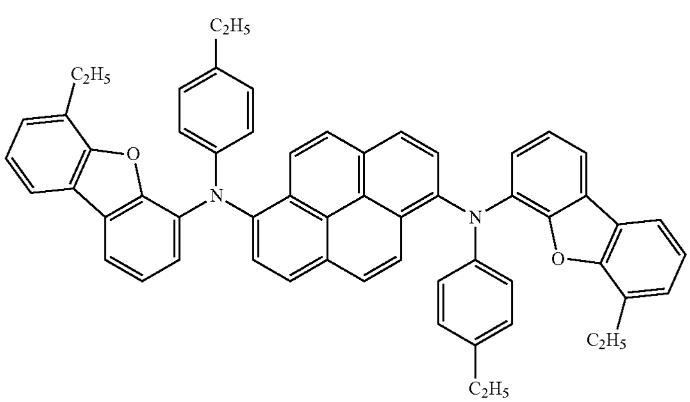

-continued
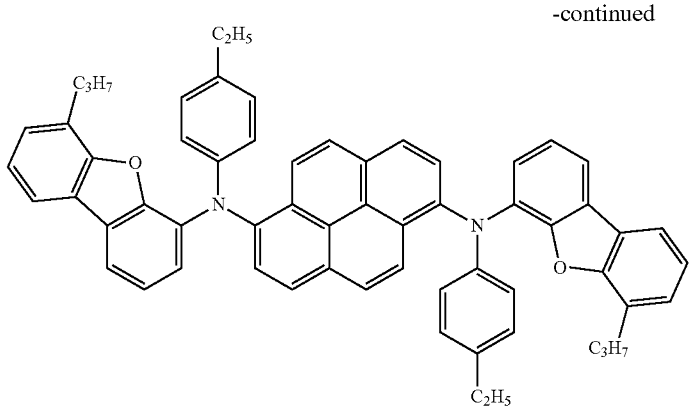
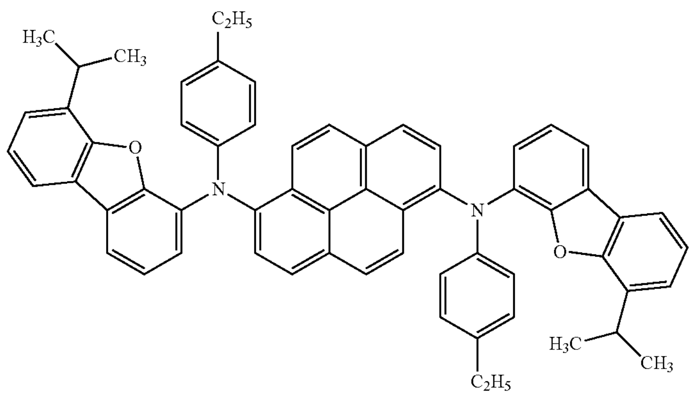
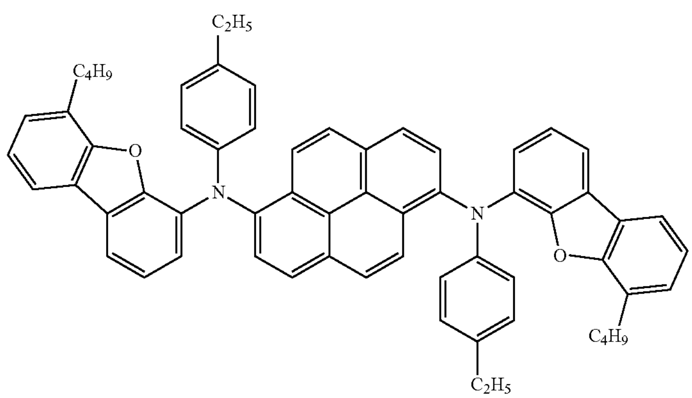
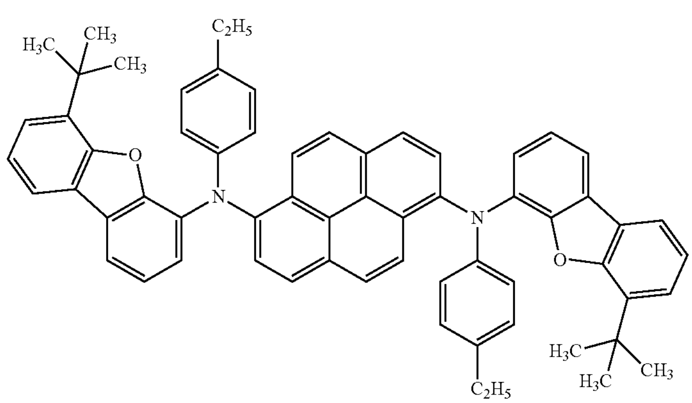

-continued
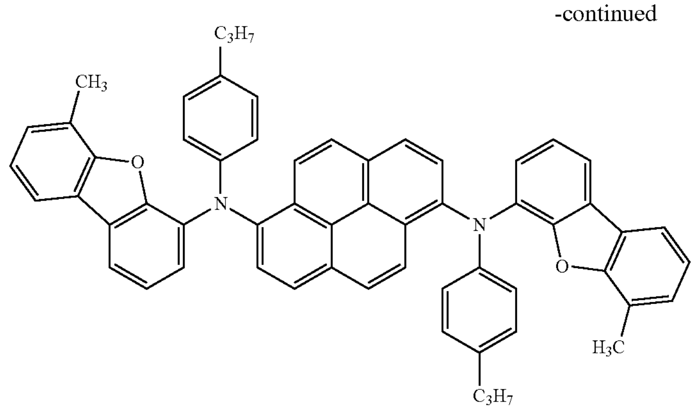
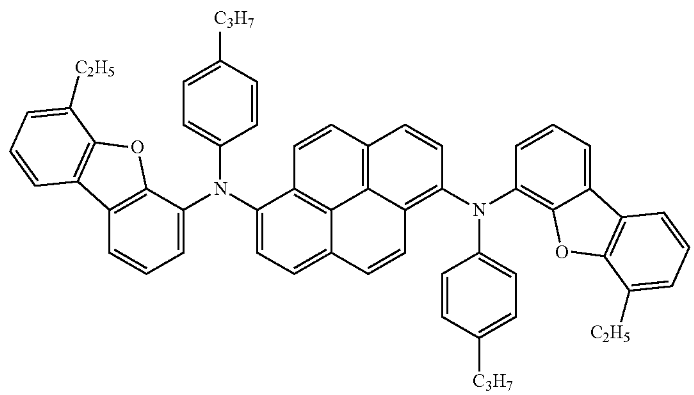
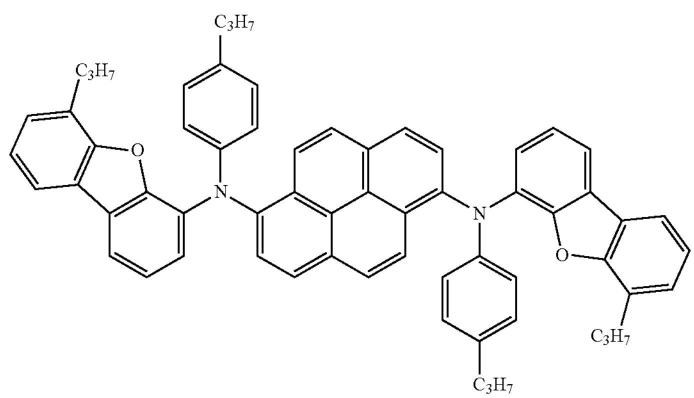
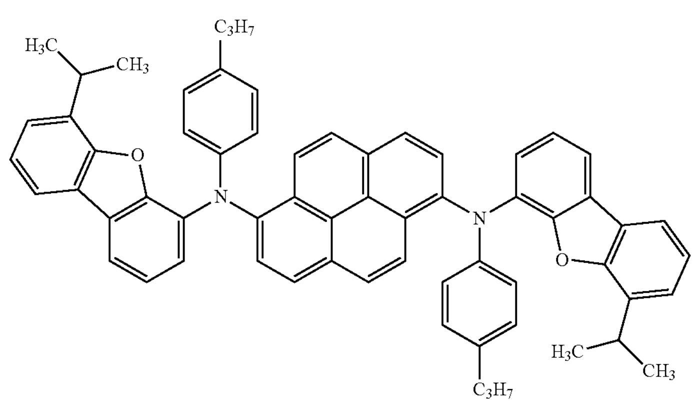

-continued
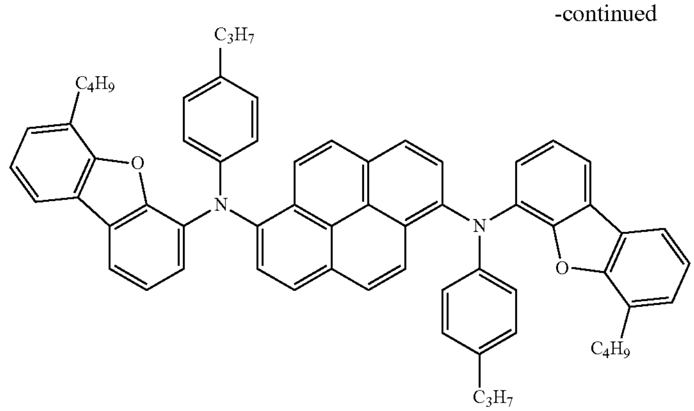
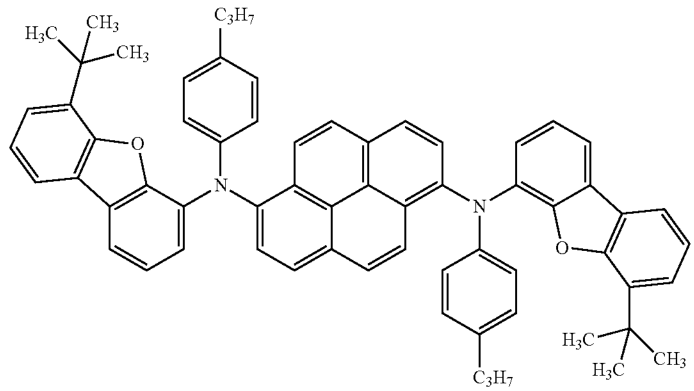
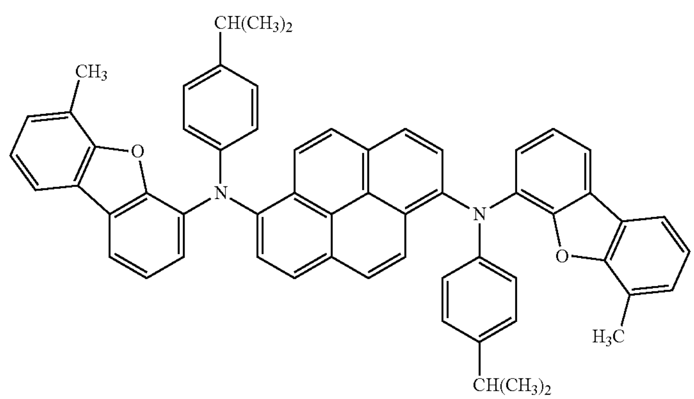
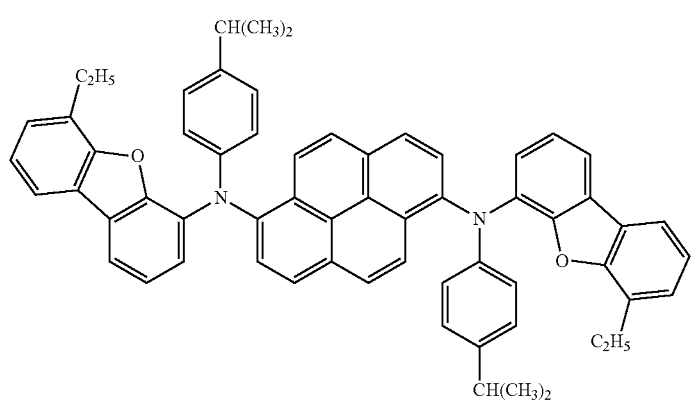

-continued
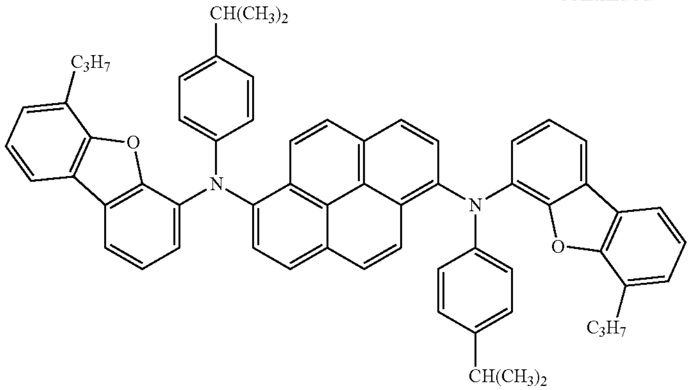
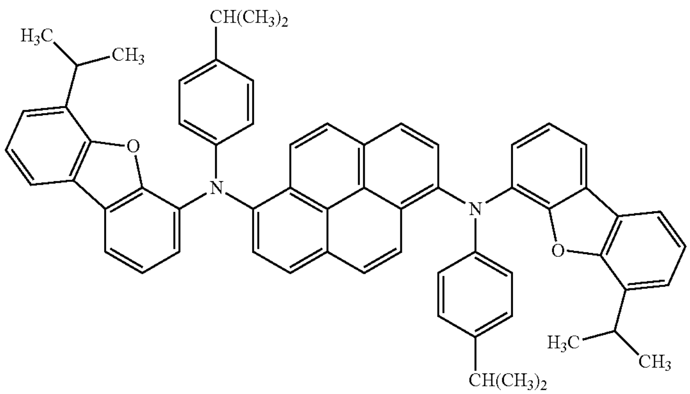
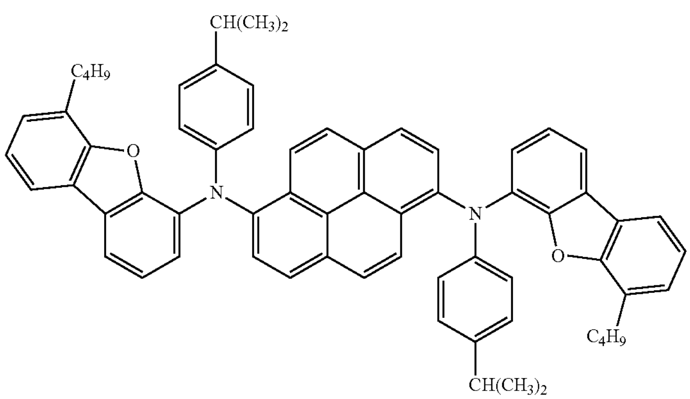
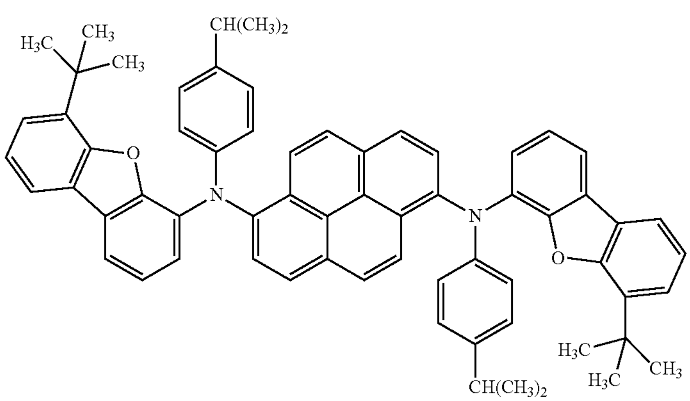

-continued
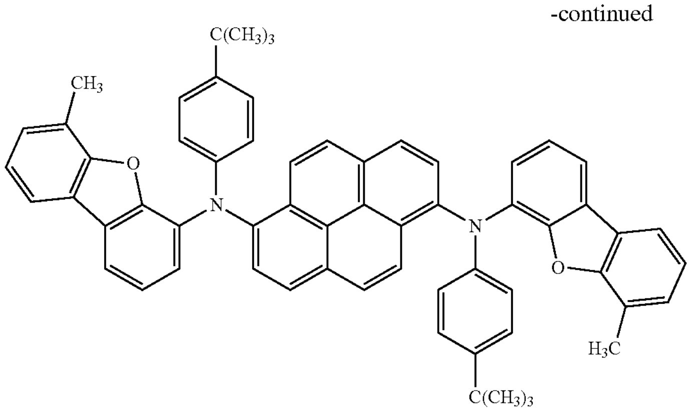
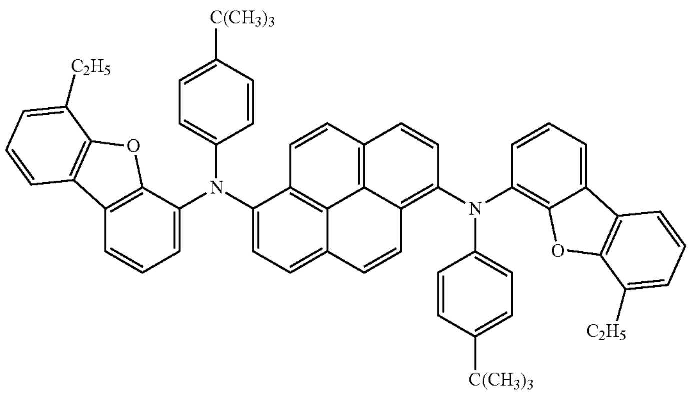
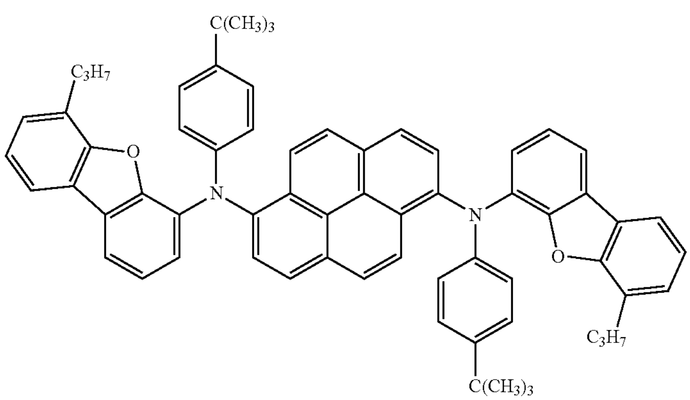
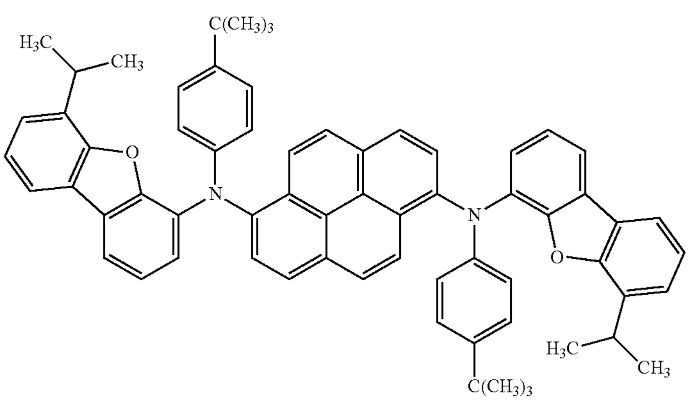

-continued
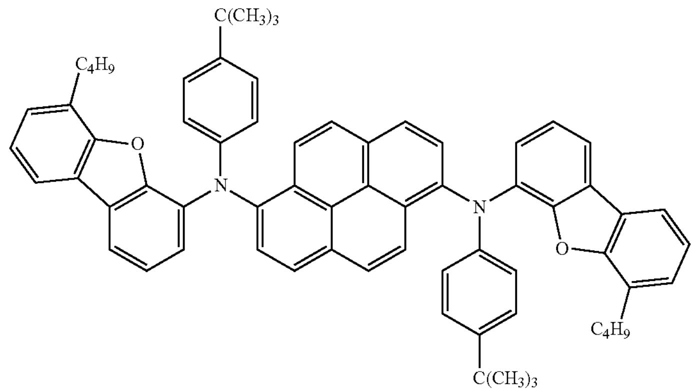
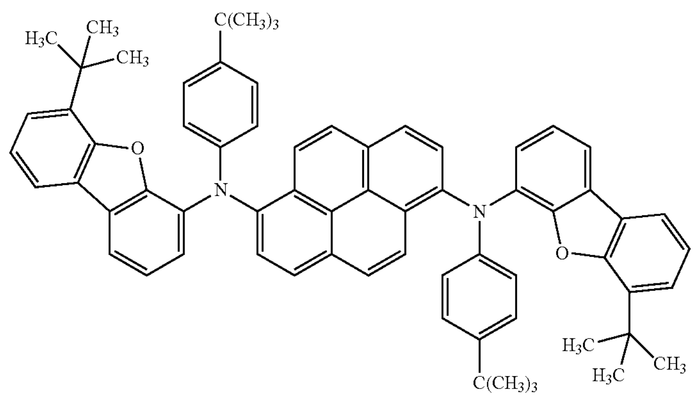
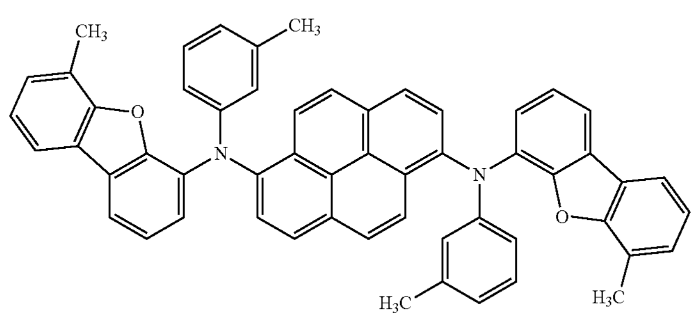
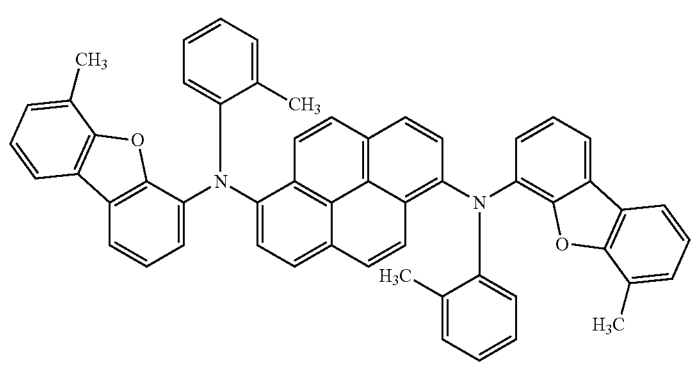

-continued
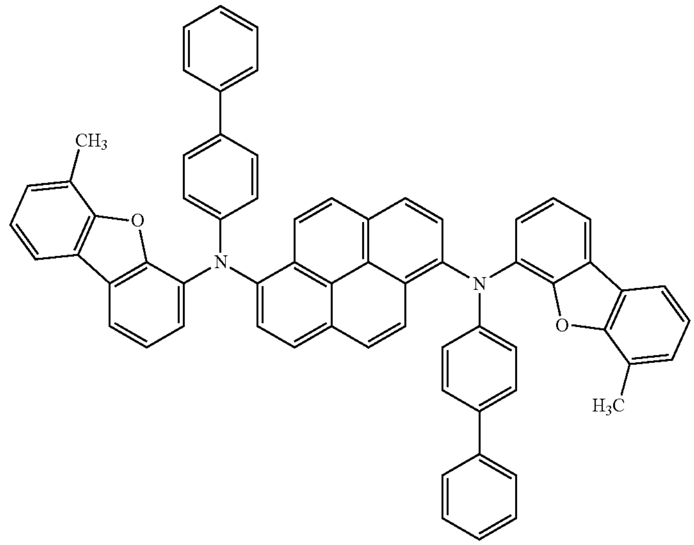
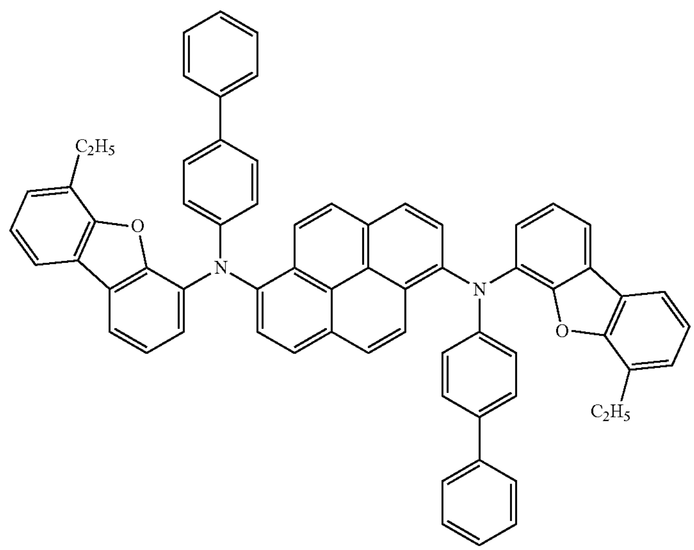
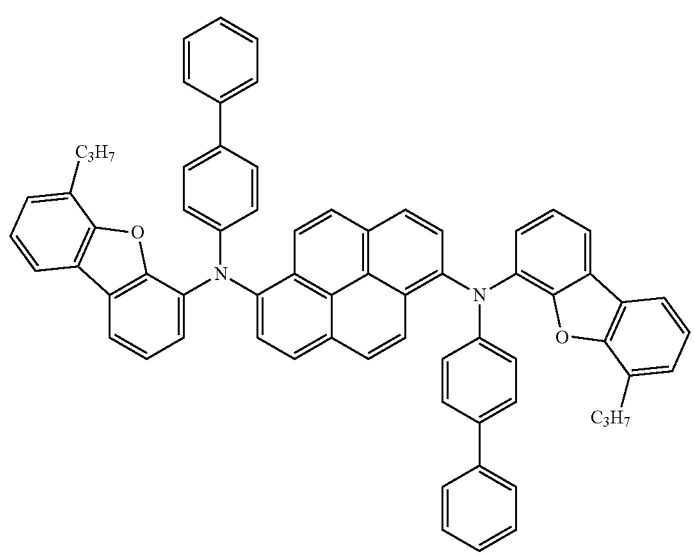

-continued
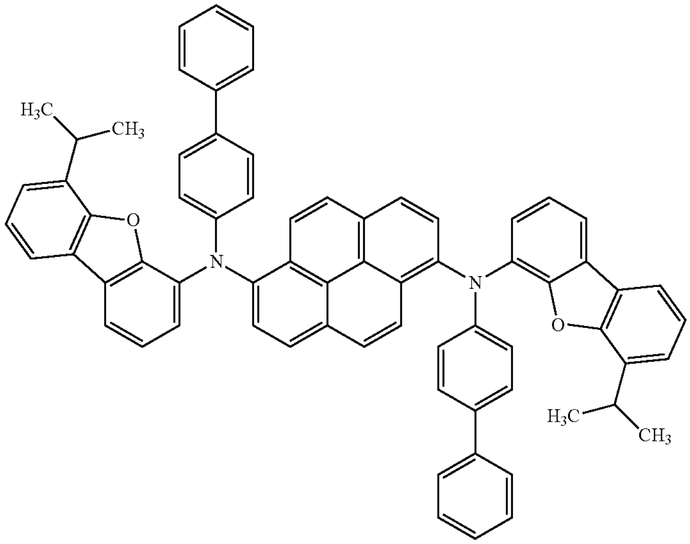
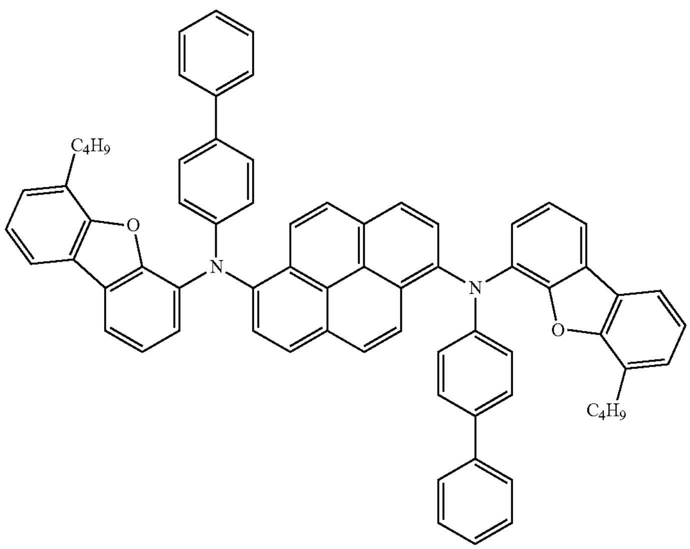
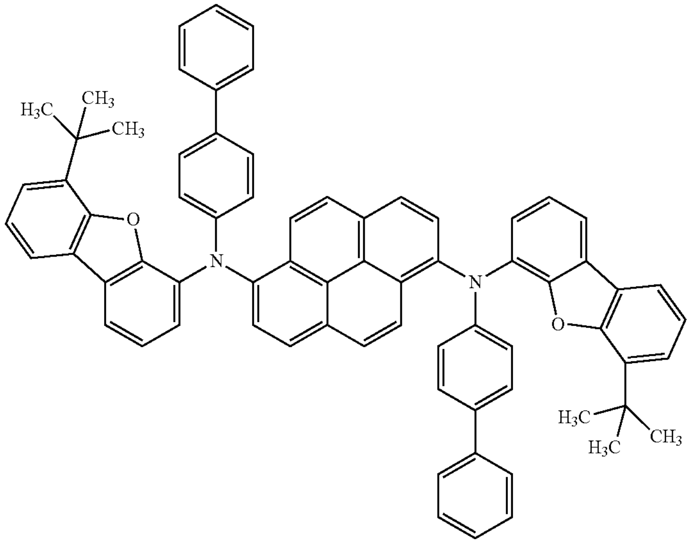

-continued
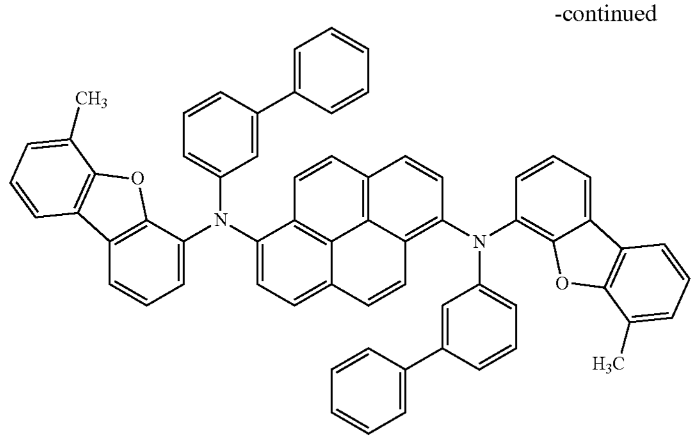
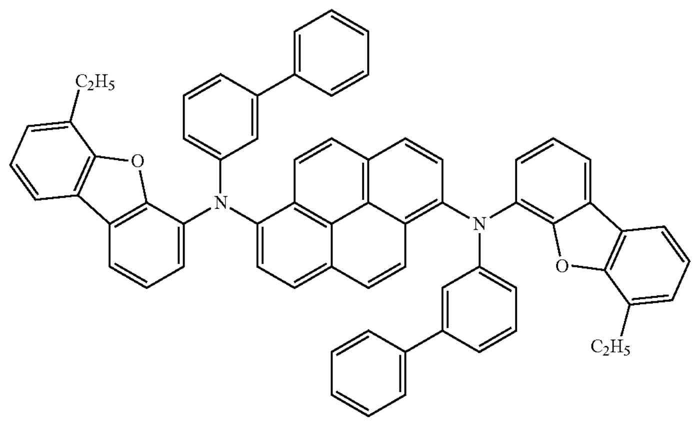
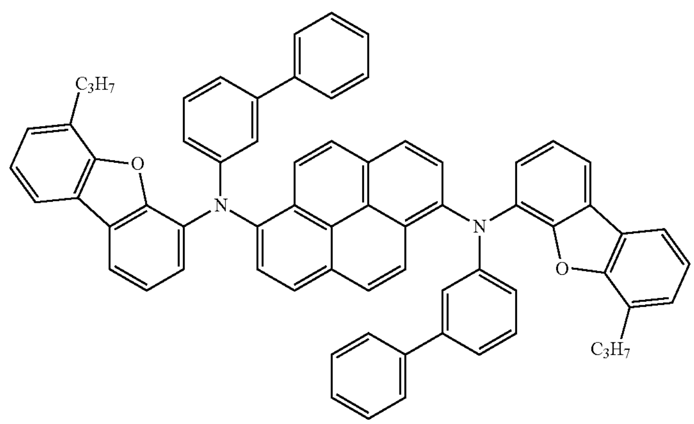
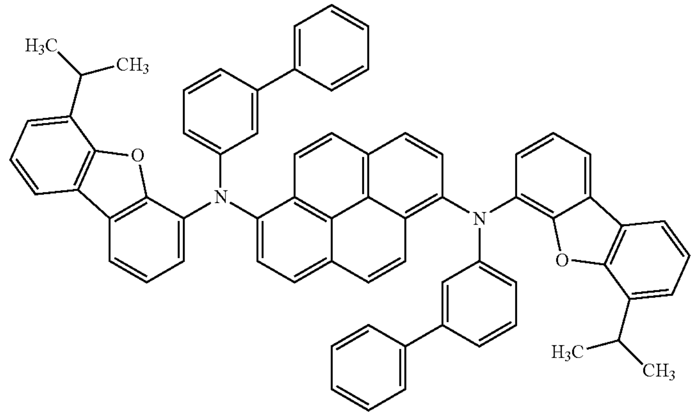

-continued
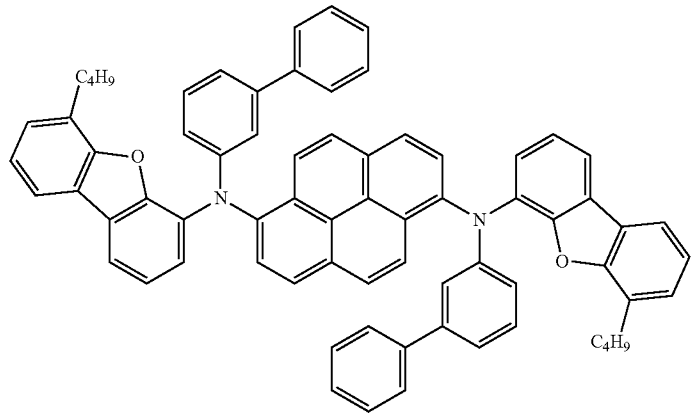
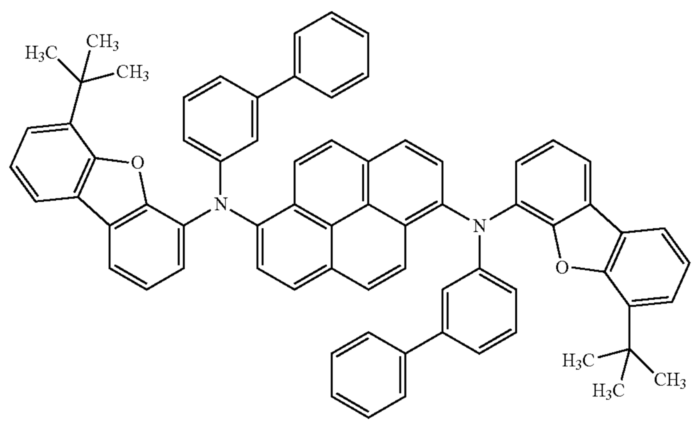
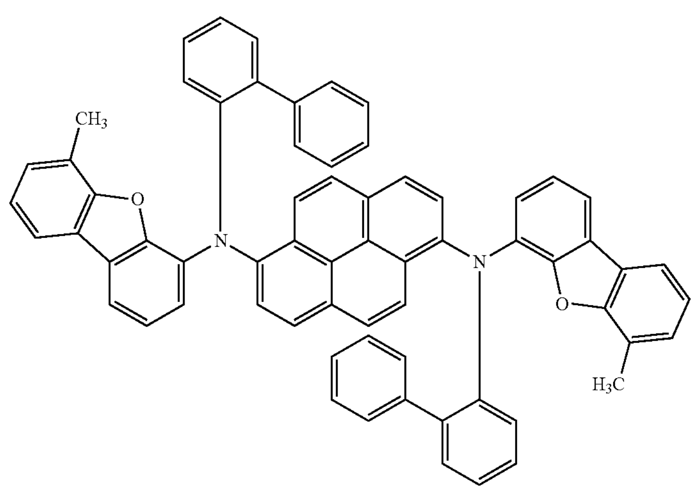

-continued
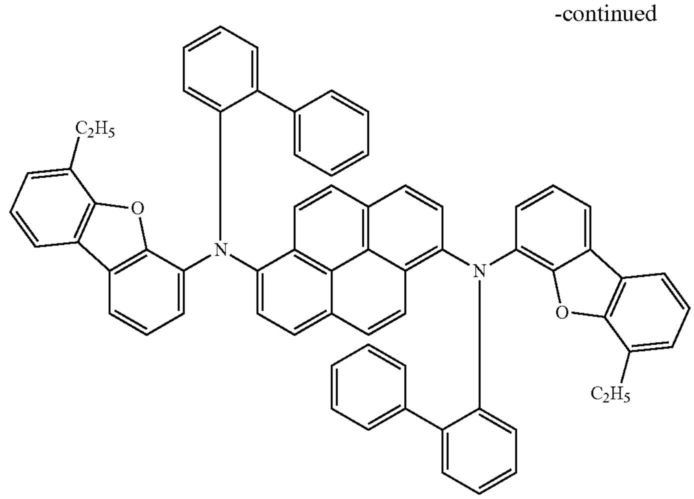
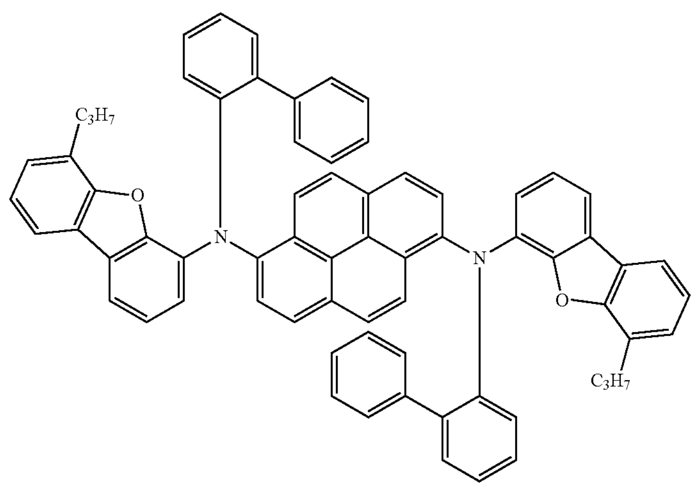
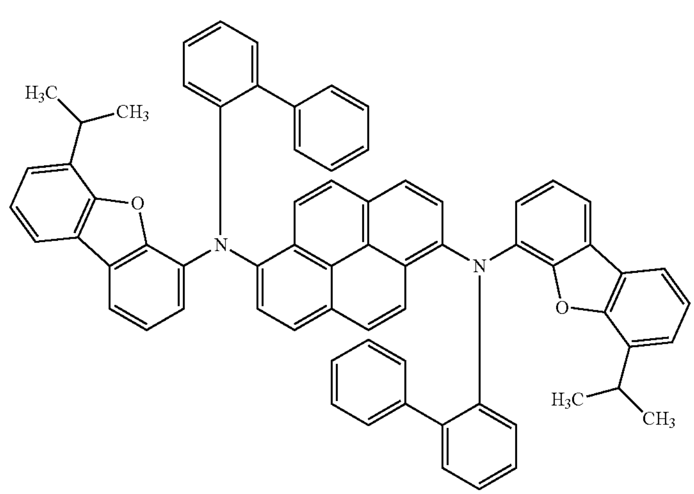

-continued
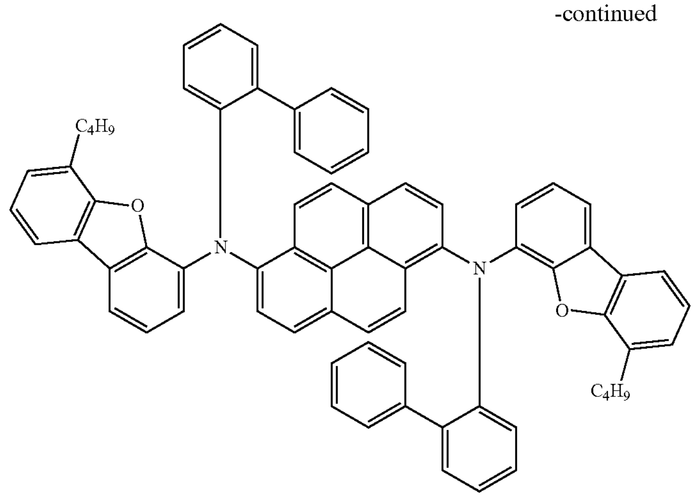
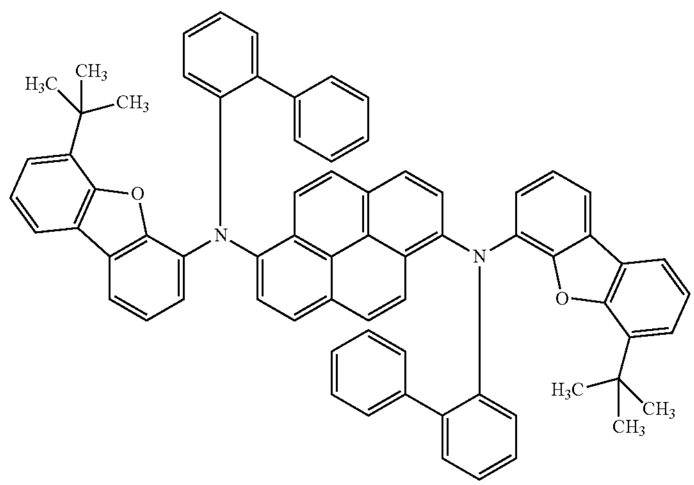
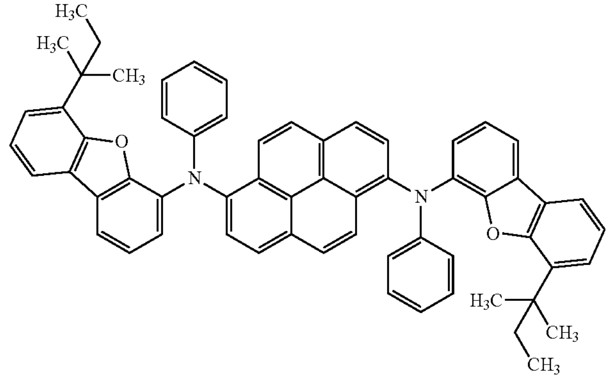
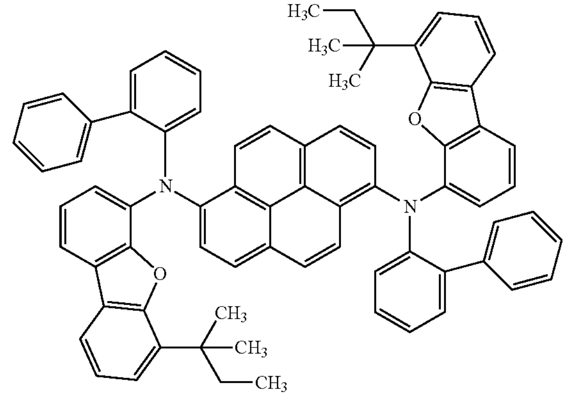

-continued
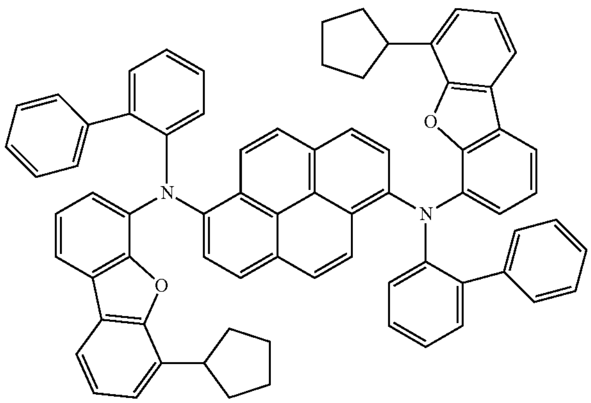
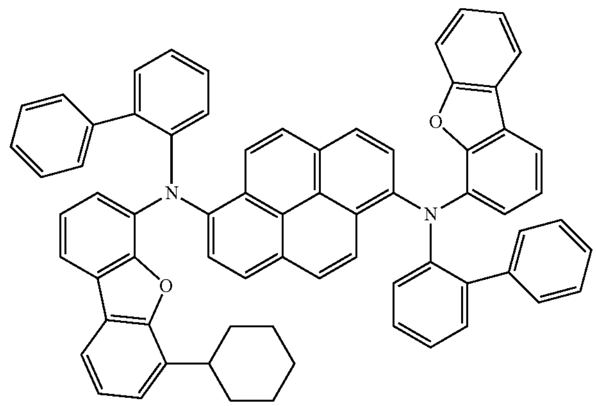
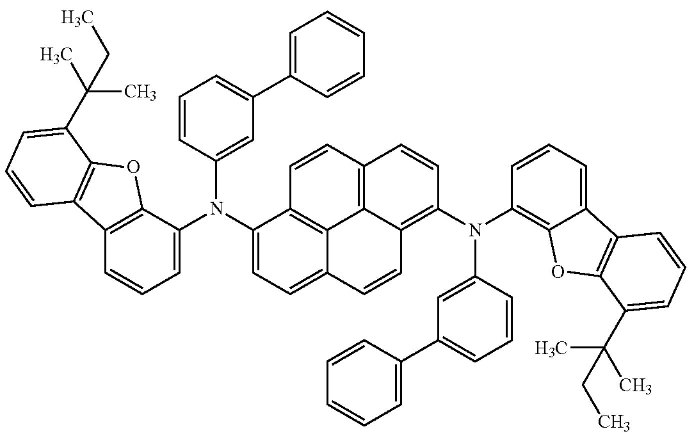
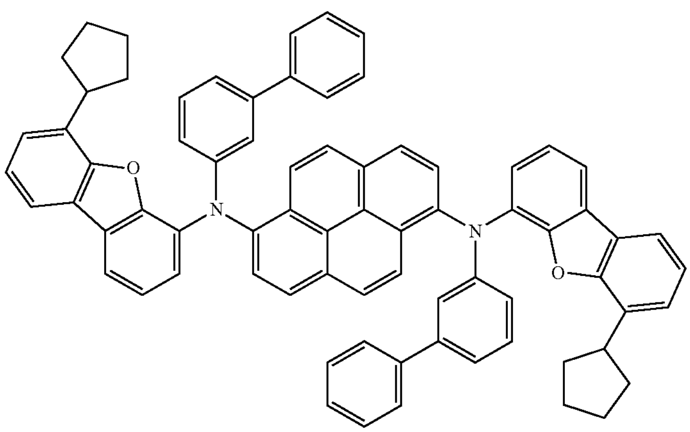
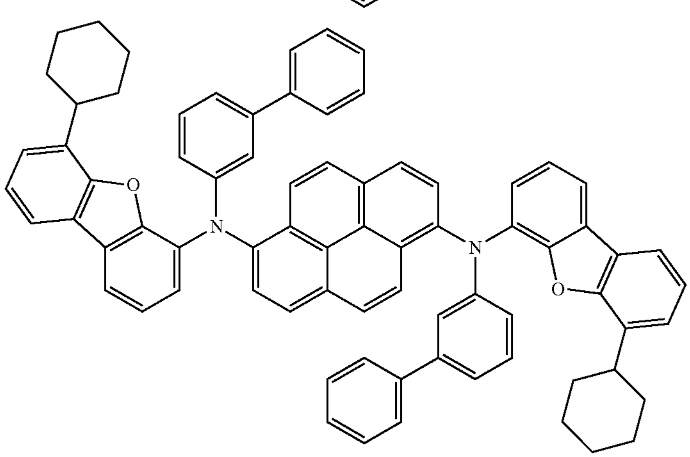

-continued
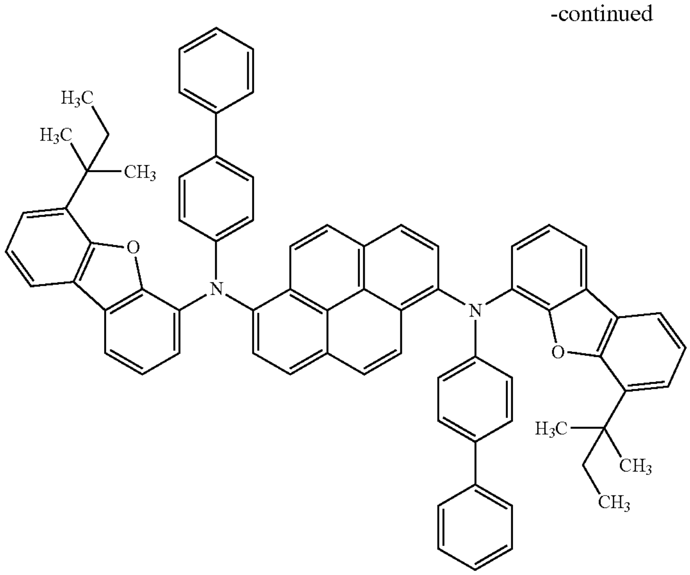
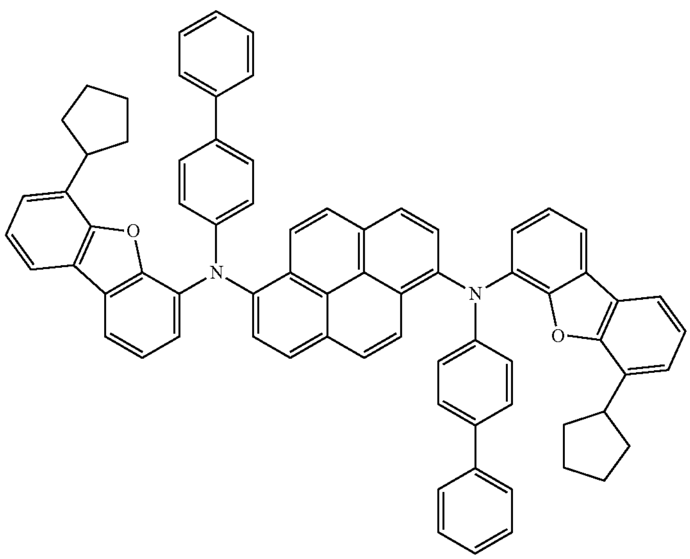
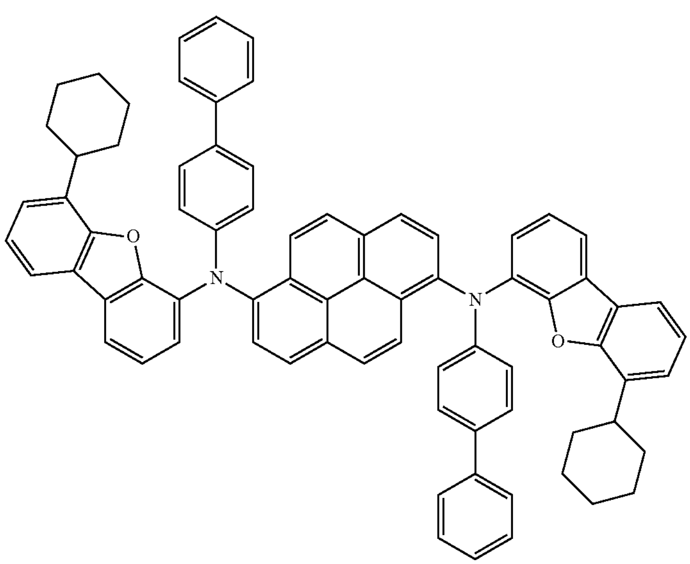
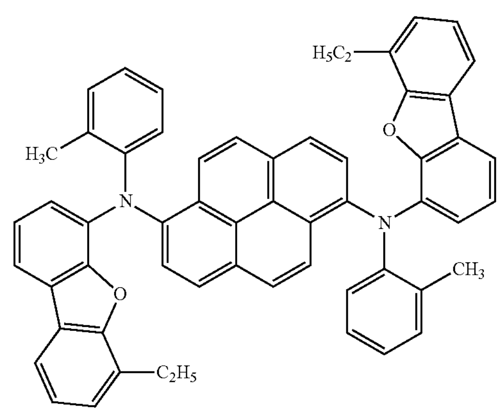

-continued
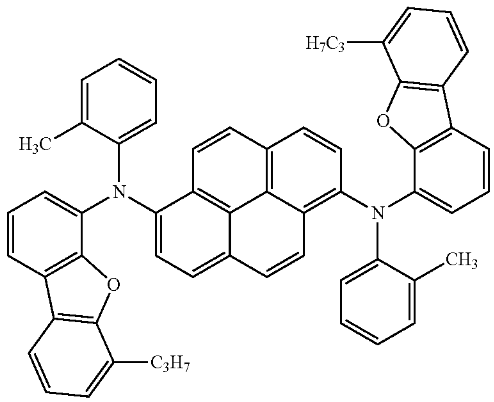
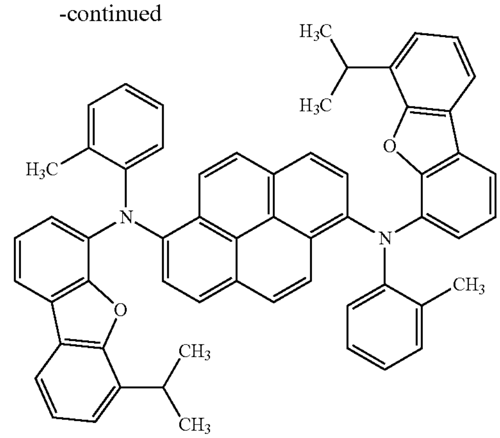
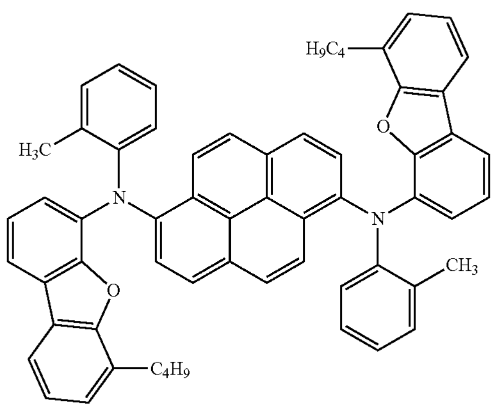
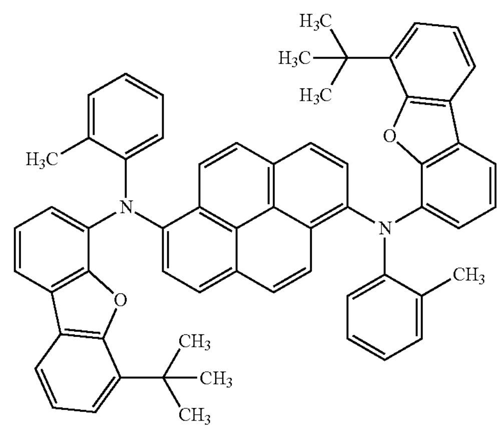
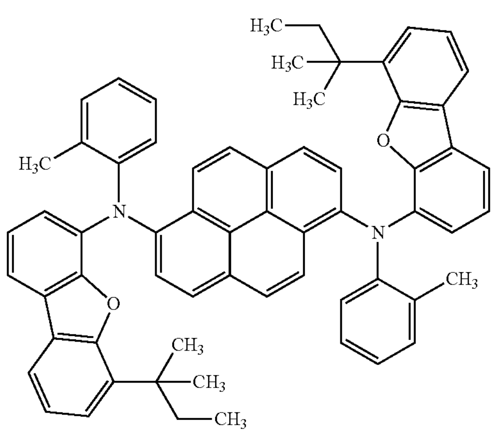
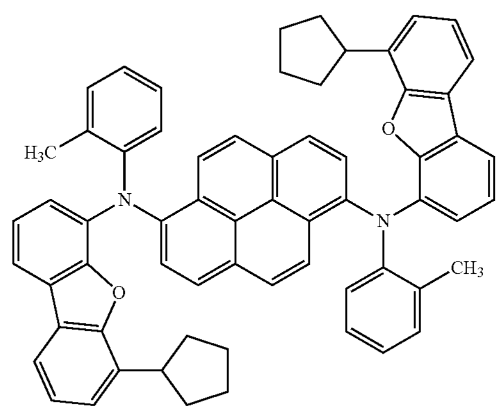
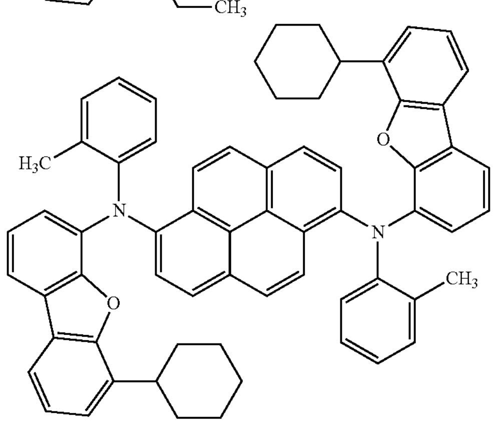
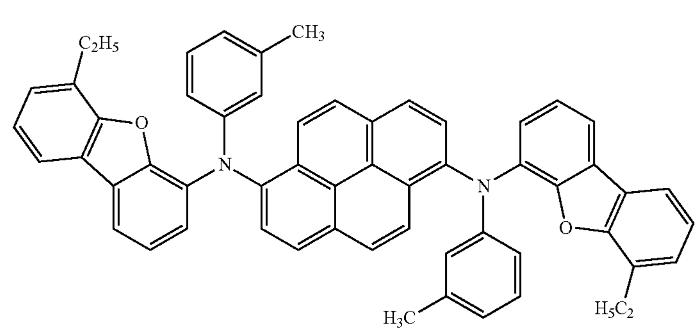

-continued
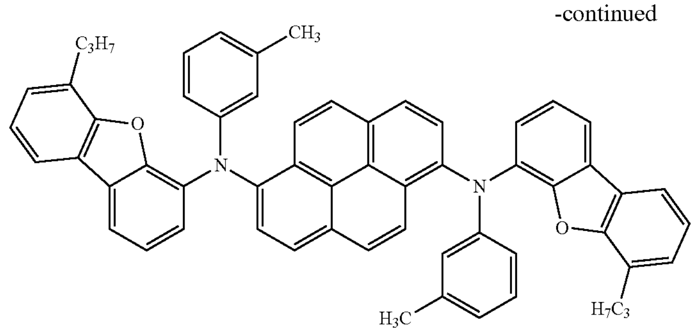
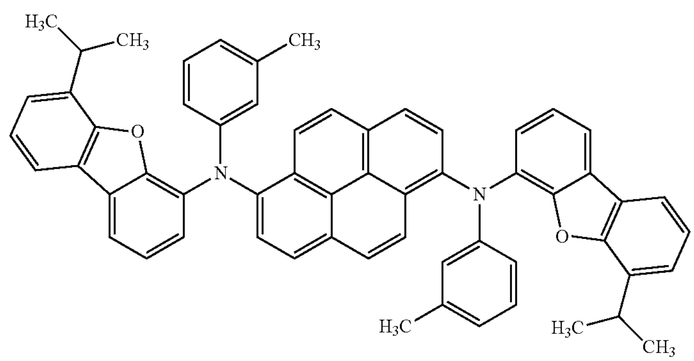
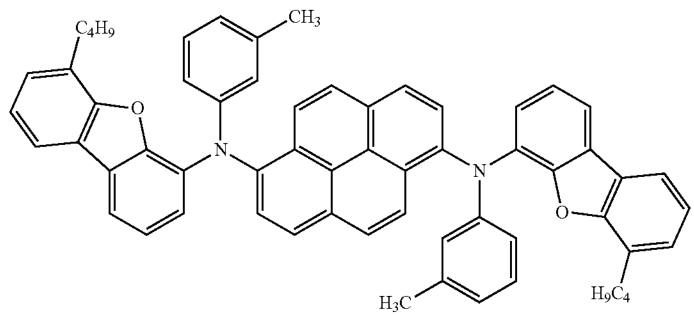
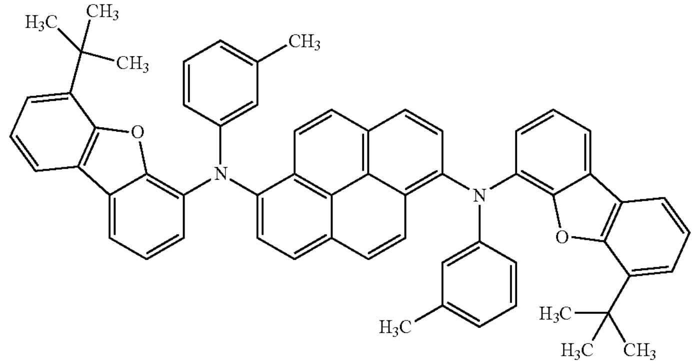

-continued
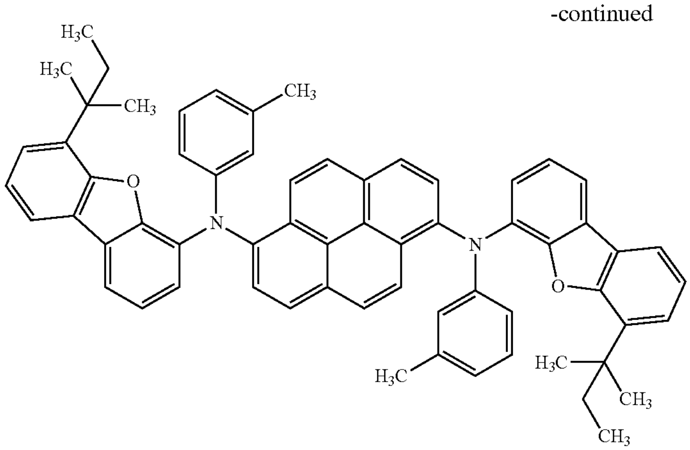
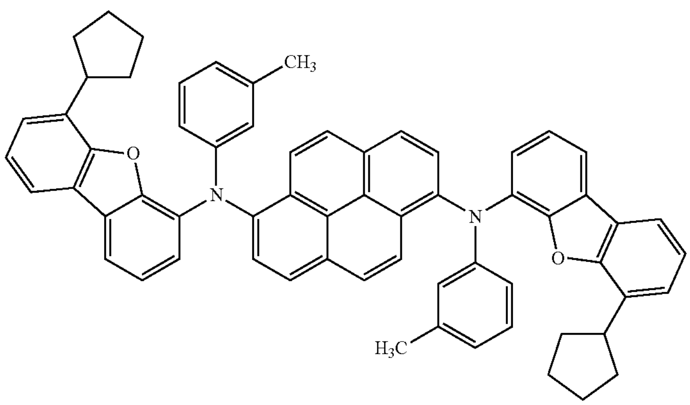
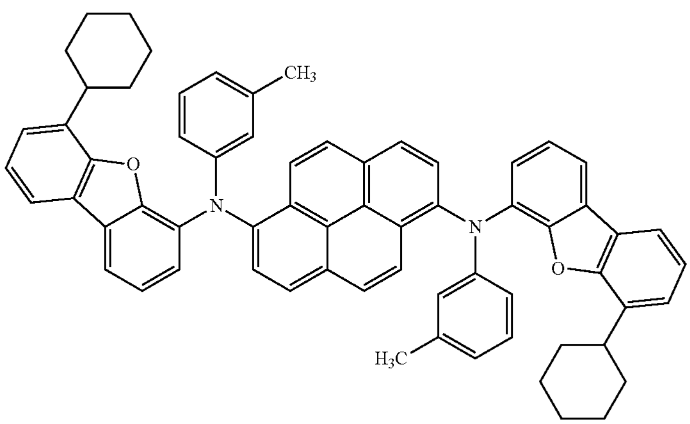
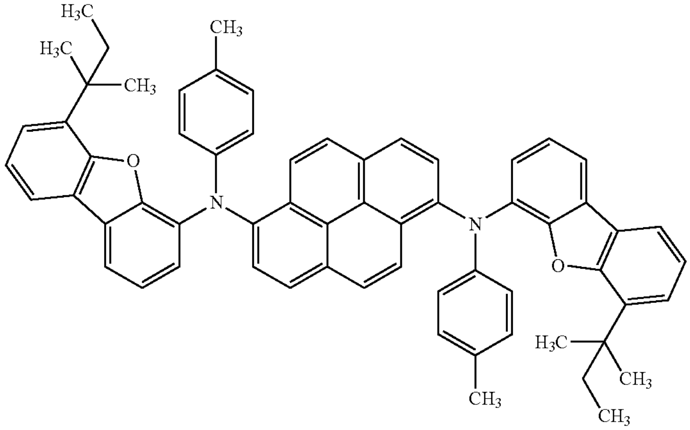

-continued
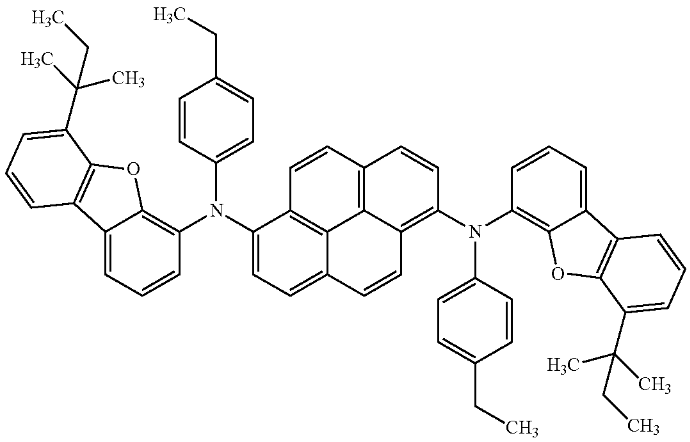
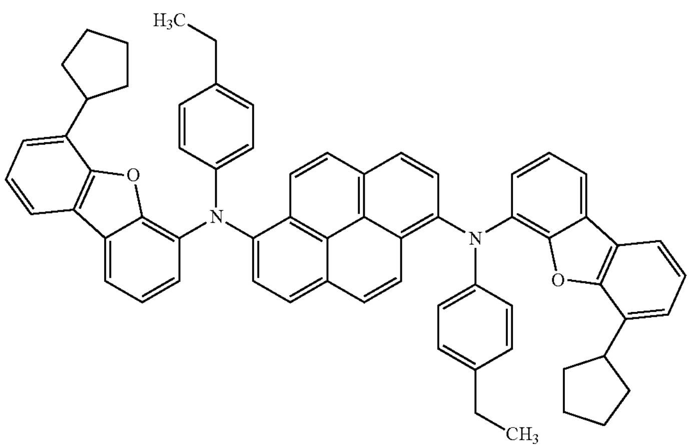
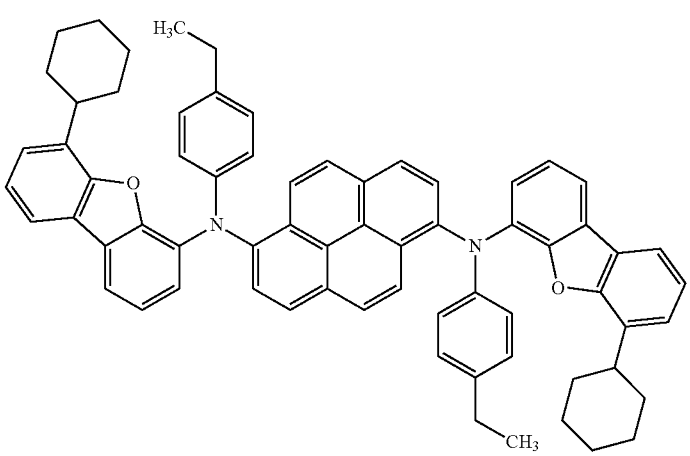

-continued
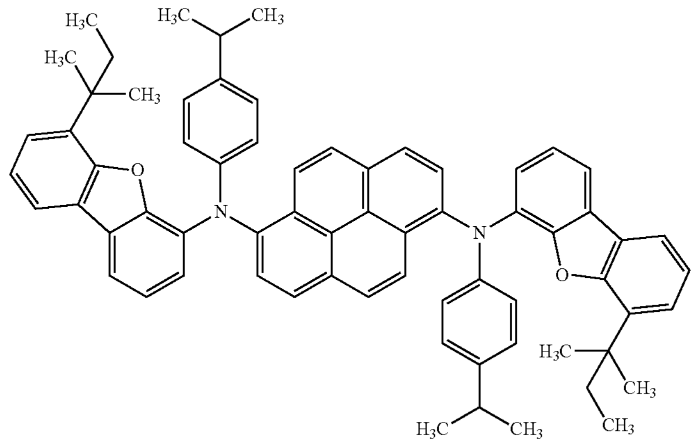
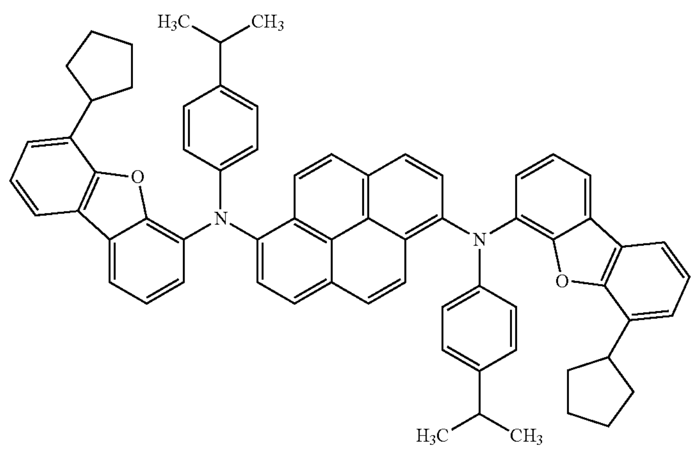
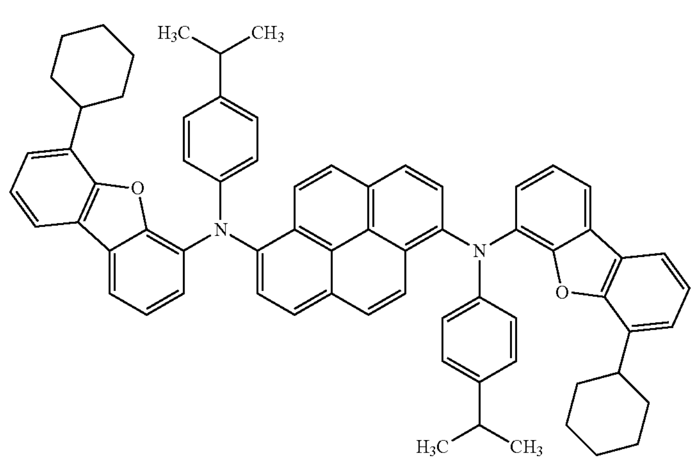

-continued
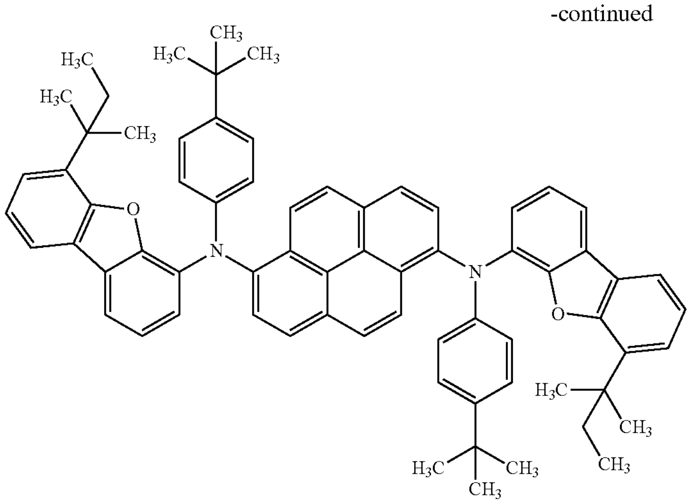
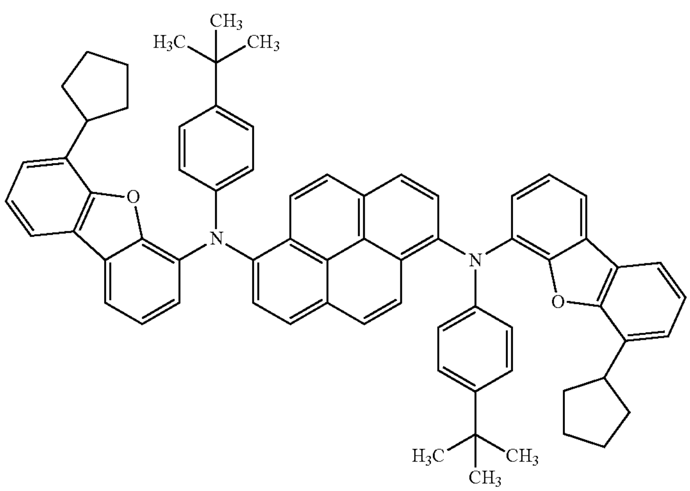
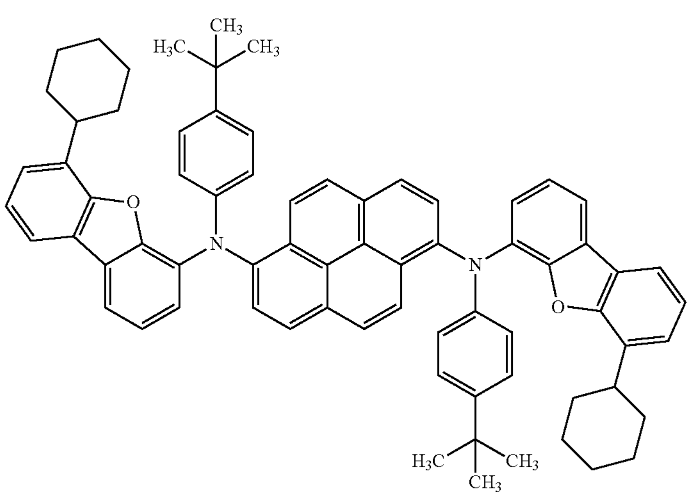

-continued
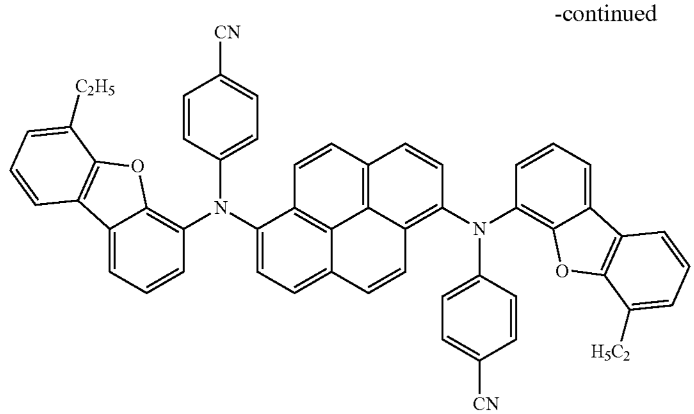
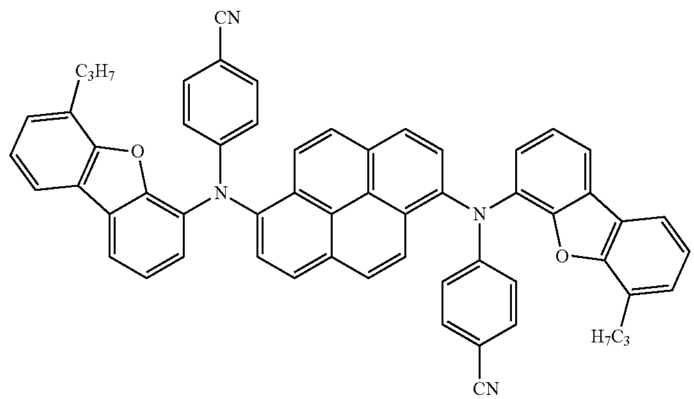
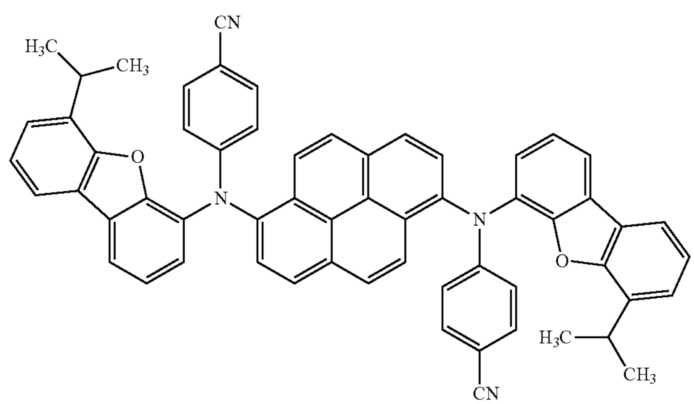
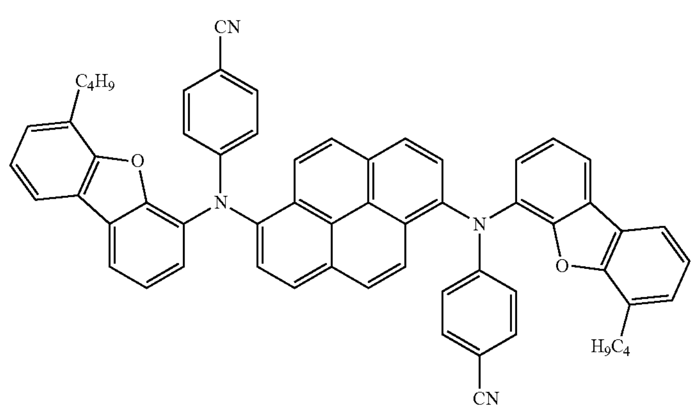

-continued
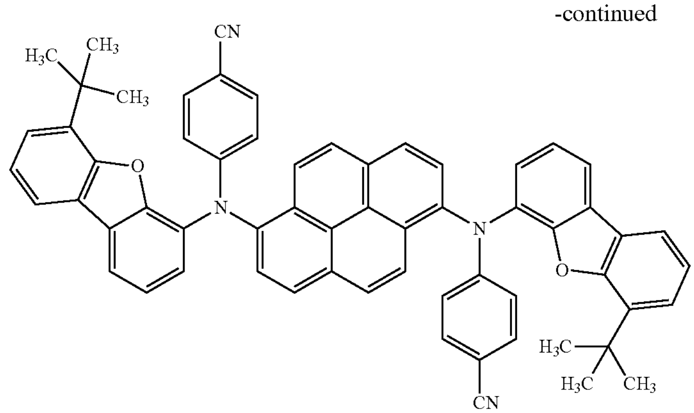
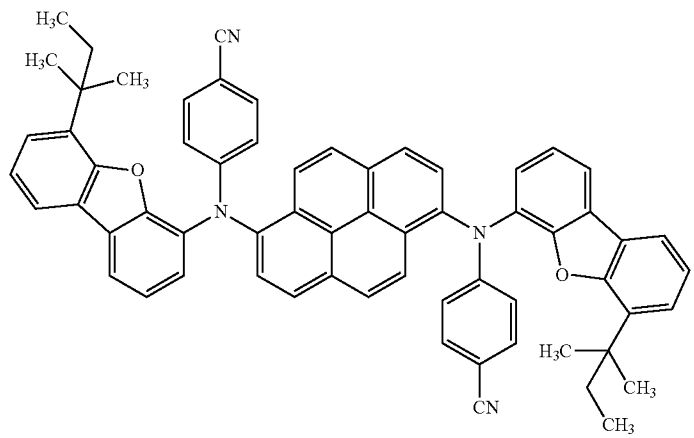
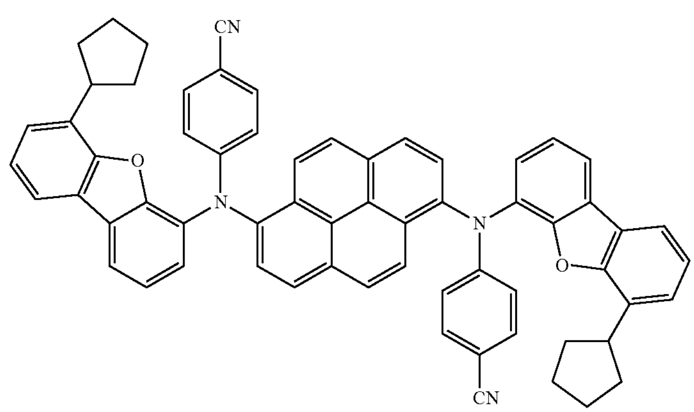
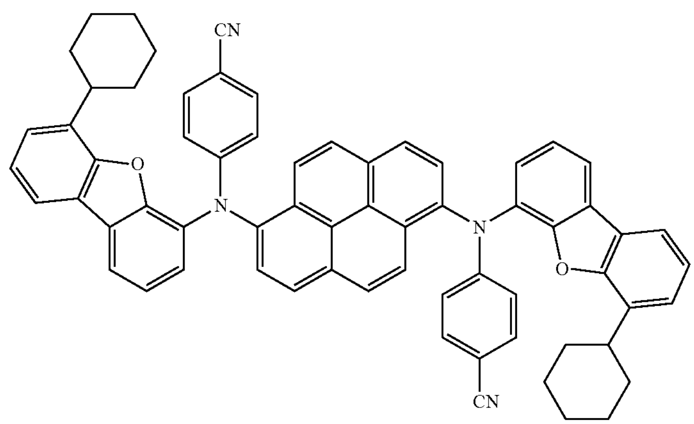

-continued
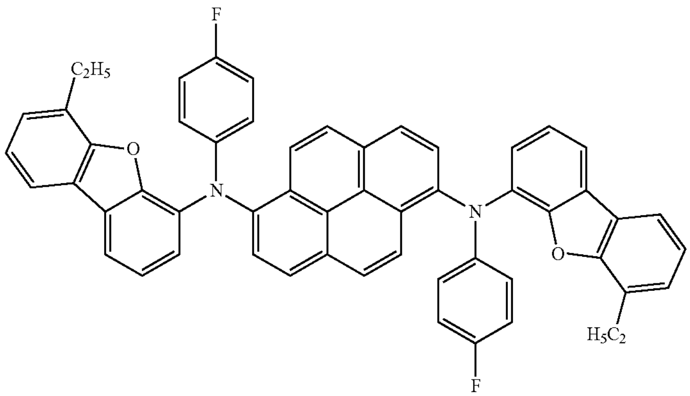
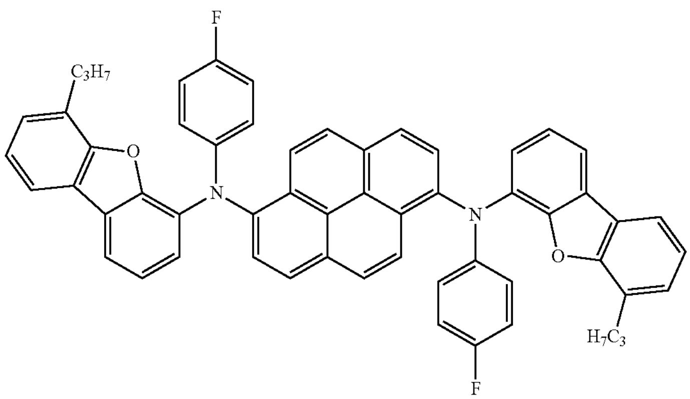
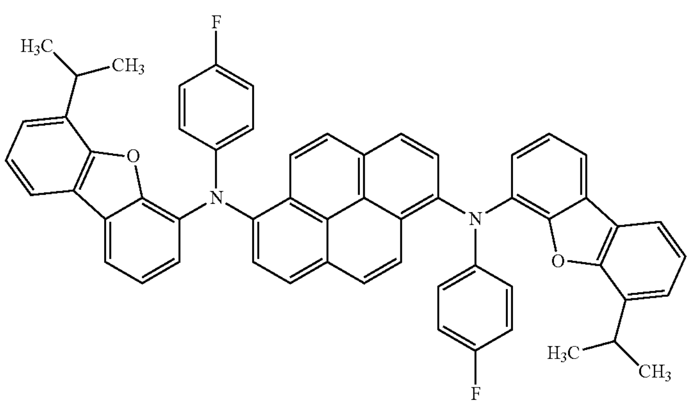
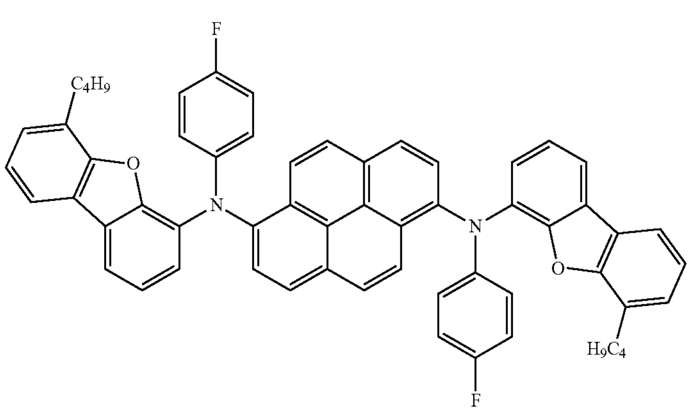

-continued
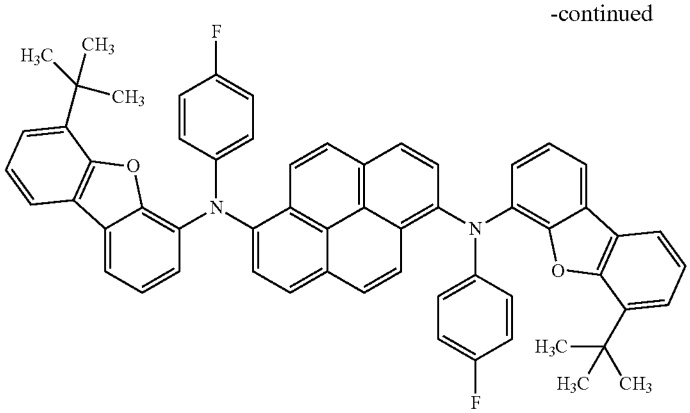
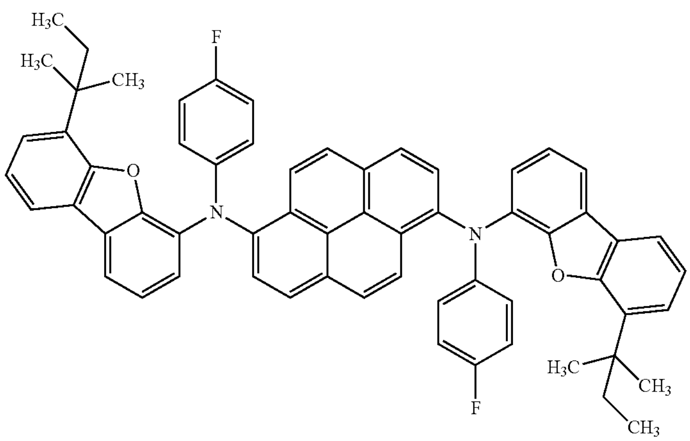
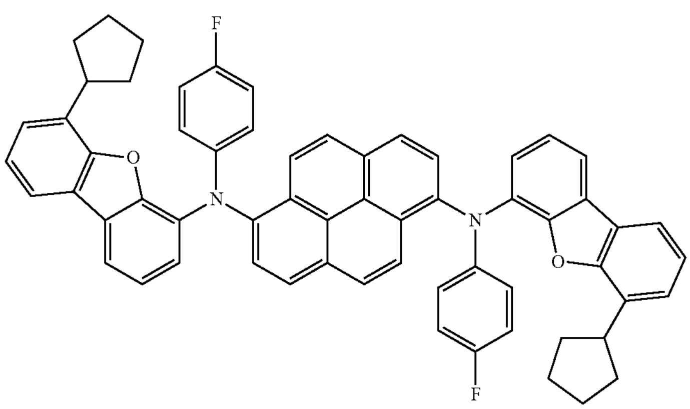
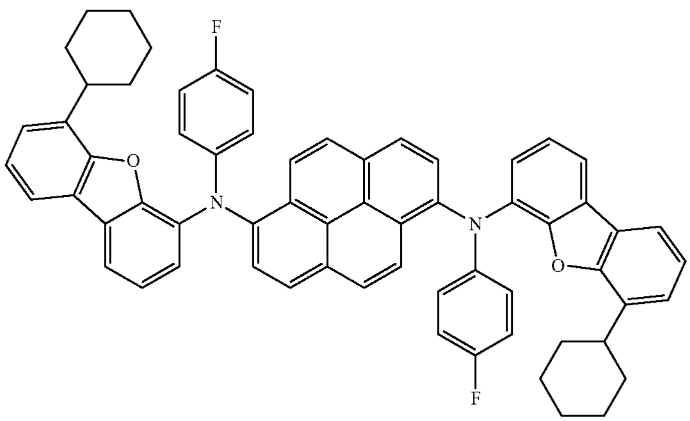

-continued
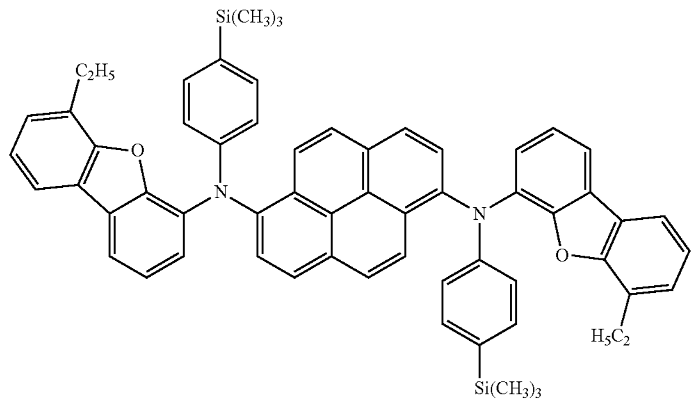
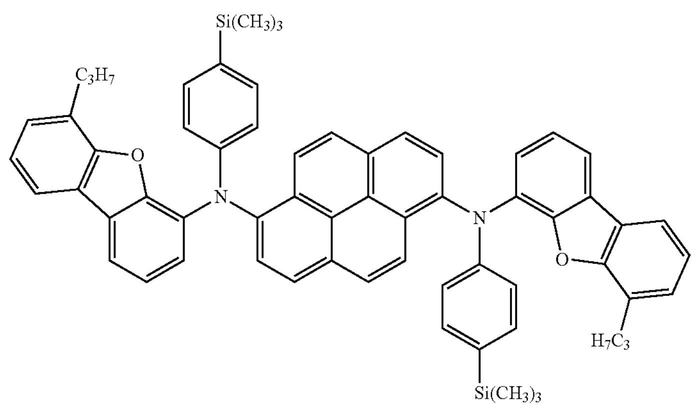
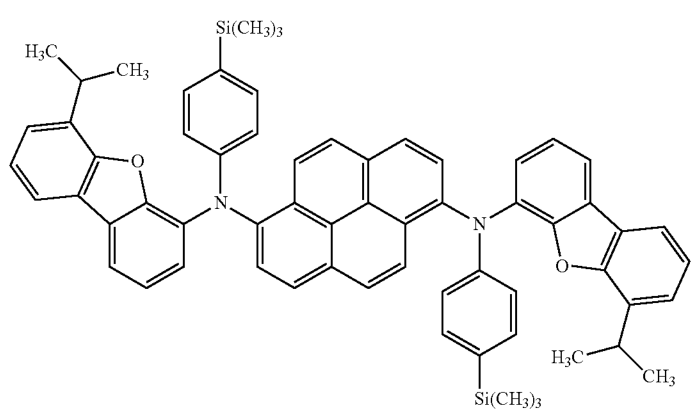
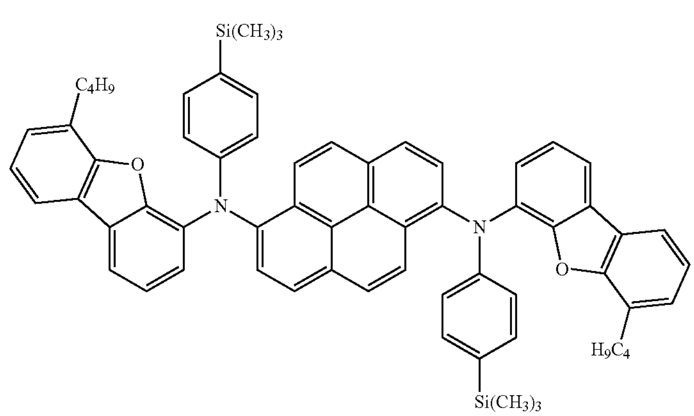

-continued
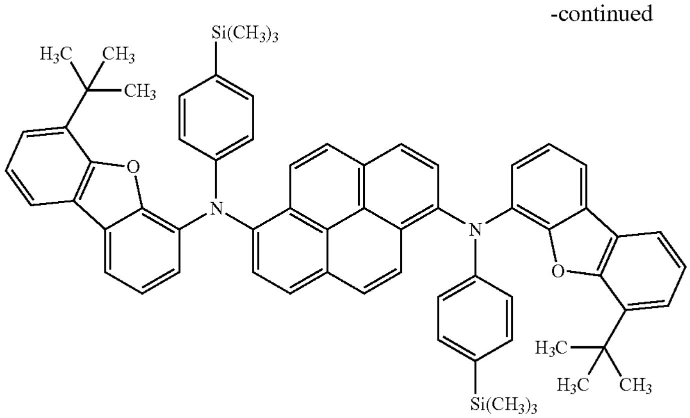
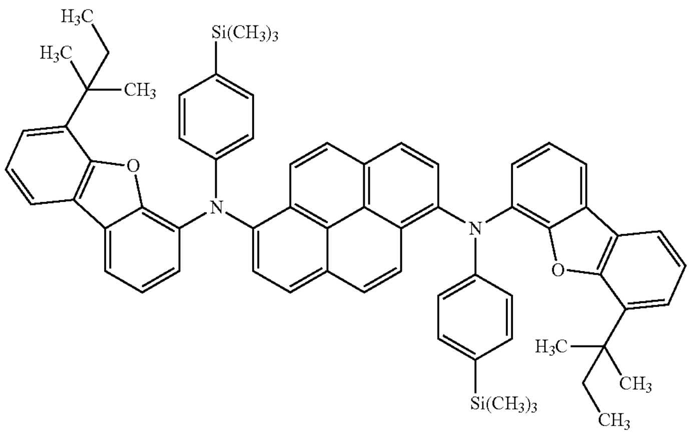
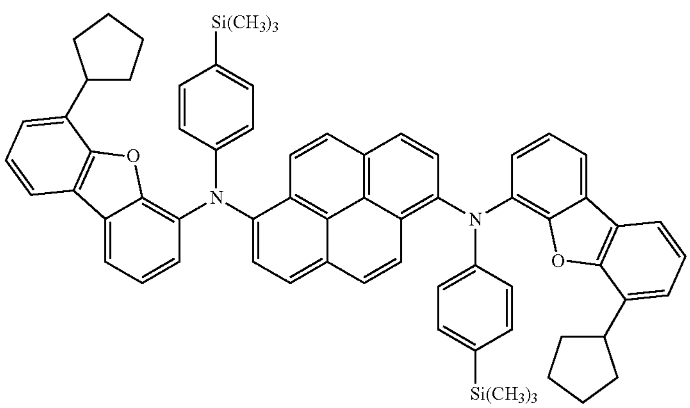
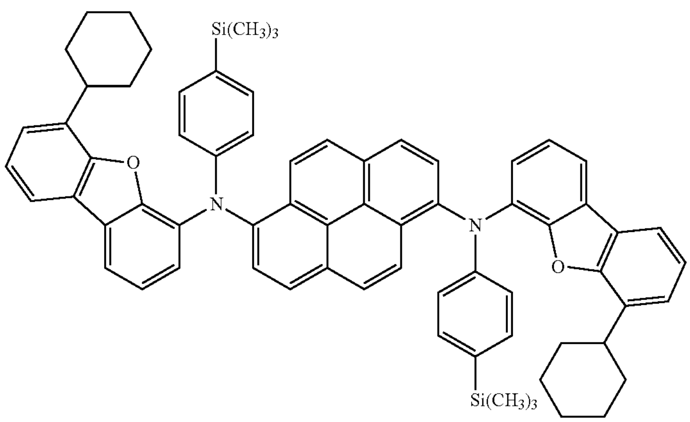

-continued
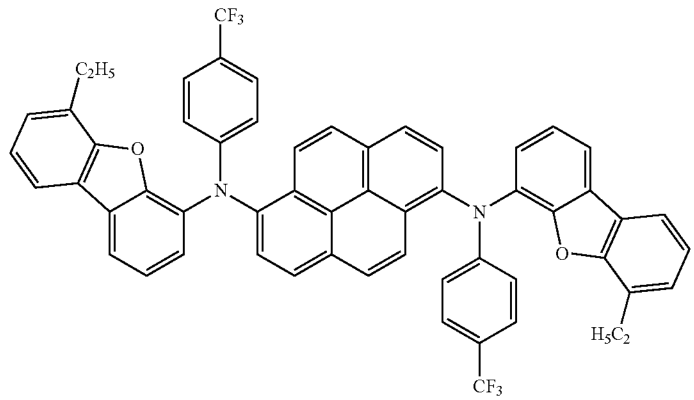
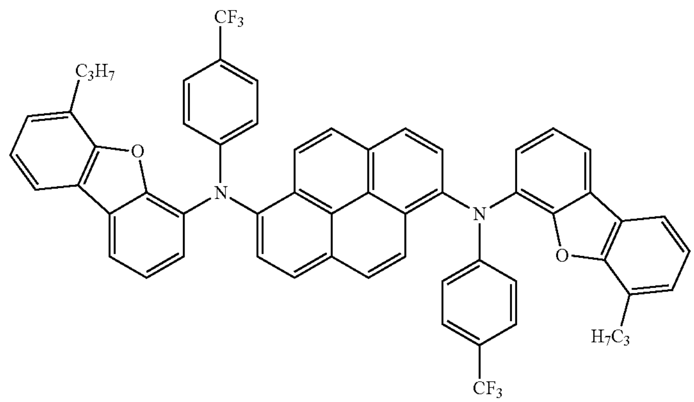
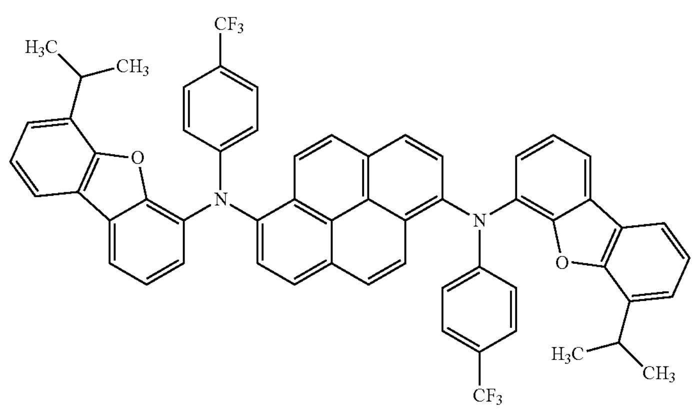
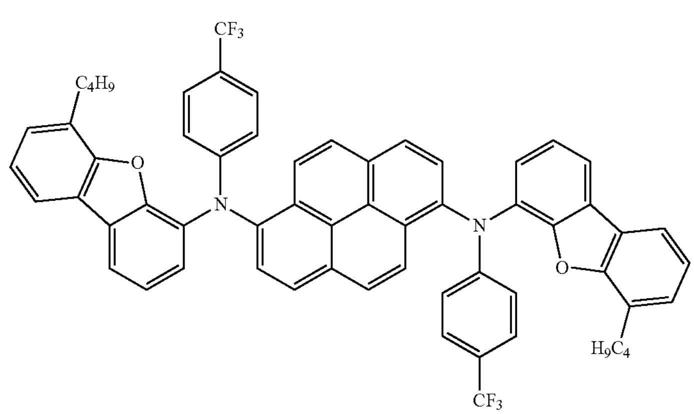

-continued
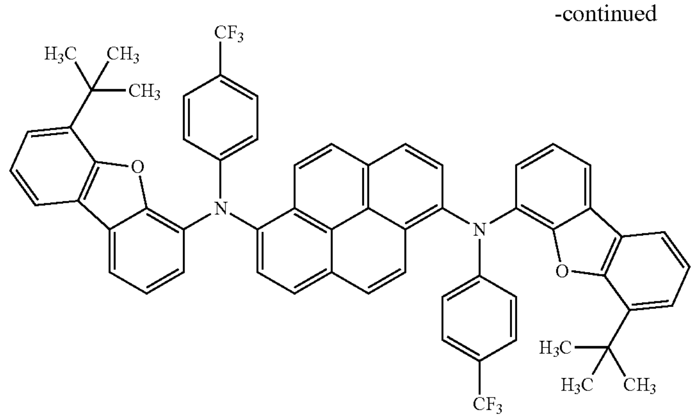
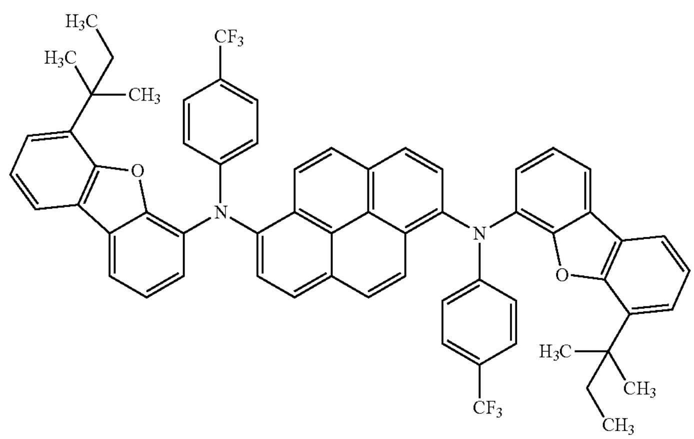
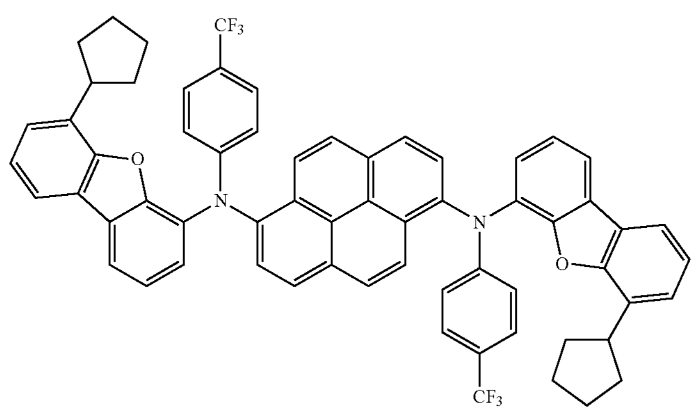
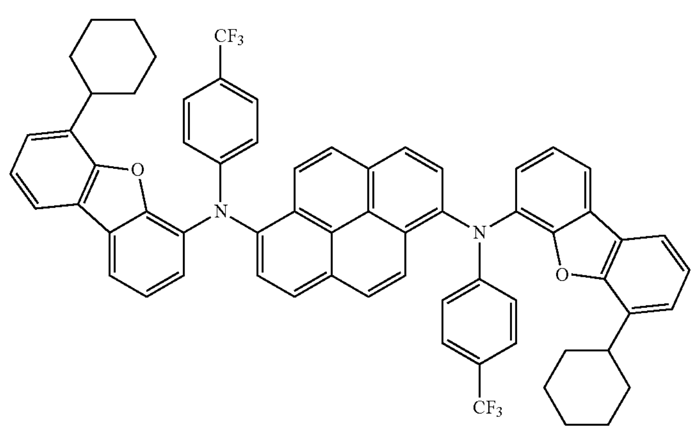

-continued
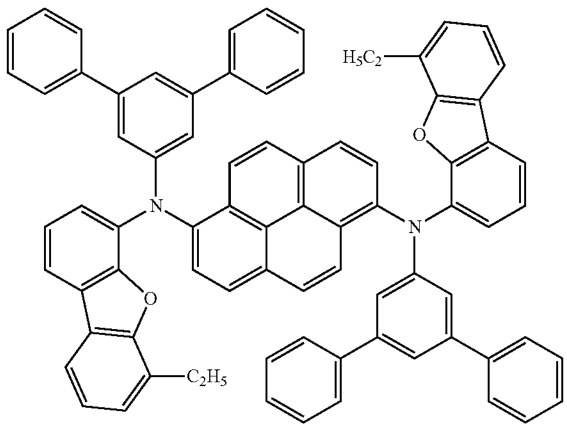
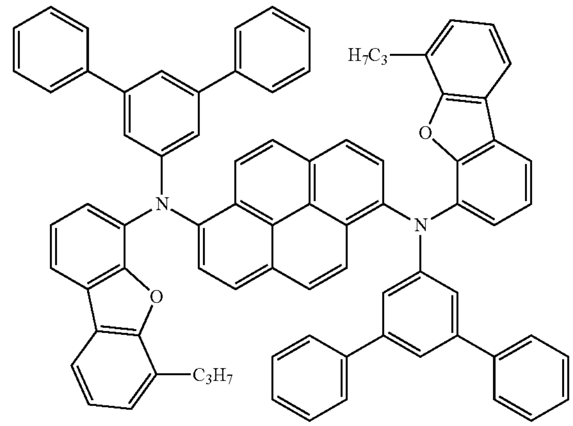
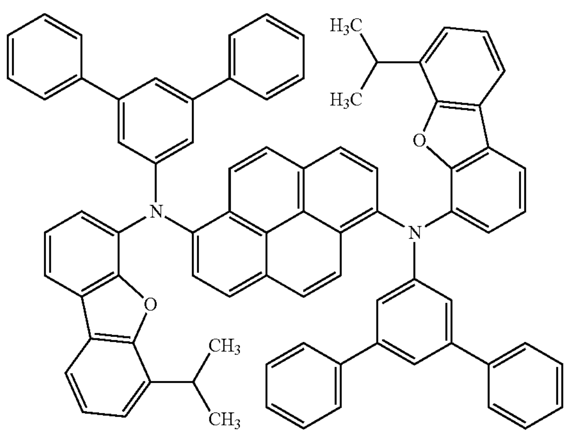
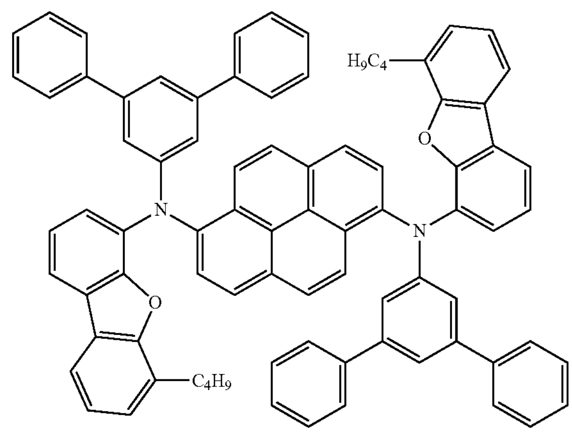
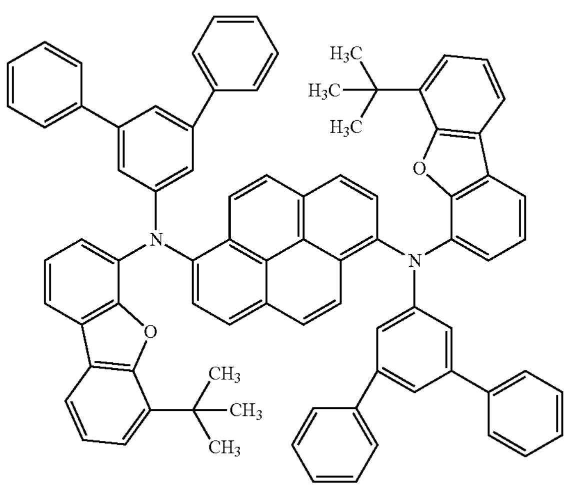
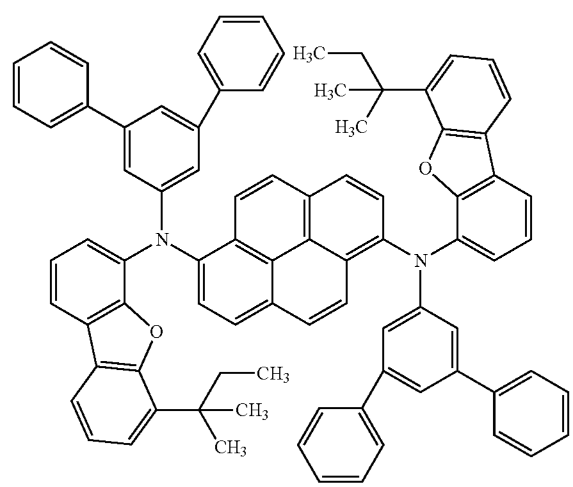

-continued
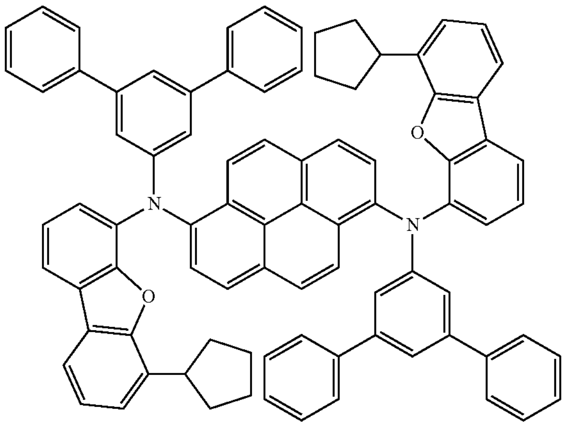
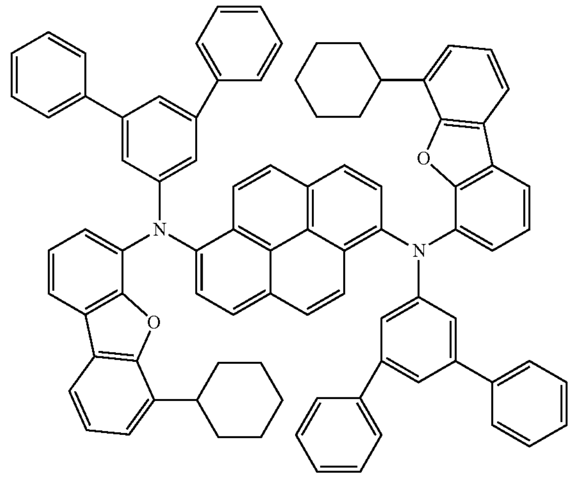
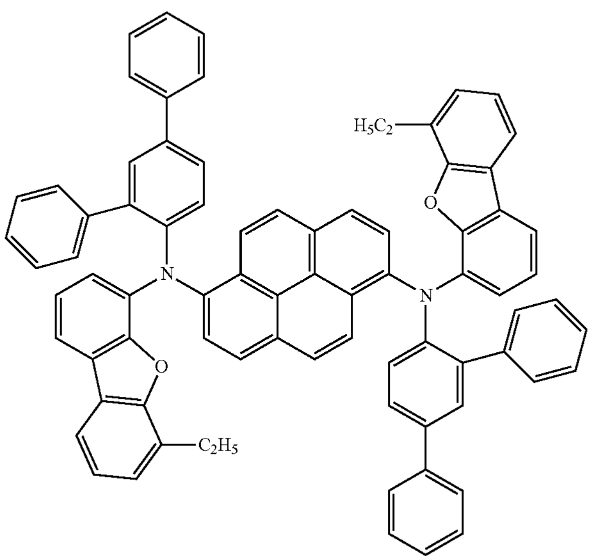
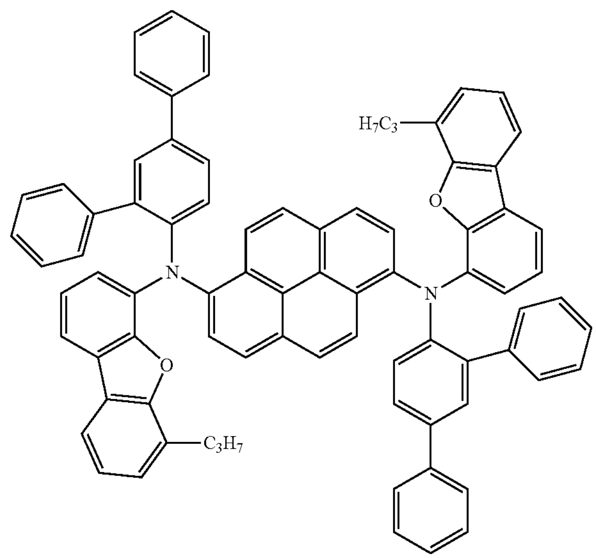
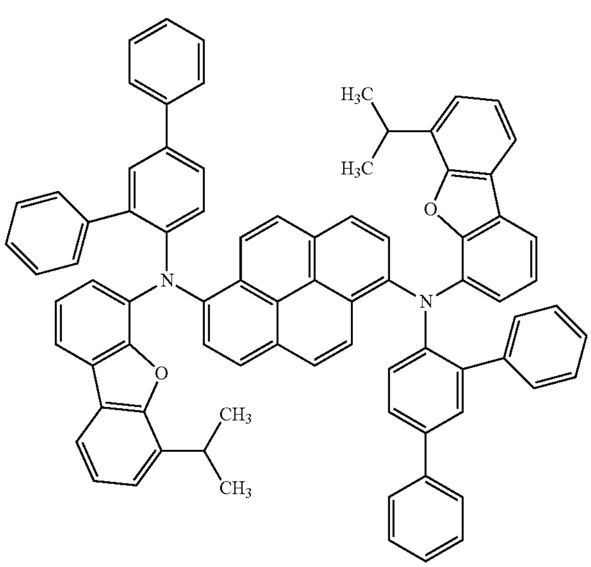
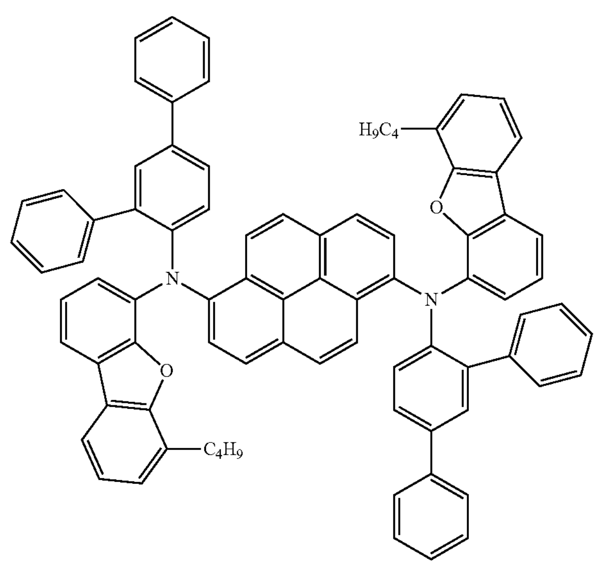

-continued
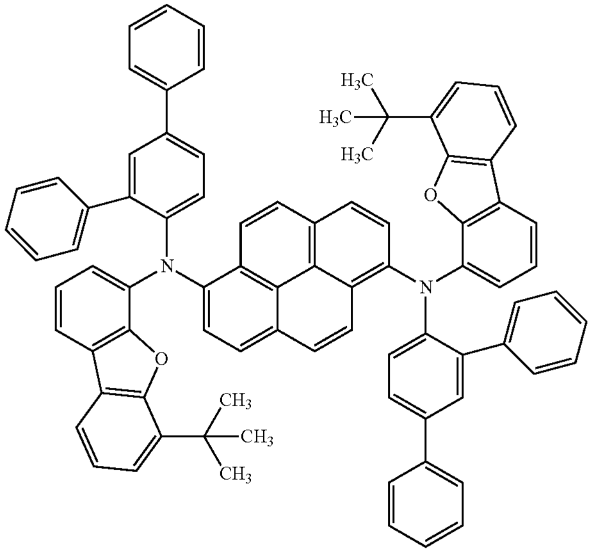
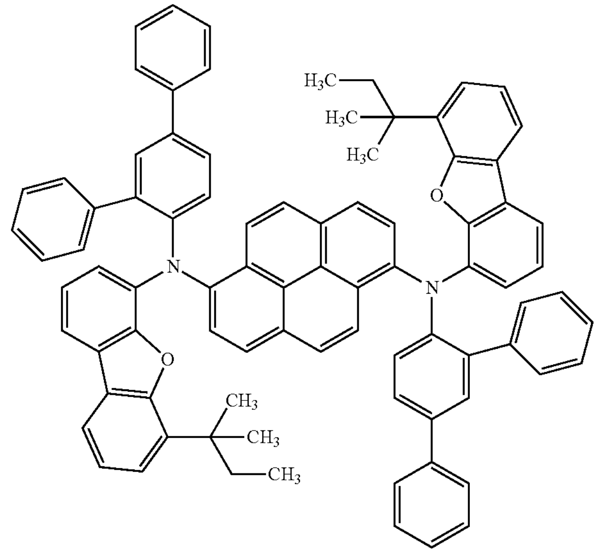
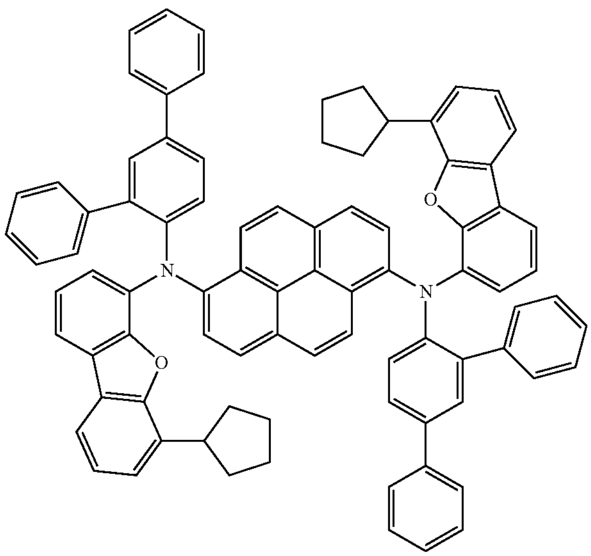
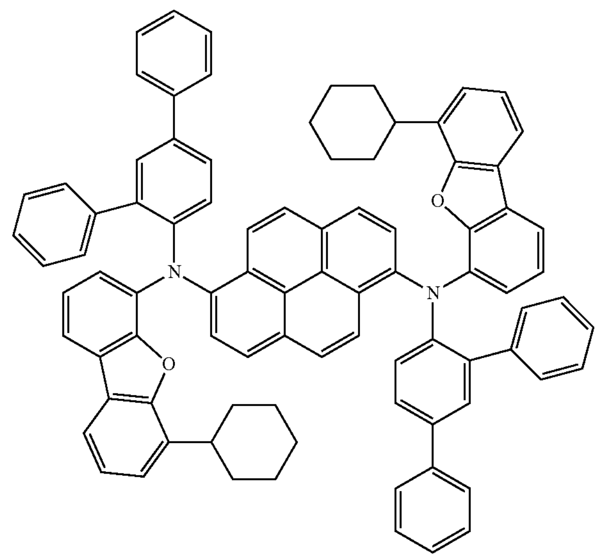
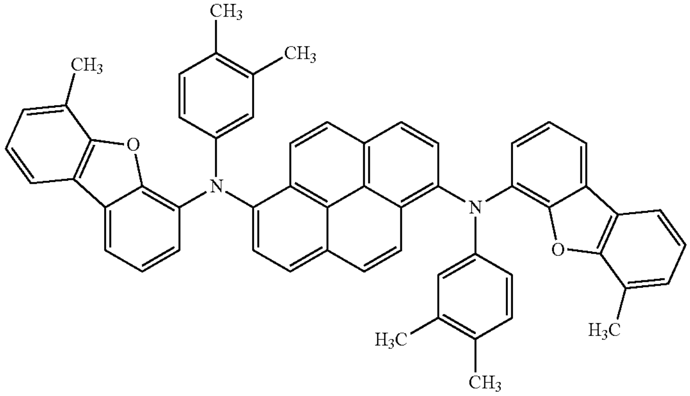

-continued
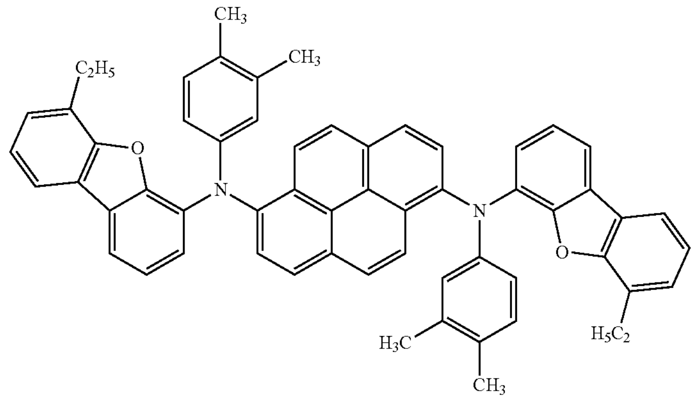
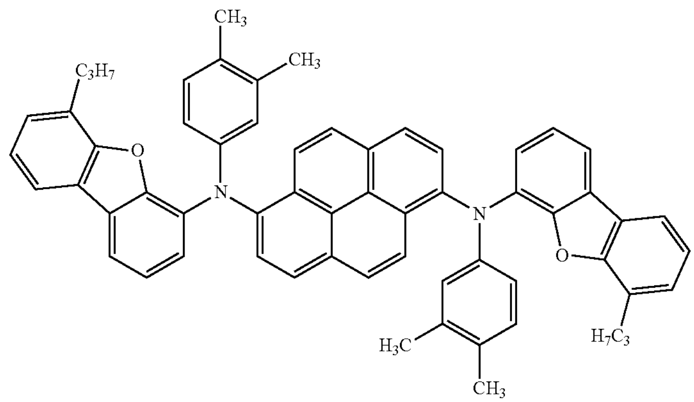
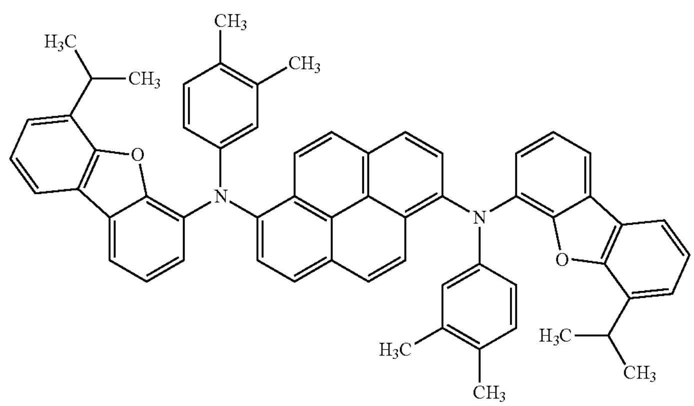
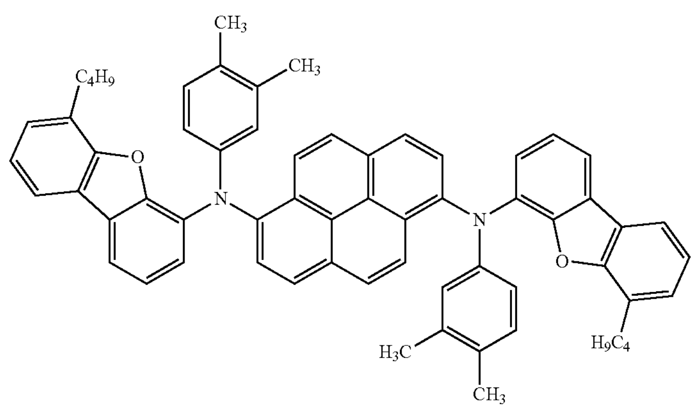

-continued
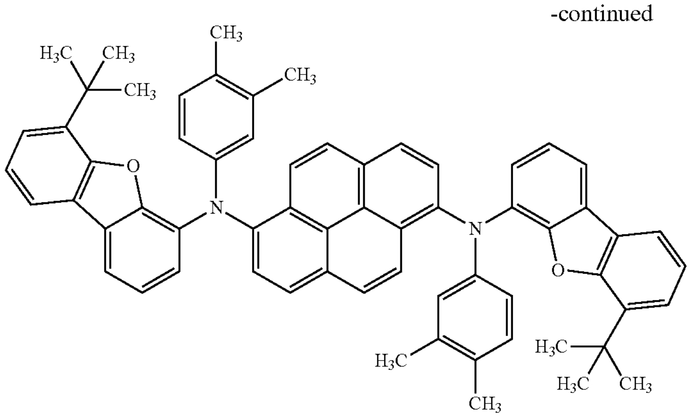
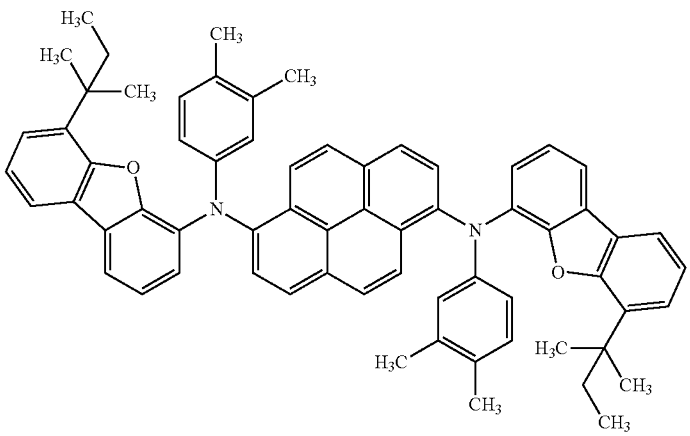
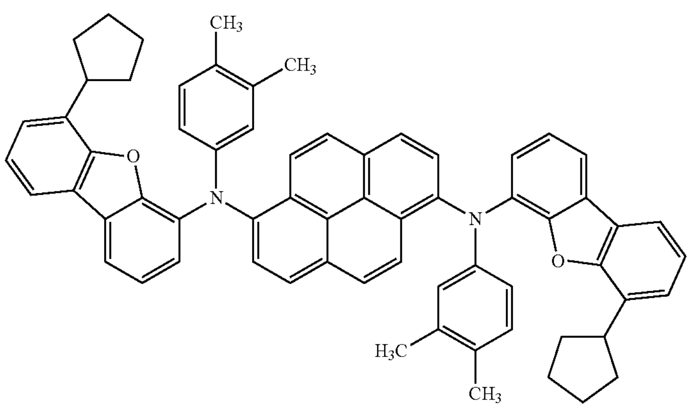
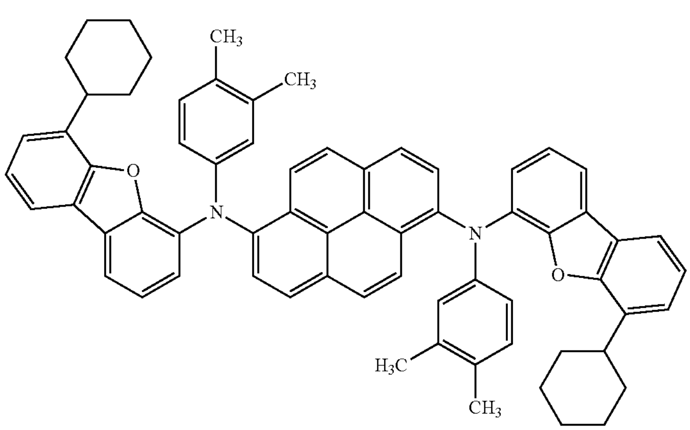
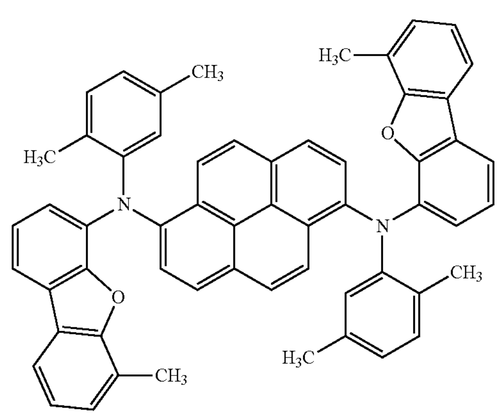

-continued
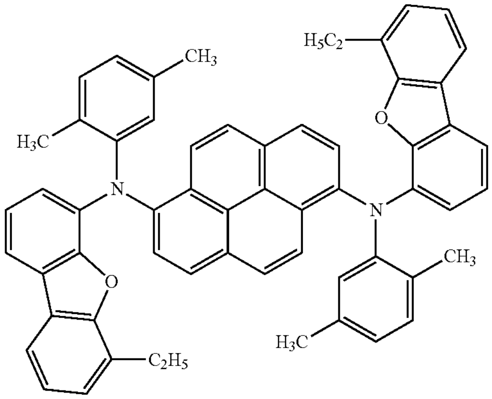
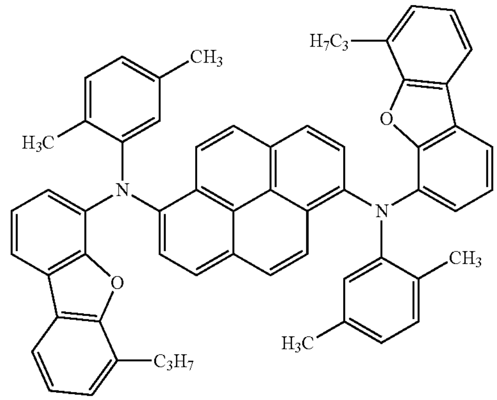
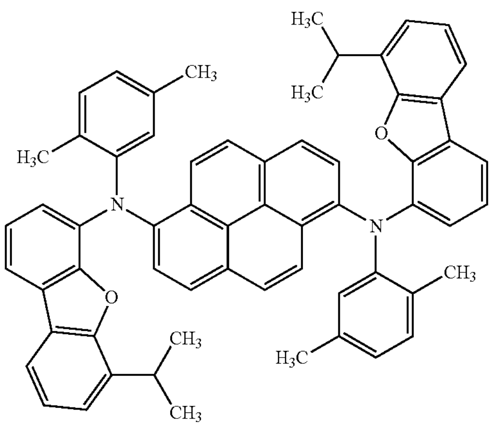
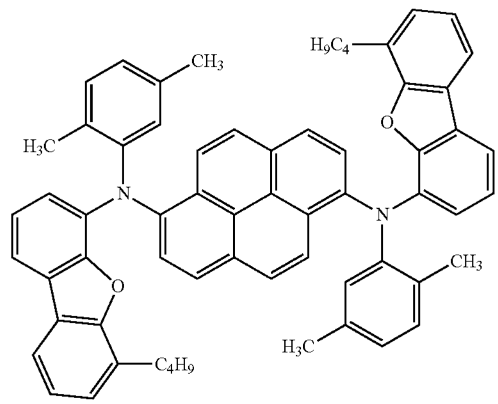
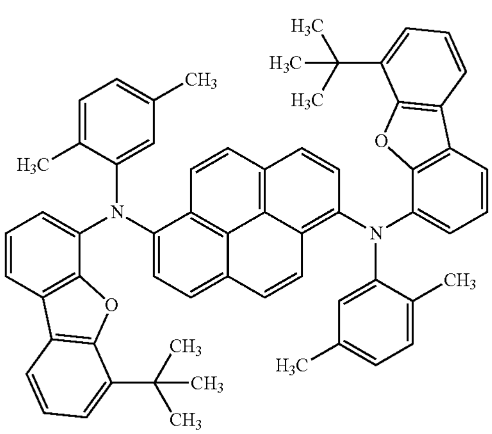
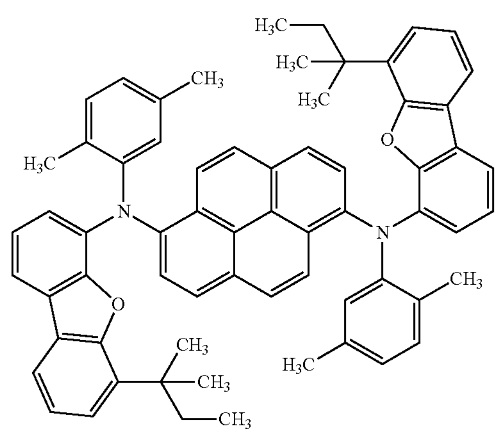
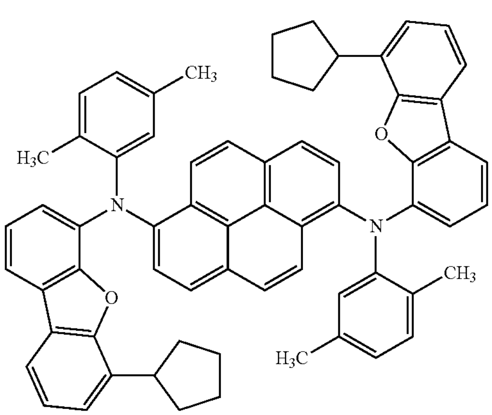
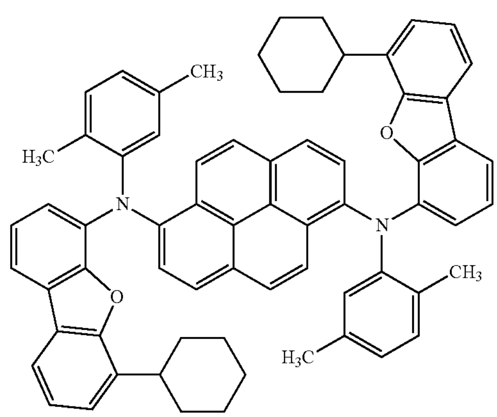

-continued
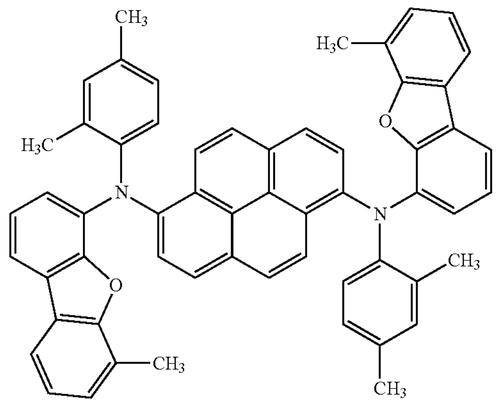
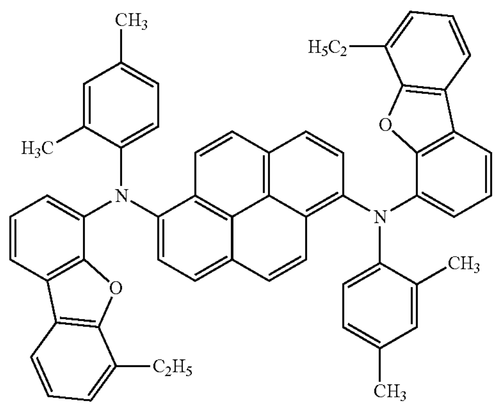
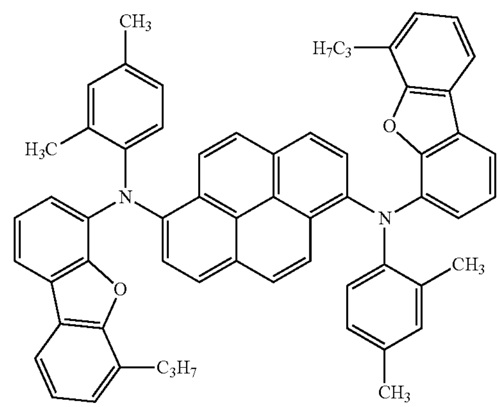
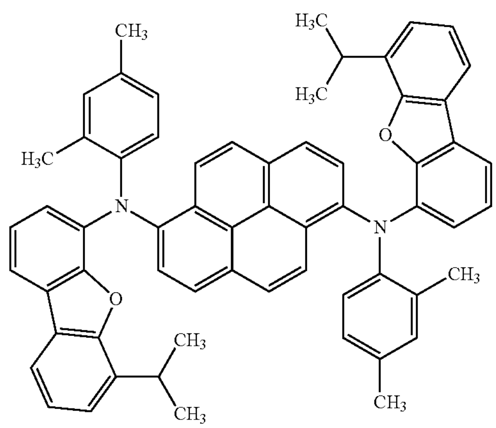
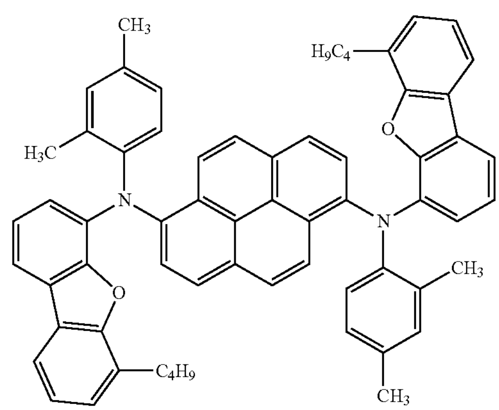
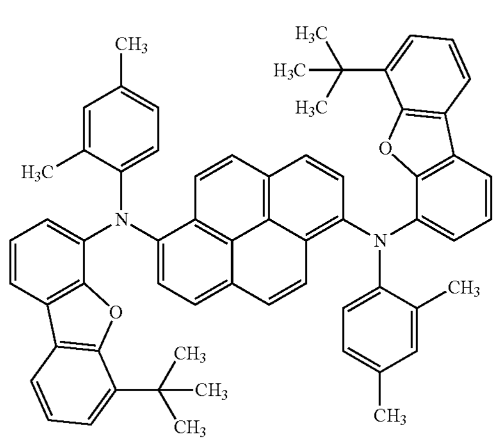
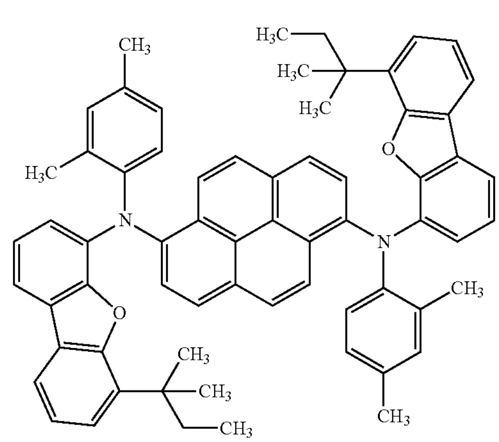

-continued
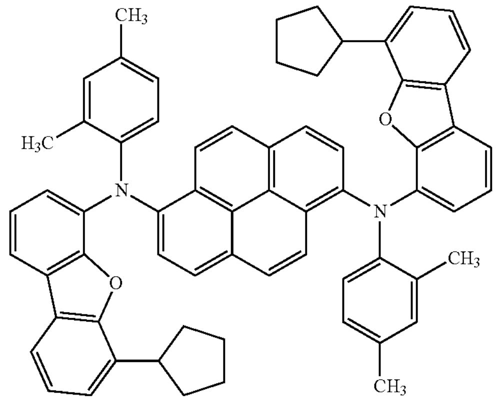
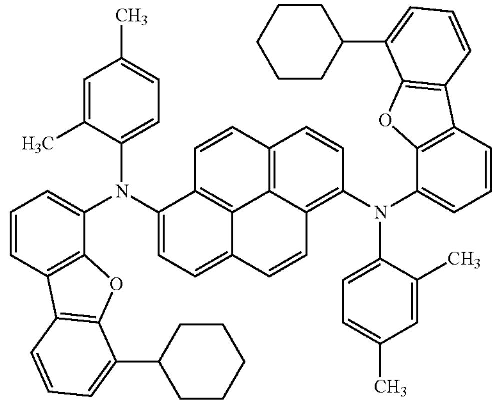
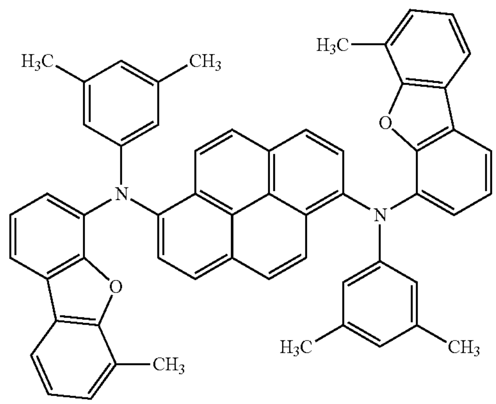
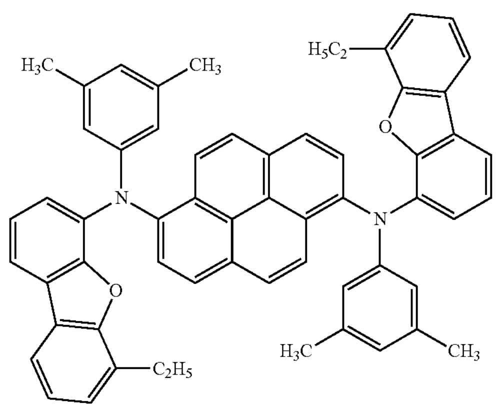
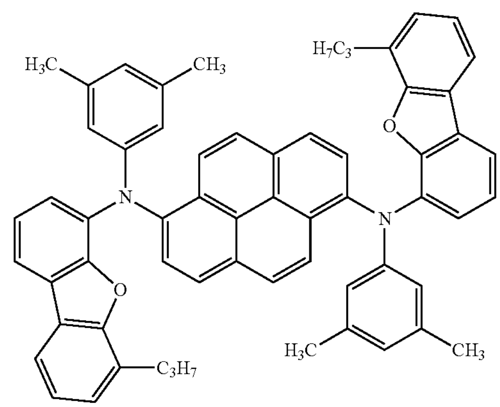
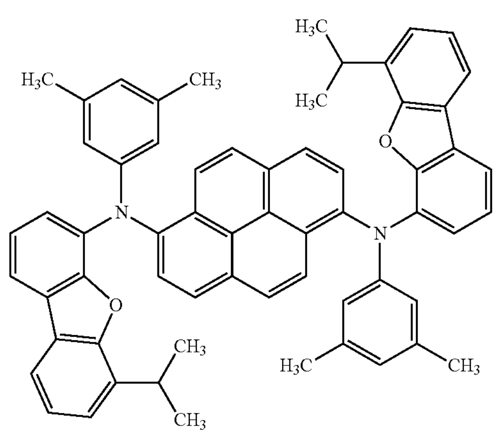
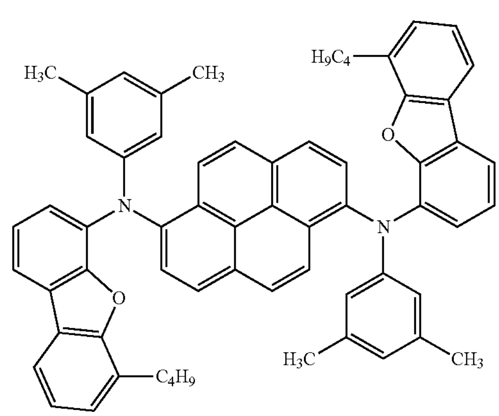

-continued
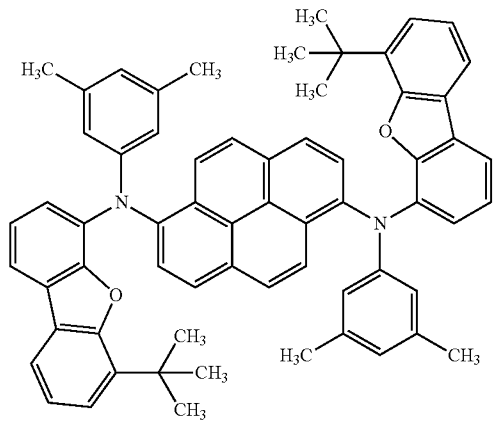
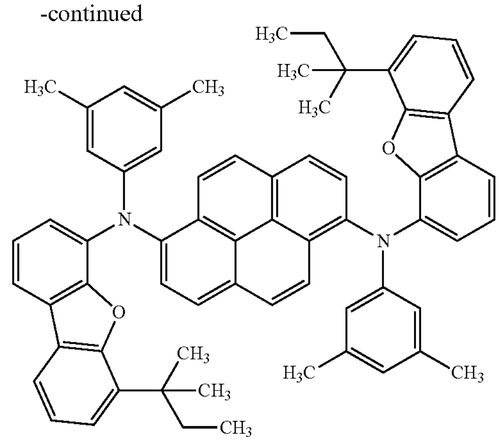
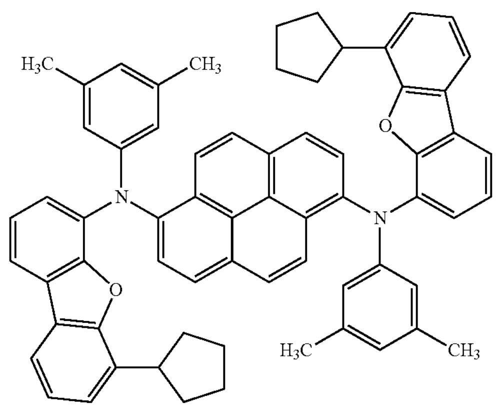
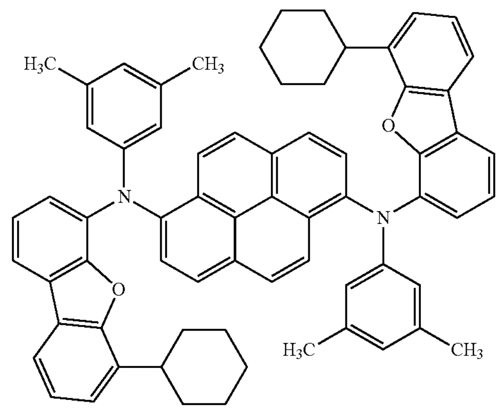
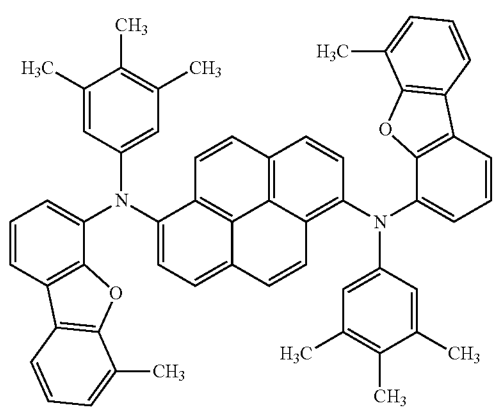
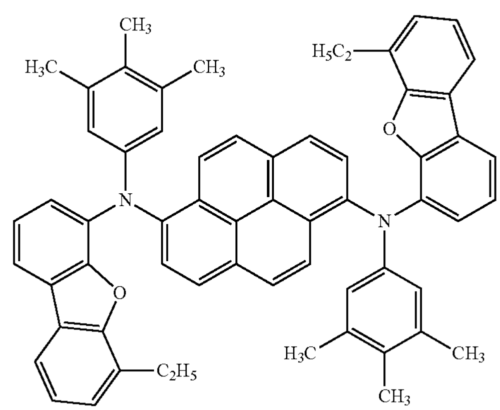
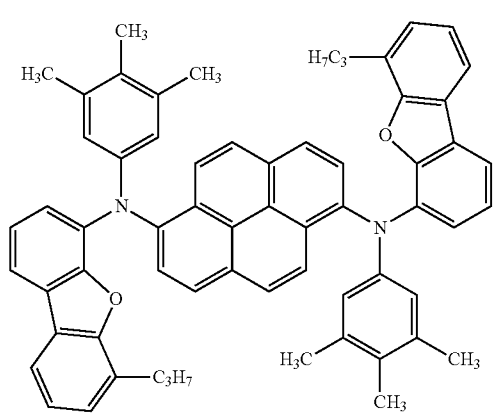
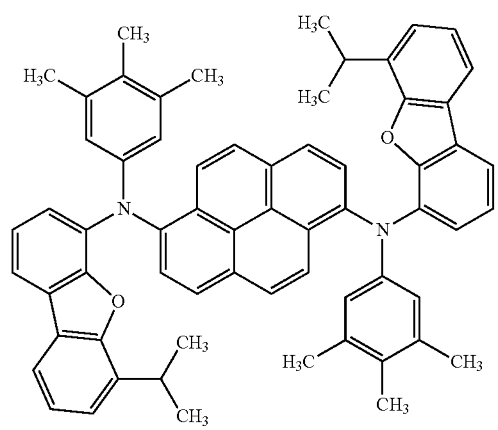

-continued
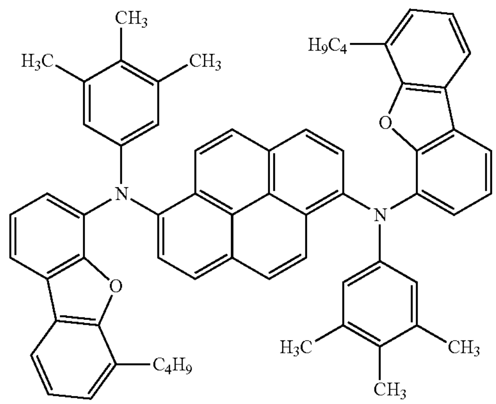
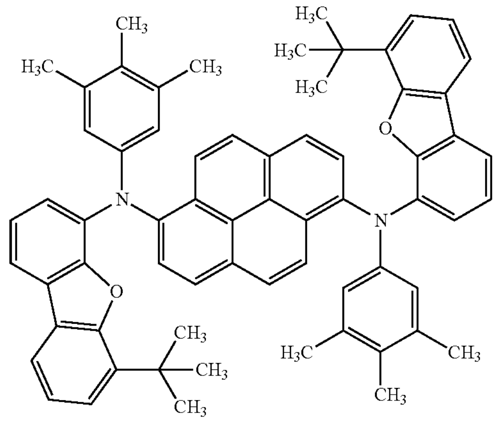
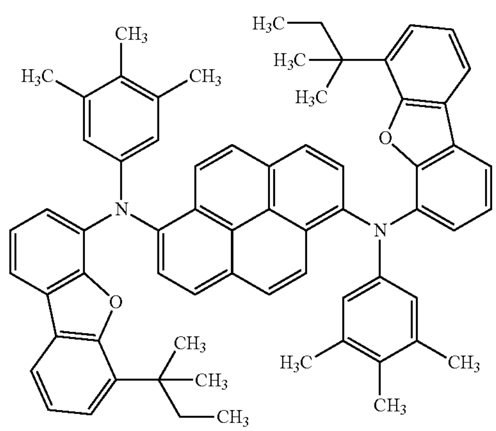
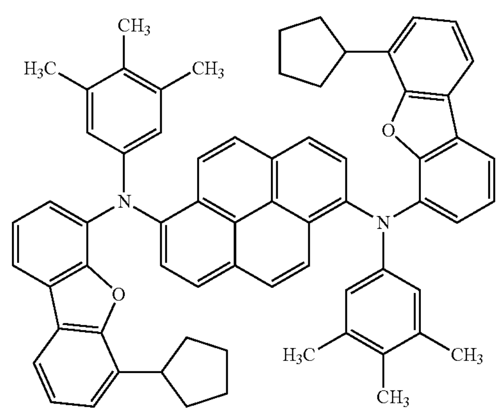
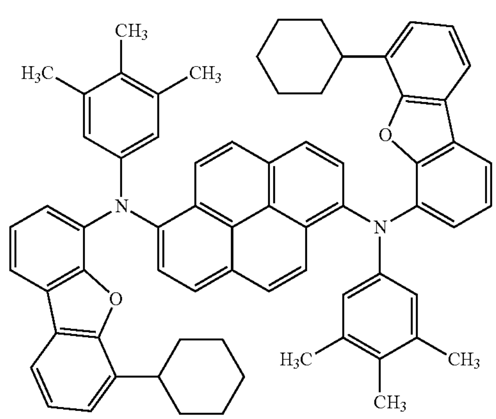

-continued
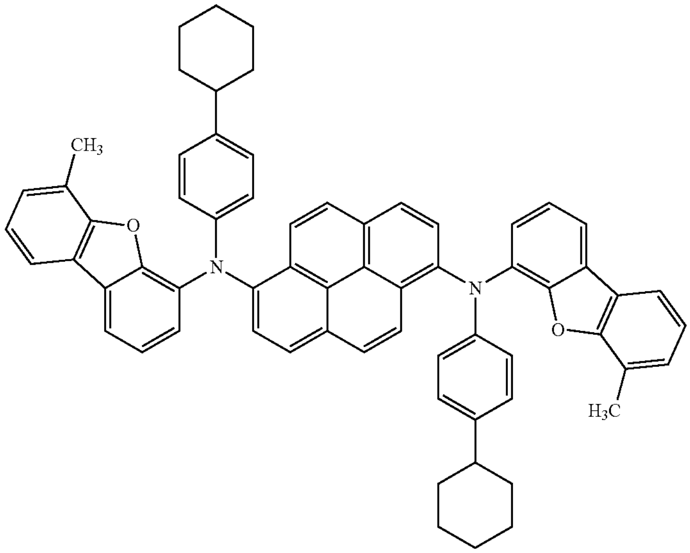
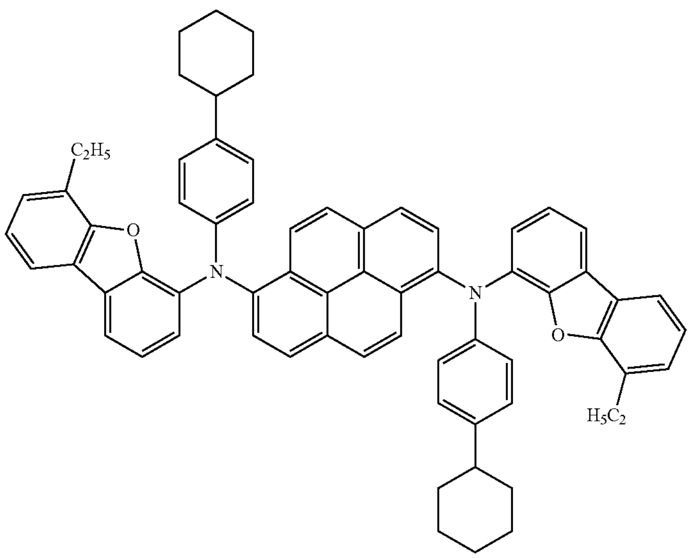
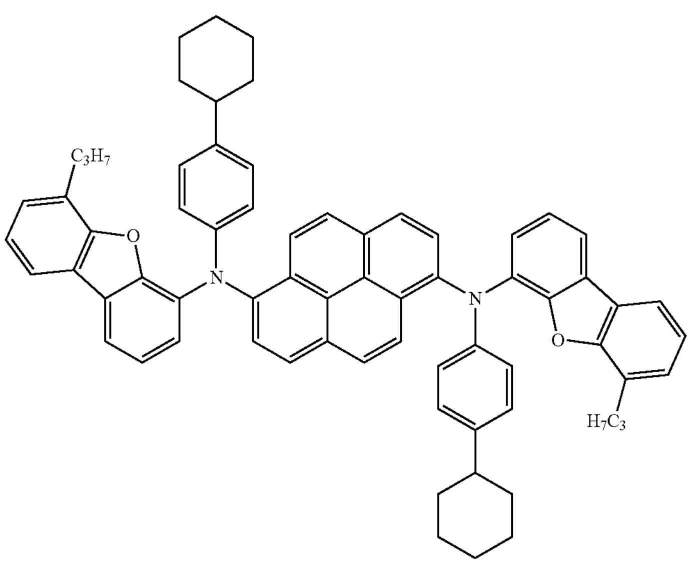

-continued
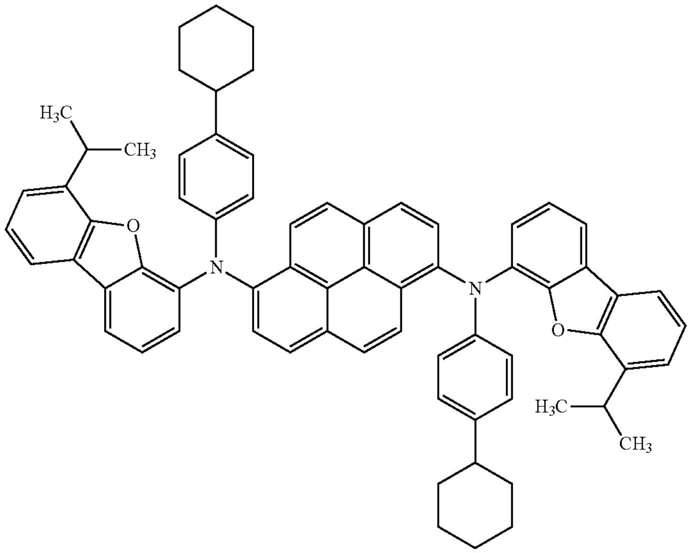
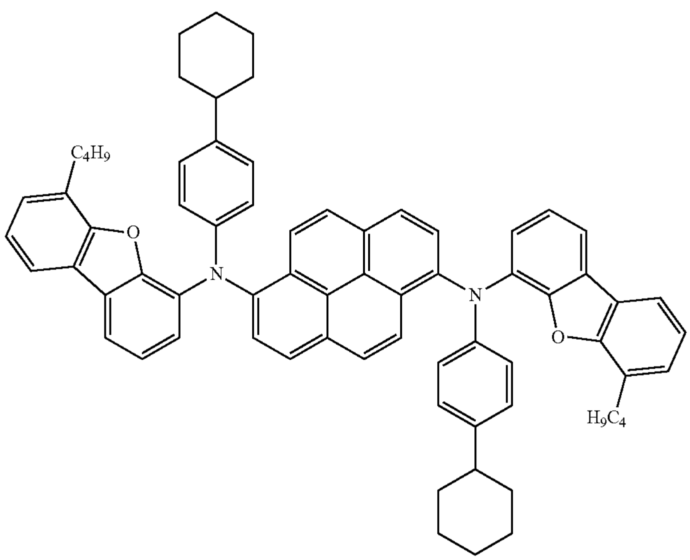
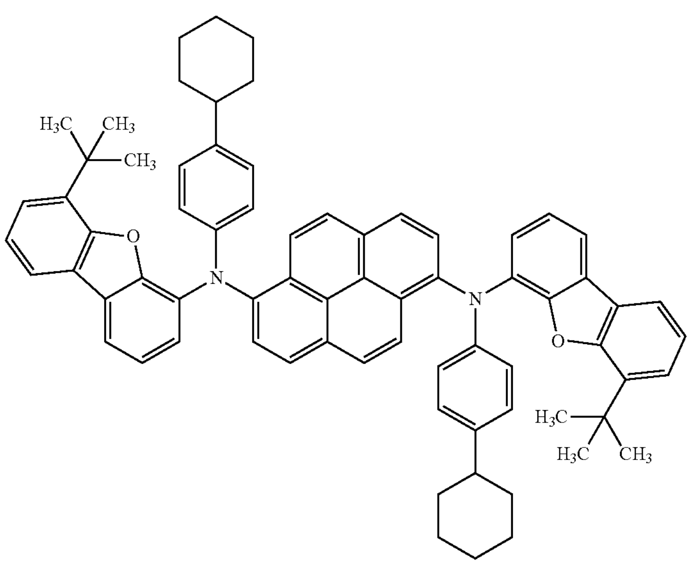

-continued
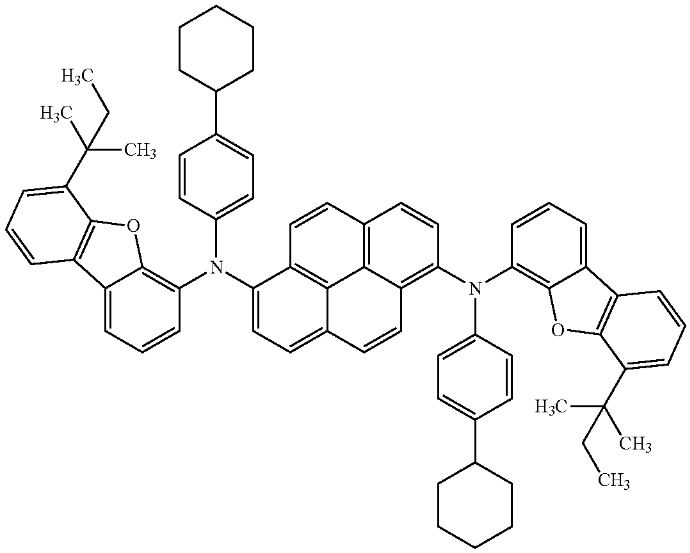
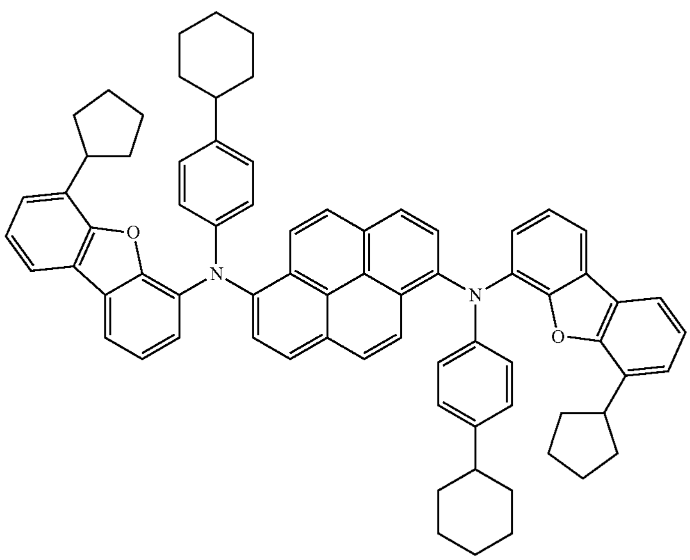
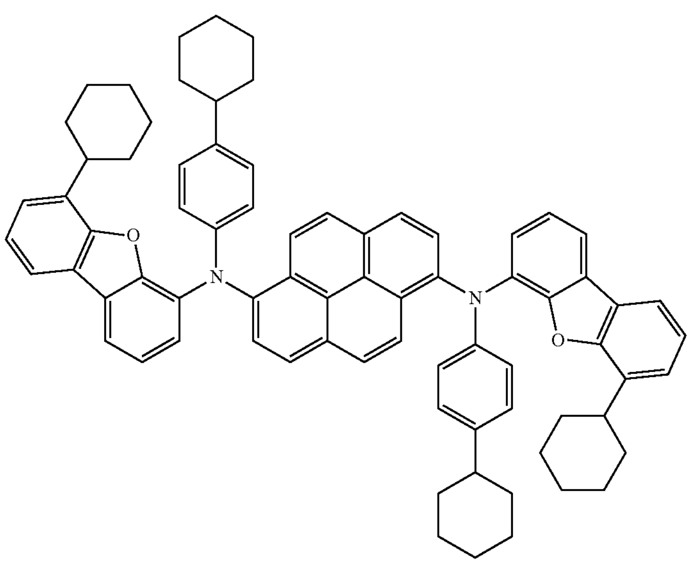

-continued
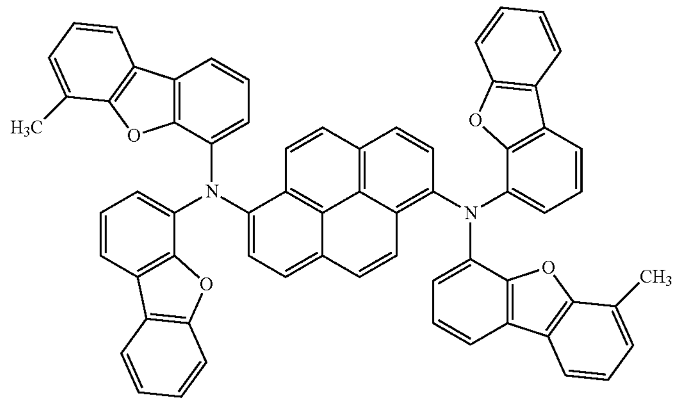
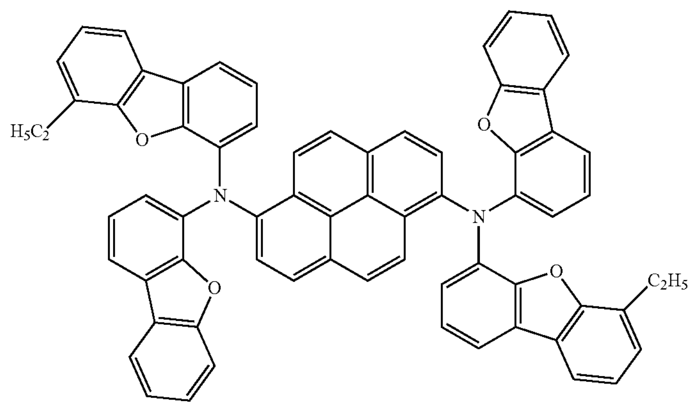
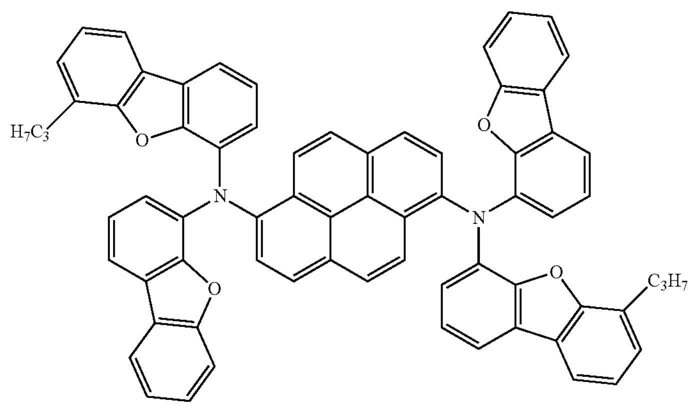
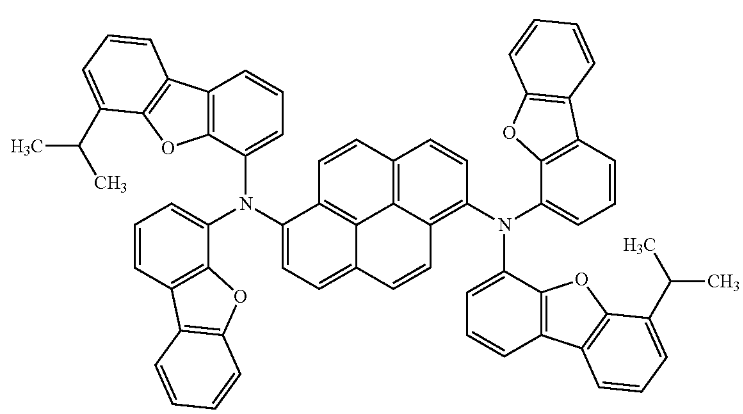

-continued
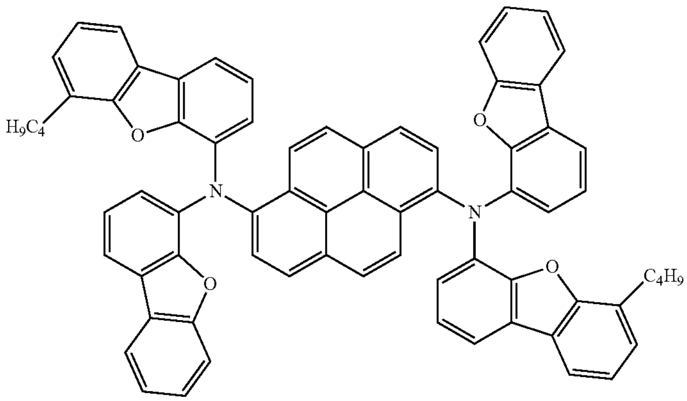
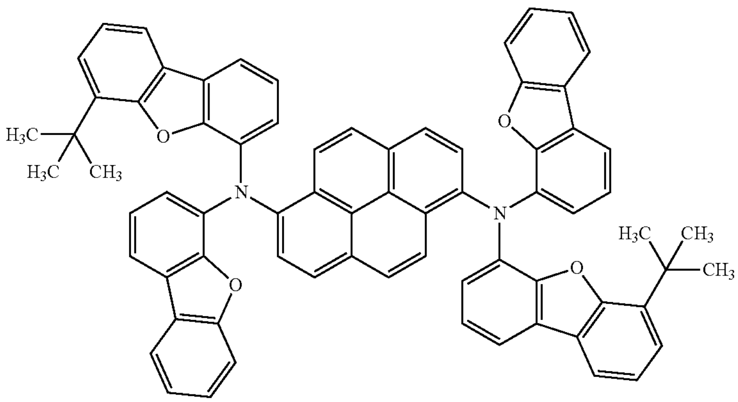
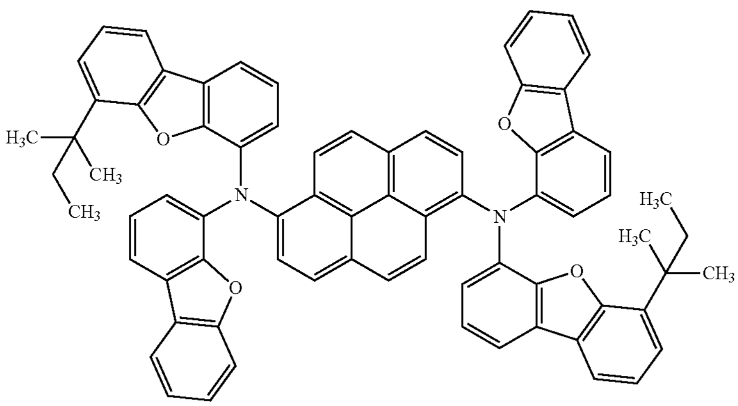
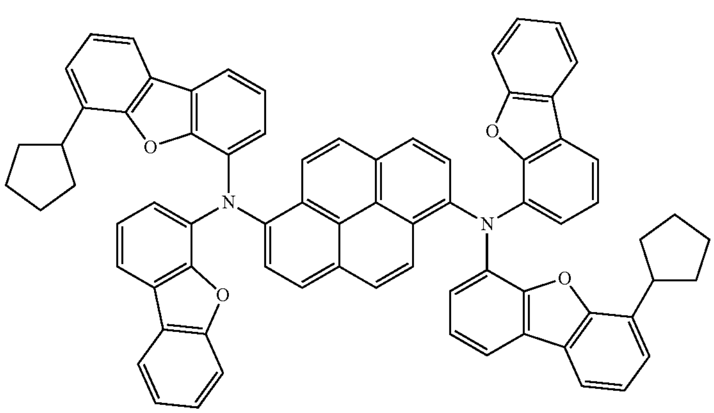

-continued
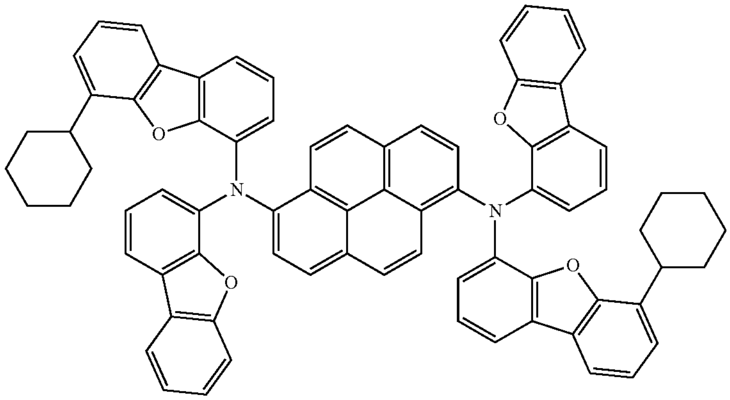
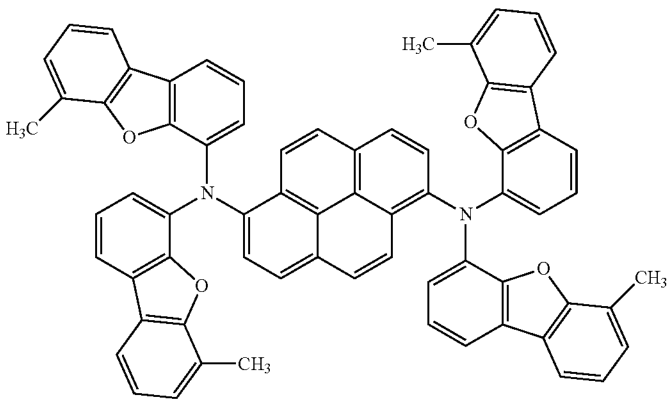
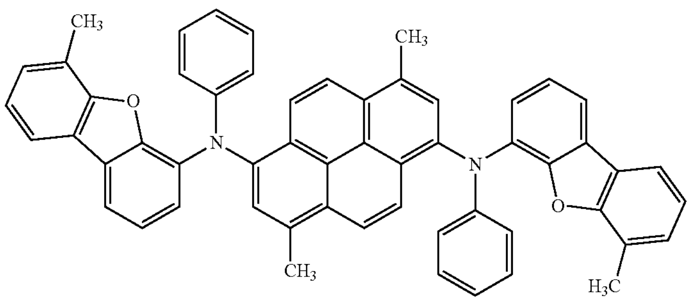
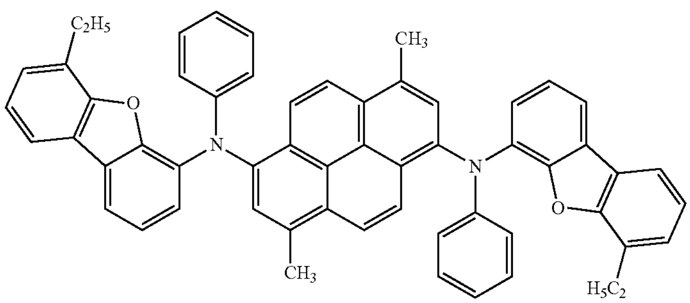
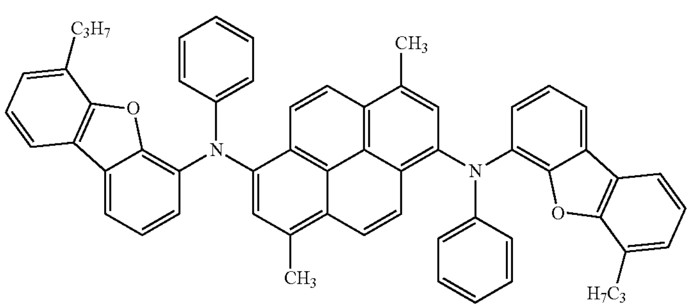

-continued
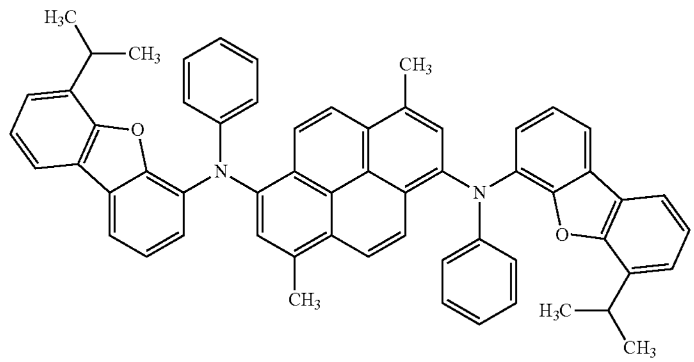
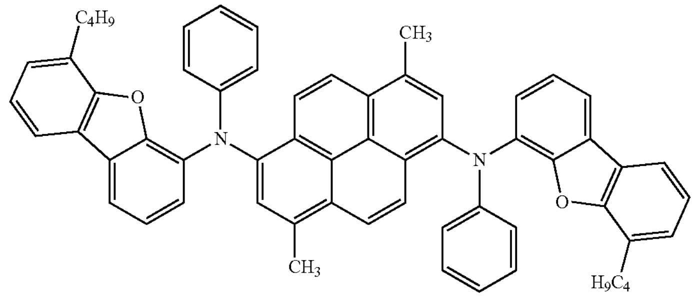
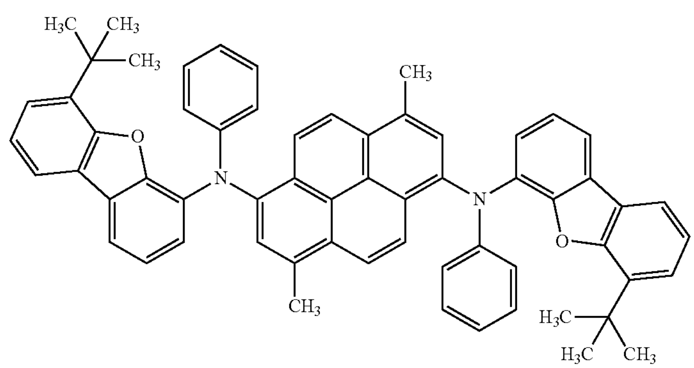
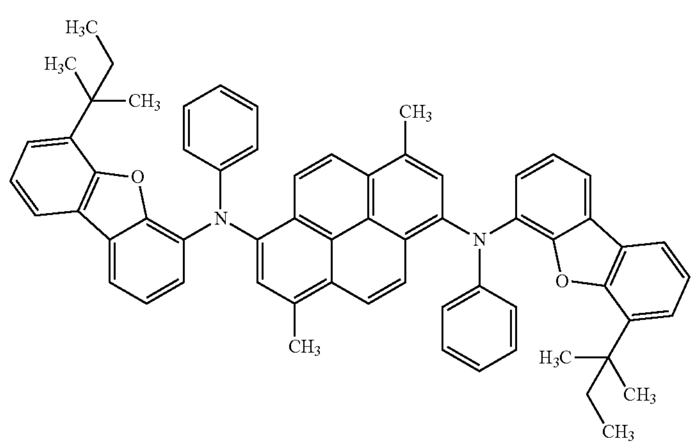

-continued
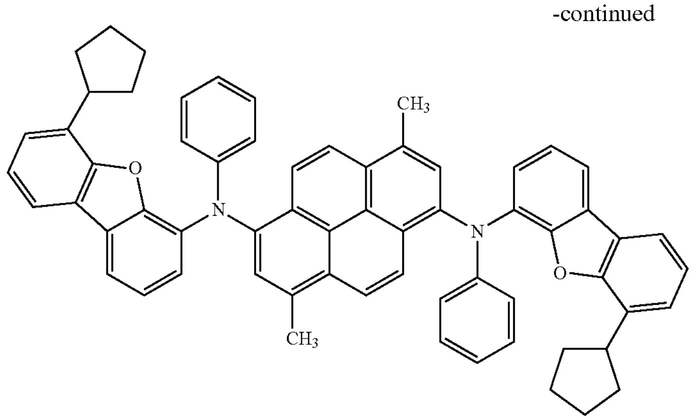
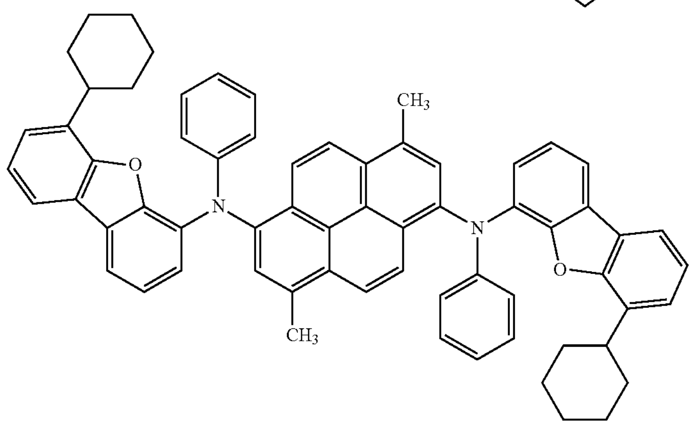
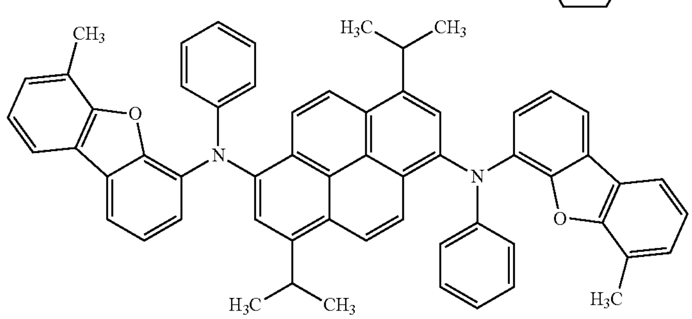
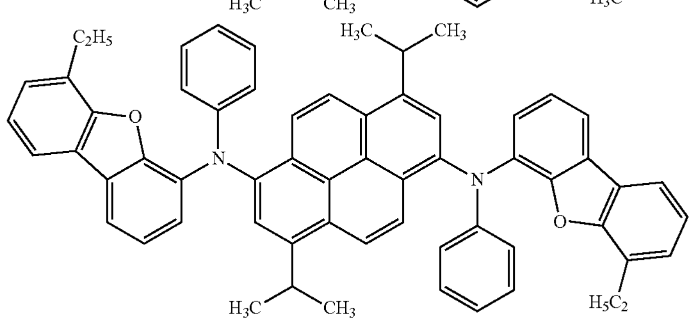
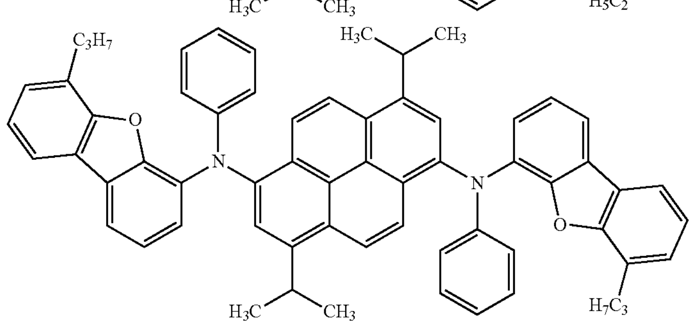

-continued
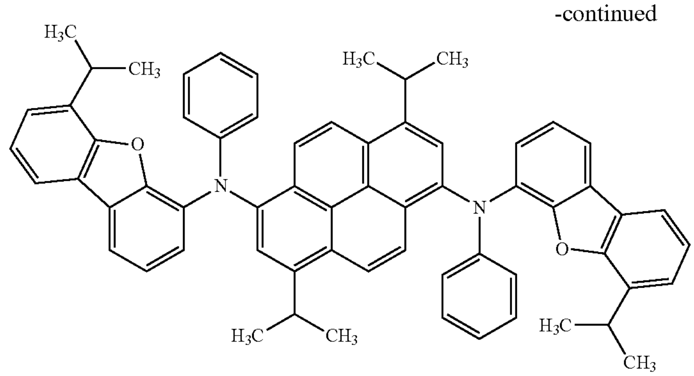
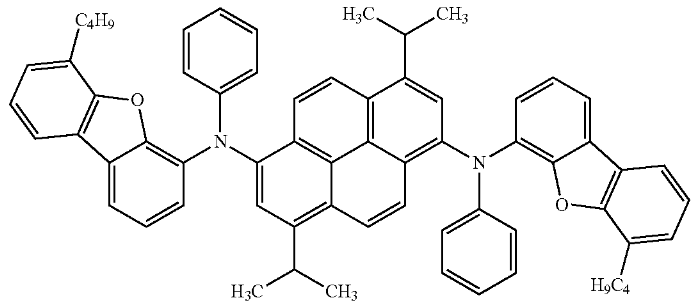
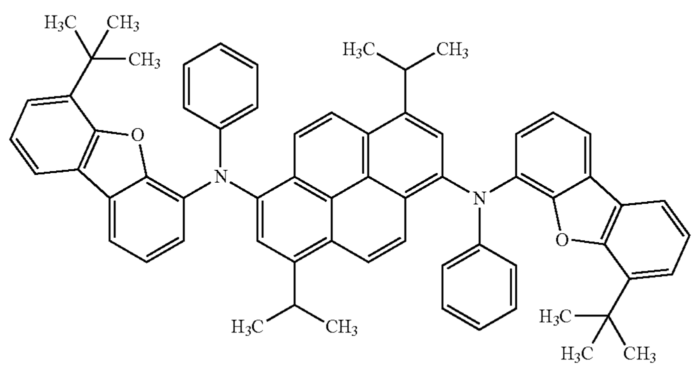
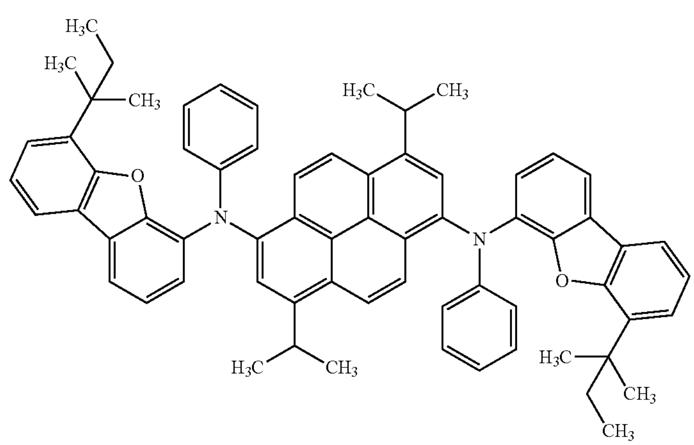

-continued
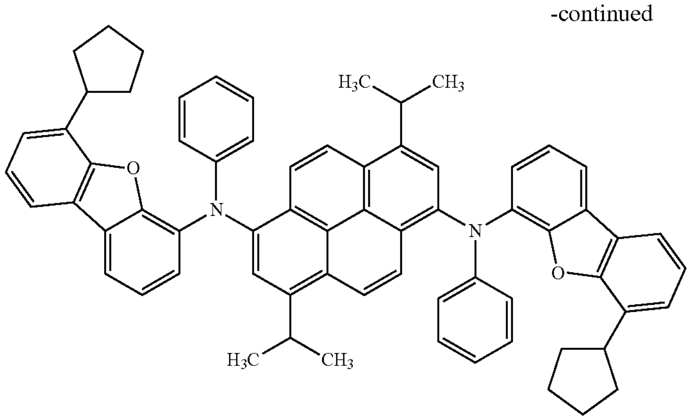
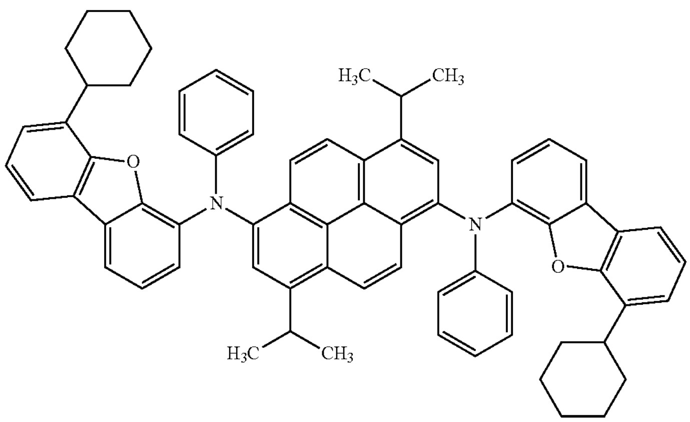
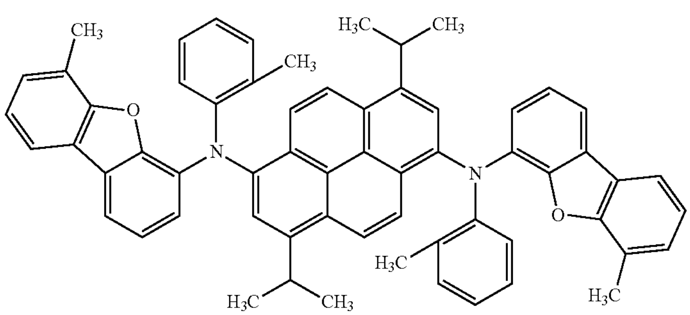
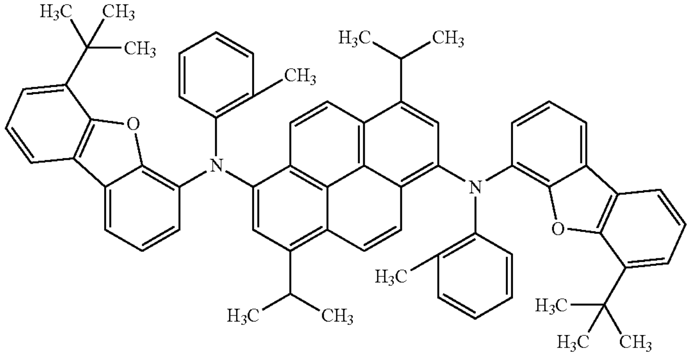

-continued
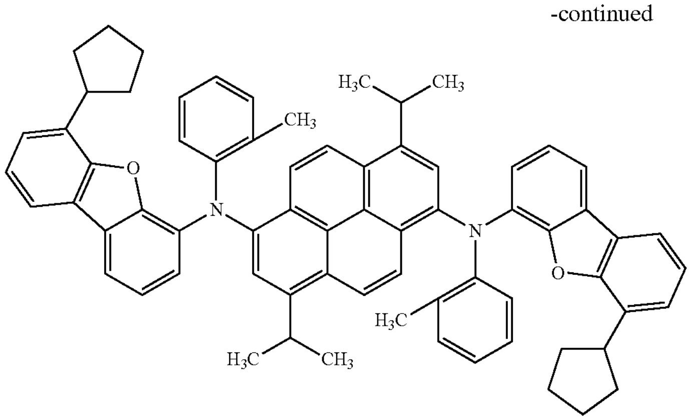
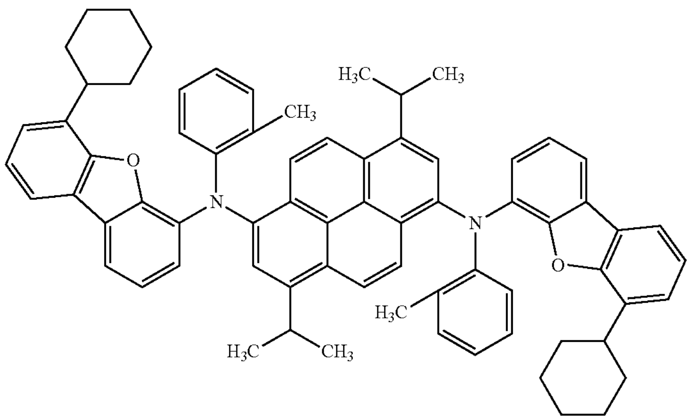
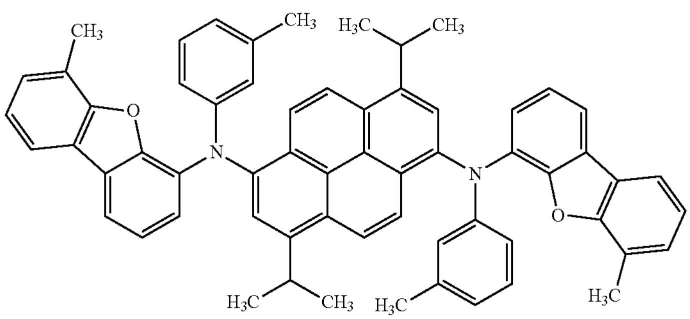
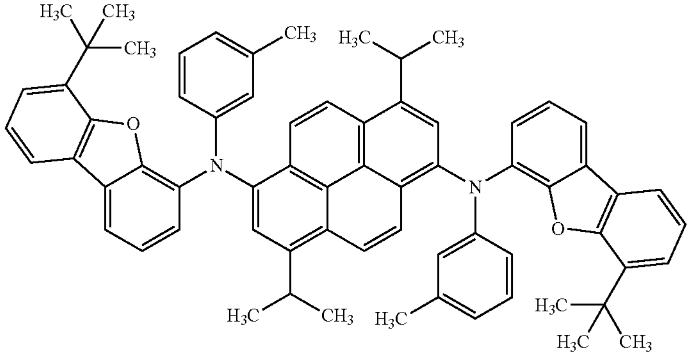

-continued
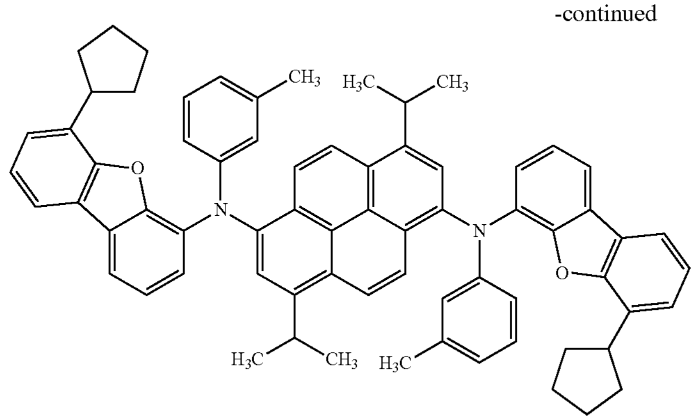
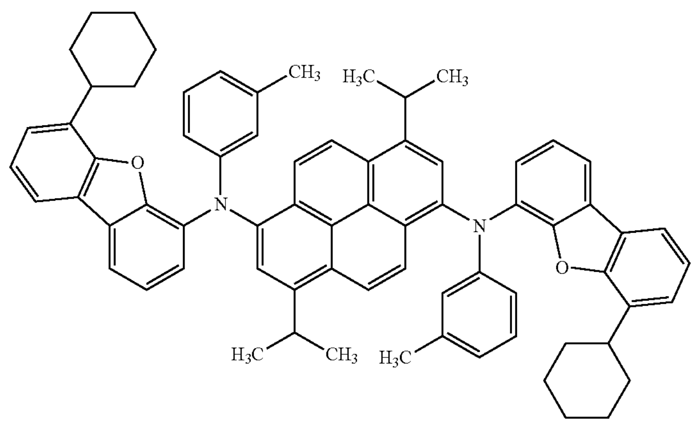
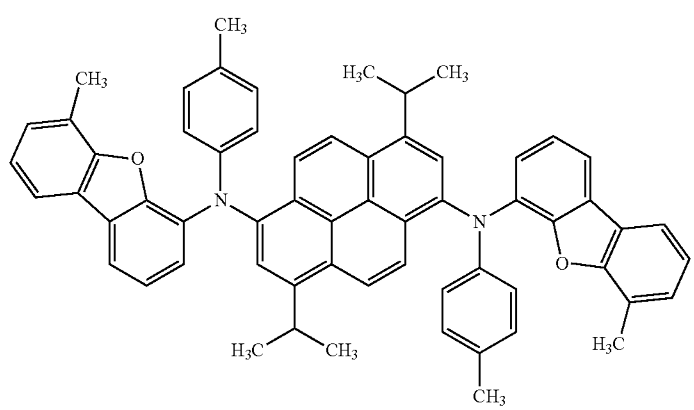
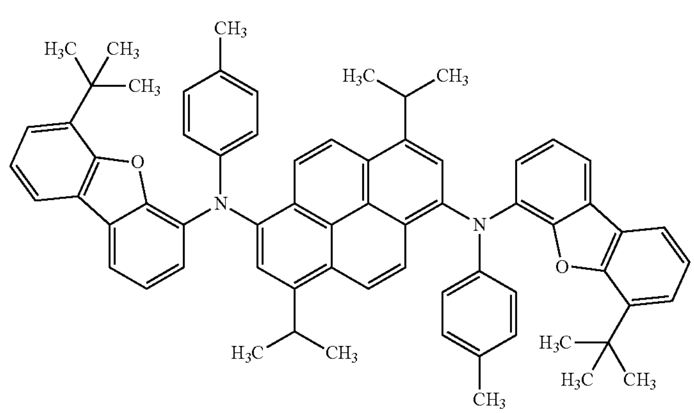

-continued
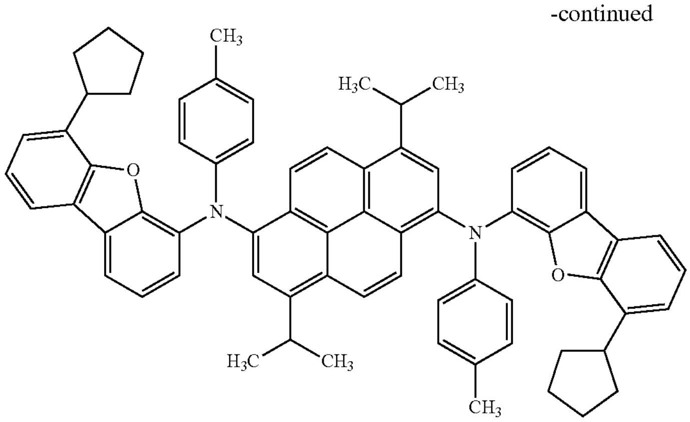
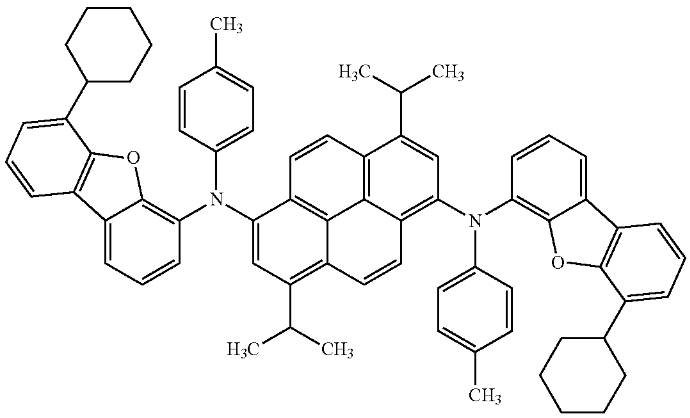
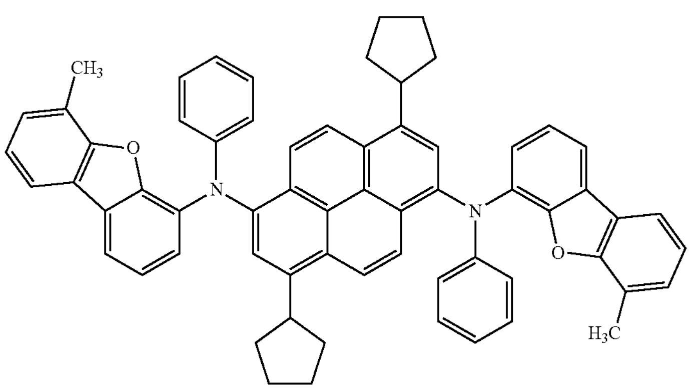
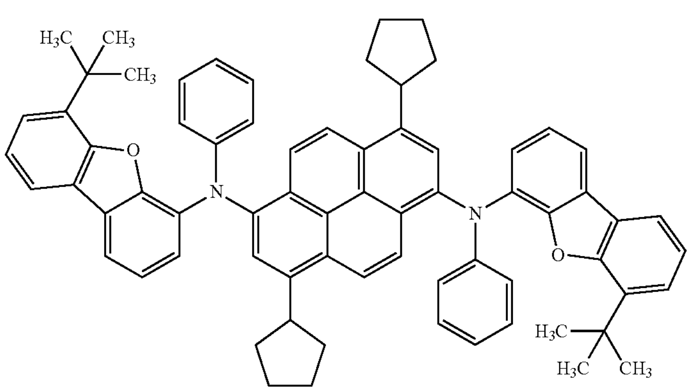

-continued
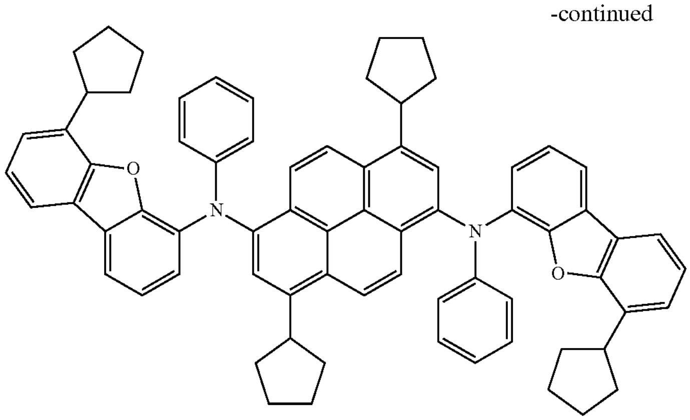
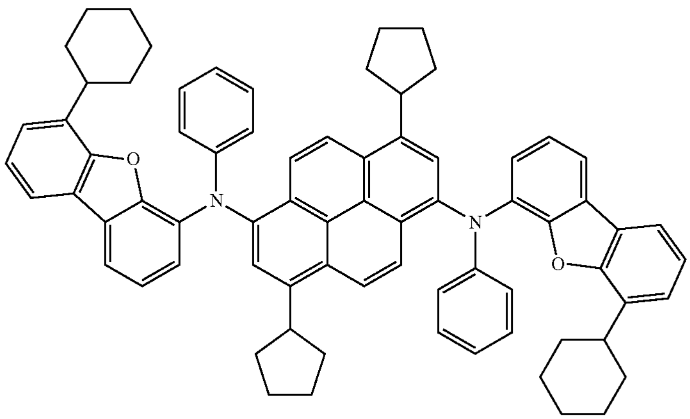
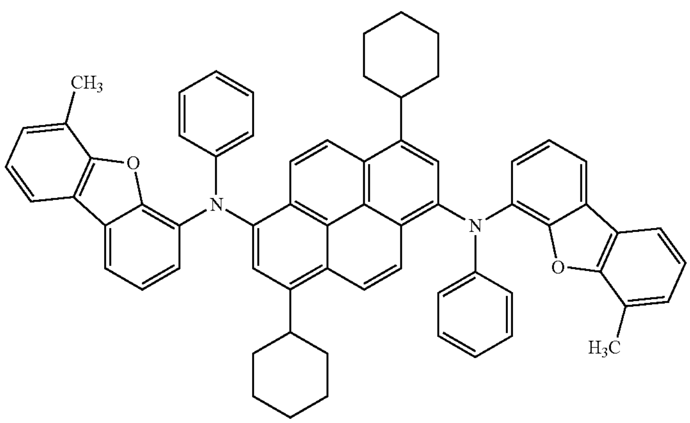
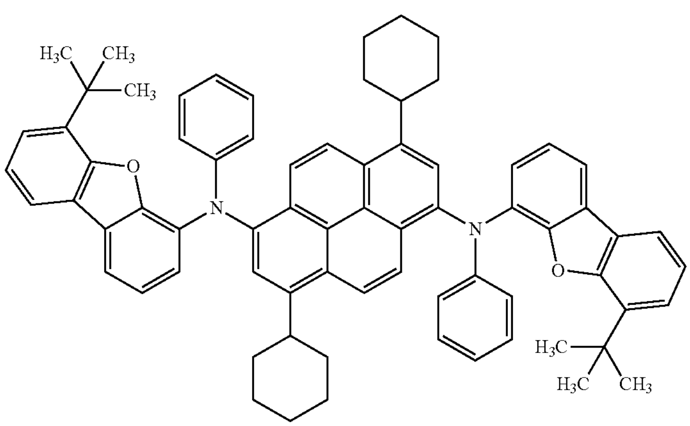

-continued
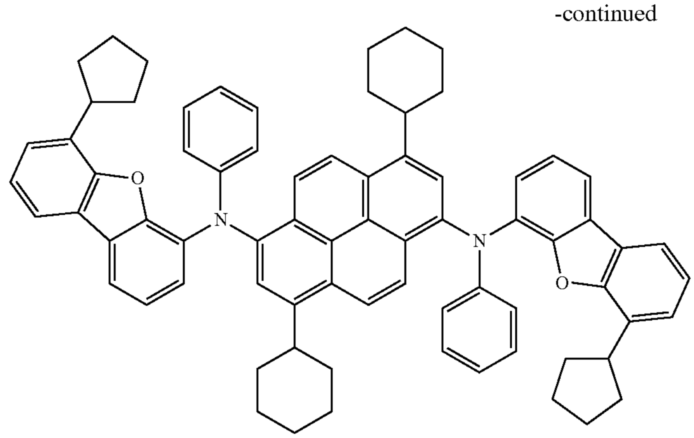
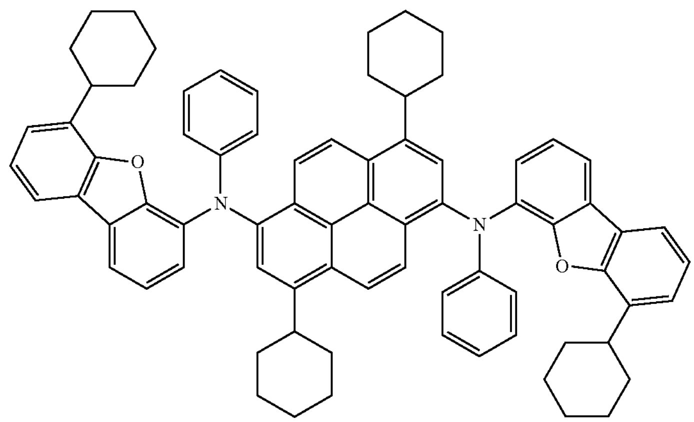
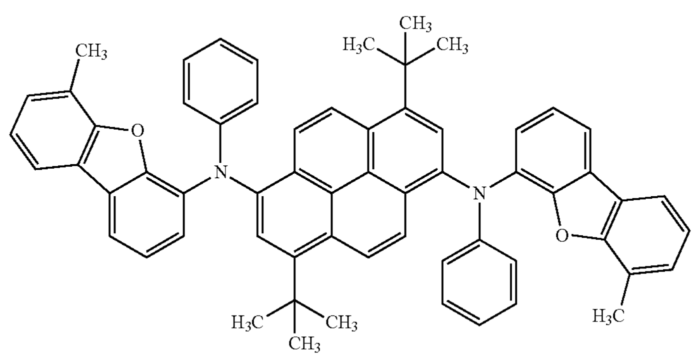
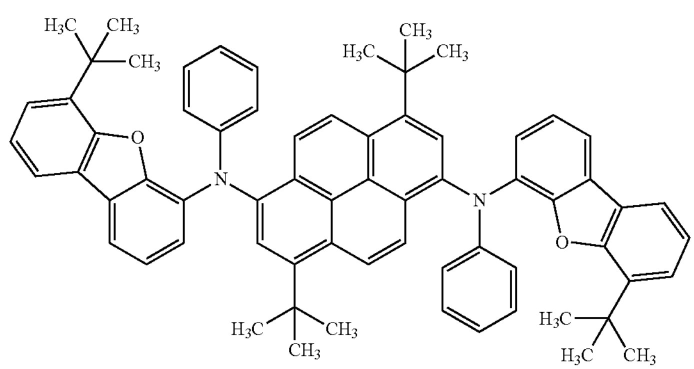

-continued

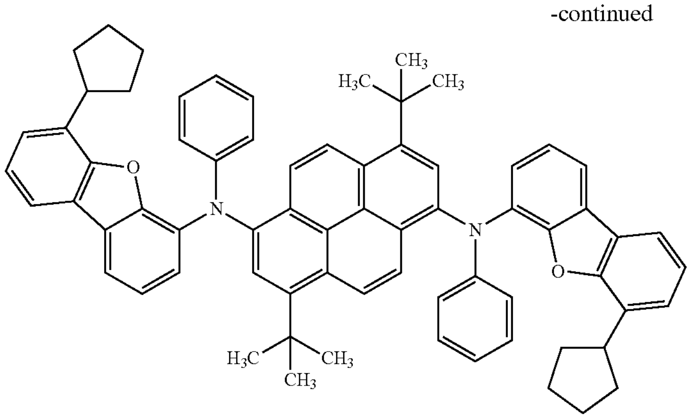

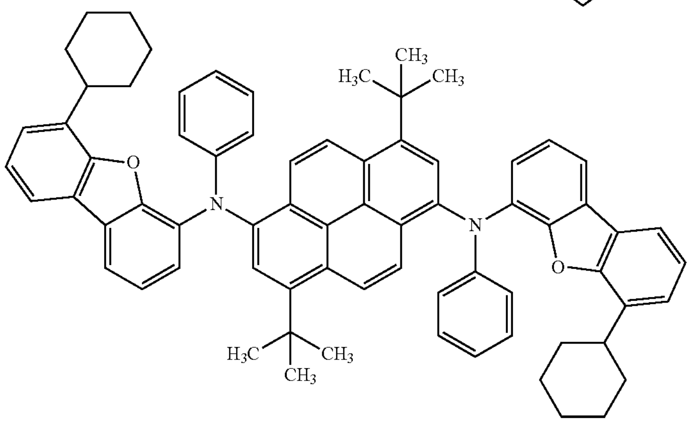

A content of the dopant material in the emitting layer is subject to no particular limitation and may be determined depending on the intended purpose of use. However, the content is preferably, for instance, in a range from 0.1 mass % to 70 mass %, more preferably in a range from 1 mass % to 30 mass %. When the content of the dopant material is 0.1 mass % or more, sufficient luminescence can be achieved. When the content is 70 mass % or less, concentration quenching can be avoided.

The emission color of the dopant material contained in the emitting layer is subject to no particular limitation in the exemplary embodiment of the invention. However, a fluorescent dopant material capable of blue emission with a main peak wavelength of 480 nm or less is preferable usable. The main peak wavelength means the peak wavelength of a luminescence spectrum having the maximum luminous intensity among luminous spectra measured in a toluene solution with a concentration from $10^{-6}$ mol/l to $10^{-5}$ mol/l.

When the dopant material having such a main peak wavelength is doped to the host material represented by the formula (1) to form the emitting layer, it is possible to provide a long-life organic EL device with high luminous efficiency.

Combination of Host Material and Dopant Material

In the exemplary embodiment, an anthracene derivative obtained when $Z^1$ in the formula (1) is represented by one of the formulae (5) to (10) is preferably usable as the host material. In particular, naphthobenzofuran represented by one of the formulae (8) to (10) is preferably usable as $Z^1$. When anthracene is substituted with naphthobenzofuran, molecular packing in the emitting layer is likely to be increased due to the flatness of the naphthobenzofuran, thereby increasing the charge mobility. As a result, charges are likely to leak out of the emitting layer, which results in reducing the luminous efficiency and lifetime. In view of the above, with a dopant that is capable of trapping electrons or holes and has a fused ring structure, it is expected to provide a long-life organic EL device with high luminous efficiency because the dopant serves to trap carrier in the emitting layer. Thus, when a compound (diaminopyrene derivative) represented by the formula (21), which is capable of trapping holes and has a fused ring structure, is used as the dopant material, it is expected to provide a long-life organic EL device with high luminous efficiency because charges can be trapped in the emitting layer.

Hole Injecting/Transporting Layer

The hole injecting/transporting layer helps injection of holes into the emitting layer and transports the holes to a luminescent region and a compound having a large hole mobility and a small energy of ionization is used to form this layer.

A material capable of transporting holes to the emitting layer with a lower field intensity is preferable as a material for the hole injecting/transporting layer and, for instance, an aromatic amine compound is preferably usable.

Electron Injecting/Transporting Layer

The electron injecting/transporting layer helps injection of electrons into the emitting layer and transports the electrons to the luminescent region and a compound having a large electron mobility is used to form this layer.

A preferable example of the compound used for the electron injecting/transporting layer is an aromatic heterocyclic compound having in the molecule at least one heteroatom. Particularly, a nitrogen-containing cyclic derivative is preferable. A preferable example of the nitrogen-containing cyclic derivative is a heterocyclic compound having nitrogen-containing six-membered or five-membered ring skeleton.

To form the organic layers except the emitting layer of the organic EL device according to the exemplary embodiment of the invention, compounds usable as a material for a typical organic EL device may be selectively used in addition to the above listed exemplary compounds.

Substrate

The organic EL device according to the exemplary embodiment of the invention is formed on a light-transmissive substrate. The light-transmissive plate, which supports the organic EL device, is preferably a smoothly-shaped substrate that transmits 50% or more of light in a visible region of 400 nm to 700 nm.

The light-transmissive plate is exemplarily a glass plate, a polymer plate or the like.

For the glass plate, materials such as soda-lime glass, barium/strontium-containing glass, lead glass, aluminosilicate glass, borosilicate glass, barium borosilicate glass and quartz can be used.

For the polymer plate, materials such as polycarbonate, acryl, polyethylene terephthalate, polyether sulfide and polysulfone can be used.

Anode and Cathode

The anode of the organic EL device is used to inject holes into the hole injecting layer, the hole transporting layer or the emitting layer. It is effective that the anode has a work function of 4.5 eV or more.

Exemplary materials for the anode are alloys of indium-tin oxide (ITO), tin oxide (NESA), indium zinc oxide, gold, silver, platinum and copper.

To form the anode, a thin film may be formed of the above electrode materials through a method such as vapor deposition and sputtering.

When light from the emitting layer is to be emitted through the anode as in the exemplary embodiment, the anode preferably transmits more than 10% of the light in the visible region. Sheet resistance of the anode is preferably several hundreds Ω/square or lower. Although depending on the material of the anode, a thickness of the anode is typically in a range of 10 nm to 1 μm, preferably in a range of 10 nm to 200 nm.

The cathode is preferably formed of a material with smaller work function in order to inject electrons into the electron injecting layer, the electron transporting layer or the emitting layer.

Although a material for the cathode is subject to no specific limitation, specific examples of the material are indium, aluminum, magnesium, alloy of magnesium and indium, alloy of magnesium and aluminum, alloy of aluminum and lithium, alloy of aluminum, scandium and lithium and alloy of magnesium and silver.

To form the cathode, a thin film may be formed of the above materials through a method such as vapor deposition and sputtering in the same manner as the anode. In addition, light may be emitted through the cathode. In addition, light from the emitting layer may be emitted through the cathode. When light from the emitting layer is to be emitted through the cathode, the cathode preferably transmits more than 10% of the light in the visible region.

Sheet resistance of the cathode is preferably several hundreds Ω per square or lower.

Although depending on the material of the cathode, a thickness of the cathode is typically in a range from 10 nm to 1 μm, preferably in a range from 50 nm to 200 nm.

Method of Forming Layers in Organic EL Device

A method of forming each of the layers in the organic EL device according to the exemplary embodiment of the invention is not particularly limited. Conventionally-known methods such as vacuum deposition and spin coating are usable to form the layers. The organic layers in the organic EL device according to the exemplary embodiment of the invention may be formed by any of known methods such as vacuum deposition, molecular beam epitaxy (MBE method) and coating methods using a solution such as dipping, spin coating, casting, bar coating and roll coating.

Thicknesses of Layers in Organic EL Device

A thickness of the emitting layer is preferably in a range from 5 nm to 50 nm, more preferably in a range from 7 nm to 50 nm and most preferably in a range from 10 nm to 50 nm. When the thickness of the emitting layer is 5 nm or more, the emitting layer can be easily formed and chromaticity is easily adjustable. When the thickness of the emitting layer is 50 nm or less, an increase in the driving voltage can be inhibited.

The thickness of each of the other organic layers is subject to no particular limitation but a preferable thickness thereof is usually in a range from several nanometers to 1 μm. When each of the organic layers has a thickness in the above range, it is possible to prevent a defect such as a pin hole resulting from an extremely thin thickness of the layer. Further, it is also possible to inhibit an increase in the driving voltage resulting from an extremely thick thickness of the layer and thus to prevent deterioration of the luminous efficiency.

Modifications of Exemplary Embodiment

It should be noted that the invention is not limited to the above exemplary embodiment but may include any modification or improvement as long as the modification or improvement are compatible with an object of the invention.

Although the organic EL device includes one emitting layer in the exemplary embodiment, the organic EL device may include a plurality of laminated emitting layers. When the organic EL device includes a plurality of emitting layers, as long as at least one of the emitting layers needs to contain a compound represented by the formula (1) and a compound represented by the formula (21), the other emitting layers may be fluorescent emitting layers or phosphorescent emitting layers.

Further, when the organic EL device includes a plurality of emitting layers, the emitting layers may be arranged adjacent to one another or, alternatively, a plurality of emitting units may be laminated on one another via an intermediate layer (i.e., a so-called tandem-type organic EL device).

According to the exemplary embodiment of the invention, the emitting layer may also preferably contain an assistance substance for assisting injection of charges.

When the emitting layer is formed of a host material that exhibits a wide energy gap, a difference in ionization potential (Ip) between the host material and the hole injecting/transporting layer etc. becomes so large that injection of the holes into the emitting layer becomes difficult, which may cause a rise in a driving voltage required for sufficient luminance.

In the above instance, introducing a hole-injectable or hole-transportable assistance substance for assisting injection of charges in the emitting layer can contribute to facilitation of the injection of the holes into the emitting layer and to reduction of the driving voltage.

As the assistance substance for assisting the injection of charges, for instance, a general hole injecting material, a general hole transporting material or the like can be used.

Specific examples of the assistance material for assisting the injection of charges are a triazole derivative, oxadiazole derivative, imidazoles derivative, polyarylalkane derivative, pyrazoline derivative, pyrazolone derivative, phenylenediamine derivative, arylamine derivative, amino-substituted chalcone derivative, oxazole derivative, fluorenone derivative, hydrazone derivative, stilbene derivative, silazane derivative, polysilane copolymer, aniline copolymer, and conductive polymer oligomer (particularly, a thiophene oligomer).

While the above are hole-injectable materials, porphyrin compounds, aromatic tertiary amine compounds and styrylamine compounds are preferable, among which aromatic tertiary amine compounds are particularly preferable.

In addition, 4,4'-bis(N-(1-naphthyl)-N-phenylamino)biphenyl (hereinafter, abbreviated as NPD) having two fused aromatic rings in a molecule, or 4,4',4"-tris(N-(3-methylphenyl)-N-phenylamino)triphenylamine (hereinafter, abbreviated as MTDATA) in which three triphenylamine units are bonded in a starburst form and the like are also usable.

In addition, a hexaazatriphenylene derivative and the like are preferably usable as the hole injecting material.

In addition, inorganic compounds such as p-type Si and p-type SiC are usable as the hole-injecting material.

The organic EL device according to the exemplary embodiment of the invention is suitably usable for a display of a television, a cellular phone or a personal computer, for lighting or for an electronic device such as a light-emitting device for a vehicle lamp.

EXAMPLES

Examples of the invention will be described below. However, the invention is not limited by these Examples.

The used compounds are shown below.

BH-1

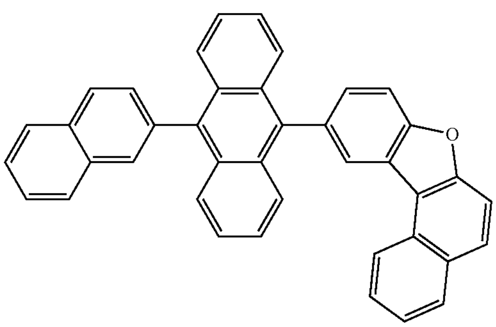

BD-1

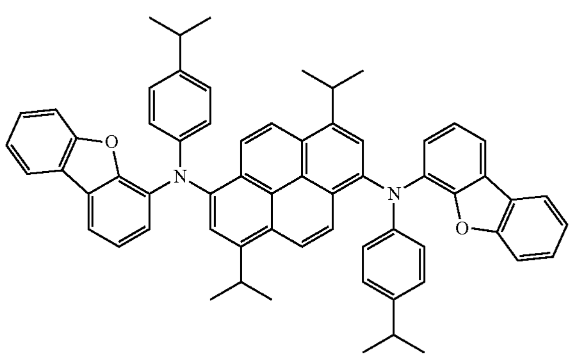

-continued

Comparative BH-1

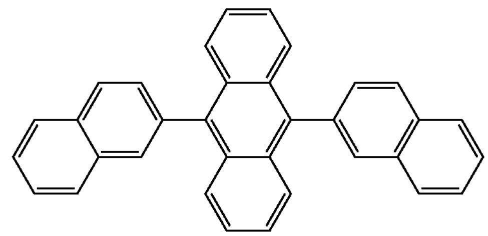

Comparative BD-1

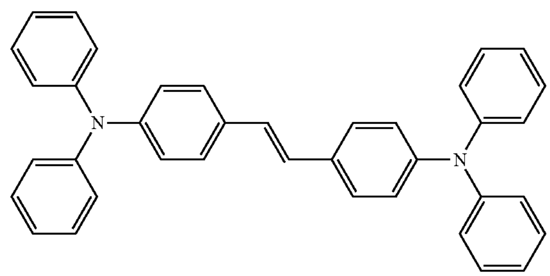

HA-1

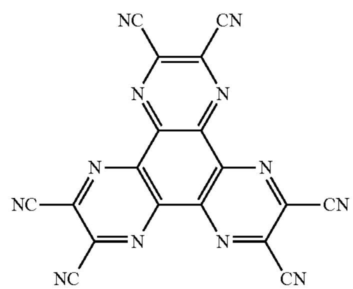

HT-1

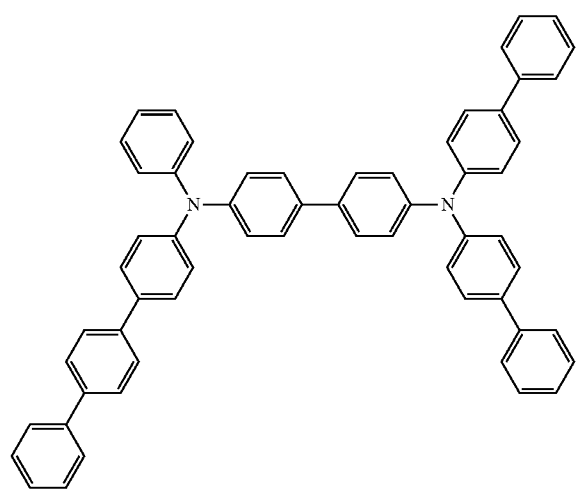

ET-1

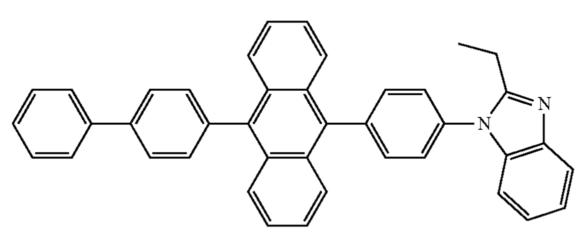

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. The ITO was 130 nm thick.

After the glass substrate having the transparent electrode line was cleaned, the glass substrate was mounted on a substrate holder of a vacuum evaporation apparatus. Initially, a compound HA-1 was deposited on a surface of the glass substrate where the transparent electrode line was provided so as to cover the transparent electrode, thereby forming a 5-nm-thick film of the compound HA-1. The HA-1 film serves as a hole injecting layer.

After the formation of the HA-1 film, a compound HT-1 was deposited on the HA-1 film to form a 95-nm-thick HT-1 film on the HA-1 film. The HT-1 film serves as a hole transporting layer.

Then, a compound BH-1 (host material) and a compound BD-1 (dopant material) were co-deposited on the HT-1 film to form a 25-nm-thick emitting layer. In the emitting layer, a concentration of the host material was 95 mass % and a concentration of the dopant material was 5 mass %.

ET-1 (an electron-transportable material) was deposited on the emitting layer to form a 25-nm-thick electron transporting layer.

LiF was deposited on the electron transporting layer to form a 1-nm-thick LiF layer.

A metal Al was deposited on the LiF film to form an 80-nm-thick metal Al cathode.

Comparative Examples 1 to 3

As shown in Table 1, organic EL devices of Comparative Examples 1 to 3 were manufactured in the same manner as that of Example 1 except for using different materials for the emitting layer.

Evaluation of Organic EL Devices

A voltage was applied to each of the manufactured organic EL devices to obtain a current density of 10 mA/cm$^2$ and then the organic EL device was evaluated in terms of driving voltage, CIE1931 chromaticity, current efficiency (L/J), external quantum efficiency (EQE), main peak wavelength $\lambda_p$ and lifetime LT90. The results are shown in Table 1. Regarding the evaluation items other than CIE1931 chromaticity and main peak wavelength $\lambda_p$, Table 1 shows calculated ratios of the values of Example 1 and Comparative Examples 1 to 3 to those of Comparative Example 1.

Driving Voltage

A driving voltage (unit: V) was measured when an electric current was induced between the ITO transparent electrode and the metal Al cathode at a current density of 10 mA/cm$^2$.

CIE1931 Chromaticity

CIE1931 chromaticity coordinates (x, y) were determined with the spectroradiometer when a voltage was applied to each device to obtain a current density of 10 mA/cm$^2$.

Current Efficiency (L/J)

A spectral radiance spectra was determined with the spectroradiometer when a voltage was applied to each device to obtain a current density of 10 mA/cm$^2$ and a current efficiency (unit: cd/A) was calculated from the obtained spectral radiance spectra.

External Quantum Efficiency (EQE)

Assuming that lambertian radiation was performed, an external quantum efficiency (EQE) (unit: %) was calculated from the obtained spectral radiance spectra.

Main Peak Wavelength $\lambda_p$

A main peak wavelength $\lambda_p$ was determined from the obtained spectral radiance spectra.

Lifetime LT90

A voltage was applied to each device to obtain a current density of 50 mA/cm$^2$ and a time (unit: h) elapsed until the luminance intensity decreased to 90% of the initial luminance intensity was measured.

TABLE 1

| | Host | Dopant | | | | | Chromaticity | | |
|---|---|---|---|---|---|---|---|---|---|
| | Material | Material | Voltage | L/J | EQE | LT90 | CIEx | CIEy | λp |
| Ex. 1 | BH-1 | BD-1 | 0.89 | 1.09 | 1.68 | 12.83 | 0.132 | 0.145 | 465 |
| Comp. 1 | Comp. BH-1 | Comp. BD-1 | 1.00 | 1.00 | 1.00 | 1.00 | 0.162 | 0.200 | 471 |
| Comp. 2 | BH-1 | Comp. BD-1 | 0.89 | 0.96 | 0.97 | 0.38 | 0.162 | 0.198 | 471 |
| Comp. 3 | Comp. BH-1 | BD-1 | 1.02 | 0.98 | 1.36 | 6.67 | 0.131 | 0.139 | 465 |

The organic EL device of Example 1 uses the host material represented by the formula (1) and the dopant material represented by the formula (21) and has significantly improved luminous efficiency and lifetime while the driving voltage was reduced as compared with the organic EL device of Comparative Example 1 that uses host material and dopant material different from ones according to the exemplary embodiment. The organic EL device of Comparative Example 2 uses the same host material as that of Example 1. The organic EL device of Comparative Example 3 uses a host material different from one represented by the formula (1). Even compared with the organic EL devices of Comparative Examples 2 and 3, the organic EL device of Example 1 has improved luminous efficiency and lifetime while the driving voltage thereof is kept low. In particular, while the driving voltage of the organic EL device of Example 1 is as low as that of the organic EL device of Comparative Example 2, the external quantum efficiency (EQE) and lifetime of the organic EL device of Example 1 are considerably improved as compared with those of the organic EL device of Comparative Example 2.

What is claimed is:

1. An organic electroluminescence device comprising:

a cathode;

an anode; and an organic layer being interposed between the cathode and the anode, the organic layer comprising one or more layers comprising at least an emitting layer, wherein the emitting layer comprises:

an anthracene derivative represented by a formula (1) below; and a pyrene derivative represented by a formula (21) below, (1)

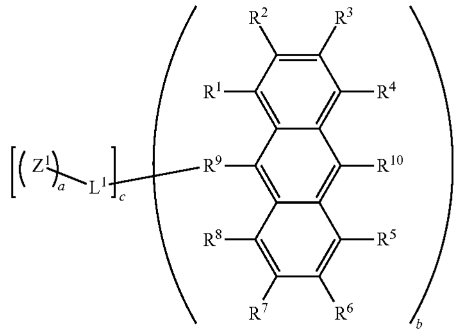

where:

a variable number c of $R^1$ to $R^{10}$ is a single bond through which $L^1$ is bonded;

the rest of $R^1$ to $R^{10}$ at which $L^1$ is not bonded each represent any one of a hydrogen atom, a halogen atom, a hydroxyl group, a cyano group, a substituted or unsubstituted amino group, a substituted or unsubstituted alkyl group having 1 to 20 carbon atoms, a substituted or unsubstituted alkoxy group having 1 to 20 carbon atoms, a substituted or unsubstituted aryloxy group having 6 to 30 ring carbon atoms, a substituted or unsubstituted arylthio group having 6 to 30 ring carbon atoms, a substituted or unsubstituted aromatic hydrocarbon group having 6 to 30 ring carbon atoms and a substituted or unsubstituted heterocyclic group having 5 to 30 ring atoms; $L^1$ is a single bond or a linking group;

the linking group is any one of an (a+1)-valent residue obtained by removing a variable number (a+1) of hydrogen atoms from a substituted or unsubstituted aromatic hydrocarbon group having 6 to 30 ring carbon atoms, an (a+1)-valent residue obtained by removing a variable number (a+1) of hydrogen atoms from a substituted or unsubstituted heterocyclic group having 5 to 30 ring atoms, and an (a+1)-valent residue obtained by removing a variable number (a+1) of hydrogen atoms from a group formed by bonding two to four of the substituted or unsubstituted aromatic hydrocarbon groups having 6 to 30 ring carbon atoms and the substituted or unsubstituted heterocyclic groups having 5 to 30 ring atoms;

a, b and c each represent an integer of 1 to 4; and $Z^1$ is represented by a formula (2) below, (2)

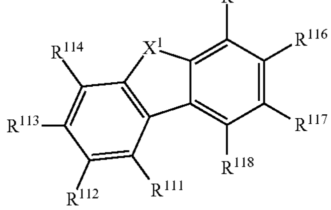

where:

$X^1$ is an oxygen atom or a sulfur atom;

$R^{111}$ to $R^{118}$ are each the same as the rest of $R^1$ to $R^{10}$ at which $L^1$ is not bonded in the formula (1); and adjacent two substituents of at least one pair of $R^{111}$ and $R^{112}$, $R^{112}$ and $R^{113}$, $R^{113}$ and $R^{114}$, $R^{115}$ and $R^{116}$, $R^{116}$ and $R^{117}$, and $R^{117}$ and $R^{118}$ are mutually bonded to form a ring represented by a formula (3) or a formula (4) below, (3)

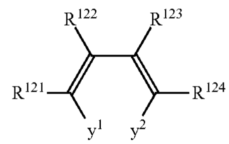

(4)

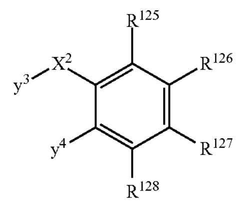

where:

$y^1$ and $y^2$ in the formula (3) represent positions where the pair selected from $R^{111}$ to $R^{118}$ in the formula (2) are bonded;

$y^3$ and $y^4$ in the formula (4) represent positions where the pair selected from $R^{111}$ to $R^{118}$ in the formula (2) are bonded;

$R^{121}$ to $R^{124}$ and $R^{125}$ to $R^{128}$ are each the same as the rest of $R^1$ to $R^{10}$ at which $L^1$ is not bonded in the formula (1);

$X^2$ is an oxygen atom or a sulfur atom; and one of the rest of $R^{111}$ to $R^{118}$ not forming the ring in the formula (2) and $R^{121}$ to $R^{124}$ in the formula (3) or one of the rest of $R^{111}$ to $R^{118}$ not forming the ring in the formula (2) and $R^{125}$ to $R^{128}$ in the formula (4) is a single bond through which $L^1$ is bonded in the formula (1), (21)

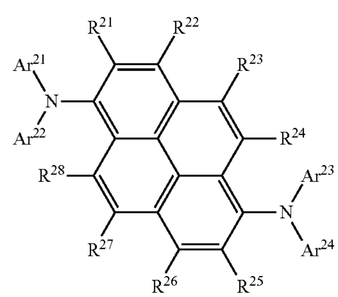

where:

$R^{21}$ to $R^{28}$ each represent any one of a hydrogen atom, a halogen atom, a cyano group, a substituted or unsubstituted alkyl group having 1 to 20 carbon atoms, a substituted or unsubstituted silyl group and a substituted or unsubstituted aromatic hydrocarbon group having 6 to 30 ring carbon atoms;

$Ar^{21}$ to $Ar^{24}$ each represent a substituted or unsubstituted aromatic hydrocarbon group having 6 to 30 ring carbon atoms or a substituted or unsubstituted heterocyclic group having 5 to 30 ring atoms; and at least one of $Ar^{21}$ to $Ar^{24}$ is a heterocyclic group represented by a formula (22) below,

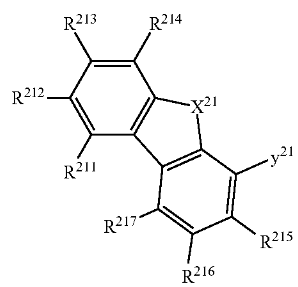

(22)

where:

$R^{211}$ to $R^{217}$ each represent any one of a hydrogen atom, a halogen atom, a cyano group, a substituted or unsubstituted alkyl group having 1 to 20 carbon atoms, a substituted or unsubstituted alkenyl group having 2 to 20 carbon atoms, a substituted or unsubstituted alkynyl group having 2 to 20 carbon atoms, a substituted or unsubstituted silyl group, a substituted or unsubstituted aromatic hydrocarbon group having 6 to 30 ring carbon atoms and a substituted or unsubstituted heterocyclic group having 5 to 30 ring atoms;

each pair of $R^{211}$ and $R^{212}$, $R^{212}$ and $R^{213}$, $R^{213}$ and $R^{214}$, $R^{215}$ and $R^{216}$, and $R^{216}$ and $R^{217}$ are optionally mutually bonded to form a saturated or unsaturated ring that is optionally substituted;

$X^{21}$ is an oxygen atom or a sulfur atom; and $y^{21}$ is a single bond through which a nitrogen atom in the formula (21) is bonded.

2. The organic electroluminescence device according to claim 1, wherein $Z^1$ is represented by one of formulae (5) to (7) below,

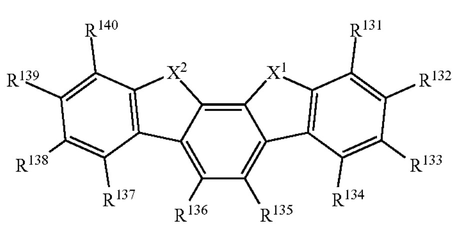

(5)

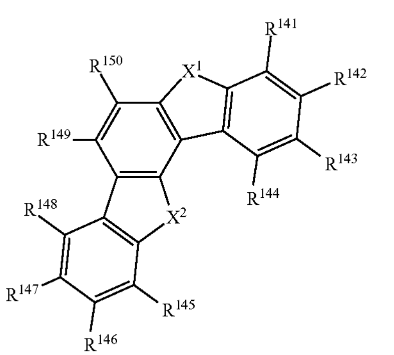

(6)

-continued

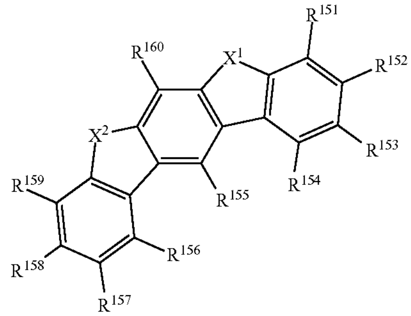

(7)

where:

$R^{131}$ to $R^{140}$, $R^{141}$ to $R^{150}$ and $R^{151}$ to $R^{160}$ are each the same as the rest of $R^1$ to $R^{10}$ at which $L^1$ is not bonded in the formula (1);

$L^1$ is bonded to $Z^1$ at one selected from among $R^{131}$ to $R^{140}$, one selected from among $R^{141}$ to $R^{150}$ or one selected from among $R^{151}$~$R^{160}$ through a single bond; and $X^1$ and $X^2$ are the same as $X^1$ in the formula (2) and $X^2$ in the formula (4), respectively, and are mutually the same or different.

3. The organic electroluminescence device according to claim 1, wherein $Z^1$ is represented by one of formulae (8) to (10) below,

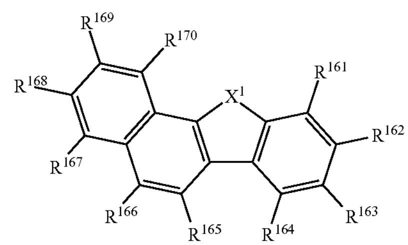

(8)

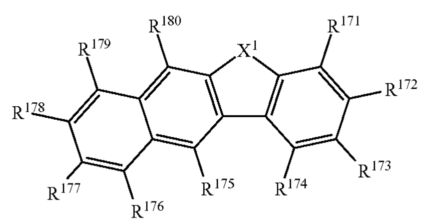

(9)

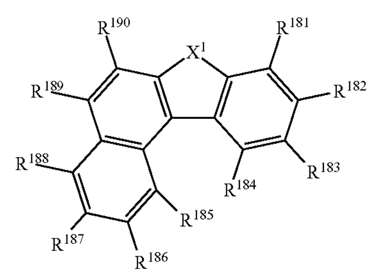

(10)

where:

$R^{161}$ to $R^{170}$, $R^{171}$ to $R^{180}$ and $R^{181}$ to $R^{190}$ are each the same as the rest of $R^1$ to $R^{10}$ at which $L^1$ is not bonded in the formula (1);

$L^1$ is bonded to $Z^1$ at one selected from among $R^{161}$ to $R^{170}$, one selected from among $R^{171}$ to $R^{180}$ or one selected from among $R^{181}$~$R^{190}$ through a single bond; and $X^1$ is the same as $X^1$ in the formula (2).

4. The organic electroluminescence device according to claim 1, wherein b in the formula (1) represents 1.

5. The organic electroluminescence device according to claim 1, wherein a in the formula (1) represents 1 or 2.

6. The organic electroluminescence device according to claim 1, wherein at least one of $R^9$ and $R^{10}$ in the formula (1) is a single bond through which $L^1$ is bonded.

7. The organic electroluminescence device according to claim 1, wherein $R^9$ in the formula (1) represents a substituted or unsubstituted aromatic hydrocarbon group having 6 to 30 ring carbon atoms or a substituted or unsubstituted heterocyclic group having 5 to 30 ring atoms.

8. The organic electroluminescence device according to claim 1, wherein $X^1$ and $X^2$ each represent an oxygen atom.

9. The organic electroluminescence device according to claim 1, wherein $Ar^{21}$ and $Ar^{23}$ in the formula (21) each represent the heterocyclic group represented by the formula (22).

10. The organic electroluminescence device according to claim 1, wherein $R^{21}$ to $R^{28}$ in the formula (21) each represent a hydrogen atom.

11. The organic electroluminescence device according to claim 1, wherein $R^{22}$ and $R^{26}$ in the formula (21) each represent a substituted or unsubstituted alkyl group having 1 to 20 carbon atoms or a substituted or unsubstituted alkylsilyl group having 3 to 30 carbon atoms, and $R^{21}$, $R^{23}$, $R^{24}$, $R^{25}$, $R^{27}$ and $R^{28}$ each represent a hydrogen atom.

12. The organic electroluminescence device according to claim 1, wherein $X^{21}$ in the formula (22) represents an oxygen atom.

* * * * *